United States Patent
Horie

(10) Patent No.: US 9,530,821 B2
(45) Date of Patent: Dec. 27, 2016

(54) LIGHT-EMITTING DEVICE, METHOD FOR DESIGNING LIGHT-EMITTING DEVICE, METHOD FOR DRIVING LIGHT-EMITTING DEVICE, ILLUMINATION METHOD, AND METHOD FOR MANUFACTURING LIGHT-EMITTING DEVICE

(71) Applicant: CITIZEN ELECTRONICS CO., LTD., Fujiyoshida-shi (JP)

(72) Inventor: Hideyoshi Horie, Odawara (JP)

(73) Assignee: CITIZEN ELECTRONICS CO., LTD., Fujiyoshida-shi (JP)

( * ) Notice: Subject to any disclaimer, the term of this patent is extended or adjusted under 35 U.S.C. 154(b) by 0 days.

(21) Appl. No.: 14/845,436

(22) Filed: Sep. 4, 2015

(65) Prior Publication Data

US 2015/0380460 A1 Dec. 31, 2015

Related U.S. Application Data

(63) Continuation of application No. PCT/JP2014/055388, filed on Mar. 4, 2014.

(30) Foreign Application Priority Data

Mar. 4, 2013 (JP) .................................. 2013-042268
Mar. 4, 2013 (JP) .................................. 2013-042269

(51) Int. Cl.
*H01L 29/20* (2006.01)
*H01L 27/15* (2006.01)
(Continued)

(52) U.S. Cl.
CPC ............... *H01L 27/15* (2013.01); *H01L 33/62* (2013.01); *H05B 33/086* (2013.01)

(58) Field of Classification Search
CPC ......... H05B 33/086; H01L 27/15; H01L 33/62
(Continued)

(56) References Cited

U.S. PATENT DOCUMENTS 5,803,579 A 9/1998 Turnbull et al.
6,459,197 B1 10/2002 Mori et al.
(Continued)

FOREIGN PATENT DOCUMENTS

CN 1249530 A 4/2000
CN 101714349 A 5/2010
(Continued)

OTHER PUBLICATIONS

International Search Report issued Jun. 3, 2014, in PCT/JP2014/055388 filed Mar. 4, 2014.
(Continued)

*Primary Examiner* — Tuan Nguyen
(74) *Attorney, Agent, or Firm* — Oblon, McClelland, Maier & Neustadt, L.L.P.

(57) ABSTRACT

A light-emitting device that can implement a natural, vivid, highly visible and comfortable appearance of colors and appearance of objects as if the objects are seen outdoors is provided. The light-emitting device can change the appearance of colors of the illuminated objects so as to satisfy the requirements for various illuminations. Furthermore, the appearance of colors of the light-emitting device which currently exists or is in use, and which includes a semiconductor light-emitting device of which appearance of colors is not very good, is improved. A method for driving the light-emitting device, an illumination method by the device, and a method for manufacturing the light-emitting device are also provided. These features are achieved by the light-emitting device that incorporates light-emitting elements and satisfies predetermined requirements, in which $\phi_{SSL}(\lambda)$
(Continued)

emitted from the light-emitting device satisfies a predetermined condition.

16 Claims, 115 Drawing Sheets

(51) Int. Cl.
   *H01L 33/62* (2010.01)
   *H05B 33/08* (2006.01)
(58) Field of Classification Search
   USPC .......................................................... 257/89
   See application file for complete search history.

(56) References Cited

U.S. PATENT DOCUMENTS

| | | | |
|---|---|---|---|
| 6,560,358 | B1 | 5/2003 | Tsukada |
| 2004/0141213 | A1 | 7/2004 | Kleiman |
| 2008/0297027 | A1 | 12/2008 | Miller et al. |
| 2010/0020117 | A1 | 1/2010 | Tanizoe et al. |
| 2010/0309107 | A1 | 12/2010 | Muroi et al. |
| 2011/0068698 | A1 | 3/2011 | Swoboda et al. |
| 2012/0008318 | A1 | 1/2012 | Ishiwata et al. |
| 2012/0112626 | A1 | 5/2012 | Sakuta et al. |
| 2013/0300282 | A1 | 11/2013 | Mori et al. |
| 2014/0183578 | A1* | 7/2014 | Horie .................. F21K 9/00 257/89 |
| 2014/0217417 | A1* | 8/2014 | Horie .................. H05B 33/0866 257/76 |

FOREIGN PATENT DOCUMENTS

| | | |
|---|---|---|
| CN | 101939691 A | 1/2011 |
| EP | 0 936 682 | 8/1999 |
| JP | 3503139 | 3/2004 |
| JP | 2011-9078 | 1/2011 |
| JP | 2012-113958 | 6/2012 |
| JP | 2013-171688 | 9/2013 |
| WO | 2009/082737 A1 | 7/2009 |
| WO | WO 2011/024818 | 3/2011 |
| WO | 2011/070473 A1 | 6/2011 |
| WO | WO 2013/069208 | 5/2013 |

OTHER PUBLICATIONS

"General-purpose fluorescent light Meat-kun", [online], Prince Electric Co., Ltd., [searched on May 16, 2011], Internet <URL: http://www.prince-d.co.jp/pdct/docs/pdf/catalog_pdf/fl_nrb_ca2011.pdf> (with English translation).

LEDs Magazine, [retrieved on Aug. 22, 2011], Internet <URL: http://www.ledsmagazine.com/news/8/8/2>.

Notification of Transmittal of translation of the International Preliminary Report on Patentability and Written Opinion issued Sep. 17, 2015 in PCT Application No. PCT/JP2014/055388.

Extended European Search Report in Patent Application No. 14761235.2-2966944, issued Oct. 24, 2016.

* cited by examiner

Example 3
Drive Point D
2833K
Duv=−0.0033

Example 4
Drive Point A
5500K
Duv=−0.0303

Example 4
Drive Point B
5889K
Duv=−0.0216

Example 4
Drive Point E
6814K
Duv=+0.0038

Example 6
Drive Point B
3639K
Duv=−0.01579

Example 6
Drive Point C
3950K
Duv=−0.01627

Example 7
Drive Point A
3327K
Duv=−0.01546

Example 8
Drive Point C
3160K
Duv=−0.01365

Reference Example 1
3292K
Duv=−0.0211

Example 9
3164K
Duv=−0.0206

Reference Comparative
Example 1
4095K
Duv=+0.0003

Example 10
4421K
Duv=−0.0042

Reference Comparative
Example 2
2880K
Duv=+0.0082

Comparative Example 2
2808K
Duv=+0.0072

Reference Example 2
3606K
Duv=−0.01115

Example 11
3470K
Duv=−0.01160

Reference Comparative
Example 3
3661K
Duv=−0.00129

Example 12
3762K
Duv=−0.00593

LIGHT-EMITTING DEVICE, METHOD FOR DESIGNING LIGHT-EMITTING DEVICE, METHOD FOR DRIVING LIGHT-EMITTING DEVICE, ILLUMINATION METHOD, AND METHOD FOR MANUFACTURING LIGHT-EMITTING DEVICE

CROSS-REFERENCE OF RELATED APPLICATION

The present application incorporates, as disclosed content of the description thereof, the entire content of the description, Claims, Drawings and Abstract of Japanese Patent Application No. 2013-042268 filed on Mar. 4, 2013, the entire content of the description, Claims, Drawings and Abstract of Japanese Patent Application No. 2013-042269 filed on Mar. 4, 2013, and a part or all of the content disclosed in the patent documents or the like cited in the present description.

TECHNICAL FIELD

The present invention relates to a light-emitting device in which a plurality of light emitting areas exists, and more particularly to a light-emitting device that can change the luminous flux amount and/or radiant flux amount emitted from each light emitting area. The present invention also relates to a method for designing the light-emitting device, a method for driving the light-emitting device, and an illumination method. The present invention also relates to a light-emitting device that incorporates both a light-emitting element and a control element. The present invention also relates to a method for manufacturing and a method for designing a light-emitting device for manufacturing a new light-emitting device by disposing a control element in a conventional light-emitting device. Furthermore, the present invention relates to an illumination method using the light-emitting device.

BACKGROUND ART

Recent advances toward higher output and higher efficiency in GaN related semiconductor light-emitting elements have been dramatic. In addition, active research is underway to increase efficiency of semiconductor light-emitting elements and various phosphors that use an electron beam as an excitation source. As a result, power-saving capabilities of today's light-emitting devices such as light sources, light source modules including light sources, fixtures including light source modules, and systems including fixtures are advancing rapidly as compared to their conventional counterparts.

For example, it is widely popular to incorporate a GaN related blue light-emitting element as an excitation light source of a yellow phosphor and create a so-called pseudo-white light source from a spectrum of the GaN related blue light-emitting element and a spectrum of the yellow phosphor, use the pseudo-white light source as an illumination light source or create a lighting fixture that incorporates the pseudo-white light source or, further, fabricate a lighting system in which a plurality of such fixtures are arranged in a space (refer to Patent Document 1).

Among packaged LEDs (for example, those that include the GaN related blue light-emitting element, the yellow phosphor, an encapsulant, and the like in a package material) which are a type of an illumination light source that can be incorporated into such modes, there are products with luminous efficacy of a source as a packaged LED exceeding 150 lm/W in a correlated color temperature (CCT) region of around 6000 K (refer to Non-Patent Document 2).

Furthermore, similar advances toward higher efficiency and greater power saving are being made in light sources for liquid crystal display (LCD) backlighting and the like.

However, many have pointed out that such light-emitting devices aiming for higher efficiency do not give sufficient consideration to color appearance. In particular, when used for illumination purposes, "color appearance" when illuminating an object with a light-emitting device such as a light source, fixture, system, or the like is particularly important together with increasing efficiency of the light-emitting device.

Attempts to address this issue include superimposing a spectrum of a red phosphor or a red semiconductor light-emitting element on a spectrum of a blue light-emitting element and a spectrum of a yellow phosphor in order to improve scores of a color rendering index (CRI) (CIE (13.3)) as established by the International Commission on Illumination (Commission Internationale de l'Eclairage/CIE). For example, while an average color rendering index ($R_a$) and a special color rendering index ($R_9$) with respect to a vivid red color sample for a typical spectrum (CCT=around 6800 K) that does not include a red source are $R_a$=81 and $R_9$=24 respectively, the scores of the color rendering indices can be improved to $R_a$=98 and $R_9$=95 when a red source is included (refer to Patent Document 2).

In addition, another attempt involves adjusting a spectrum emitted from a light-emitting device particularly for special illumination applications so that color appearance of an object is based on a desired color. For example, Non-Patent Document 1 describes a red-based illumination light source.

CITATION LIST

Patent Documents

Patent Document 1: Japanese Patent Publication No. 3503139
Patent Document 2: WO2011/024818

Non-Patent Document

Non-Patent Document 1: "General-purpose fluorescent light meat-kun", [online], Prince Electric Co., Ltd., [retrieved on May 16, 2011], Internet <URL: http://www.prince-d.co.jp/pdct/docs/pdf/catalog_pdf/fl_nrb_ca2011.pdf>
Non-Patent Document 2: LEDs MAGAZINE, [retrieved on Aug. 22, 2011], Internet <URL: http://www.ledsmagazine.com/news/8/8/2>

SUMMARY OF INVENTION

Technical Problem

A color rendering index is an index which indicates how close a color appearance is, when illuminating with light (test light) of a light-emitting device that is an evaluation object, compared to a color appearance when illuminating with a "reference light" that is selected in correspondence with a CCT of the test light. In other words, a color rendering index is an index indicating fidelity of the light-emitting device that is an evaluation object. However, recent studies have made it increasingly clear that a high average color rendering index ($R_a$) or a high special color rendering index ($R_i$ (where i ranges from 1 to 14 or, in Japan, ranges from 1 to 15 pursuant to JIS) does not necessarily lead to favorable color perception in a person. In other words, there is a problem that the aforementioned methods for improving color rendering index scores do not always achieve favorable color appearance.

Furthermore, the effect of illuminance of an illuminated object causing a variation in color appearance is not included in various color rendition metric that are currently in use. It is an everyday experience that a vivid color of a flower seen outdoors where illuminance is normally around 10000 lx or higher becomes dull once the flower is brought indoors where illuminance is around 500 lx as though the flower itself has changed to a different flower with lower chroma, even though the color is fundamentally the same. Generally, saturation regarding the color appearance of an object is dependent on illuminance, and saturation decreases as illuminance decreases even though a spectral power distribution that is being illuminated is unchanged. In other words, color appearance becomes dull. This effect is known as the Hunt effect.

Despite having a significant effect on color rendering property, as things stand, the Hunt effect is not actively considered for overall evaluation of a light-emitting device such as a light source, a fixture, or a system. In addition, while the simplest way to compensate for the Hunt effect is to dramatically increase indoor illuminance, this causes an unnecessary increase in energy consumption. Furthermore, a specific method of achieving a color appearance or an object appearance that is as natural, vivid, highly visible, and comfortable as perceived outdoors under illuminance comparable to an indoor illumination environment remains to be revealed.

Meanwhile, with light having its spectrum adjusted so as to, for example, increase chroma of red to be used for special illumination in restaurants or for food illumination, there is a problem that hue (angle) deviation increases in comparison to reference light as evidenced by yellow appearing reddish or blue appearing greenish. In other words, the color appearance of colors other than a specific color of an illuminated object becomes unnatural. Another problem is that when a white object is illuminated by such light, the white object itself appears colored and is no longer perceived as being white.

To solve the above problems, the present inventor reached, as disclosed in Japanese Patent Application No. 2011-223472, an invention of an illumination method and an overall light-emitting device such as an illumination light source, a lighting fixture, and a lighting system which are capable of achieving, under an indoor illumination environment where illuminance is around 5000 lx or lower including cases where detailed work is performed and generally around 1500 lx or lower, a color appearance or an object appearance as perceived by a person which is as natural, vivid, highly visible, and comfortable as perceived outdoors in a high-illuminance environment regardless of scores of various color rendition metric. At the same time, the present inventor also reached an illumination method that implements a comfortable illumination environment at high efficiency. Further, the present inventor reached design guidelines for this preferred light-emitting device.

The light sources that satisfy the requirements which the present inventor have already discovered can implement a natural, vivid, highly visible, and comfortable appearance of colors and an appearance of objects under an indoor luminance environment as if the objects were seen under an outdoor environment.

However, the concept of an optimum illumination slightly differs depending on age, gender, country and the like, and also differs depending on the space and purpose of the illumination. Furthermore, taste in illumination which an individual feels to be optimum may differ greatly depending on the living environment where the individual grew up and the culture thereof.

LED illumination is already common, but many products which do not consider the appearance of colors are on the market. Many LED lighting fixtures/lighting systems are already in practical use. However even if a user experiences an unnatural feeling and is unsatisfied with the appearance of colors, it is impractical to replace the target lighting fixtures/systems or the like to improve the appearance of colors thereof, if time constraints and economic issues of the user are considered.

It is an object of the present invention to provide a light-emitting device that can implement a natural, vivid, highly visible and comfortable appearance of colors and appearance of objects as if the objects are seen outdoors, and to provide a light-emitting device that can change the appearance of colors of the illuminated objects so as to satisfy the requirements for various illuminations, and a method for designing thereof. Furthermore, it is an object of the present invention to provide a method for driving the light-emitting device and an illumination method with a device.

The present invention is for improving the appearance of colors of a light-emitting device which currently exists or is in use, and which includes a semiconductor light-emitting device of which appearance of colors is not very good. Further, the present invention discloses a method for designing and a method for manufacturing this light-emitting device, and also discloses an illumination method using this light-emitting device.

Moreover, the present invention also discloses a method or the like for finely adjusting the appearance of colors of a semiconductor light-emitting device having good appearance of colors according to the taste of the user using the above mentioned technique.

Solution to Problem

In order to achieve the objects described above, the present invention includes first to fifth inventions described below. The first invention of the present invention relates to the following light-emitting device. The light-emitting device according to the first invention of the present invention includes first and second embodiments.

[1]

A light-emitting device incorporating a light-emitting element and satisfying the following A or B, wherein $\phi_{SSL}(\lambda)$ emitted from the light-emitting device satisfies both the following Condition 1 and Condition 2:

A: a light-emitting device which includes M number of light emitting areas (M is 2 or greater natural number) and has the light-emitting elements in the light emitting areas, wherein when $\phi_{SSL}N(\lambda)$ (N is 1 to M) is a spectral power distribution of a light emitted from each light emitting area in a main radiant direction of the light-emitting device, $\phi_{SSL}(\lambda)$, which is a spectral power distribution of all the lights emitted from the light-emitting device in the radiant direction, is

[Expression 1]

$$\phi_{SSL}(\lambda) = \sum_{N=1}^{M} \phi_{SSL}N(\lambda).$$

B: a light-emitting device incorporating the light-emitting element and a control element, wherein if a wavelength is denoted by $\lambda$(nm), a spectral power distribution of a light emitted from the light-emitting element in a main radiant direction is denoted by $\Phi_{elm}(\lambda)$, and a spectral power distribution of a light emitted from the light-emitting device in the main radiant direction is denoted by $\phi_{SSL}(\lambda)$ $\Phi_{elm}(\lambda)$ does not satisfy at least one of the following Conditions 1 and 2:

Condition 1:

light emitted from the light-emitting device includes, in the main radiant direction thereof, light whose distance $D_{uvSSL}$ from a black-body radiation locus as defined by ANSI C78.377 satisfies $-0.0350 \leq D_{uvSSL} \leq -0.0040$, Condition 2:

if a spectral power distribution of light emitted from the light-emitting device in the radiant direction is denoted by $\phi_{SSL}(\lambda)$, a spectral power distribution of a reference light that is selected according to $T_{SSL}$ (K) of the light emitted from the light-emitting device in the radiant direction is denoted by $\phi_{ref}(\lambda)$, tristimulus values of the light emitted from the light-emitting device in the radiant direction are denoted by $(X_{SSL}, Y_{SSL}, Z_{SSL})$, and tristimulus values of the reference light that is selected according to $T_{SSL}$ (K) of the light emitted from the light-emitting device in the radiant direction are denoted by $(X_{ref}, Y_{ref}, Z_{ref})$ and if a normalized spectral power distribution $S_{SSL}(\lambda)$ of light emitted from the light-emitting device in the radiant direction, a normalized spectral power distribution $S_{ref}(\lambda)$ of a reference light that is selected according to $T_{SSL}$ (K) of the light emitted from the light-emitting device in the radiant direction, and a difference $\Delta S(\lambda)$ between these normalized spectral power distributions are respectively defined as $$S_{SSL}(\lambda) = \phi_{SSL}(\lambda)/Y_{SSL},$$

$$S_{ref}(\lambda) = \phi_{ref}(\lambda)/Y_{ref}$$

and $$\Delta S(\lambda) = S_{ref}(\lambda) - S_{SSL}(\lambda) \text{ and}$$

an index $A_{cg}$ represented by the following Formula (1) satisfies $-360 \leq A_{cg} \leq -10$, in the case when a wavelength that produces a longest wavelength local maximum value of $S_{SSL}(\lambda)$ in a wavelength range from 380 nm to 780 nm is denoted by $\lambda_R$ (nm), and a wavelength $\Lambda 4$ that assumes $S_{SSL}(\lambda_R)/2$ exists on a longer wavelength-side of $\lambda_R$, and an index $A_{cg}$ represented by the following Formula (2) satisfies $-360 \leq A_{cg} \leq -10$, in the case when a wavelength that produces a longest wavelength local maximum value of $S_{SSL}(\lambda)$ in a wavelength range from 380 nm to 780 nm is denoted by $\lambda_R$ (nm), and a wavelength $\Lambda 4$ that assumes $S_{SSL}(\lambda_R)/2$ does not exist on a longer wavelength-side of $\lambda_R$,

[Expression 2]

$$A_{cg} = \int_{380}^{495} \Delta S(\lambda) d\lambda + \int_{495}^{590} (-\Delta S(\lambda)) d\lambda + \int_{590}^{\Lambda 4} \Delta S(\lambda) d\lambda \quad (1)$$

[Expression 3]

$$A_{cg} = \int_{380}^{495} \Delta S(\lambda) d\lambda + \int_{495}^{590} (-\Delta S(\lambda)) d\lambda + \int_{590}^{780} \Delta S(\lambda) d\lambda \quad (2)$$

[2]

The light-emitting device according to [1], satisfying the A.

[3]

The light-emitting device according to [2], wherein a semiconductor light-emitting element is included in at least one of the light emitting areas as the light-emitting element.

[4]

The light-emitting device according to [2] or [3], including light emitting areas so that $\phi_{SSL}(\lambda)$ can satisfy the Conditions 1 to 2 by changing a luminous flux amount and/or a radiant flux amount emitted from the light emitting areas.

[5]

The light-emitting device according to any one of [2] to [4], wherein all of $\phi_{SSL}N(\lambda)$ (N is 1 to M) satisfies the Condition 1 and Condition 2.

[6] The light-emitting device according to any one of [2] to [5], wherein at least one light emitting area of the M number of light emitting areas has wiring that allows the light emitting area to be electrically driven independently from other light emitting areas.

[7]

The light-emitting device according to [6], wherein all the M numbers of light emitting areas each have wiring that allows the light emitting area to be electrically driven independently from other light emitting areas.

[8]

The light-emitting device according to any one of [2] to [7], wherein at least one selected from the group consisting of the index $A_{cg}$ represented by the Formula (1) or (2), the correlated color temperature $T_{SSL}(K)$ and the distance $D_{uvSSL}$ from the black-body radiation locus can be changed.

[9]

The light-emitting device according to [8], wherein a luminous flux and/or a radiant flux emitted from the light-emitting device in the main radiant direction can be independently controlled when at least one selected from the group consisting of the index $A_{cg}$ represented by the Formula (1) or (2), the correlated color temperature $T_{SSL}(K)$ and the distance $D_{uvSSL}$ from the black-body radiation locus is changed.

[10]

The light-emitting device according to any one of [2] to [9], wherein a maximum distance L between two arbitrary points on a virtual outer periphery enveloping the entire light emitting areas closest to each other, is 0.4 mm or more and 200 mm or less.

[11]

The light-emitting device according to any one of [2] to [10], including the light emitting areas that allow $\phi_{SSL}(\lambda)$ to further satisfy the following Conditions 3 to 4 by changing a luminous flux amount and/or a radiant flux amount emitted from the light emitting areas:

Condition 3:

if an a* value and a b* value in CIE 1976 L*a*b* color space of 15 Munsell renotation color samples from #01 to #15 listed below when mathematically assuming illumination by the light emitted in the radiant direction are respectively denoted by $a^*_{nSSL}$ and $b^*_{nSSL}$ (where n is a natural number from 1 to 15), and if an a* value and a b* value in CIE 1976 L*a*b* color space of the 15 Munsell renotation color samples when mathematically assuming illumination by a reference light that is selected according to a correlated color temperature $T_{SSL}$ (K) of the light emitted in the radiant direction are respectively denoted by $a^*_{nref}$ and $b^*_{nref}$ (where n is a natural number from 1 to 15), then each saturation difference $\Delta C_n$ satisfies $-3.8 \leq \Delta C_n \leq 18.6$ (where n is a natural number from 1 to 15), and an average saturation difference represented by formula (3) below satisfies formula (4) below and

[Expression 4]

$$\frac{\sum_{n=1}^{15} \Delta C_n}{15} \quad (3)$$

[Expression 5]

$$1.0 \leq \frac{\sum_{n=1}^{15} \Delta C_n}{15} \leq 7.0, \quad (4)$$

if a maximum saturation difference value is denoted by $\Delta C_{max}$ and a minimum saturation difference value is denoted by $\Delta C_{min}$, then a difference $|\Delta C_{max} - \Delta C_{min}|$ between the maximum saturation difference value and the minimum saturation difference value satisfies $2.8 \leq |\Delta C_{max} - \Delta C_{min}| \leq 19.6$, where $\Delta C_n = \sqrt{\{(a^*_{nSSL})^2 + (b^*_{nSSL})^2\}} - \sqrt{\{(a^*_{nref})^2 + (b^*_{nref})^2\}}$
with the 15 Munsell renotation color samples being:

| | |
|---|---|
| #01 | 7.5P 4/10 |
| #02 | 10PB 4/10 |
| #03 | 5PB 4/12 |
| #04 | 7.5B 5/10 |
| #05 | 10BG 6/8 |
| #06 | 2.5BG 6/10 |
| #07 | 2.5G 6/12 |
| #08 | 7.5GY 7/10 |
| #09 | 2.5GY 8/10 |
| #10 | 5Y 8.5/12 |
| #11 | 10YR 7/12 |
| #12 | 5YR 7/12 |
| #13 | 10R 6/12 |
| #14 | 5R 4/14 |
| #15 | 7.5RP 4/12 |

Condition 4:

if hue angles in CIE 1976 L*a*b* color space of the 15 Munsell renotation color samples when mathematically assuming illumination by the light emitted in the radiant direction are denoted by $\theta_{nSSL}$ (degrees) (where n is a natural number from 1 to 15), and if hue angles in a CIE 1976 L*a*b* color space of the 15 Munsell renotation color samples when mathematically assuming illumination by a reference light that is selected according to the correlated color temperature $T_{SSL}$ (K) of the light emitted in the radiant direction are denoted by $\theta_{nref}$ (degrees) (where n is a natural number from 1 to 15), then an absolute value of each difference in hue angles $|\Delta h_n|$ satisfies $0 \leq |\Delta h_n| 9.0$ (degree) (where n is a natural number from 1 to 15), where $\Delta h_n = \theta_{nSSL} - \theta_{nref}$.

[12]

The light-emitting device according to any one of [2] to [11], wherein a luminous efficacy of radiation K (lm/W) in a wavelength range from 380 nm to 780 nm as derived from the spectral power distribution $\phi_{SSL}(\lambda)$ of light emitted from the light-emitting device in the radiant direction satisfies $180(\text{lm/W}) \leq K(\text{lm/W}) \leq 320(\text{lm/W})$.

[13]

The light-emitting device according to any one of [2] to [12], wherein a correlated color temperature $T_{SSL}$ (K) of light emitted from the light-emitting device in the radiant direction satisfies $2550\,(K) \leq T_{SSL}(K) \leq 5650\,(K)$.

[14]

The light-emitting device according to [1], satisfying the B.

[15]

The light-emitting device according to [14], wherein the light-emitting element includes a semiconductor light-emitting element.

[16]

The light-emitting device according to [14] or [15], wherein $\Phi_{elm}(\lambda)$ does not satisfy at least one of the following Condition 3 and Condition 4, and $\phi_{SSL}(\lambda)$ satisfies both the following Condition 3 and Condition 4:

Condition 3:

if an a* value and a b* value in CIE 1976 L*a*b* color space of 15 Munsell renotation color samples from #01 to #15 listed below when mathematically assuming illumination by the target light are respectively denoted by $a^*_n$ and $b^*_n$ (where n is a natural number from 1 to 15), and if an a* value and a b* value in CIE 1976 L*a*b* color space of the 15 Munsell renotation color samples when mathematically assuming illumination by a reference light that is selected according to a correlated color temperature T (K) of the light emitted in the radiant direction are respectively denoted by $a^*_{nref}$ and $b^*_{nref}$ (where n is a natural number from 1 to 15), then each saturation difference $\Delta C_n$ satisfies $-3.8 \leq \Delta C_n \leq 18.6$ (where n is a natural number from 1 to 15), and an average $SAT_{av}$ of saturation difference represented by formula (3) below satisfies formula (4) below and

[Expression 6]

$$SAT_{av} = \frac{\sum_{n=1}^{15} \Delta C_n}{15} \quad (3)$$

[Expression 7]

$$1.0 \leq \frac{\sum_{n=1}^{15} \Delta C_n}{15} \leq 7.0, \quad (4)$$

if a maximum saturation difference value is denoted by $\Delta C_{max}$ and a minimum saturation difference value is denoted by $\Delta C_{min}$, then a difference $|\Delta C_{max} - \Delta C_{min}|$ between the maximum saturation difference value and the minimum saturation difference value satisfies $$2.8 < |\Delta C_{max} - \Delta C_{min}| \leq 19.6,$$

where $\Delta C_n = \sqrt{\{(a^*_n)^2 + (b^*_n)^2\}} - 29\{(a^*_{nref})^2 + (b^*_{nref})^2\}$
with the 15 Munsell renotation color samples being:

| | |
|---|---|
| #01 | 7.5P 4/10 |
| #02 | 10PB 4/10 |
| #03 | 5PB 4/12 |
| #04 | 7.5B 5/10 |
| #05 | 10BG 6/8 |
| #06 | 2.5BG 6/10 |
| #07 | 2.5G 6/12 |
| #08 | 7.5GY 7/10 |
| #09 | 2.5GY 8/10 |
| #10 | 5Y 8.5/12 |
| #11 | 10YR 7/12 |
| #12 | 5YR 7/12 |
| #13 | 10R 6/12 |
| #14 | 5R 4/14 |
| #15 | 7.5RP 4/12 |

Condition 4:
if hue angles in CIE 1976 L*a*b* color space of the 15 Munsell renotation color samples when mathematically assuming illumination by the target light are denoted by $\theta_n$ (degrees) (where n is a natural number from 1 to 15), and
if hue angles in a CIE 1976 L*a*b* color space of the 15 Munsell renotation color samples when mathematically assuming illumination by a reference light that is selected according to the correlated color temperature T (K) of the light emitted in the radiant direction are denoted by $\theta_{nref}$ (degrees) (where n is a natural number from 1 to 15), then an absolute value of each difference in hue angles $|\Delta h_n|$ satisfies $0 \leq |\Delta h_n| \leq 9.0$ (degree) (where n is a natural number from 1 to 15),
where $\Delta h_n = \theta_n - \theta_{nref}$.

[17]
A light-emitting device incorporating a light-emitting element including a semiconductor light-emitting element, and a control element, wherein
if a wavelength is denoted by $\lambda$(nm), a spectral power distribution of a light emitted from the light-emitting element in a main radiant direction is denoted by $\Phi_{elm}(\lambda)$, and a spectral power distribution of a light emitted from the light-emitting device in the main radiant direction is denoted by $\phi_{SSL}(\lambda)$,
$\Phi_{elm}(\lambda)$ satisfies both of the following Condition 1 and Condition 2, and $\phi_{SSL}(\lambda)$ also satisfies both of the following Conditions 1 and 2:
Condition 1:
a light, of which distance $D_{uv}$ from a black-body radiation locus as defined by ANSI C78.377 in a spectral power distribution of the target light satisfies $-0.0350 \leq D_{uv} - 0.0040$, is included;
Condition 2:
if a spectral power distribution of the target light is denoted by $\phi(\lambda)$, a spectral power distribution of a reference light that is selected according to T (K) of the target light is denoted by $\phi_{ref}(\lambda)$, tristimulus values of the target light are denoted by (X, Y, Z), and tristimulus values of the reference light that is selected according to T (K) of the light emitted from the light-emitting device in the radiant direction are denoted by $(X_{ref}, Y_{ref}, Z_{ref})$ and
if a normalized spectral power distribution S ($\lambda$) of target light, a normalized spectral power distribution $S_{ref}(\lambda)$ of a reference light, and a difference $\Delta S (\lambda)$ between these normalized spectral power distributions are respectively defined as $$S(\lambda) = \phi(\lambda)/Y$$

$$S_{ref}(\lambda) = \phi_{ref}(\lambda)/Y_{ref}$$

$$\Delta S(\lambda) = S_{ref}(\lambda) - S(\lambda), \text{ and}$$

when a wavelength that produces a longest wavelength local maximum value of S($\lambda$) in a wavelength range from 380 nm to 780 nm is denoted by $\lambda_R$ (nm),
an index $A_{cg}$ represented by the following Formula (1) satisfies $-360 \leq A_{cg} \leq -10$, in the case when the wavelength $\Lambda 4$ that is $S(\lambda_R)/2$ exists in the longer wavelength-side of $\lambda_R$, and
an index $A_{cg}$ represented by the following Formula (2) satisfies $360 \leq A_{cg} \leq -10$, in the case when the wavelength $\Lambda 4$ that is $S(\lambda_R)/2$ does not exist in the longer wavelength-side of $\lambda_R$,

[Expression 8]

$$A_{cg} = \int_{380}^{495} \Delta S(\lambda) d\lambda + \int_{495}^{590} (-\Delta S(\lambda)) d\lambda + \int_{590}^{\Lambda 4} \Delta S(\lambda) d\lambda \quad (1)$$

[Expression 9]

$$A_{cg} = \int_{380}^{495} \Delta S(\lambda) d\lambda + \int_{495}^{590} (-\Delta S(\lambda)) d\lambda + \int_{590}^{780} \Delta S(\lambda) d\lambda \quad (2)$$

[18]
The light-emitting device according to [17], wherein
$\Phi_{elm}(\lambda)$ satisfies both of the following Condition 3 and Condition 4, and $\phi_{SSL}(\lambda)$ also satisfies both of the following Condition 3 and Condition 4:
Condition 3:
if an a* value and a b* value in CIE 1976 L*a*b* color space of 15 Munsell renotation color samples from #01 to #15 listed below when mathematically assuming illumination by the target light are respectively denoted by $a^*_n$ and $b^*_n$ (where n is a natural number from 1 to 15), and
if an a* value and a b* value in CIE 1976 L*a*b* color space of the 15 Munsell renotation color samples when mathematically assuming illumination by a reference light that is selected according to a correlated color temperature T (K) of the light emitted in the radiant direction are respectively denoted by $a^*_{nref}$ and $b^*_{nref}$ (where n is a natural number from 1 to 15), then each saturation difference $\Delta C_n$ satisfies
$-3.8 \leq \Delta C_n \leq 18.6$ (where n is a natural number from 1 to 15), and
an average $SAT_{av}$ of saturation difference represented by formula (3) below satisfies formula (4) below and

[Expression 10]

$$SAT_{av} = \frac{\sum_{n=1}^{15} \Delta C_n}{15} \quad (3)$$

[Expression 11]

$$1.0 \leq \frac{\sum_{n=1}^{15} \Delta C_n}{15} \leq 7.0, \quad (4)$$

if a maximum saturation difference value is denoted by $\Delta C_{max}$ and a minimum saturation difference value is denoted by $\Delta C_{min}$, then a difference $|\Delta C_{max}-\Delta C_{min}|$ between the maximum saturation difference value and the minimum saturation difference value satisfies $$2.8 \leq |\Delta C_{max}-\Delta C_{min}| \leq 19.6,$$

where $\Delta C_n = \sqrt{\{(a^*_n)^2+(b^*_n)^2\}} - \sqrt{\{(a^*_{nref})^2+(b^*_{nref})^2\}}$ with the 15 Munsell renotation color samples being:

| | |
|---|---|
| #01 | 7.5P 4/10 |
| #02 | 10PB 4/10 |
| #03 | 5PB 4/12 |
| #04 | 7.5B 5/10 |
| #05 | 10BG 6/8 |
| #06 | 2.5BG 6/10 |
| #07 | 2.5G 6/12 |
| #08 | 7.5GY 7/10 |
| #09 | 2.5GY 8/10 |
| #10 | 5Y 8.5/12 |
| #11 | 10YR 7/12 |
| #12 | 5YR 7/12 |
| #13 | 10R 6/12 |
| #14 | 5R 4/14 |
| #15 | 7.5RP 4/12 |

Condition 4:

if hue angles in CIE 1976 L*a*b* color space of the 15 Munsell renotation color samples when mathematically assuming illumination by the target light are denoted by $\theta_n$ (degrees) (where n is a natural number from 1 to 15), and if hue angles in a CIE 1976 L*a*b* color space of the 15 Munsell renotation color samples when mathematically assuming illumination by a reference light that is selected according to the correlated color temperature T (K) of the light emitted in the radiant direction are denoted by $\theta_{nref}$ (degrees) (where n is a natural number from 1 to 15), then an absolute value of each difference in hue angles $|\Delta h_n|$ satisfies $0 \leq |\Delta h_n| \leq 9.0$ (degree) (where n is a natural number from 1 to 15), where $\Delta h_n = \theta_n - \theta_{nref}$.

[19]

The light-emitting device according to [14], [15] or [17], wherein if $D_{uv}$ derived from the spectral power distribution of the light emitted from the light-emitting element in the main radiant direction is denoted by $D_{uv}(\Phi_{elm})$ and $D_{uv}$ derived from the spectral power distribution of the light emitted from the light-emitting device in the main radiant direction is denoted by $D_{uv}(\phi_{SSL})$ $D_{uv}(\phi_{SSL}) < D_{uv}(\Phi_{elm})$ is satisfied.

[20]

The light-emitting device according to [14], [15] or [17], wherein if $A_{cg}$ derived from the spectral power distribution of the light emitted from the light-emitting element in the main radiant direction is denoted by $A_{cg}(\Phi_{elm})$, and $A_{cg}$ derived from the spectral power distribution of the light emitted from the light-emitting device in the main radiant direction is denoted by $A_{cg}(\phi_{SSL})$, $A_{cg}(\phi_{SSL}) < A_{cg}(\Phi_{elm})$ is satisfied.

[21] The light-emitting device according to [16] or [18], wherein if an average of the saturation difference derived from the spectral power distribution of the light emitted from the light-emitting element in the main radiant direction is denoted by $SAT_{av}(\Phi_{elm})$, and if an average of the saturation difference derived from the spectral power distribution of the light emitted from the light-emitting device in the main radiant direction is denoted by $SAT_{av}(\phi_{SSL})$, $SAT_{av}(\Phi_{elm}) < SAT_{av}(\phi_{SSL})$ is satisfied.

[22]

The light-emitting device according to any one of [14] to [21], wherein the control element is an optical filter that absorbs or reflects light in a range of 380 nm $\leq \lambda$(nm) $\leq$ 780 nm.

[23]

The light-emitting device according to any one of [14] to [22], wherein the control element has a collection function and/or a diffusion function of the light emitted from the light-emitting element.

[24]

The light-emitting device according to [23], wherein the collection function and/or the diffusion function of the control element is implemented by at least one of the functions of a concave lens, a convex lens and a Fresnel lens.

[25]

The light-emitting device according to any one of [14] to [24], wherein a luminous efficacy of radiation K (lm/W) in a wavelength range from 380 nm to 780 nm as derived from the spectral power distribution $\phi_{SSL}(\lambda)$ of light emitted from the light-emitting device in the radiant direction satisfies $$180(\text{lm/W}) \leq K(\text{lm/W}) \leq 320(\text{lm/W}).$$

[26]

The light-emitting device according to [16] or [18], wherein the absolute value of each difference in hue angles $|\Delta h_n|$ light-emitting device satisfies $0.0003 \leq |\Delta h_n|$ 8.3 (degree) (where n is a natural number from 1 to 15).

[27]

The light-emitting device according to [16] or [18], wherein the average $SAT_{av}$ of the saturation difference of the light-emitting device represented by the Formula (3) satisfies the following Formula (4)'

[Expression 12]

$$1.2 \leq \frac{\sum_{n=1}^{15} \Delta C_n}{15} \leq 6.3. \qquad (4)'$$

[28]

The light-emitting device according to [16] or [18], wherein the each saturation difference $\Delta C_n$ of the light-emitting device satisfies $-3.4 \leq \Delta C_n \leq 16.8$ (where n is a natural number from 1 to 15).

[29]

The light-emitting device according to [16] or [18], wherein the difference $|\Delta C_{max}-\Delta C_{min}|$ between the maximum saturation difference value of the light-emitting device and the minimum saturation difference value thereof, satisfies $$3.2 \leq |\Delta C_{max}-\Delta C_{min}| \leq 17.8.$$

[30]

The light-emitting device according to any one of [14] to [29], wherein
the light emitted from the light-emitting device in the radiant direction has the distance $D_{uv}$ from the black-body radiation locus that specifies $-0.0250 \leq D_{uv} \leq -0.0100$.

[31]

The light-emitting device according to any one of [14] to [30], wherein
the index $A_{cg}$ of the light-emitting device represented by the Formula (1) or (2) satisfies $-322 \leq A_{cg} \leq -12$.

[32]

The light-emitting device according to any one of [14] to [31], wherein
the luminous efficacy of radiation K (lm/W) in a wavelength range from 380 nm to 780 nm as derived from the spectral power distribution $\phi_{SSL}(\lambda)$ of light emitted from the light-emitting device in the radiant direction satisfies $206(lm/W) \leq K(lm/W) \leq 288(lm/W)$.

[33]

The light-emitting device according to any one of [14] to [32], wherein
the correlated color temperature T(K) of the light-emitting device satisfies $2550(K) \leq T(K) \leq 5650(K)$.

[34]

The light-emitting device according to any one of [14] to [33], wherein
illuminance at which the light emitted from the light-emitting device in the radiant direction illuminates objects is 150 lx to 5000 lx.

[35]

The light-emitting device according to any one of [14] to [34], wherein
the light-emitting device emits, in the radiant direction, light emitted from one to six light-emitting elements.

[36]

The light-emitting device according to any one of [14] to [35], wherein
a peak wavelength of an emission spectrum of the semiconductor light-emitting element is 380 nm or longer and shorter than 495 nm and the full-width at half-maximum of the emission spectrum of the semiconductor light-emitting element is 2 nm to 45 nm.

[37]

The light-emitting device according to [36], wherein the peak wavelength of the emission spectrum of the semiconductor light-emitting element is 395 nm or longer and shorter than 420 nm.

[38]

The light-emitting device according to [36], wherein the peak wavelength of the emission spectrum of the semiconductor light-emitting element is 420 nm or longer and shorter than 455 nm.

[39]

The light-emitting device according to [36], wherein the peak wavelength of the emission spectrum of the semiconductor light-emitting element is 455 nm or longer and shorter than 485 nm.

[40]

The light-emitting device according to any one of [14] to [35], wherein
the peak wavelength of the emission spectrum of the semiconductor light-emitting element is 495 nm or longer and shorter than 590 nm and the full-width at half-maximum of the emission spectrum of the semiconductor light-emitting element is 2 nm to 75 nm.

[41]

The light-emitting device according to any one of [14] to [35], wherein
the peak wavelength of the emission spectrum of the semiconductor light-emitting element is 590 nm or longer and shorter than 780 nm and the full-width at half-maximum of the emission spectrum of the semiconductor light-emitting element is 2 nm to 30 nm.

[42]

The light-emitting device according to any one of [14] to [35], wherein
the semiconductor light-emitting element is fabricated on any substrate selected from the group consisting of a sapphire substrate, a GaN substrate, a GaAs substrate and a GaP substrate.

[43]

The light-emitting device according to any one of [14] to [35], wherein
the semiconductor light-emitting element is fabricated on a GaN substrate or a GaP substrate and a thickness of the substrate is 100 μm to 2 mm.

[44]

The light-emitting device according to any one of [14] to [36], wherein
the semiconductor light-emitting element is fabricated on a sapphire substrate or a GaAs substrate and the semiconductor light-emitting element is removed from the substrate.

[45]

The light-emitting device according to any one of [14] to [39], comprising a phosphor as a light-emitting element.

[46]

The light-emitting device according to [45], wherein
the phosphor includes one to five types of phosphors each having different emission spectra.

[47]

The light-emitting device according to [45] or [46], wherein
the phosphor includes a phosphor having an individual emission spectrum, when photoexcited at room temperature, with a peak wavelength of 380 nm or longer and shorter than 495 nm and a full-width at half-maximum of 2 nm to 90 nm.

[48]

The light-emitting device according to [47], wherein
the phosphor includes one or more types of phosphors selected from the group consisting of a phosphor represented by general formula (5) below, a phosphor represented by general formula (5)' below, $(Sr, Ba)_3MgSi_2O_8:Eu^{2+}$, and $(Ba, Sr, Ca, Mg)Si_2O_2N_2:Eu$

$(Ba,Sr,Ca)MgAl_{10}O_{17}:Mn,Eu$     (5)

$Sr_aBa_bEu_x(PO_4)_cX_d$     (5)'

(in the general formula (5)', X is Cl, in addition, c, d, and x are numbers satisfying $2.7 \leq c \leq 3.3$, $0.9 \leq d \leq 1.1$, and $0.3 \leq x \leq 1.2$, moreover, a and b satisfy conditions represented by $a+b=5-x$ and $0 \leq b/(a+b) \leq 0.6$).

[49]

The light-emitting device according to [45] of [46], wherein
the phosphor includes a phosphor having an individual emission spectrum, when photoexcited at room temperature, with a peak wavelength of 495 nm or longer and shorter than 590 nm and a full-width at half-maximum of 2 to 130 nm.

[50]
The light-emitting device according to [49], wherein the phosphor includes one or more types of phosphors selected from the group consisting of $Si_{6-z}Al_zO_zN_{8-z}$:Eu (where 0<z<4.2), a phosphor represented by general formula (6) below, a phosphor represented by general formula (6)' below, and $SrGaS_4$:$Eu^{2+}$ $$Ba_aCa_bSr_cMg_dEu_xSiO_4 \qquad (6)$$

(in the general formula (6), a, b, c, d, and x satisfy a+b+c+d+x=2, 1.0≤a≤2.0, 0≤b≤0.2, 0.2≤c≤1.0, 0≤d<0.2, and 0<x≤0.5).

$$Ba_{1-x-y}Sr_xEu_yMg_{1-z}Mn_zAl_{10}O_{17} \qquad (6)'$$

(in the general formula (6)', x, y, and z respectively satisfy 0.1≤x≤0.4, 0.25≤y≤0.6, and 0.05≤z≤0.5).

[51]
The light-emitting device according to [45] or [46], wherein
the phosphor includes a phosphor having an individual emission spectrum, when photoexcited at room temperature, with a peak wavelength of 590 nm or longer and shorter than 780 nm and a full-width at half-maximum of 2 nm to 130 nm.

[52]
The light-emitting device according to [51], wherein
the phosphor includes one or more types of phosphors selected from the group consisting of a phosphor represented by general formula (7) below, a phosphor represented by general formula (7)' below, (Sr, Ca, Ba)$_2$Al$_x$Si$_{5-x}$O$_x$N$_{8-x}$:Eu (where 0≤x≤2), Eu$_y$(Sr, Ca, Ba)$_{1-y}$:Al$_{1+x}$Si$_{4-x}$O$_x$N$_{7-x}$ (where 0≤x<4, 0≤y<0.2), K$_2$SiF$_6$:Mn$^{4+}$, A$_{2+x}$M$_y$Mn$_z$F$_n$ (where A is Na and/or K; M is Si and Al; −1≤x≤1 and 0.9≤y+z≤1.1 and 0.001≤z≤0.4 and 5≤n≤7), (Ca, Sr, Ba, Mg)AlSiN$_3$:Eu and/or (Ca, Sr, Ba)AlSiN$_3$:Eu, and (CaAlSiN$_3$)$_{1-x}$(Si$_2$N$_2$O)$_x$:Eu (where x satisfies 0<x<0.5)

$$(La_{1-x-y}Eu_xLn_y)_2O_2S \qquad (7)$$

(in the general formula (7), x and y denote numbers respectively satisfying 0.02≤x≤0.50 and 0≤y≤0.50, and Ln denotes at least one trivalent rare-earth element among Y, Gd, Lu, Sc, Sm, and Er)

$$(k-x)MgO.xAF_2.GeO_2:yMn^{4+} \qquad (7)'$$

(in the general formula (7)', k, x, and y denote numbers respectively satisfying 2.8≤k≤5, 0.1≤x≤0.7, and 0.005≤y≤0.015, and A is calcium (Ca), strontium (Sr), barium (Ba), zinc (Zn), or a mixture consisting of these elements).

[53]
The light-emitting device according to any one of [14] to [35], further comprising a phosphor as the light-emitting element, wherein
a peak wavelength of an emission spectrum of the semiconductor light-emitting element is 395 nm or longer and shorter than 420 nm, and the phosphor includes SBCA, β-SiAlON, and CASON.

[54]
The light-emitting device according to any one of [14] to [35], further comprising a phosphor as the light-emitting element, wherein
a peak wavelength of an emission spectrum of the semiconductor light-emitting element is 395 nm or longer and shorter than 420 nm, and the phosphor includes SCA, β-SiAlON, and CASON.

[55]
The light-emitting device according to any one of [1] to [54], which is selected from the group consisting of a packaged LED, an LED module, an LED lighting fixture, and an LED lighting system.

[56]
The light-emitting device according to any one of [1] to [55], which is used as one selected from the group consisting of a residential uses' device, an exhibition illumination device, a presentation illumination device, a medical illumination device, a work illumination device, an illumination device incorporated in industrial equipments, an illumination device for interior of transportation, an illumination device for works of art, and an illumination device for aged persons.

In order to achieve the objects described above, the second invention of the present invention relates to the following method for designing a light-emitting device. The method for designing a light-emitting device according to the second invention of the present invention includes first and second embodiments.

[57]
A method for designing a light-emitting device which includes M number of light emitting areas (M is 2 or greater natural number), and incorporating a semiconductor light-emitting element as a light-emitting element in at least one of the light emitting areas,
the method comprising designing the light emitting areas such that, when $\phi_{SSL}(\lambda)$ (N is 1 to M) is a spectral power distribution of a light emitted from each light emitting area in a main radiant direction of the light-emitting device, and $\phi_{SSL}(\lambda)$, which is a spectral power distribution of all the lights emitted from the light-emitting device in the radiant direction, is represented by

[Expression 13]

$$\phi_{SSL}(\lambda) = \sum_{N=1}^{M} \phi_{SSL}N(\lambda),$$

$\phi_{SSL}(\lambda)$ satisfies the following Conditions 1 to 2 by changing a luminous flux amount and/or a radiant flux amount emitted from the light emitting areas:

Condition 1:
light emitted from the light-emitting device includes, in the main radiant direction thereof, light whose distance $D_{uvSSL}$ from a black-body radiation locus as defined by ANSI C78.377 satisfies −0.0350≤$D_{uvSSL}$≤−0.0040, Condition 2:
if a spectral power distribution of light emitted from the light-emitting device in the radiant direction is denoted by $\phi_{SSL}(\lambda)$, a spectral power distribution of a reference light that is selected according to $T_{SSL}$ (K) of the light emitted from the light-emitting device in the radiant direction is denoted by $\phi_{ref}(\lambda)$, tristimulus values of the light emitted from the light-emitting device in the radiant direction are denoted by ($X_{SSL}$, $Y_{SSL}$, $Z_{SSL}$) and tristimulus values of the reference light that is selected according to $T_{SSL}$ (K) of the light emitted from the light-emitting device in the radiant direction are denoted by ($X_{ref}$, $Y_{ref}$, $Z_{ref}$), and
if a normalized spectral power distribution $S_{SSL}(\lambda)$ of light emitted from the light-emitting device in the radiant direction, a normalized spectral power distribution $S_{ref}(\lambda)$ of a reference light that is selected according to $T_{SSL}$ (K) of the light emitted from the light-emitting device in the radiant direction, and a difference $\Delta S(\lambda)$ between these normalized spectral power distributions are respectively defined as $$S_{SSL}(\lambda)=\phi_{SSL}(\lambda)/Y_{SSL},$$

$$S_{ref}(\lambda)=\phi_{ref}(\lambda)/Y_{ref}$$

and $$\Delta S(\lambda)=S_{ref}(\lambda)-S_{SSL}(\lambda) \text{ and}$$

an index $A_{cg}$ represented by the following Formula (1) satisfies $-360 \leq A_{cg} - 10$, in the case when a wavelength that produces a longest wavelength local maximum value of $S_{SSL}(\lambda)$ in a wavelength range from 380 nm to 780 nm is denoted by $\lambda_R$ (nm), and a wavelength $\Lambda 4$ that assumes $S_{SSL}(\lambda_R)/2$ exists on a longer wavelength-side of $\lambda_R$, and an index $A_{cg}$ represented by the following Formula (2) satisfies $-360 \leq A_{cg} \leq 10$, in the case when a wavelength that produces a longest wavelength local maximum value of $S_{SSL}(\lambda)$ in a wavelength range from 380 nm to 780 nm is denoted by $\lambda_R$ (nm), and a wavelength $\Lambda 4$ that assumes $S_{SSL}(\lambda_R)/2$ does not exist on a longer wavelength-side of $\lambda_R$,

[Expression 14]

$$A_{cg}=\int_{380}^{495}\Delta S(\lambda)d\lambda+\int_{495}^{590}(-\Delta S(\lambda))d\lambda+\int_{590}^{\Lambda 4}\Delta S(\lambda)d\lambda \quad (1)$$

[Expression 15]

$$A_{cg}=\int_{380}^{495}\Delta S(\lambda)d\lambda+\int_{495}^{590}(-\Delta S(\lambda))d\lambda+\int_{590}^{780}\Delta S(\lambda)d\lambda \quad (2)$$

[58]
The method for designing a light-emitting device according to [57], wherein
all of $\phi_{SSL}N(\lambda)$ (N is 1 to M) satisfies the Condition 1 and Condition 2.

[59]
The method for designing a light-emitting device according to [57] or [58], wherein
at least one light emitting area of the M number of light emitting areas has wiring that allows the light emitting area to be electrically driven independently from other light emitting areas.

[60]
The method for designing a light-emitting device according to [59], wherein
all the M numbers of light emitting areas each have wiring that allows the light emitting area to be electrically driven independently from other light emitting areas.

[61]
The method for designing a light-emitting device according to any one of [57] to [60], wherein
at least one selected from the group consisting of the index $A_{cg}$ represented by the Formula (1) or (2), the correlated color temperature $T_{SSL}(K)$ and the distance $D_{uvSSL}$ from the black-body radiation locus can be changed.

[62]
The method for designing a light-emitting device according to [61], wherein
a luminous flux and/or a radiant flux emitted from the light-emitting device in the main radiant direction can be independently controlled when at least one selected from the group consisting of the index $A_{cg}$ represented by the Formula (1) or (2), the correlated color temperature $T_{SSL}(K)$ and the distance $D_{uvSSL}$ from the black-body radiation locus is changed.

[63]
The method for designing a light-emitting device according to any one of [57] to [62], wherein
a maximum distance L between two arbitrary points on a virtual outer periphery enveloping the entire light emitting areas closest to each other, is 0.4 mm or more and 200 mm or less.

[64]
The method for designing a light-emitting device according to any one of [57] to [63],
further comprising allowing $\phi_{SSL}(\lambda)$ to further satisfy the following Conditions 3 to 4 by changing a luminous flux amount and/or a radiant flux amount emitted from the light emitting areas:

Condition 3:
if an a* value and a b* value in CIE 1976 L*a*b* color space of 15 Munsell renotation color samples from #01 to #15 listed below when mathematically assuming illumination by the light emitted in the radiant direction are respectively denoted by $a^*_{nSSL}$ and $b^*_{nSSL}$ (where n is a natural number from 1 to 15), and if an a* value and a b* value in CIE 1976 L*a*b* color space of the 15 Munsell renotation color samples when mathematically assuming illumination by a reference light that is selected according to a correlated color temperature T (K) of the light emitted in the radiant direction are respectively denoted by $a^*_{nref}$ and $b^*_{nref}$ (where n is a natural number from 1 to 15), then each saturation difference $\Delta C_n$ satisfies $-3.8 \leq \Delta C \leq 18.6$ (where n is a natural number from 1 to 15), an average saturation difference represented by formula (3) below satisfies formula (4) below and

[Expression 16]

$$\frac{\sum_{n=1}^{15}\Delta C_n}{15} \quad (3)$$

[Expression 17]

$$1.0 \leq \frac{\sum_{n=1}^{15}\Delta C_n}{15} \leq 7.0, \quad (4)$$

if a maximum saturation difference value is denoted by $\Delta C_{max}$ and a minimum saturation difference value is denoted by $\Delta C_{min}$ then a difference $|\Delta C_{max}-\Delta C_{min}|$ between the maximum saturation difference value and the minimum saturation difference value satisfies $2.8 < |\Delta C_{max}-\Delta C_{min}| \leq 19.6$, where $\Delta C_n=\sqrt{\{(a^*_{nSSL})^2+(b^*_{nSSL})^2\}}-\sqrt{\{(a^*_{nref})^2+(b^*_{nref})^2\}}$
with the 15 Munsell renotation color samples being:

| | |
|---|---|
| #01 | 7.5P 4/10 |
| #02 | 10PB 4/10 |
| #03 | 5PB 4/12 |
| #04 | 7.5B 5/10 |
| #05 | 10BG 6/8 |
| #06 | 2.5BG 6/10 |
| #07 | 2.5G 6/12 |
| #08 | 7.5GY 7/10 |
| #09 | 2.5GY 8/10 |
| #10 | 5Y 8.5/12 |
| #11 | 10YR 7/12 |
| #12 | 5YR 7/12 |

-continued

| #13 | 10R 6/12 |
| #14 | 5R 4/14 |
| #15 | 7.5RP 4/12 |

Condition 4:

if hue angles in CIE 1976 L*a*b* color space of the 15 Munsell renotation color samples when mathematically assuming illumination by the light emitted in the radiant direction are denoted by $\theta_{nSSL}$ (degrees) (where n is a natural number from 1 to 15), and if hue angles in a CIE 1976 L*a*b* color space of the 15 Munsell renotation color samples when mathematically assuming illumination by a reference light that is selected according to the correlated color temperature $T_{SSL}$ (K) of the light emitted in the radiant direction are denoted by $\theta_{nref}$ (degrees) (where n is a natural number from 1 to 15), then an absolute value of each difference in hue angles $|\Delta h_n|$ satisfies $0 \le |\Delta h_n| \le 9.0$ (degree) (where n is a natural number from 1 to 15), where $\Delta h_n = \theta_{nSSL} - \theta_{nref}$.

[65]

The method for designing a light-emitting device according to any one of [57] to [64], wherein a luminous efficacy of radiation K (lm/W) in a wavelength range from 380 nm to 780 nm as derived from the spectral power distribution $\phi_{SSL}$ (λ) of light emitted from the light-emitting device in the radiant direction satisfies 180(lm/W)≤K(lm/W)≤320(lm/W).

[66]

The method for designing a light-emitting device according to any one of [57] to [65], wherein the correlated color temperature $T_{SSL}$ (K) of light emitted from the light-emitting device in the radiant direction satisfies

2550(K)≤$T_{SSL}$(K)≤5650(K).

In order to achieve the objects described above, the third invention of the present invention relates to the following method for driving a light-emitting device.

[67]

A method for driving a light-emitting device which includes M number of light emitting areas (M is 2 or greater natural number), and has a semiconductor light-emitting element as a light-emitting element in at least one of the light emitting areas, the method comprising supplying power to each light emitting area such that, when $\phi_{SSL}(\lambda)$ (N is 1 to M) is a spectral power distribution of a light emitted from each light emitting area in a main radiant direction of the light-emitting device, and $\phi_{SSL}(\lambda)$, which is a spectral power distribution of all the lights emitted from the light-emitting device in the radiant direction, is represented by

[Expression 18]

$$\phi_{SSL}(\lambda) = \sum_{N=1}^{M} \phi_{SSL}N(\lambda),$$

$\phi_{SSL}(\lambda)$ satisfies the following Conditions 1 to 2:

Condition 1:

light emitted from the light-emitting device includes, in the main radiant direction thereof, light whose distance $D_{uvSSL}$ from a black-body radiation locus as defined by ANSI C78.377 satisfies −0.0350≤$D_{uvSSL}$≤−0.0040, Condition 2:

if a spectral power distribution of light emitted from the light-emitting device in the radiant direction is denoted by $\phi_{SSL}$ (λ), a spectral power distribution of a reference light that is selected according to $T_{SSL}$ (K) of the light emitted from the light-emitting device in the radiant direction is denoted by $\phi_{ref}$ (λ), tristimulus values of the light emitted from the light-emitting device in the radiant direction are denoted by ($X_{SSL}$, $Y_{SSL}$, $Z_{SSL}$), and tristimulus values of the reference light that is selected according to $T_{SSL}$ (K) of the light emitted from the light-emitting device in the radiant direction are denoted by ($X_{ref}$, $Y_{ref}$, $Z_{ref}$), and if a normalized spectral power distribution $S_{SSL}$ (λ) of light emitted from the light-emitting device in the radiant direction, a normalized spectral power distribution $S_{ref}(\lambda)$ of a reference light that is selected according to $T_{SSL}$ (K) of the light emitted from the light-emitting device in the radiant direction, and a difference ΔS (λ) between these normalized spectral power distributions are respectively defined as $S_{SSL}(\lambda) = \phi_{SSL}(\lambda)/Y_{SSL}$, $S_{ref}(\lambda) = \phi_{ref}(\lambda)/Y_{ref}$ and $\Delta S(\lambda) = S_{ref}(\lambda) - S_{SSL}(\lambda)$ and an index $A_{cg}$ represented by the following Formula (1) satisfies −360≤$A_{cg}$≤−10, in the case when a wavelength that produces a longest wavelength local maximum value of $S_{SSL}$ (λ) in a wavelength range from 380 nm to 780 nm is denoted by $\lambda_R$ (nm), and a wavelength Λ4 that assumes $S_{SSL}$ ($\lambda_R$)/2 exists on a longer wavelength-side of $\lambda_R$,

[Expression 19]

$$A_{cg} = \int_{380}^{495} \Delta S(\lambda)d\lambda + \int_{495}^{590}(-\Delta S(\lambda))d\lambda + \int_{590}^{\Lambda 4} \Delta S(\lambda) d\lambda \quad (1), \text{ and}$$

an index $A_{cg}$ represented by the following Formula (2) satisfies −360≤$A_{cg}$≤−10, in the case when a wavelength that produces a longest wavelength local maximum value of $S_{SSL}$ (λ) in a wavelength range from 380 nm to 780 nm is denoted by $\lambda_R$ (nm), and a wavelength Λ4 that assumes $S_{SSL}$ ($\lambda_R$)/2 does not exist on a longer wavelength-side of $\lambda_R$,

[Expression 20]

$$A_{cg} = \int_{380}^{495} \Delta S(\lambda)d\lambda + \int_{495}^{590}(-\Delta S(\lambda))d\lambda + \int_{590}^{780} \Delta S(\lambda) d\lambda \quad (2).$$

[68]

The method for driving a light-emitting device according to [67], wherein power is supplied to the light emitting areas so that all of $\phi_{SSL}N(\lambda)$ (N is 1 to M) satisfies the Condition 1 and Condition 2.

[69]

The method for driving a light-emitting device according to [67] or [68], wherein at least one light emitting area of the M number of light emitting areas is electrically driven independently from other light emitting areas.

[70]

The method for driving a light-emitting device according to any one of [67] to [69], wherein all the M number of light emitting areas are electrically driven independently from other light emitting areas.

[71]

The method for driving a light-emitting device according to any one of [67] to [69], wherein at least one selected from the group consisting of the index $A_{cg}$ represented by the Formula (1) or (2), the correlated color temperature $T_{SSL}(K)$ and the distance $D_{uvSSL}$ from the black-body radiation locus is changed.

[72]

The method for driving a light-emitting device according to [71], wherein a luminous flux and/or a radiant flux emitted from the light-emitting device in the main radiant direction is unchanged when at least one selected from the group consisting of the index $A_{cg}$ represented by the Formula (1) or (2), the correlated color temperature $T_{SSL}(K)$ and the distance $D_{uvSSL}$ from the black-body radiation locus is changed.

[73]

The method for driving a light-emitting device according to [71], wherein a luminous flux and/or a radiant flux emitted from the light-emitting device in the main radiant direction is decreased when the index $A_{cg}$ represented by the Formula (1) or (2) is decreased.

[74]

The method for driving a light-emitting device according to [71], wherein a luminous flux and/or a radiant flux emitted from the light-emitting device in the main radiant direction is increased when the correlated color temperature $T_{SSL}(K)$ is increased.

[75]

The method for driving a light-emitting device according to [71], wherein a luminous flux and/or a radiant flux emitted from the light-emitting device in the main radiant direction is decreased when the distance $D_{uvSSL}$ from the black-body radiation locus is decreased.

[76]

The method for driving a light-emitting device according to any one of [67] to [75], further comprising supplying power such that $\phi_{SSL}(\lambda)$ further satisfies the following Condition 3 and Condition 4:

Condition 3:

if an a* value and a b* value in CIE 1976 L*a*b* color space of 15 Munsell renotation color samples from #01 to #15 listed below when mathematically assuming illumination by the light emitted in the radiant direction are respectively denoted by $a^*_{nSSL}$ and $b^*_{nSSL}$ (where n is a natural number from 1 to 15), and if an a* value and a b* value in CIE 1976 L*a*b* color space of the 15 Munsell renotation color samples when mathematically assuming illumination by a reference light that is selected according to a correlated color temperature $T_{SSL}$ (K) of the light emitted in the radiant direction are respectively denoted by $a^*_{nref}$ and $b^*_{nref}$ (where n is a natural number from 1 to 15), then each saturation difference $\Delta C_n$ satisfies $-3.8 \leq \Delta C_n \leq 18.6$ (where n is a natural number from 1 to 15), an average saturation difference represented by formula (3) below satisfies formula (4) below and

[Expression 21]

$$\frac{\sum_{n=1}^{15} \Delta C_n}{15} \quad (3)$$

[Expression 22]

$$1.0 \leq \frac{\sum_{n=1}^{15} \Delta C_n}{15} \leq 7.0 \quad (4)$$

if a maximum saturation difference value is denoted by $\Delta C_{max}$ and a minimum saturation difference value is denoted by $\Delta C_{min}$, then a difference $|\Delta C_{max} - \Delta C_{min}|$ between the maximum saturation difference value and the minimum saturation difference value satisfies $2.8 \leq |\Delta C_{max} - \Delta C_{min}| \leq 19.6$, where $\Delta C_n = \sqrt{\{(a^*_{nSSL})^2 + (b^*_{nSSL})^2\}} - \sqrt{\{(a^*_{nref})^2 + (b^*_{nref})^2\}}$ with the 15 Munsell renotation color samples being:

| | |
|---|---|
| #01 | 7.5P 4/10 |
| #02 | 10PB 4/10 |
| #03 | 5PB 4/12 |
| #04 | 7.5B 5/10 |
| #05 | 10BG 6/8 |
| #06 | 2.5BG 6/10 |
| #07 | 2.5G 6/12 |
| #08 | 7.5GY 7/10 |
| #09 | 2.5GY 8/10 |
| #10 | 5Y 8.5/12 |
| #11 | 10YR 7/12 |
| #12 | 5YR 7/12 |
| #13 | 10R 6/12 |
| #14 | 5R 4/14 |
| #15 | 7.5RP 4/12 |

Condition 4:

if hue angles in CIE 1976 L*a*b* color space of the 15 Munsell renotation color samples when mathematically assuming illumination by the light emitted in the radiant direction are denoted by $\theta_{nSSL}$ (degrees) (where n is a natural number from 1 to 15), and if hue angles in a CIE 1976 L*a*b* color space of the 15 Munsell renotation color samples when mathematically assuming illumination by a reference light that is selected according to the correlated color temperature $T_{SSL}$ (K) of the light emitted in the radiant direction are denoted by $\theta_{nref}$ (degrees) (where n is a natural number from 1 to 15), then an absolute value of each difference in hue angles $|\Delta h_n|$ satisfies $0 \leq |\Delta h_n| \leq 9.0$ (degree) (where n is a natural number from 1 to 15), where $\Delta h_n = \theta_{nSSL} - \theta_{nref}$.

In order to achieve the objects described above, the fourth invention of the present invention relates to the following illumination method. The illumination method according to the fourth invention of the present invention includes first and second embodiments.

[77]

An illumination method comprising:

illuminated objects preparation step of preparing illuminated objects; and an illumination step of illuminating the objects by light emitted from a light-emitting devices which includes M number of light emitting areas (M is 2 or greater natural number), and has a semiconductor light-emitting element as a light-emitting element in at least one of the light emitting areas, in the illumination step, when light emitted from the light-emitting devices illuminate the objects, the objects are illuminated so that the light measured at a position of the objects satisfies <1>, <2> and <3> below:

<1> a distance $D_{uvSSL}$ from a black-body radiation locus as defined by ANSI C78.377 of the light measured at the position of the objects satisfies $-0.0350 \leq D_{uvSSL} \leq -0.0040$;

<2> if an a* value and a b* value in CIE 1976 L*a*b* color space of 15 Munsell renotation color samples from #01 to #15 listed below when mathematically assuming illumination by the light measured at the position of the objects are respectively denoted by $a^*_{nSSL}$ and $b^*_{nSSL}$ (where n is a natural number from 1 to 15), and if an a* value and a b* value in CIE 1976 L*a*b* color space of the 15 Munsell renotation color samples when mathematically assuming illumination by a reference light that is selected according to a correlated color temperature $T_{SSL}$ (K) of the light measured at the position of the objects are respectively denoted by $a^*_{nref}$ and $b^*_{nref}$ (where n is a natural number from 1 to 15), then each saturation difference $\Delta C_n$ satisfies $-3.8 \leq \Delta C_n \leq 18.6$ (where n is a natural number from 1 to 15), and an average saturation difference represented by formula (3) below satisfies formula (4) below and

[Expression 23]

$$\frac{\sum_{n=1}^{15} \Delta C_n}{15} \qquad (3)$$

[Expression 24]

$$1.0 \leq \frac{\sum_{n=1}^{15} \Delta C_n}{15} \leq 7.0 \qquad (4)$$

if a maximum saturation difference value is denoted by $\Delta C_{max}$ and a minimum saturation difference value is denoted by $\Delta C_{min}$, then a difference $|\Delta C_{max} - \Delta C_{min}|$ between the maximum saturation difference value and the minimum saturation difference value satisfies $2.8 \leq |\Delta C_{max} - \Delta C_{min}| \leq 19.6$, where $\Delta C_n = \sqrt{\{(a^*_{nSSL})^2 + (b^*_{nSSL})^2\}} - \sqrt{\{(a^*_{nref})^2 + (b^*_{nref})^2\}}$ with the 15 Munsell renotation color samples being:

| | |
|---|---|
| #01 | 7.5P 4/10 |
| #02 | 10PB 4/10 |
| #03 | 5PB 4/12 |
| #04 | 7.5B 5/10 |
| #05 | 10BG 6/8 |
| #06 | 2.5BG 6/10 |
| #07 | 2.5G 6/12 |
| #08 | 7.5GY 7/10 |
| #09 | 2.5GY 8/10 |
| #10 | 5Y 8.5/12 |
| #11 | 10YR 7/12 |
| #12 | 5YR 7/12 |
| #13 | 10R 6/12 |
| #14 | 5R 4/14 |
| #15 | 7.5RP 4/12 |

<3> if hue angles in CIE 1976 L*a*b* color space of the 15 Munsell renotation color samples when mathematically assuming illumination by the light measured at the position of the objects are denoted by $\theta_{nSSL}$ (degrees) (where n is a natural number from 1 to 15), and if hue angles in CIE 1976 L*a*b* color space of the 15 Munsell renotation color samples when mathematically assuming illumination by a reference light that is selected according to the correlated color temperature $T_{SSL}$ (K) of the light measured at the position of the objects are denoted by $\theta_{nref}$ (degrees) (where n is a natural number from 1 to 15), then an absolute value of each difference in hue angles $|\Delta h_n|$ satisfies $0 \leq |\Delta h_n| \leq 9.0$ (degree) (where n is a natural number from 1 to 15), here $\Delta h_n = \theta_{nSSL} - \theta_{nref}$.

[78]

The illumination method according to [77], wherein when $\phi_{SSL}N(\lambda)$ (N is 1 to M) is a spectral power distribution of a light which has been emitted from each light-emitting element and has reached the position of the objects, and $\phi_{SSL}(\lambda)$ is a spectral power distribution of the light measured at the position of the objects is represented by

[Expression 25]

$$\phi_{SSL}(\lambda) = \sum_{N=1}^{M} \phi_{SSL}N(\lambda),$$

all the $\phi_{SSL}N(\lambda)$ (N is 1 to M) can satisfy the <1>, <2> and <3>.

[79]

The illumination method according to [77] or [78], wherein at least one light emitting area of the M number of light emitting areas is electrically driven independently from other light emitting areas for performing the illumination.

[80]

The illumination method according to [79], wherein all the M number of light emitting areas are electrically driven independently from other light emitting areas.

[81]

The illumination method according to any one of [77] to [80], wherein at least one selected from the group consisting of an average saturation difference represented by the formula (3),

[Expression 26]

$$\frac{\sum_{n=1}^{15} \Delta C_n}{15},$$

the correlated color temperature $T_{SSL}(K)$, and the distance $D_{uvSSL}$ from the black-body radiation locus is changed.

[82]

The illumination method according to [81], wherein the luminance in the object is independently controlled when at least one selected from the group of an average saturation difference represented by the formula (3,

[Expression 27]

$$\frac{\sum_{n=1}^{15} \Delta C_n}{15},$$

the correlated color temperature $T_{SSL}$(K), and the distance $D_{uvSSL}$ from the black-body radiation locus is changed.

[83]
The illumination method according to [82], wherein
the luminance in the object is unchangeable when at least one selected from the group of an average saturation difference represented by the formula (3),

[Expression 28]

$$\frac{\sum_{n=1}^{15} \Delta C_n}{15},$$

the correlated color temperature $T_{SSL}$(K), and the distance $D_{uvSSL}$ from the black-body radiation locus is changed.

[84]
The illumination method according to [82], wherein
the luminance in the object is decreased when the average saturation difference represented by the formula (3),

[Expression 29]

$$\frac{\sum_{n=1}^{15} \Delta C_n}{15},$$

is increased.

[85]
The illumination method according to [82], wherein
the illuminance in the object is increased when the correlated color template $T_{SSL}$(K) is increased.

[86]
The illumination method according to [82], wherein
the luminance in the object is decreased when the distance $D_{uvSSL}$ from the black-body radiation locus is decreased.

[87]
The illumination method according to any one of [77] to [86], wherein
if a maximum distance between two arbitrary points on a virtual outer periphery enveloping the entire light emitting areas closest to each other is denoted by L, and a distance between the light-emitting device and the illumination object is denoted by H,
the distance H is set so as to satisfy $$5 \times L \leq H \leq 500 \times L.$$

In order to achieve the objects described above, the fifth invention of the present invention relates to the following method for manufacturing a light-emitting device.

[88]
A method for manufacturing a light-emitting device: incorporating a light-emitting element which includes a semiconductor light-emitting element; and a control element, the method comprising:

a step of preparing a first light-emitting device having the light-emitting element; and
a step of manufacturing a second light-emitting device by disposing the control element so as to act on at least a part of light emitted from the first light-emitting device in a main radiant direction, wherein
if a wavelength is denoted by λ(nm), a spectral power distribution of a light emitted from the first light-emitting device in the main radiant direction is denoted by $\Phi_{elm}(\lambda)$, and a spectral power distribution of a light emitted from the second light-emitting device in the main radiant direction is denoted by $\phi_{SSL}(\lambda)$,
$\Phi_{elm}(\lambda)$ does not satisfy at least one of the following Condition 1 and Condition 2, and $\phi_{SSL}(\lambda)$ satisfies both the Condition 1 and Condition 2:

Condition 1:
a light, of which distance $D_{uv}$ from a black-body radiation locus as defined by ANSI C78.377 in a spectral power distribution of the target light satisfies $-0.0350 \leq D_{uv} - 0.0040$, is included;

Condition 2:
if a spectral power distribution of the target light is denoted by $\phi(\lambda)$, a spectral power distribution of a reference light that is selected according to T (K) of the target light is denoted by $\phi_{ref}(\lambda)$, tristimulus values of the target light are denoted by (X, Y, Z), and tristimulus values of the reference light that is selected according to T (K) of the light emitted from the light-emitting device in the radiant direction are denoted by $(X_{ref}, Y_{ref}, Z_{ref})$ and
if a normalized spectral power distribution S (λ) of target light, a normalized spectral power distribution $S_{ref}(\lambda)$ of a reference light, and a difference ΔS (λ) between these normalized spectral power distributions are respectively defined as $$S(\lambda) = \phi(\lambda)/Y$$

$$S_{ref}(\lambda) = \phi_{ref}(\lambda)/Y_{ref}$$

$$\Delta S(\lambda) = S_{ref}(\lambda) - S(\lambda), \text{ and}$$

when a wavelength that produces a longest wavelength local maximum value of S(λ) in a wavelength range from 380 nm to 780 nm is denoted by $\lambda_R$ (nm),
an index $A_{cg}$ represented by the following Formula (1) satisfies $-360 \leq A_{cg} \leq -10$, in the case when the wavelength Λ4 that is $S(\lambda_R)/2$ exists in the longer wavelength-side of $\lambda_R$, and
an index $A_{cg}$ represented by the following Formula (2) satisfies $360 \leq A_{cg} \leq -10$, in the case when the wavelength Λ4 that is $S(\lambda_R)/2$ does not exist in the longer wavelength-side of $\lambda_R$,

[Expression 30]

$$A_{cg} = \int_{380}^{495} \Delta S(\lambda) d\lambda + \int_{495}^{590} (-\Delta S(\lambda)) d\lambda + \int_{590}^{\Lambda 4} \Delta S(\lambda) d\lambda \quad (1)$$

[Expression 31]

$$A_{cg} = \int_{380}^{495} \Delta S(\lambda) d\lambda + \int_{495}^{590} (-\Delta S(\lambda)) d\lambda + \int_{590}^{780} \Delta S(\lambda) d\lambda \quad (2).$$

[89]
The method for manufacturing a light-emitting device according to [88], wherein
$\Phi_{elm}(\lambda)$ does not satisfy at least one of the following Condition 3 and Condition 4, and $\phi_{SSL}(\lambda)$ satisfies both the Condition 3 and Condition 4:

Condition 3:

if an a* value and a b* value in CIE 1976 L*a*b* color space of 15 Munsell renotation color samples from #01 to #15 listed below when mathematically assuming illumination by the target light are respectively denoted by $a^*_n$ and $b^*_n$ (where n is a natural number from 1 to 15), and if an a* value and a b* value in CIE 1976 L*a*b* color space of the 15 Munsell renotation color samples when mathematically assuming illumination by a reference light that is selected according to a correlated color temperature T (K) of the light emitted in the radiant direction are respectively denoted by $a^*_{nref}$ and $b^*_{nref}$ (where n is a natural number from 1 to 15), then each saturation difference $\Delta C_n$ satisfies −3.8≤$\Delta C_n$≤18.6 (where n is a natural number from 1 to 15), and an average $SAT_{av}$ of saturation difference represented by formula (3) below satisfies formula (4) below and

[Expression 32]

$$SAT_{av} = \frac{\sum_{n=1}^{15} \Delta C_n}{15} \quad (3)$$

[Expression 33]

$$1.0 \leq \frac{\sum_{n=1}^{15} \Delta C_n}{15} \leq 7.0 \quad (4)$$

if a maximum saturation difference value is denoted by $\Delta C_{max}$ and a minimum saturation difference value is denoted by $\Delta C_{min}$, then a difference $|\Delta C_{max} - \Delta C_{min}|$ between the maximum saturation difference value and the minimum saturation difference value satisfies 2.8≤$|\Delta C_{max} - \Delta C_{min}|$≤19.6, where $\Delta C_n = \sqrt{\{(a^*_n)^2 + (b^*_n)^2\}} - \sqrt{\{(a^*_{nref})^2 + (b^*_{nref})^2\}}$ with the 15 Munsell renotation color samples being:

| | |
|---|---|
| #01 | 7.5P 4/10 |
| #02 | 10PB 4/10 |
| #03 | 5PB 4/12 |
| #04 | 7.5B 5/10 |
| #05 | 10BG 6/8 |
| #06 | 2.5BG 6/10 |
| #07 | 2.5G 6/12 |
| #08 | 7.5GY 7/10 |
| #09 | 2.5GY 8/10 |
| #10 | 5Y 8.5/12 |
| #11 | 10YR 7/12 |
| #12 | 5YR 7/12 |
| #13 | 10R 6/12 |
| #14 | 5R 4/14 |
| #15 | 7.5RP 4/12 |

Condition 4:

if hue angles in CIE 1976 L*a*b* color space of the 15 Munsell renotation color samples when mathematically assuming illumination by the target light are denoted by $\theta_n$ (degrees) (where n is a natural number from 1 to 15), and if hue angles in a CIE 1976 L*a*b* color space of the 15 Munsell renotation color samples when mathematically assuming illumination by a reference light that is selected according to the correlated color temperature T (K) of the light emitted in the radiant direction are denoted by $\theta_{nref}$ (degrees) (where n is a natural number from 1 to 15), then an absolute value of each difference in hue angles $|\Delta h_n|$ satisfies 0≤$|\Delta h_n|$≤9.0 (degree) (where n is a natural number from 1 to 15), where $\Delta h_n = \theta_n - \theta_{nref}$.

[90]

A method for manufacturing a light-emitting device incorporating: a light-emitting element which includes a semiconductor light-emitting element; and a control element, the method comprising:

a step of preparing a first light-emitting device having the light-emitting element; and a step of manufacturing a second light-emitting device by disposing the control element so as to act on at least a part of light emitted from the first light-emitting device in a main radiant direction, wherein if a wavelength is denoted by λ (nm), a spectral power distribution of a light emitted from the first light-emitting device in the main radiant direction is denoted by $\Phi_{elm}(\lambda)$, and a spectral power distribution of a light emitted from the second light-emitting device in the main radiant direction is denoted by $\phi_{SSL}(\lambda)$ $\Phi_{elm}(\lambda)$ satisfies both the following Condition 1 and Condition 2, and $\phi_{SSL}(\lambda)$ also satisfies both the following Condition 1 and Condition 2:

Condition 1:

a light, of which distance $D_{uv}$ from a black-body radiation locus as defined by ANSI C78.377 in a spectral power distribution of the target light satisfies −0.0350≤$D_{uv}$−0.0040, is included; Condition 2:

if a spectral power distribution of the target light is denoted by $\phi(\lambda)$, a spectral power distribution of a reference light that is selected according to T (K) of the target light is denoted by $\phi_{ref}(\lambda)$, tristimulus values of the target light are denoted by (X, Y, Z), and tristimulus values of the reference light that is selected according to T (K) of the light emitted from the light-emitting device in the radiant direction are denoted by ($X_{ref}$, $Y_{ref}$, $Z_{ref}$) and if a normalized spectral power distribution S (λ) of target light, a normalized spectral power distribution $S_{ref}$ (λ) of a reference light, and a difference ΔS (λ) between these normalized spectral power distributions are respectively defined as $S(\lambda) = \phi(\lambda)/Y$ $S_{ref}(\lambda) = \phi_{ref}(\lambda)/Y_{ref}$ $\Delta S(\lambda) = S_{ref}(\lambda) - S(\lambda)$, and when a wavelength that produces a longest wavelength local maximum value of S(λ) in a wavelength range from 380 nm to 780 nm is denoted by $\lambda_R$ (nm), an index $A_{cg}$ represented by the following Formula (1) satisfies −360≤$A_{cg}$≤−10, in the case when the wavelength Λ4 that is $S(\lambda_R)/2$ exists in the longer wavelength-side of $\lambda_R$, and an index $A_{cg}$ represented by the following Formula (2) satisfies 360≤$A_{cg}$≤−10, in the case when the wavelength Λ4 that is $S(\lambda_R)/2$ does not exist in the longer wavelength-side of 4,

[Expression 34]

$$A_{cg} = \int_{380}^{495} \Delta S(\lambda)d\lambda + \int_{495}^{590}(-\Delta S(\lambda))d\lambda + \int_{590}^{\Lambda 4}\Delta S(\lambda)d\lambda \quad (1)$$

[Expression 35]

$$A_{cg}=\int_{380}^{495}\Delta S(\lambda)d\lambda+\int_{495}^{590}(-\Delta S(\lambda))d\lambda+\int_{590}^{780}\Delta S(\lambda)d\lambda \quad (2).$$

[91]

The method for manufacturing a light-emitting device according to [90], wherein $\Phi_{elm}(\lambda)$ satisfies both of the following Condition 3 and Condition 4, and $\phi_{SSL}(\lambda)$ also satisfies both of the following Condition 3 and Condition 4:

Condition 3:

if an a* value and a b* value in CIE 1976 L*a*b* color space of 15 Munsell renotation color samples from #01 to #15 listed below when mathematically assuming illumination by the target light are respectively denoted by $a^*_n$ and $b^*_n$ (where n is a natural number from 1 to 15), and if an a* value and a b* value in CIE 1976 L*a*b* color space of the 15 Munsell renotation color samples when mathematically assuming illumination by a reference light that is selected according to a correlated color temperature T (K) of the light emitted in the radiant direction are respectively denoted by $a^*_{nref}$ and $b^*_{nref}$ (where n is a natural number from 1 to 15), then each saturation difference $\Delta C_n$ satisfies $-3.8 \leq \Delta C_n \leq 18.6$ (where n is a natural number from 1 to 15), and an average $SAT_{av}$ of saturation difference represented by formula (3) below satisfies formula (4) below and

[Expression 36]

$$SAT_{av} = \frac{\sum_{n=1}^{15} \Delta C_n}{15} \quad (3)$$

[Expression 37]

$$1.0 \leq \frac{\sum_{n=1}^{15} \Delta C_n}{15} \leq 7.0 \quad (4)$$

if a maximum saturation difference value is denoted by $\Delta C_{max}$ and a minimum saturation difference value is denoted by $\Delta C_{min}$, then a difference $|\Delta C_{max} - \Delta C_{min}|$ between the maximum saturation difference value and the minimum saturation difference value satisfies $2.8 \leq |\Delta C_{max} - \Delta C_{min}| \leq 19.6.$ where $\Delta C_n = \sqrt{\{(a^*_n)^2 + (b^*_n)^2\}} - \sqrt{\{(a^*_{nref})^2 + (b^*_{nref})^2\}}$ with the 15 Munsell renotation color samples being:

| #01 | 7.5P 4/10 |
|-----|-----------|
| #02 | 10PB 4/10 |
| #03 | 5PB 4/12 |
| #04 | 7.5B 5/10 |
| #05 | 10BG 6/8 |
| #06 | 2.5BG 6/10 |
| #07 | 2.5G 6/12 |
| #08 | 7.5GY 7/10 |
| #09 | 2.5GY 8/10 |
| #10 | 5Y 8.5/12 |
| #11 | 10YR 7/12 |
| #12 | 5YR 7/12 |
| #13 | 10R 6/12 |
| #14 | 5R 4/14 |
| #15 | 7.5RP 4/12 |

Condition 4:

if hue angles in CIE 1976 L*a*b* color space of the 15 Munsell renotation color samples when mathematically assuming illumination by the target light are denoted by $\theta_n$ (degrees) (where n is a natural number from 1 to 15), and if hue angles in a CIE 1976 L*a*b* color space of the 15 Munsell renotation color samples when mathematically assuming illumination by a reference light that is selected according to the correlated color temperature T (K) of the light emitted in the radiant direction are denoted by $\theta_{nref}$ (degrees) (where n is a natural number from 1 to 15), then an absolute value of each difference in hue angles $|\Delta h_n|$ satisfies $0 \leq |\Delta h_n| \leq 9.0$ (degree) (where n is a natural number from 1 to 15), where $\Delta h_n = \theta_n - \theta_{nref}$.

Advantageous Effects of Invention

According to the first and fifth invention of the present invention, compared to a case where illumination is performed with reference light (sometimes referred to as experimental reference light), a case where illumination is performed by a light-emitting device emitting light which produces a color appearance close to reference light and which has a high $R_a$ and a high $R_i$ (sometimes referred to as experimental pseudo-reference light), and the like, a light-emitting device and an illumination method that can implement a truly good appearance of colors of object, which are judged by subjects to be more favorable, are achieved even at an approximately similar CCT and/or an approximately similar illuminance. Furthermore, according to the second embodiment of the first and fourth invention of the present invention, the appearance of colors of a light-emitting device, which currently exists or is in use, and which includes a semiconductor light-emitting device of which appearance of colors is not very good, can be improved to the good appearance of colors mentioned above. Furthermore, according to the present invention, the appearance of colors of the semiconductor light-emitting device, which excels in the appearance of colors, can be further adjusted according to the taste of the user using a similar technique.

Particularly in the first to fifth inventions of the present invention, a natural, vivid, highly visible and comfortable appearance of colors and appearance of objects as if the objects are seen outdoors can be implemented, and according to the first embodiment of the first to fourth inventions of the present invention, the chromaticity points (that is, the correlated color temperature and distance $D_{uv}$ from the black-body radiation locus as defined by ANSI C78.377) of the light source can be changed according to the illuminated space and purpose of use. Further, by changing $A_{cg}$, which greatly influences the appearance of colors, the saturation (chroma) of the illumination object illuminated by this light-emitting device can also be changed. Moreover, by making the luminance of the luminous flux and/or the radiant flux of the light source or the illumination object variable with respect to the change of the chromaticity points of the light source, the luminance with respect to the chroma (saturation), correlated color temperature, $D_{uv}$, etc. of an illumination object can be controlled to the optimum.

Advantageous effects achieved by the first to fifth inventions of the present invention can be more specifically exemplified regarding color appearance of an object as follows.

First, when illuminating by a light-emitting device according to the first invention of the present invention such as a light source, a fixture, or a system or illuminating with the illumination method according to the fourth invention of the present invention, compared to cases where illumination is performed with experimental reference light or experimental pseudo-reference light, white appears whiter, more natural, and more comfortable even at an approximately similar CCT and/or an approximately similar illuminance. Furthermore, differences in lightness among achromatic colors such as white, gray, and black become more visible. As a result, for example, black letters or the like on an ordinary sheet of white paper become more legible. Moreover, while details will be given later, such an effect is completely unexpected in the context of conventional wisdom.

Second, with illuminance that is realized by a light-emitting device according to the first invention of the present invention or illuminance when illuminating with the illumination method according to the fourth invention of the present invention, a truly natural color appearance as though viewed under several tens of thousands of lx such as under outdoor illuminance on a sunny day is achieved for a majority of colors such as purple, bluish purple, blue, greenish blue, green, yellowish green, yellow, reddish yellow, red, and reddish purple, and in some cases, all colors even in an ordinary indoor environment of around several thousand 1x to several hundred 1x. In addition, the skin colors of subjects (Japanese), various foods, clothing, wooden colors, and the like which have intermediate chroma also acquire a natural color appearance which many of the subjects feel more favorable.

Third, when illuminating by a light-emitting device according to the first invention of the present invention or illuminating with the illumination method according to the fourth invention of the present invention, colors among close hues can be identified more easily and work or the like can be performed as comfortably as though under a high-illuminance environment as compared to cases where illumination is performed with experimental reference light or experimental pseudo-reference light even at an approximately similar CCT and/or an approximately similar illuminance. Furthermore, specifically, for example, a plurality of lipsticks with similar red colors can be more readily distinguished from each other.

Fourth, when illuminating by a light source, a fixture, or a system according to the first invention of the present invention or illuminating with the illumination method according to the fourth invention of the present invention, objects can be viewed more clearly and readily as though viewed under a high-illuminance environment as compared to cases where illumination is performed with experimental reference light or experimental pseudo-reference light even at an approximately similar CCT and/or an approximately similar illuminance.

In addition to these effects, in the second embodiment of the first, second, fourth and fifth inventions of the present invention, the appearance of colors can be further adjusted in accordance with the taste of the user, even in a semiconductor light-emitting device which excels in the appearance of colors when used for illumination purposes.

The conveniences implemented by the first embodiment of the first to fourth inventions of the present invention follow.

In other words, optimum illumination differs depending on age, gender, country and the like, or depending on the space and the purpose of illumination, but if the light-emitting device according to the first embodiment of the first invention of the present invention, or the method for driving the light-emitting device according to the first embodiment of the third invention of the present invention is used, more suitable illumination conditions can be easily selected from a variable range.

BRIEF DESCRIPTION OF THE DRAWINGS

In FIG. 102, the dotted line indicates the relative spectral power distribution in the Reference Example 1 that does not include a control element, and the solid line indicates the relative spectral power distribution radiating onto the axis in Example 9 that includes a control element;

In FIG. 105, the dotted line indicates the relative spectral power distribution in the Reference Comparative Example 1 that does not include a control element, and the solid line indicates the relative spectral power distribution radiating onto the axis in Example 10 that includes a control element;

In FIG. 107, the dotted line indicates the relative spectral power distribution in the Reference Comparative Example 2 that does not include a control element, and the solid line indicates the relative spectral power distribution radiating onto the axis in Comparative Example 2 that includes a control element;

In FIG. 109, the dotted line indicates the relative spectral power distribution in the Reference Example 2 that does not include a control element, and the solid line indicates the relative spectral power distribution radiating onto the axis in Example 11 that includes a control element;

In FIG. 111, the dotted line indicates the relative spectral power distribution in the Reference Comparative Example 3 that does not include a control element, and the solid line indicates the relative spectral power distribution radiating onto the axis in Example 12 that includes a control element;

DESCRIPTION OF EMBODIMENTS

Figure 1:
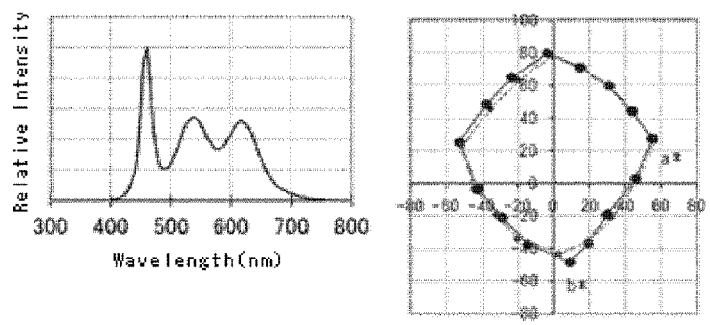
FIG. 1 is a diagram showing a spectral power distribution when assuming that light, emitted from a packaged LED which incorporates a semiconductor light-emitting element with a peak wavelength of 459 nm and which comprises a green phosphor and a red phosphor, illuminates the 15 Munsell renotation color samples, and a CIELAB color space on which are respectively plotted a* values and b* values of the 15 Munsell renotation color samples when illuminated by the LED and when illuminated by reference light.

While the present invention will be described in detail hereinafter, it is to be understood that the present invention is not limited to the embodiments described below and that various modifications can be made without departing from the spirit and scope of the invention.

Moreover, in a light-emitting device according to the first to third inventions of the present invention specifies the invention based on light in a "main radiant direction" among light emitted from a light-emitting device. Therefore, light-emitting devices capable of radiating light including light in a "main radiant direction" which meets requirements of the first embodiments of the first to fourth inventions of the present invention are to be included in the spirit and scope of the first embodiments of the first to fourth inventions of the present invention.

In addition, an illumination method according to a first embodiment of the fourth invention of the present invention specifies the invention based on light at a position where an object is illuminated in a case where light emitted from a light-emitting device used in the illumination method illuminates the object. Therefore, illumination methods used by light-emitting devices capable of emitting light at a "position where an object is illuminated" which meets requirements of the first embodiment of the first to fourth inventions of the present invention are to be included in the spirit and scope of the first embodiment of the first to fourth inventions of the present invention.

According to the second embodiment of the first invention of the present invention, on the other hand, the spectral power distribution $\Phi_{elm}(\lambda)$ of the light, emitted from a light-emitting element included in the light-emitting device in a main radiant direction, is controlled by a control element included in the light-emitting device, and the light is then emitted in the "main radiant direction". Therefore, light-emitting devices capable of radiating light including light in a "main radiant direction" which meets requirements of the second embodiments of the first, second, fourth and fifth inventions of the present invention controlled by the control element are to be included in the spirit and scope of the second embodiments of the first, second, fourth and fifth inventions of the present invention. According to the second embodiment of the fifth and the second inventions of the present invention, a method for manufacturing and a method for designing a light-emitting device that can irradiate light, including light in the "main radiant direction" which satisfies the requirement of the second embodiment of the first, second, fourth and fifth inventions of the present invention controlled by the control element, are provided, and manufacturing and designing of the light-emitting device by disposing the control element that belongs to the scope of the second embodiment of the first, second, fourth and fifth inventions of the present invention. In addition, an illumination method according to a second embodiment of the fourth invention of the present invention specifies the invention based on light at a position where an object is illuminated in a case where light emitted from the light-emitting device illuminates the object. Therefore, illumination methods used by light-emitting devices capable of emitting light at a "position where an object is illuminated" which meets requirements of the second embodiment of the first, second, fourth and fifth inventions of the present invention by disposing the control element are to be included in the spirit and scope of the second embodiment of the first, second, fourth and fifth inventions of the present invention.

As used herein, the "main radiant direction" according to the first to third inventions of the present invention refers to a direction in which light is radiated over a suitable range and in a suitable orientation which are in line with usage of the light-emitting device.

For example, the "main radiant direction" may be a direction in which luminous intensity or luminance of the light-emitting device is maximum or locally maximum.

In addition, the "main radiant direction" may be a direction having a finite range including a direction in which the luminous intensity or the luminance of the light-emitting device is maximum or locally maximum.

In addition, the main radiant direction may be a direction in which radiant intensity or radiance of the light-emitting device is maximum or locally maximum.

In addition, the "main radiant direction" may be a direction having a finite range including a direction in which the radiant intensity or the radiance of the light-emitting device is maximum or locally maximum.

Specific examples will be given below.

When the light-emitting device is an individual light-emitting diode (LED), an individual packaged LED, an individual LED module, an individual LED bulb, an individual composite lamp constituted by a fluorescent lamp and a semiconductor light-emitting element, an individual composite lamp constituted by an incandescent bulb and a semiconductor light-emitting element, or the like, a main radiant direction may be a vertical direction of each light-emitting device or within a finite solid angle which includes the vertical direction and which ranges between, for example, a maximum of $\pi$ (sr) and a minimum of $\pi/100$ (sr).

When the light-emitting device is an LED lighting fixture in which a lens, a reflection mechanism, and the like is added to the packaged LED or the like or a lighting fixture which incorporates a fluorescent lamp and a semiconductor light-emitting element and which has light distribution characteristics applicable to so-called direct lighting use, semi-direct lighting use, general diffused lighting use, direct/indirect lighting use, semi-indirect lighting use, and indirect lighting use, a main radiant direction may be a vertical direction of each light-emitting device or within a finite solid angle which includes the vertical direction and which ranges between, for example, a maximum of $\pi$ (sr) and a minimum of $\pi/100$ (sr). In addition, the main radiant direction may be a direction in which luminous intensity or luminance of the light-emitting device is maximum or locally maximum. Furthermore, the main radiant direction may be within a finite solid angle that includes a direction in which luminous intensity or luminance of the light-emitting device is maximum or locally maximum and which ranges between, for example, a maximum of $\pi$ (sr) and a minimum of $\pi/100$ (sr). In addition, the main radiant direction may be a direction in which radiant intensity or radiance of the light-emitting device is maximum or locally maximum. Furthermore, the main radiant direction may be within a finite solid angle which includes a direction in which radiant intensity or radiance of the light-emitting device is maximum or locally maximum and which ranges between, for example, a maximum of $\pi$ (sr) and a minimum of $\pi/100$ (sr).

When the light-emitting device is a lighting system in which a plurality of the LED lighting fixtures or lighting fixtures incorporating a fluorescent lamp is mounted, the main radiant direction may be a vertical direction of a planar center of each light-emitting device or within a finite solid angle which includes the vertical direction and which ranges between, for example, a maximum of $\pi$ (sr) and a minimum of $\pi/100$ (sr). In addition, the main radiant direction may be a direction in which luminous intensity or luminance of the light-emitting device is maximum or locally maximum. Furthermore, the main radiant direction may be within a finite solid angle which includes a direction in which luminous intensity or luminance of the light-emitting device is maximum or locally maximum and which ranges between, for example, a maximum of $\pi$ (sr) and a minimum of $\pi/100$ (sr). In addition, the main radiant direction may be a direction in which radiant intensity or radiance of the light-emitting device is maximum or locally maximum. Furthermore, the main radiant direction may be within a finite solid angle which includes a direction in which radiant intensity or radiance of the light-emitting device is maximum or locally maximum and which ranges between, for example, a maximum of $\pi$ (sr) and a minimum of $\pi/100$ (sr).

A spectral power distribution of light emitted in the main radiant direction by the light-emitting device is favorably measured at a distance where illuminance at a measuring point is a practical illuminance (as will be described later, 150 lx or higher and 5000 lx or lower).

In the present specification, reference light as defined by CIE which is used in calculations for estimating a mathematical color appearance may sometimes be referred to as reference light, calculational reference light, and the like. On the other hand, experimental reference light which is used when making actual visual comparisons or, in other words, light from an incandescent bulb which incorporates a tungsten filament or the like may sometimes be referred to as reference light, experimental reference light and the like. In addition, light with a high $R_a$ and a high $R_f$ which is estimated to have a color appearance that is close to reference light such as light from an LED light source which is used as alternate light for experimental reference light in a visual comparison experiment may sometimes be referred to as reference light, experimental pseudo-reference light and the like. Furthermore, light that is an object of a mathematical or experimental examination may sometimes be referred to as test light in contrast to reference light.

The light-emitting device according to the first embodiment of the first invention of the present invention includes M number of light emitting areas (M is 2 or greater natural number). In this description, light emitting areas that emit light in an equivalent spectral power distribution (allowing a general dispersion generated in the manufacturing steps) are called the "same type of light emitting areas". In other words, even if the light emitting areas are physically separated and disposed with a distance, these light emitting areas are of a same type if they emit lights in an equivalent spectral power distribution (allowing a general dispersion generated in the manufacturing steps). This means that the light-emitting device, according to the first embodiment of the first invention of the present invention, includes two or more types of light emitting areas from which lights in mutually different spectral power distributions are emitted.

At least one light emitting area of the plurality of types of light emitting areas includes a semiconductor light-emitting element as the light-emitting element. Only if at least one light emitting area includes a semiconductor light-emitting element as the light-emitting element, the light-emitting element included in each light emitting area is not limited. The light-emitting elements, other than the semiconductor light-emitting element, can be any light-emitting element if various supplied energies can be converted into electromagnetic radiation energy, and the electromagnetic radiation energy includes visible light in a range from 380 nm to 780 nm. For example, a hot filament, a fluorescent tube, a high pressure sodium lamp, a laser, and a secondary harmonic generation (SHG) source that can convert electric energy can be used. A phosphor or the like that can convert light energy can also be used.

The configuration of the light-emitting device according to the first embodiment of the first invention of the present invention is not especially limited, only if a plurality of light emitting areas, including a light emitting area which has a semiconductor light-emitting element as the light-emitting element, exists therein. An individual semiconductor light-emitting element to which a lead or the like as a conducting mechanism is added or a packaged LED to which a heat dissipating mechanism is further added and integrated with a phosphor or the like may be adopted as the light emitting area.

In addition, the light-emitting device can be an LED module in which a robust heat dissipating mechanism is added to one or more packaged LEDs and which is generally mounted with a plurality of packaged LEDs may be adopted as the light-emitting device. Furthermore, an LED lighting fixture in which a lens, a reflecting mechanism, and the like are added to a packaged LED may be adopted. Moreover, a lighting system which supports a large number of LED lighting fixtures or the like and which is configured to be capable of illuminating an object may be adopted. The light-emitting device according to the present embodiment encompasses all of the above.

In the light-emitting device according to the first embodiment of the first invention of the present invention, when $\phi_{SSL}N(\lambda)$ (N is in the 1 to M range) is the spectral power distribution of the light emitted from each light emitting area, $\phi_{SSL}(\lambda)$, which is the spectral power distribution of all the lights emitted from the light-emitting device in the radiant direction, is given by

[Expression 38]

$$\phi_{SSL}(\lambda) = \sum_{N=1}^{M} \phi_{SSL}N(\lambda).$$

This will be described with reference to FIG. 113.

Figure 113:
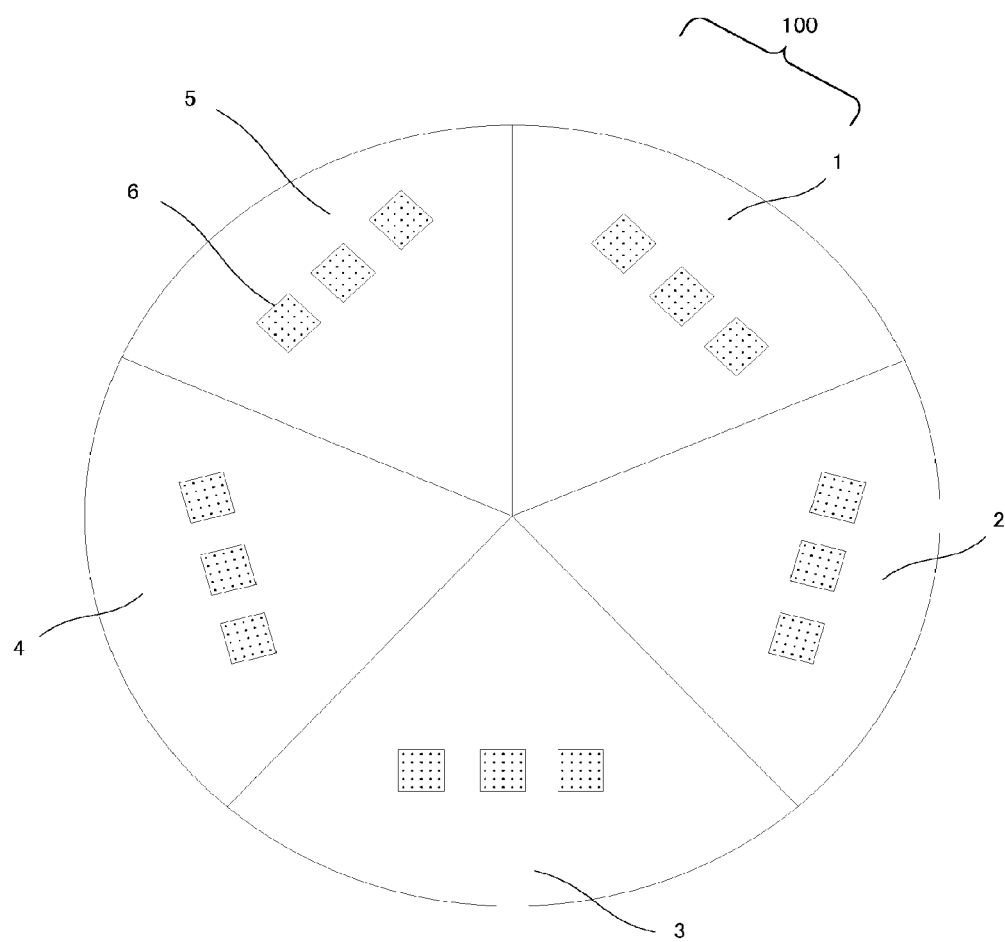
FIG. 113 is a diagram showing an example of the light emitting areas of the light-emitting device according to the first embodiment of the first invention of the present invention.

The light-emitting device 100 in FIG. 113 is one mode of the light-emitting device according to the first embodiment of the first invention of the present invention. The light-emitting device 100 is the case when M in the above expression is M=5, and 5 (five types of) light emitting areas, that is, the light emitting area 1 to the light emitting area 5, are included. Each light emitting area has a semiconductor light-emitting element 6 as the light-emitting element.

When $\phi_{SSL}1(\lambda)$ is the spectral power distribution of the light emitted from the light emitting area 1, $\lambda_{SSL}2(\lambda)$ is the spectral power distribution of the light emitted from the light emitting area 2, $\phi_{SSL}3(\lambda)$ is the spectral power distribution of the light emitted from the light emitting area 3, $\phi_{SSL}4(\lambda)$ is the spectral power distribution of the light emitted from the light emitting area 4, and $\phi_{SSL}5(\lambda)$ is the spectral power distribution of the light emitted from the light emitting area 5, then the spectral power distribution $\phi_{SSL}(\lambda)$ of all the lights emitted from the light-emitting device in the radiant direction is given by

[Expression 39]

$$\phi_{SSL}(\lambda) = \phi_{SSL}1(\lambda) + \phi_{SSL}2(\lambda) + \phi_{SSL}3(\lambda) + \phi_{SSL}4(\lambda) + \phi_{SSL}5(\lambda)$$
$$= \sum_{N=1}^{5} \phi_{SSL}N(\lambda).$$

In other words, when N is 1 to M, $\phi_{SSL}(\lambda)$ can be given by

[Expression 40]

$$\phi_{SSL}(\lambda) = \sum_{N=1}^{M} \phi_{SSL}N(\lambda).$$

According to the first embodiment of the first to fourth inventions of the present invention, the appearance of colors can be variable while implementing a natural, vivid, highly visible and comfortable appearance of colors and appearance of objects as if the objects are seen outdoors. In concrete terms, the light-emitting device, including light emitting areas that can satisfy predetermined conditions by changing the luminous flux amount and/or radiant flux amount emitted from each light emitting area, is provided.

The light-emitting device according to the second embodiment of the first invention of the present invention has: a light-emitting element that includes a semiconductor light-emitting element; and a control element.

The light-emitting element according to the second embodiment of the first, second, fourth and fifth inventions of the present invention includes the semiconductor light-emitting element as an essential element, but may also include other light-emitting elements. Other light-emitting elements are not especially limited if various supplied energies can be converted into electromagnetic radiation energy, and the electromagnetic radiation energy includes visible light in a range from 380 nm to 780 nm. For example, a hot filament, a fluorescent tube, a high pressure sodium lamp, a laser, and a secondary harmonic generation (SHG) source that can convert electric energy can be used. A phosphor that can convert light energy can also be used.

The control element according to the second embodiment of the first, second, fourth and fifth inventions of the present invention is a passive element that itself has no amplifying function, and is not especially limited if the intensity modulation for each wavelength can be performed in an appropriate range, on light that is emitted from a light-emitting element or a light-emitting device having relatively low level processing, in the main direction, and can constitute a light-emitting device having high level processing. Examples of the control element of the second embodiment of the first, second, fourth and fifth inventions of the present invention are passive devices, such as a reflection mirror, an optical filter and an optical lens. The control element according to the second embodiment of the first, second, fourth and fifth inventions of the present invention may be an absorption material that is disposed in the sealing material of the packaged LED, so as to perform intensity modulation for each wavelength in an appropriate range. However, a light-emitting element and a reflection mirror, optical filter, an absorption material or the like that can perform intensity modulation, of which wavelength dependency is low, on the light emitted from a light-emitting device having relatively low level processing, are not included in the control element.

Figure 114:
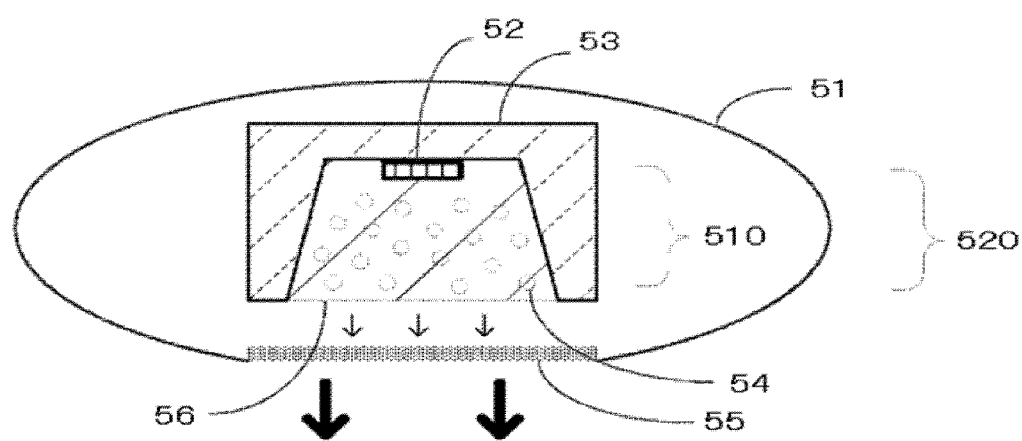
FIG. 114 is a schematic diagram showing an example of the light-emitting device according to the second embodiment of the first invention of the present invention.

An overview of the light-emitting device according to the second embodiment of the first invention of the present invention will be further described with reference to FIG. 114. In the example of FIG. 114, an LED chip 52, which is a semiconductor light-emitting element, and a phosphor 54 are included as a light-emitting element, and a packaged LED 510, which is a light-emitting device having low level processing, is constituted by this light-emitting element and by other constituents, such as sealing material 56 and packaging material 53. In this case, an optical filter 55 that performs intensity modulation for each wavelength in an appropriate range is disposed in the reliant direction of the light of the packaged LED 510 as the control element, and thereby an LED light bulb 520, which is a light-emitting device having high level processing, is configured as a result. This LED light bulb 520 can be the light-emitting device according to the second embodiment of the first invention of the present invention.

An overview of the light-emitting device according to the second embodiment of the first invention of the present invention will be further described with reference to FIG. 115. It is assumed that a blue LED chip 52a, a green LED chip 52b and a red LED chip 52c, which are semiconductor light-emitting elements, are included as the light-emitting elements, and the packaged LED 510, which is a light-emitting device having low level processing, is constituted by these light-emitting elements and other constituents, such as sealing material 56 and packaging material 53. In this case, an optical filter 55 which functions as a control element is disposed in the radiant direction of the packaged LED 510, and thereby an LED light bulb 520, which is a light-emitting device having high level processing, is configured as a result. This LED light bulb 520 can be the light-emitting device according to the second embodiment of the first invention of the present invention. Further, n number of LED light bulbs 520 are disposed and m number of incandescent bulbs 511, which are light-emitting devices having mid-level processing, including a heat filament 52d as the light-emitting element, are disposed, whereby an illumination system 530, which is a light-emitting device having high level processing, is constructed. The illumination system can be the light-emitting device according to the second embodiment of the first invention of the present invention.

The light (radiant flux) emitted from the light-emitting element in the main radiant direction that is referred to in this description is a total of the light (radiant flux) emitted from all the light-emitting elements in the main radiant direction, and here this spectral power distribution is denoted as $\Phi_{elm}$. $\Phi_{elm}(\lambda)$ is a function of the wavelength $\lambda$. $\Phi_{elm}(\lambda)$ can be measured by performing radiant measurement for the light-emitting device, from which the control element according to this description is removed. In the case of the light-emitting device which includes the LED chip and the phosphor as the light-emitting elements, and which has an optical filter that performs intensity modulation for each wavelength in an appropriate range as the control element, as shown in FIG. 114, $\Phi_{elm}(\lambda)$ is acquired if the spectral power distribution of the light irradiated in the main radiant direction from the light-emitting device from which the optical filter is removed is measured. In other words, $\Phi_{elm}(\lambda)$ can be acquired if the spectral power distribution of the light emitted in the main radiant direction of the packaged LED, which is the light-emitting device having a low level processing is measured.

Figure 115:
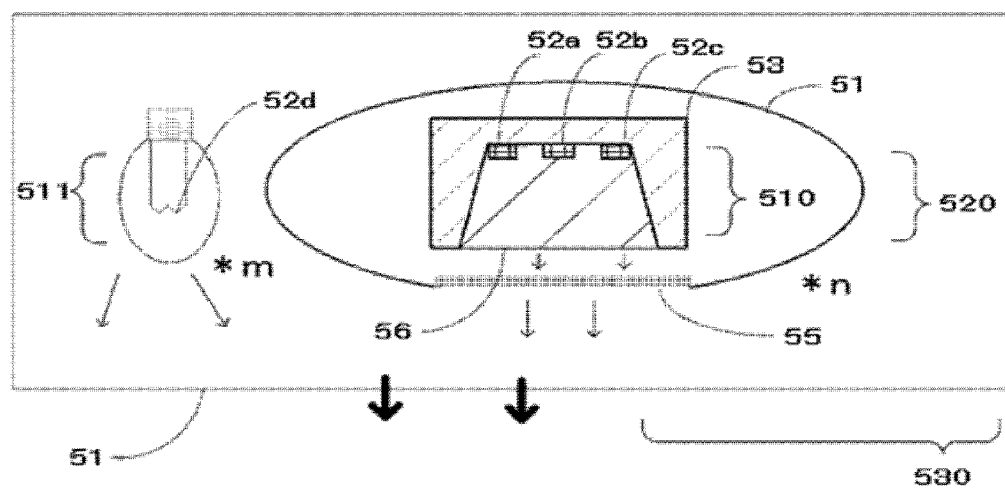
FIG. 115 is a schematic diagram showing an example of the light-emitting device according to the second embodiment of the first invention of the present invention.

If there is "a light-emitting device having mid-level processing or a light-emitting device having high level processing" which partially exists in "a light-emitting device having even higher level processing" as shown in FIG. 115, then the spectral power distribution of light, which is irradiated in the main radiant direction from the light-emitting device including n number of packaged LEDs and m number of incandescent bulbs in a state where the control element is disabled, can be regarded as $\Phi_{elm}(\lambda)$.

The light-emitting device according to the second embodiment of the first invention of the present invention includes a light-emitting element including a semiconductor light-emitting element. For the light-emitting element, the semiconductor light-emitting element is included as an essential element, but another light-emitting element may be included. The other light-emitting elements are not particularly limited as long as it can emit light corresponding to a range of 380 nm to 780 nm in some way, and examples of the light-emitting element include thermal emission light from a hot filament or the like, electric discharge emission light from a fluorescent tube, a high-pressure sodium lamp, or the like, stimulated emission light from a laser or the like, spontaneous emission light from a semiconductor light-emitting element, and spontaneous emission light from a phosphor. The light-emitting device according to the present embodiment includes a control element as well, but other configurations are not especially limited. An individual semiconductor light-emitting element to which a lead or the like as a conducting mechanism is added or a packaged LED to which a heat dissipating mechanism is further added and integrated with a phosphor or the like may be adopted as the light-emitting element. The light-emitting device can be an LED module in which a robust heat dissipating mechanism is added to one or more packaged LEDs and which is generally mounted with a plurality of packaged LEDs may be adopted as the light-emitting device. Furthermore, an LED lighting fixture in which a lens, a reflecting mechanism, and the like are added to a packaged LED may be adopted. Moreover, a lighting system which supports a large number of LED lighting fixtures or the like and which is configured to be capable of illuminating an object may be adopted. Still further, for example, an individual electric discharge tube to which a mechanism capable of applying a high voltage is added or an electric discharge tube having a phosphor arranged in the interior or circumference thereof may be adopted as the light-emitting device according to the present embodiment when the light-emitting device includes an electric discharge tube as the light-emitting element. A lighting fixture in which a plurality of fluorescent tubes incorporating one or more phosphors are disposed may also be adopted. Furthermore, a lighting fixture to which a reflecting mechanism or the like is added may be adopted. Moreover, a control circuit or the like may be added to the lighting fixture to provide a lighting system. The light-emitting device according to the present embodiment encompasses all of the above.

In the second embodiment of the first, second, fourth and fifth inventions of the present invention, the light-emitting element may be a light-emitting device. In other words, the light-emitting element according to the second embodiment of the first, second, fourth and fifth inventions of the present invention may be an LED module, an LED lighting fixture, a lighting system, or a lighting fixture having another mechanism.

The present inventor has discovered a radiometric property or a photometric property common to spectra or spectral power distributions capable of realizing a color appearance or an object appearance which is as natural, vivid, highly visible, and comfortable as though perceived outdoors in a high-illuminance environment even in an ordinary indoor illuminance environment. The present inventor further ascertained, from a colorimetric perspective, in what way the color appearance of the color samples having specific spectral reflectance characteristics when assuming that the color is illuminated by light having the aforementioned spectrum or spectral power distribution changes (or does not change) when the object described above is achieved in comparison with a case where illumination by calculational reference light is assumed, and collectively reached the present invention. In addition, the present inventor discovered that the appearance of colors can be variable if a plurality of light emitting areas is included. Further, the present inventor examined the spectral power distribution of a light-emitting device that can implement both a natural, vivid, highly visible and comfortable appearance of colors and appearance of objects, and suppress the secondary influence of light irradiation onto the illumination object, which is of concern in the case when the illumination object is, for example, an art object or perishable food, and reached the present invention as a result.

It should be noted that the present invention was made based on experimental facts which defy common and conventional wisdom.

Specific circumstances leading to the invention can be summarized as follows.

Summary of Circumstances Leading to Invention

First Embodiment of First to Fourth Inventions of the Present Invention

As a first step, a baseline mathematical examination was conducted on the assumption of: A) a packaged LED light source incorporating both a semiconductor light-emitting element and a phosphor; and B) a packaged LED light source which does not include a phosphor and which only incorporates a semiconductor light-emitting element as a light-emitting element, which both have a high degree of freedom in setting a spectral power distribution.

In doing so, by employing, as a guideline, a mathematical variation regarding the color appearance of a color sample having specific spectral reflectance characteristics between a case where illumination by calculational reference light is assumed and a case where illumination by test light that is an examination object is assumed, test lights causing changes in hue, saturation (chroma) or the like were examined in detail. In particular, while being aware of the Hunt effect in an ordinary indoor environment where illuminance drops to around $1/10$ to $1/1000$ as compared to outdoors, the mathematical examination focused on light with variations in saturation of color appearance of an illuminated object.

As a second step, prototypes of a packaged LED light source and a lighting fixture incorporating the packaged LED light source were made based on the mathematically examined test light. In addition, for comparative visual experiments to be performed in a third step, an incandescent bulb with a tungsten filament was prepared as experimental reference light. Furthermore, prototypes of a light source capable of emitting light (experimental pseudo-reference light) with high $R_a$ and high $R_i$ and which produces a color appearance that is close to that of calculational reference light as well as a lighting fixture incorporating the light source were also made. Moreover, for visual experiments using the above, in order to have subjects evaluate a color appearance when an object is illuminated by experimental reference light or experimental pseudo-reference light and a color appearance when the object is illuminated by light (test light) of a lighting fixture incorporating the packaged LED light source, an illumination experiment system capable of illuminating different illuminating light on a large number of observation objects was fabricated.

As a third step, comparative visual experiments were performed. Due consideration was given to preparing chromatic objects so that colors of the observation objects covered all hues including purple, bluish purple, blue, greenish blue, green, yellowish green, yellow, reddish yellow, red, and reddish purple. Achromatic objects such as white objects and black objects were also prepared. These chromatic and achromatic objects were prepared in wide varieties and in large numbers including still objects, fresh flowers, food, clothing, and printed material. At this point, the subjects were asked to evaluate a color appearance when the objects were illuminated by experimental reference light or experimental pseudo-reference light and a color appearance when the objects were illuminated by test light. Comparisons between the former and the latter were performed at similar CCTs and similar illuminance. The subjects were asked to perform evaluations from the perspective of which of the lights had relatively achieved a color appearance or an object appearance that is as natural, vivid, highly visible, and comfortable as though perceived outdoors. The subjects were also asked the reasons for their judgment regarding which is superior or inferior.

As a fourth step, radiometric properties and photometric properties of the experimental reference light/experimental pseudo-reference light and the test light were extracted from actual measured values. Furthermore, a difference in colorimetric properties regarding a color appearance of color samples having specific spectral reflectance characteristics which differs from the observation objects described above between a case where illumination at a spectral power distribution of calculational reference light is calculationally assumed and a case where illumination at a spectral power distribution of an actually measured experimental reference light/experimental pseudo-reference light/test light is calculationally assumed was compared with the evaluations by the subjects in the visual experiments, and characteristics of the illumination method or the light-emitting device determined to be truly comfortable were extracted.

As a fifth step, the present inventor examined how the appearance of colors change by adjusting the luminous flux amount and/or the radiant flux amount of each light emitting area in the light-emitting device that includes a plurality of light emitting areas.

Moreover, contents of the fifth step also represent examples/comparative examples of the first embodiment of the first to fourth inventions of the present invention, contents of the third and fourth steps also represent examples/comparative examples of the illumination method according to the first embodiment of the fourth invention of the present invention, and contents of the second, third and fourth steps also represent examples/comparative examples of the first embodiment of the first to third inventions of the present invention.

Second Embodiment of First, Second, Fourth and Fifth Inventions of the Present Invention As a first step, without taking functions of a control element into consideration, a baseline mathematical examination was conducted on the assumption of: A) a packaged LED light source incorporating both a semiconductor light-emitting element and a phosphor; and B) a packaged LED light source which does not include a phosphor and which only incorporates a semiconductor light-emitting element as a light-emitting element, which both have a high degree of freedom in setting a spectral power distribution.

In doing so, by employing, as a guideline, a mathematical variation regarding the color appearance of a color sample having specific spectral reflectance characteristics between a case where illumination by calculational reference light is assumed and a case where illumination by test light that is an examination object is assumed, test lights causing changes in hue, saturation (chroma), or the like were examined in detail. In particular, while being aware of the Hunt effect in an ordinary indoor environment where illuminance drops to around $1/10$ to $1/1000$ as compared to outdoors, the mathematical examination focused on light with variations in saturation of color appearance of an illuminated object.

As a second step, prototypes of a packaged LED light source and a lighting fixture incorporating the packaged LED light source were made based on the mathematically examined test light. The functions of the control element are not included in the lighting fixture. In addition, for comparative visual experiments to be performed in a third step, an incandescent bulb with a tungsten filament was prepared as experimental reference light. Furthermore, prototypes of a light source capable of emitting light (experimental pseudo-reference light) with high $R_a$ and high $R_i$ and which produces a color appearance that is close to that of calculational reference light as well as a lighting fixture incorporating the light source were also made. Moreover, for visual experiments using the above, in order to have subjects evaluate a color appearance when an object is illuminated by experimental reference light or experimental pseudo-reference light and a color appearance when the object is illuminated by light (test light) of a lighting fixture incorporating the packaged LED light source, an illumination experiment system capable of illuminating different illuminating light on a large number of observation objects was fabricated.

As a third step, comparative visual experiments were performed by using a lighting fixture and a lighting system that does not include the functions of the control element.

Due consideration was given to preparing chromatic objects so that colors of the observation objects covered all hues including purple, bluish purple, blue, greenish blue, green, yellowish green, yellow, reddish yellow, red, and reddish purple. Achromatic objects such as white objects and black objects were also prepared. These chromatic and achromatic objects were prepared in wide varieties and in large numbers including still objects, fresh flowers, food, clothing, and printed material. At this point, the subjects were asked to evaluate a color appearance when the objects were illuminated by experimental reference light or experimental pseudo-reference light and a color appearance when the objects were illuminated by test light. Comparisons between the former and the latter were performed at similar CCTs and similar illuminance. The subjects were asked to perform evaluations from the perspective of which of the lights had relatively achieved a color appearance or an object appearance that is as natural, vivid, highly visible, and comfortable as though perceived outdoors. The subjects were also asked the reasons for their judgment regarding which is superior or inferior.

As a fourth step, radiometric properties and photometric properties of the experimental reference light/experimental pseudo-reference light and the test light were extracted from actual measured values. Furthermore, a difference in colorimetric properties regarding a color appearance of color samples having specific spectral reflectance characteristics which differs from the observation objects described above between a case where illumination at a spectral power distribution of calculational reference light is calculationally assumed and a case where illumination at a spectral power distribution of an actually measured experimental reference light/experimental pseudo-reference light/test light is calculationally assumed was compared with the evaluations by the subjects in the visual experiments, and characteristics of the illumination method or the light-emitting device determined to be truly comfortable were extracted.

As the fifth step, the present inventor carried out an examination to introduce a control element to a light-emitting device that does not include a control element.

Moreover, contents of the third and fourth steps also represent reference examples/reference comparative examples of the second embodiment of the first and fifth inventions of the present invention, and contents of the fifth step also represents examples/comparative examples of the second embodiment of the first, second, fourth and fifth inventions of the present invention.

[Quantification Method of Color Samples' Selection and Color Appearance]

In the first step, in consideration of the Hunt effect, a spectral power distribution at a position where light emitted from a light-emitting device mainly examined in the illumination method according to the fourth invention of the present invention illuminates an object or a spectral power distribution of light in a main radiant direction which is emitted by the light-emitting device according to the first invention of the present invention was assumed to vary saturation of an illuminated object from a case where illumination is performed using reference light. At this point, the following selections were made in order to quantify a color appearance or a variation thereof.

It was considered that, in order to quantitatively evaluate a color appearance from a spectral power distribution, a color sample with obvious mathematical spectral reflectance characteristics is favorably defined and a difference in color appearance of the color sample between a case of illumination by calculational reference light and a case of illumination by test light is adopted as an index.

Although test colors used in CRI are general choices, color samples $R_1$ to $R_8$ which are used when deriving an average color rendering index or the like are color samples with intermediate chroma and were therefore considered unsuitable when discussing saturation of high-chroma colors. In addition, while $R_9$ to $R_{12}$ are high-chroma color samples, there are not enough samples for a detailed discussion covering a range of all hue angles.

Therefore, it was decided that 15 color samples (one color sample per hue) be selected from color samples which have the highest chroma and which are positioned outermost in a Munsell color circle according to the Munsell renotation color system. Moreover, these are the same color samples used in CQS (Color Quality Scale) (versions 7.4 and 7.5) that is a new color rendition metric proposed by NIST (National Institute of Standards and Technology), U.S.A. The 15 color samples used in the first to fifth inventions of the present invention will be listed below. In addition, a number assigned for convenience sake are provided before each color sample. Moreover, in the present specification, these numbers will sometimes be represented by n. For example, n=3 signifies "5PB 4/12". n denotes a natural number from 1 to 15.

|     |           |
|-----|-----------|
| #01 | 7.5P 4/10 |
| #02 | 10PB 4/10 |
| #03 | 5PB 4/12  |
| #04 | 7.5B 5/10 |
| #05 | 10BG 6/8  |
| #06 | 2.5BG 6/10|
| #07 | 2.5G 6/12 |
| #08 | 7.5GY 7/10|
| #09 | 2.5GY 8/10|
| #10 | 5Y 8.5/12 |
| #11 | 10YR 7/12 |
| #12 | 5YR 7/12  |
| #13 | 10R 6/12  |
| #14 | 5R 4/14   |
| #15 | 7.5RP 4/12|

In the first to fifth inventions of the present invention, from the perspective of deriving various indices, an attempt was made to quantify in what way the color appearance of the 15 color samples listed above changes (or does not change) between a case where the colors are assumed to be illuminated by calculational reference light and a case where the colors are assumed to be illuminated by test light when a color appearance or an object appearance that is as natural, vivid, highly visible, and comfortable as though perceived in an outdoor high-illuminance environment is achieved even in an ordinary indoor illuminance environment, and to extract results of the quantification as a color rendering property that should be attained by a light-emitting device.

Moreover, selection of a color space and selection of a chromatic adaptation formula are also important when quantitatively evaluating color appearance that is mathematically derived from the spectral power distributions described above. In the first to fifth inventions of the present invention, CIE 1976 L*a*b* (CIELAB) that is a uniform color space currently recommended by the CIE was used. In addition, CMCCAT2000 (Colour Measurement Committee's Chromatic Adaptation Transform of 2000) was adopted for chromatic adaptation calculation.

Chromaticity Points Derived from Spectral Power Distribution at Position where Object is Illuminated or from Spectral Power Distribution of Light in Main Radiant Direction Emitted from Light-Emitting Device First Embodiment of First to Fourth Inventions of the Present Invention In the first step, selection of a chromaticity point of a light source is also important when making various prototypes of a packaged LED light source. Although chromaticity derived from a light source, a spectral power distribution at a position where an object is illuminated by light from the light source, or a spectral power distribution of light in a main radiant direction emitted from a light-emitting device can be defined by, for example, a CIE 1931 (x,y) chromaticity diagram, the derived chromaticity is favorably discussed using a CIE 1976 (u',v') chromaticity diagram which is a more uniform chromaticity diagram. In addition, when describing a position on a chromaticity diagram using a CCT and $D_{uv}$, a (u', (2/3)v') chromaticity diagram (synonymous with a CIE 1960 (u,v) chromaticity diagram) is particularly used. Moreover, $D_{uv}$ as described in the present specification is an amount defined by ANSI C78.377 and represents a distance of closest approach to a black-body radiation locus on a (u',(2/3)v') chromaticity diagram as an absolute value thereof. Furthermore, a positive sign means that a chromaticity point of a light-emitting device is above (on a side where v' is greater than) the black-body radiation locus, and a negative sign means that the chromaticity point of the light-emitting device is below (on a side where v' is smaller than) the black-body radiation locus.

Chromaticity Points Derived from Spectral Power Distribution of Light in Main Radiant Direction Emitted from Light-Emitting Device that does not Include Control Element or from Spectral Power Distribution at Position where Object is Illuminated Second Embodiment of First, Second, Fourth and Fifth Inventions of the Present Invention In the first step, selection of a chromaticity point of a light source is also important when making various prototypes of a packaged LED light source. Although chromaticity derived from a light source, a spectral power distribution at a position where an object is illuminated by light from the light source, or a spectral power distribution of light in a main radiant direction emitted from a light-emitting device can be defined by, for example, a CIE 1931 (x,y) chromaticity diagram, the derived chromaticity is favorably discussed using a CIE 1976 (u', v') chromaticity diagram which is a more uniform chromaticity diagram. In addition, when describing a position on a chromaticity diagram using a CCT and $D_{uv}$, a (u', (2/3)v') chromaticity diagram (synonymous with a CIE 1960 (u,v) chromaticity diagram) is particularly used. Moreover, $D_{uv}$ as described in the present specification is an amount defined by ANSI C78.377 and represents a distance of closest approach to a black-body radiation locus on a (u', (2/3)v') chromaticity diagram as an absolute value thereof. Furthermore, a positive sign means that a chromaticity point of a light-emitting device is above (on a side where v' is greater than) the black-body radiation locus, and a negative sign means that the chromaticity point of the light-emitting device is below (on a side where v' is smaller than) the black-body radiation locus.

[Examination of Calculation Regarding Saturation and $D_{uv}$ Value]

Figure 2:
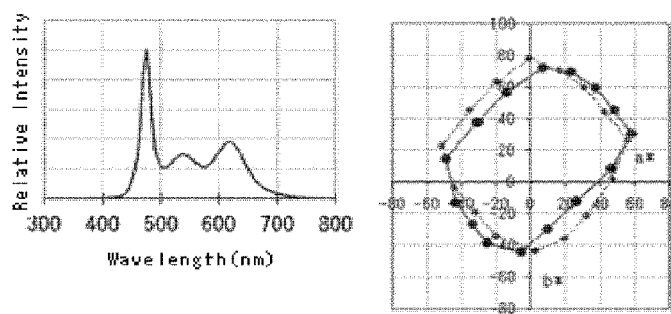
FIG. 2 is a diagram showing a spectral power distribution when assuming that light, emitted from a packaged LED which incorporates a semiconductor light-emitting element with a peak wavelength of 475 nm and which comprises a green phosphor and a red phosphor, illuminates the 15 Munsell renotation color samples, and a CIELAB color space on which are respectively plotted a* values and b* values of the 15 Munsell renotation color samples when illuminated by the LED and when illuminated by reference light.
Figure 3:
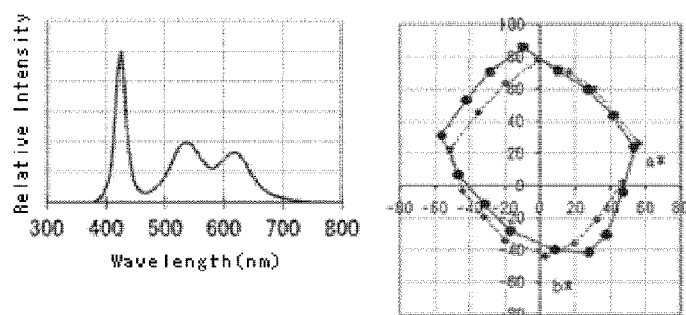
FIG. 3 is a diagram showing a spectral power distribution when assuming that light, emitted from a packaged LED which incorporates a semiconductor light-emitting element with a peak wavelength of 425 nm and which comprises a green phosphor and a red phosphor, illuminates the 15 Munsell renotation color samples, and a CIELAB color space on which are respectively plotted a* values and b* values of the 15 Munsell renotation color samples when illuminated by the LED and when illuminated by reference light.

The color appearance of an object can vary even if the chromaticity point remains the same. For example, the three spectral power distributions (test lights) shown in FIGS. 1, 2, and 3 represent an example where the color appearance of an illuminated object is varied at a same chromaticity (CCT=5500 K, $D_u$=0.0000) when assuming a packaged LED which incorporates a semiconductor light-emitting element with a peak wavelength from 425 to 475 nm and which uses the semiconductor light-emitting element as an excitation light source of a green phosphor and a red phosphor. While it is assumed that same materials are used for the green phosphor and the red phosphor constituting the respective spectral power distributions, in order to vary saturation, peak wavelengths of blue semiconductor light-emitting elements were respectively set to 459 nm for FIG. 1, 475 nm for FIG. 2, and 425 nm for FIG. 3. Expected color appearances of the 15 color samples when assuming illumination at the respective spectral power distributions and illumination by calculational reference lights corresponding to the respective spectral power distributions are as depicted in the CIELAB color spaces in FIGS. 1 to 3. In the drawings, points connected by dotted lines represent illumination by calculational reference light and points connected by solid lines represent illumination by test light. Moreover, while a direction perpendicular to the plane of paper represents lightness, only a* and b* axes were plotted for the sake of convenience.

The following findings were made regarding the spectral power distribution shown in FIG. 1. Based on calculations assuming illumination by calculational reference light and calculations assuming illumination by the test lights shown in the drawings, it was predicted that the color appearances of the 15 color samples will closely resemble one another. In addition, Ra calculated based on the spectral power distribution was high at 95. In a case where illumination by the test light shown in FIG. 2 is assumed, it was predicted that red and blue will appear vivid but purple and green will dull as compared to a case where illumination by calculational reference light is assumed. Ra calculated based on the spectral power distribution was relatively low at 76. Conversely, in a case where illumination by the test light shown in FIG. 3 is assumed, it was predicted that purple and green will appear vivid but red and blue will dull as compared to a case where illumination by calculational reference light is assumed. Ra calculated based on the spectral power distribution was relatively low at 76.

As described above, it was found that color appearances can be varied at the same chromaticity point.

However, a detailed examination by the present inventor revealed that a degree of freedom of light in a vicinity of a black-body radiation locus or, in other words, light whose $D_{uv}$ is in a vicinity of 0 is insufficient to vary spectral power distribution and vary the color appearance of the 15 high-saturation color samples. A more specific description will be given below.

For example, as shown in FIGS. 2 and 3, opposite tendencies were predicted for a variation in saturation of red/blue and a variation in saturation of purple/green. In other words, it was predicted that when saturation of a certain hue increases, saturation of another hue decreases. In addition, according to another examination, it was difficult to simultaneously vary saturation of a large number of hues using a simple and feasible method. Therefore, when illuminating with light in a vicinity of a black-body radiation locus or light whose $D_{uv}$ is in a vicinity of 0, it was difficult to simultaneously vary saturation of a large number of hues of the 15 high-chroma color samples, to relatively uniformly increase or decrease saturation of many hues, and the like.

In consideration thereof, the present inventor mathematically examined color appearances of the 15 color samples when assigning different $D_{uv}$ values to a plurality of spectral power distributions while comparing with a case where illumination is performed by calculational reference light. Generally, it is thought that white appears greenish when $D_{uv}$ is biased toward positive, white appears reddish when $D_{uv}$ takes a negative value, and overall color appearance becomes unnatural when $D_{uv}$ deviates from the vicinity of 0. In particular, it is thought that coloring of white induces such perceptions. However, the present inventor conducted the following examination with an aim to increase saturation controllability.

The eight spectral power distributions shown in FIGS. 4 to 11 represent calculation results of varying $D_{uv}$ from −0.0500 to +0.0150 at a same CCT (2700 K) when assuming a packaged LED which incorporates a blue semiconductor light-emitting element with a peak wavelength of 459 nm and which uses the blue semiconductor light-emitting element as an excitation light source of a green phosphor and a red phosphor. Expected color appearances of the 15 color samples when assuming illumination at the respective spectral power distributions (test lights) and illumination by calculational reference lights corresponding to the respective test lights are as represented in the CIELAB color spaces in FIGS. 4 to 11. In the drawings, points connected by dotted lines represent results regarding the calculational reference lights and points connected by solid lines represent results regarding respective test lights. Moreover, while a direction perpendicular to the plane of paper represents lightness, only a* and b* axes were plotted for the sake of convenience.

Figure 4:
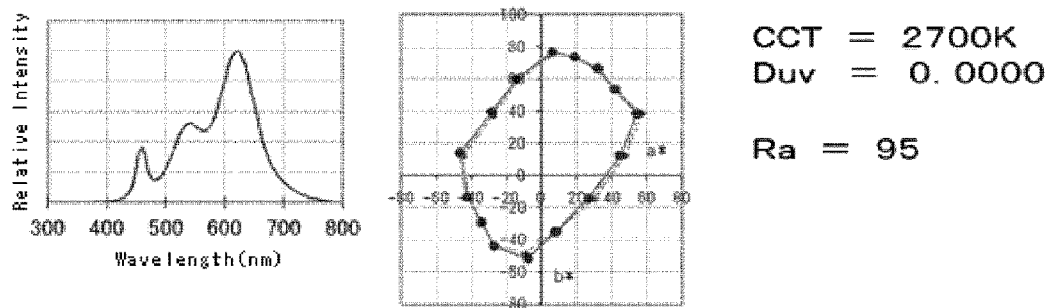
FIG. 4 is a diagram showing a spectral power distribution when assuming that light, emitted from a packaged LED which incorporates a semiconductor light-emitting element with a peak wavelength of 459 nm and which comprises a green phosphor and a red phosphor, illuminates the 15 Munsell renotation color samples, and a CIELAB color space on which are respectively plotted a* values and b* values of the 15 Munsell renotation color samples when illuminated by the LED and when illuminated by reference light (Duv=0.0000)

With the test light with $D_{uv}$=0.0000 shown in FIG. 4, it was predicted that the color appearances of the 15 color samples will closely resemble one another between a case where illumination by calculational reference light is assumed and a case where illumination by the test light shown in FIG. 4 is assumed. Ra calculated based on the spectral power distribution was high at 95.

Figure 5:
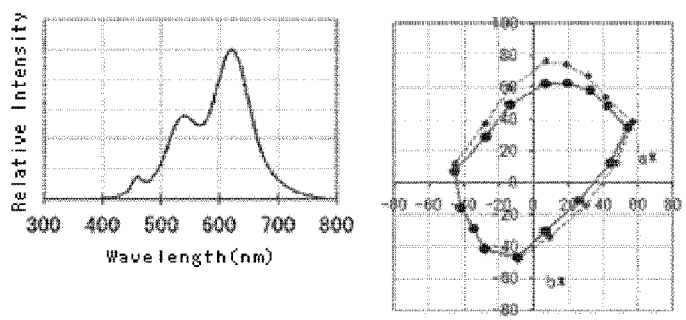
FIG. 5 is a diagram showing a spectral power distribution when assuming that light, emitted from a packaged LED which incorporates a semiconductor light-emitting element with a peak wavelength of 459 nm and which comprises a green phosphor and a red phosphor, illuminates the 15 Munsell renotation color samples, and a CIELAB color space on which are respectively plotted a* values and b* values of the 15 Munsell renotation color samples when illuminated by the LED and when illuminated by reference light (Duv=0.0100)
Figure 6:
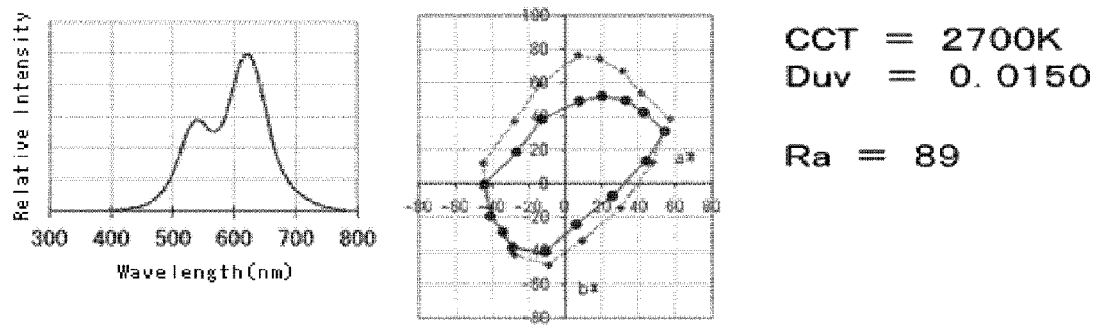
FIG. 6 is a diagram showing a spectral power distribution when assuming that light, emitted from a packaged LED which incorporates a semiconductor light-emitting element with a peak wavelength of 459 nm and which comprises a green phosphor and a red phosphor, illuminates the 15 Munsell renotation color samples, and a CIELAB color space on which are respectively plotted a* values and b* values of the 15 Munsell renotation color samples when illuminated by the LED and when illuminated by reference light (Duv=0.0150)
Figure 7:
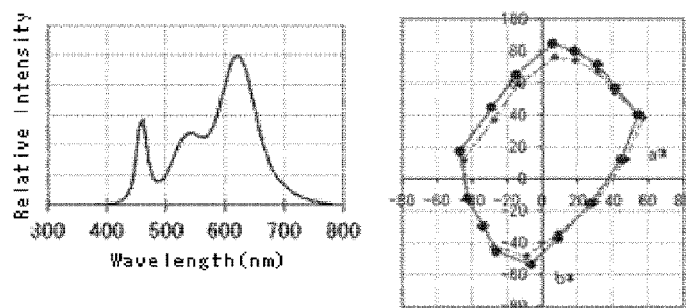
FIG. 7 is a diagram showing a spectral power distribution when assuming that light, emitted from a packaged LED which incorporates a semiconductor light-emitting element with a peak wavelength of 459 nm and which comprises a green phosphor and a red phosphor, illuminates the 15 Munsell renotation color samples, and a CIELAB color space on which are respectively plotted a* values and b* values of the 15 Munsell renotation color samples when illuminated by the LED and when illuminated by reference light (Duv=−0.0100)
Figure 8:
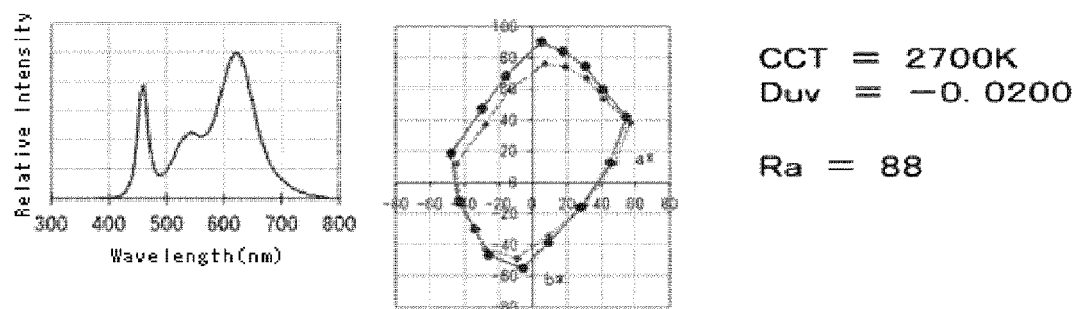
FIG. 8 is a diagram showing a spectral power distribution when assuming that light, emitted from a packaged LED which incorporates a semiconductor light-emitting element with a peak wavelength of 459 nm and which comprises a green phosphor and a red phosphor, illuminates the 15 Munsell renotation color samples, and a CIELAB color space on which are respectively plotted a* values and b* values of the 15 Munsell renotation color samples when illuminated by the LED and when illuminated by reference light (Duv=−0.0200)
Figure 9:
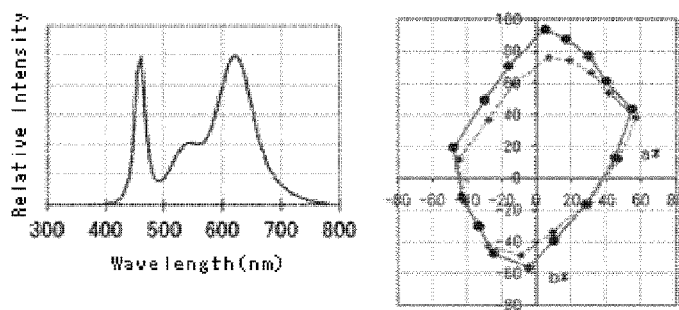
FIG. 9 is a diagram showing a spectral power distribution when assuming that light, emitted from a packaged LED which incorporates a semiconductor light-emitting element with a peak wavelength of 459 nm and which comprises a green phosphor and a red phosphor, illuminates the 15 Munsell renotation color samples, and a CIELAB color space on which are respectively plotted a* values and b* values of the 15 Munsell renotation color samples when illuminated by the LED and when illuminated by reference light (Duv=−0.0300)
Figure 10:
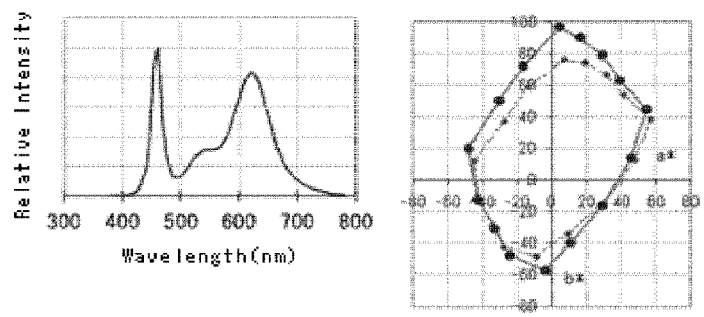
FIG. 10 is a diagram showing a spectral power distribution when assuming that light, emitted from a packaged LED which incorporates a semiconductor light-emitting element with a peak wavelength of 459 nm and which comprises a green phosphor and a red phosphor, illuminates the 15 Munsell renotation color samples, and a CIELAB color space on which are respectively plotted a* values and b* values of the 15 Munsell renotation color samples when illuminated by the LED and when illuminated by reference light (Duv=−0.0400)
Figure 11:
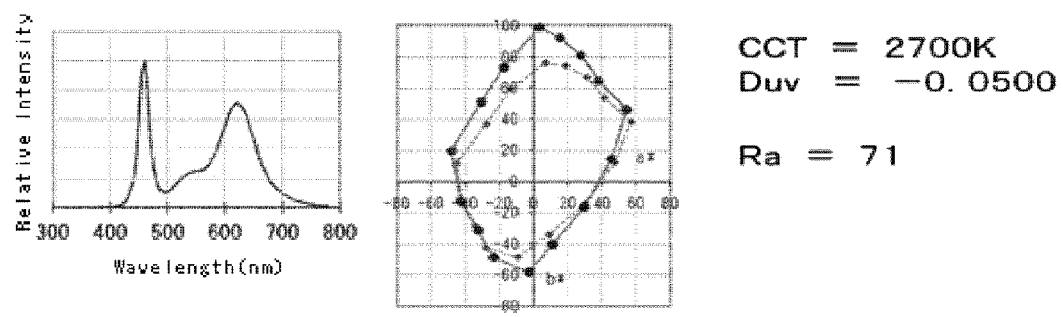
FIG. 11 is a diagram showing a spectral power distribution when assuming that light, emitted from a packaged LED which incorporates a semiconductor light-emitting element with a peak wavelength of 459 nm and which comprises a green phosphor and a red phosphor, illuminates the 15 Munsell renotation color samples, and a CIELAB color space on which are respectively plotted a* values and b* values of the 15 Munsell renotation color samples when illuminated by the LED and when illuminated by reference light (Duv=−0.0500)

The test lights shown in FIGS. 5 and 6 represent examples where $D_{uv}$ is shifted in a positive direction from +0.0100 to +0.0150. As shown, when $D_{uv}$ is shifted in the positive direction, it was predicted that the saturation of the 15 color samples can be varied over a wider hue range as compared to the case of the test light with $D_{uv}$=0.0000. In addition, it was found that the saturation of the 15 color samples can be varied relatively uniformly as compared to the case of the test light with $D_{uv}$=0.0000. Moreover, with the case of the calculational reference lights and the case of the test lights shown in FIGS. 5 and 6, it was predicted that the color appearances of almost all of the 15 color samples with the exception of the blue to greenish blue region will dull when $D_{uv}$ is shifted in the positive direction. Furthermore, a trend was also predicted in that the greater the shift of $D_{uv}$ in the positive direction, the lower the saturation. Ra calculated based on the spectral power distributions of FIGS. 5 and 6 were 94 and 89, respectively.

On the other hand, the test lights shown in FIGS. 7 to 11 represent examples where $D_{uv}$ is shifted in a negative direction from −0.0100 to −0.0500. As shown, when $D_{uv}$ is shifted in the negative direction, it was found that the saturation of the 15 color samples can be varied over a wider hue range as compared to the case of the test light with $D_{uv}$=0.0000. It was also found that the saturation of the 15 color samples can be varied relatively uniformly as compared to the case of the test light with $D_{uv}$=0.0000. Moreover, it was predicted that the color appearances of almost all of the 15 color samples with the exception of the blue to greenish blue region and the purple region will appear vividly when $D_{uv}$ is shifted in the negative direction between a case where illumination by the calculational reference lights is assumed and a case where illumination by the test lights shown in FIGS. 7 to 11 is assumed. Furthermore, a trend was also predicted in that the greater the shift of $D_{uv}$ in the negative direction, the higher the saturation. Ra calculated based on the spectral power distributions of FIGS. 7 to 11 was 92, 88, 83, 77, and 71, respectively. According to currently prevailing belief, it was predicted that the greater the shift of $D_{uv}$ in the negative direction, the further the deviation of color appearance from a case of illumination with reference light and, therefore, the greater the deterioration of color appearance.

In consideration thereof, the present inventor mathematically examined predictions of color appearances of the 15 most vivid color samples which are positioned outermost in the Munsell renotation color system when assigning various $D_{uv}$ values to test lights in which spectrum-forming light-emitting elements (light-emitting materials) differ from each other while comparing with calculational reference lights.

The 10 spectral power distributions shown in FIGS. 12 to 21 represent results of varying $D_{uv}$ from −0.0500 to +0.0400 at a same CCT (4000 K) when a packaged LED incorporating four semiconductor light-emitting elements is assumed. Peak wavelengths of the four semiconductor light-emitting elements were respectively set to 459 nm, 528 m, 591 nm, and 662 nm. Expected color appearances of the 15 color samples when assuming illumination by the 10 respective test lights and illumination by the calculational reference lights corresponding to the respective test lights are as represented in the CIELAB color spaces in FIGS. 12 to 21. In the drawings, points connected by dotted lines represent results obtained with the calculational reference lights and points connected by solid lines represent results regarding the respective test lights. Moreover, while a direction perpendicular to the plane of paper represents lightness, only a* and b* axes were plotted for the sake of convenience.

Figure 12:
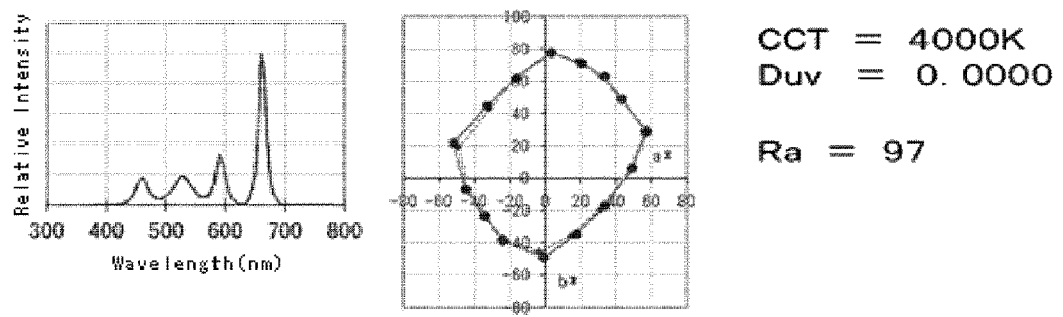
FIG. 12 is a diagram showing a spectral power distribution when assuming that light emitted from a packaged LED which incorporates four semiconductor light-emitting elements illuminates the 15 Munsell renotation color samples, and a CIELAB color space on which are respectively plotted a* values and b* values of the 15 Munsell renotation color samples when illuminated by the LED and when illuminated by reference light (Duv=0.0000)
Figure 13:
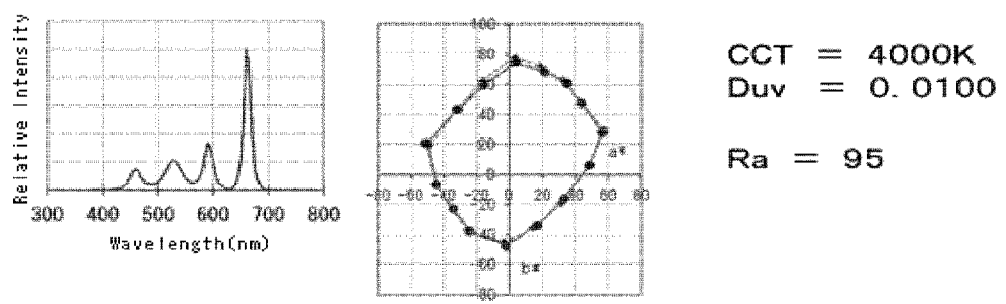
FIG. 13 is a diagram showing a spectral power distribution when assuming that light emitted from a packaged LED which incorporates four semiconductor light-emitting elements illuminates the 15 Munsell renotation color samples, and a CIELAB color space on which are respectively plotted a* values and b* values of the 15 Munsell renotation color samples when illuminated by the LED and when illuminated by reference light (Duv=0.0100)
Figure 14:
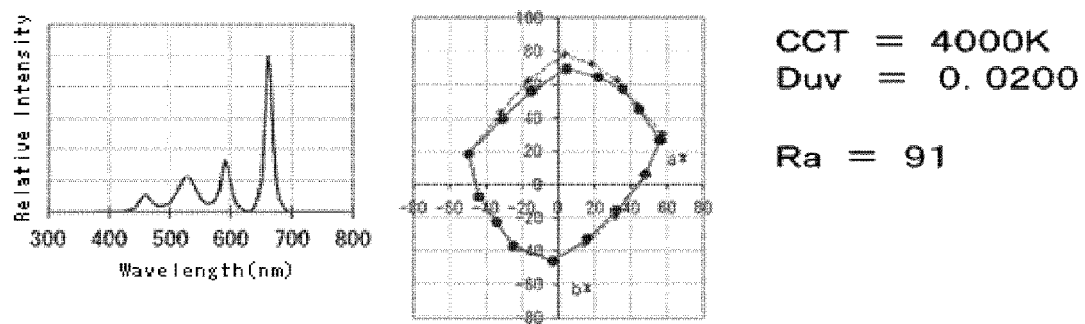
FIG. 14 is a diagram showing a spectral power distribution when assuming that light emitted from a packaged LED which incorporates four semiconductor light-emitting elements illuminates the 15 Munsell renotation color samples, and a CIELAB color space on which are respectively plotted a* values and b* values of the 15 Munsell renotation color samples when illuminated by the LED and when illuminated by reference light (Duv=0.0200)
Figure 15:
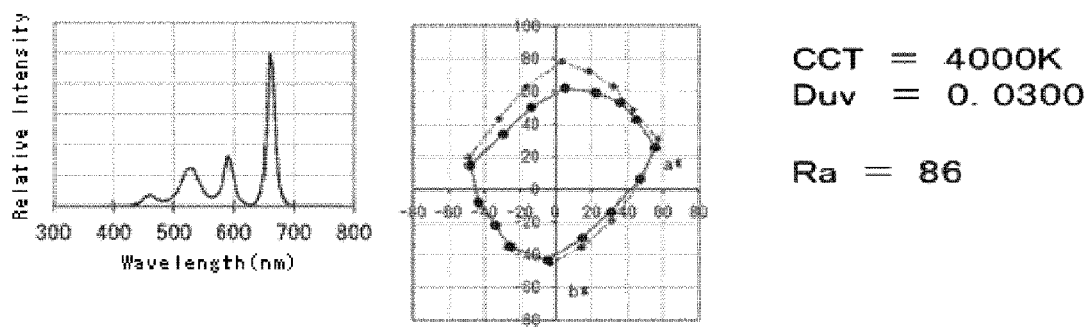
FIG. 15 is a diagram showing a spectral power distribution when assuming that light emitted from a packaged LED which incorporates four semiconductor light-emitting elements illuminates the 15 Munsell renotation color samples, and a CIELAB color space on which are respectively plotted a* values and b* values of the 15 Munsell renotation color samples when illuminated by the LED and when illuminated by reference light (Duv=0.0300)
Figure 16:
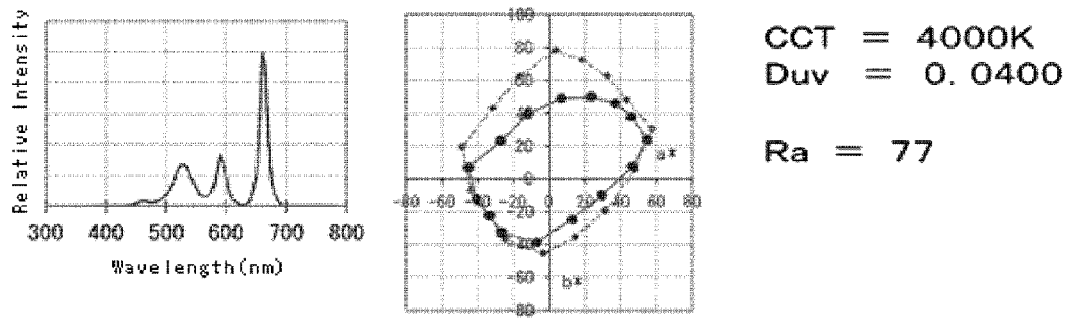
FIG. 16 is a diagram showing a spectral power distribution when assuming that light emitted from a packaged LED which incorporates four semiconductor light-emitting elements illuminates the 15 Munsell renotation color samples, and a CIELAB color space on which are respectively plotted a* values and b* values of the 15 Munsell renotation color samples when illuminated by the LED and when illuminated by reference light (Duv=0.0400)
Figure 17:
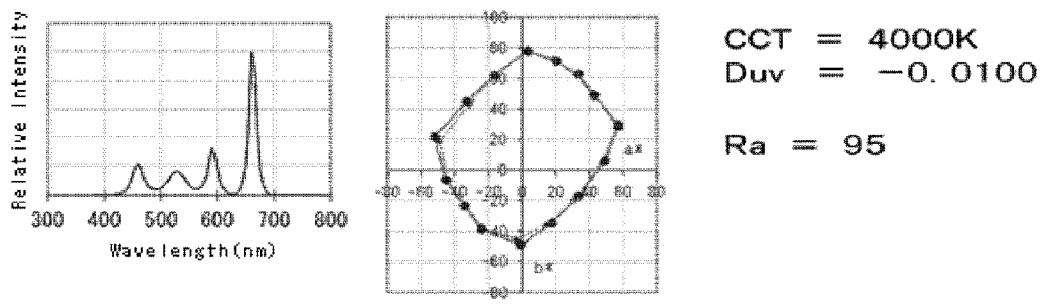
FIG. 17 is a diagram showing a spectral power distribution when assuming that light emitted from a packaged LED which incorporates four semiconductor light-emitting elements illuminates the 15 Munsell renotation color samples, and a CIELAB color space on which are respectively plotted a* values and b* values of the 15 Munsell renotation color samples when illuminated by the LED and when illuminated by reference light (Duv=−0.0100)
Figure 18:
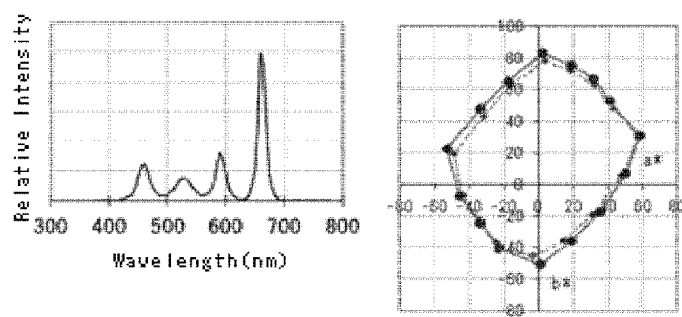
FIG. 18 is a diagram showing a spectral power distribution when assuming that light emitted from a packaged LED which incorporates four semiconductor light-emitting elements illuminates the 15 Munsell renotation color samples, and a CIELAB color space on which are respectively plotted a* values and b* values of the 15 Munsell renotation color samples when illuminated by the LED and when illuminated by reference light (Duv=−0.0200)
Figure 19:
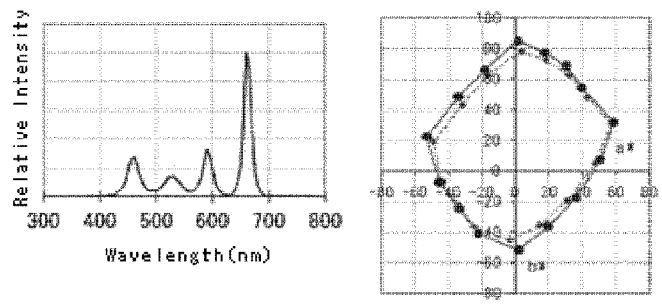
FIG. 19 is a diagram showing a spectral power distribution when assuming that light emitted from a packaged LED which incorporates four semiconductor light-emitting elements illuminates the 15 Munsell renotation color samples, and a CIELAB color space on which are respectively plotted a* values and b* values of the 15 Munsell renotation color samples when illuminated by the LED and when illuminated by reference light (Duv=−0.0300)
Figure 20:
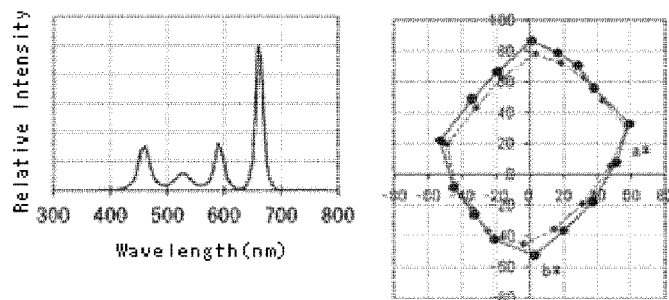
FIG. 20 is a diagram showing a spectral power distribution when assuming that light emitted from a packaged LED which incorporates four semiconductor light-emitting elements illuminates the 15 Munsell renotation color samples, and a CIELAB color space on which are respectively plotted a* values and b* values of the 15 Munsell renotation color samples when illuminated by the LED and when illuminated by reference light (Duv=−0.0400)
Figure 21:
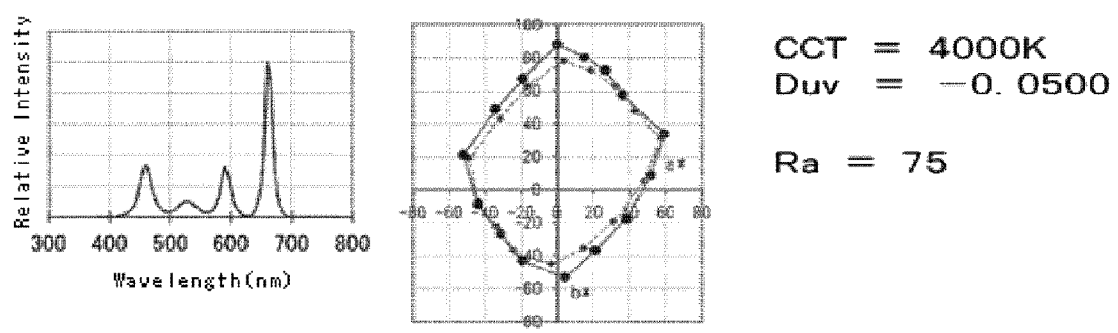
FIG. 21 is a diagram showing a spectral power distribution when assuming that light emitted from a packaged LED which incorporates four semiconductor light-emitting elements illuminates the 15 Munsell renotation color samples, and a CIELAB color space on which are respectively plotted a* values and b* values of the 15 Munsell renotation color samples when illuminated by the LED and when illuminated by reference light (Duv=−0.0500)

With the test light with $D_{uv}$=0.0000 shown in FIG. 12, it was predicted that the color appearances of the 15 color samples will closely resemble one another between a case where illumination by the calculational reference light is assumed and a case where illumination by the test light shown in FIG. 12 is assumed. Ra calculated based on the spectral power distribution was high at 98.

The test lights shown in FIGS. 13 to 16 represent examples where $D_{uv}$ is shifted in a positive direction from +0.0100 to +0.0400. As shown, when $D_{uv}$ is shifted in the positive direction, it was found that the saturation of the 15 color samples can be varied over a wider hue range as compared to the case of the test light with $D_{uv}$=0.0000. It was also found that the saturation of the 15 color samples can be varied relatively uniformly as compared to the case of the test light with $D_{uv}$=0.0000. Moreover, it was predicted that the color appearances of almost all of the 15 color samples with the exception of the blue to greenish blue region and the red region will appear dull when $D_{uv}$ is shifted in the positive direction between a case where illumination by the calculational reference lights is assumed and a case where illumination by the test lights shown in FIGS. 13 to 16 is assumed. Furthermore, a trend was also predicted in that the greater the shift of $D_{uv}$ in the positive direction, the lower the saturation. Ra calculated based on the spectral power distributions of FIGS. 13 to 16 was 95, 91, 86, and 77, respectively. According to currently prevailing belief, it was predicted that the greater the shift of $D_{uv}$ in the positive direction, the further the deviation of color appearance from a case of illumination with reference light and, therefore, the greater the deterioration of color appearance.

On the other hand, the test lights shown in FIGS. 17 to 21 represent examples where $D_{uv}$ is shifted in a negative direction from −0.0100 to −0.0500. As shown, when $D_{uv}$ is shifted in the negative direction, it was found that the saturation of the 15 color samples can be varied over a wider hue range as compared to the case of the test light with $D_{uv}$=0.0000. It was also found that the saturation of the 15 color samples can be varied relatively uniformly as compared to the case of the test light with $D_{uv}$=0.0000. Moreover, it was predicted that the color appearances of almost all of the 15 color samples with the exception of the blue to greenish blue region and the red region will appear vividly when $D_{uv}$ is shifted in the negative direction between a case where illumination by the calculational reference lights is assumed and a case where illumination by the test lights shown in FIGS. 17 to 21 is assumed. Furthermore, a trend was also predicted in that the greater the shift of $D_{uv}$ in the negative direction, the higher the saturation. Ra calculated based on the spectral power distributions of FIGS. 17 to 21 was 95, 91, 86, 81, and 75, respectively. According to currently prevailing belief, it was predicted that the greater the shift of $D_{uv}$ in the negative direction, the further the deviation of color appearance from a case of illumination with reference light and, therefore, the greater the deterioration of color appearance.

In addition, the present inventor mathematically examined predictions of color appearances of the 15 most vivid color samples which are positioned outermost in the Munsell renotation color system when assigning various $D_{uv}$ values to test lights in which spectrum-forming light-emitting elements (light-emitting materials) further differ from each other while comparing with calculational reference light.

The 11 spectral power distributions shown in FIGS. 22 to 32 represent calculation results of varying $D_{uv}$ from −0.0448 to +0.0496 at a close CCT (approximately 5500 K) when assuming a packaged LED which incorporates a purple semiconductor light-emitting element and which uses the purple semiconductor light-emitting element as an excitation light source of a blue phosphor, a green phosphor, and a red phosphor. A peak wavelength of the incorporated semiconductor light-emitting element was set to 405 nm. Moreover, the result shown in FIG. 32 was obtained without including a green phosphor in order to cause $D_{uv}$ to take an excessively negative value. Mathematically expected color appearances of the 15 color samples when assuming illumination by the 11 respective test lights and illumination by calculational reference lights corresponding to the respective test lights are as represented in the CIELAB color spaces in FIGS. 22 to 32. In the drawings, points connected by dotted lines represent results regarding the calculational reference lights and points connected by solid lines represent results regarding the respective test lights. Moreover, while a direction perpendicular to the plane of paper represents lightness, only a* and b* axes were plotted for the sake of convenience.

Figure 22:
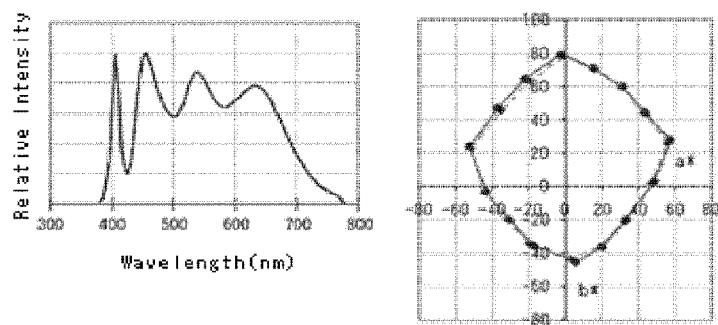
FIG. 22 is a diagram showing a spectral power distribution when assuming that light, emitted from a packaged LED which incorporates a semiconductor light-emitting element with a peak wavelength of 405 nm and which comprises a blue phosphor, a green phosphor, and a red phosphor, illuminates the 15 Munsell renotation color samples, and a CIELAB color space on which are respectively plotted a* values and b* values of the 15 Munsell renotation color samples when illuminated by the LED and when illuminated by reference light (Duv=0.0001)
Figure 23:
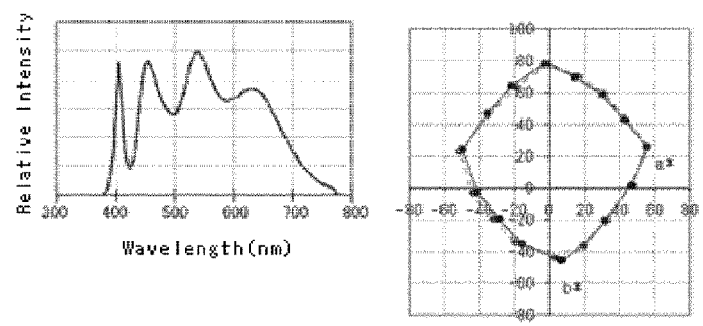
FIG. 23 is a diagram showing a spectral power distribution when assuming that light, emitted from a packaged LED which incorporates a semiconductor light-emitting element with a peak wavelength of 405 nm and which comprises a blue phosphor, a green phosphor, and a red phosphor, illuminates the 15 Munsell renotation color samples, and a CIELAB color space on which are respectively plotted a* values and b* values of the 15 Munsell renotation color samples when illuminated by the LED and when illuminated by reference light (Duv=0.0100)
Figure 24:
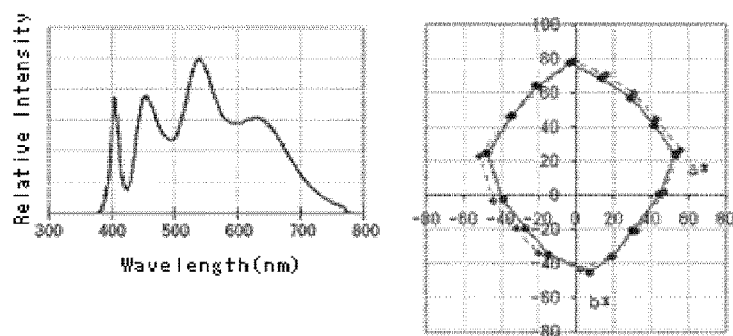
FIG. 24 is a diagram showing a spectral power distribution when assuming that light, emitted from a packaged LED which incorporates a semiconductor light-emitting element with a peak wavelength of 405 nm and which comprises a blue phosphor, a green phosphor, and a red phosphor, illuminates the 15 Munsell renotation color samples, and a CIELAB color space on which are respectively plotted a* values and b* values of the 15 Munsell renotation color samples when illuminated by the LED and when illuminated by reference light (Duv=0.0194)
Figure 25:
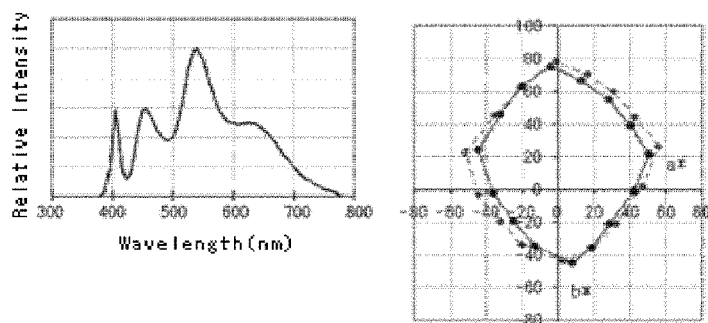
FIG. 25 is a diagram showing a spectral power distribution when assuming that light, emitted from a packaged LED which incorporates a semiconductor light-emitting element with a peak wavelength of 405 nm and which comprises a blue phosphor, a green phosphor, and a red phosphor, illuminates the 15 Munsell renotation color samples, and a CIELAB color space on which are respectively plotted a* values and b* values of the 15 Munsell renotation color samples when illuminated by the LED and when illuminated by reference light (Duv=0.0303)
Figure 26:
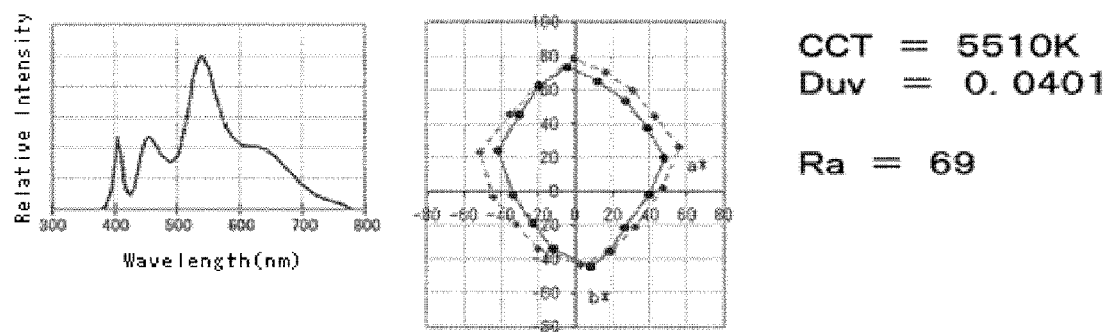
FIG. 26 is a diagram showing a spectral power distribution when assuming that light, emitted from a packaged LED which incorporates a semiconductor light-emitting element with a peak wavelength of 405 nm and which comprises a blue phosphor, a green phosphor, and a red phosphor, illuminates the 15 Munsell renotation color samples, and a CIELAB color space on which are respectively plotted a* values and b* values of the 15 Munsell renotation color samples when illuminated by the LED and when illuminated by reference light (Duv=0.0401)
Figure 27:
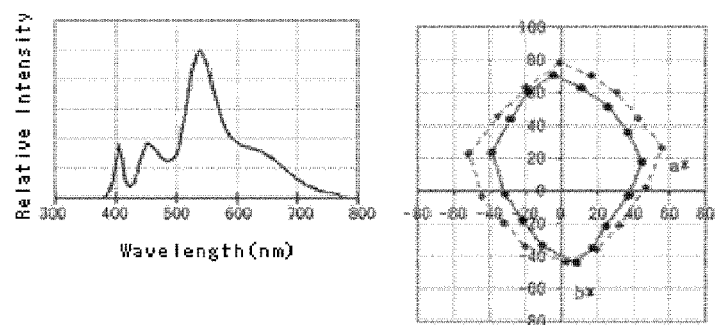
FIG. 27 is a diagram showing a spectral power distribution when assuming that light, emitted from a packaged LED which incorporates a semiconductor light-emitting element with a peak wavelength of 405 nm and which comprises a blue phosphor, a green phosphor, and a red phosphor, illuminates the 15 Munsell renotation color samples, and a CIELAB color space on which are respectively plotted a* values and b* values of the 15 Munsell renotation color samples when illuminated by the LED and when illuminated by reference light (Duv=0.0496)
Figure 28:
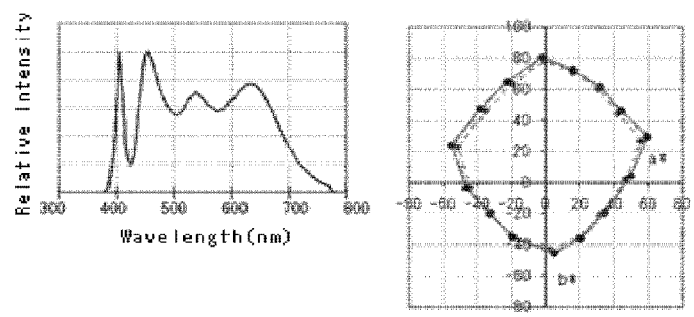
FIG. 28 is a diagram showing a spectral power distribution when assuming that light, emitted from a packaged LED which incorporates a semiconductor light-emitting element with a peak wavelength of 405 nm and which comprises a blue phosphor, a green phosphor, and a red phosphor, illuminates the 15 Munsell renotation color samples, and a CIELAB color space on which are respectively plotted a* values and b* values of the 15 Munsell renotation color samples when illuminated by the LED and when illuminated by reference light (Duv=−0.0100)
Figure 29:
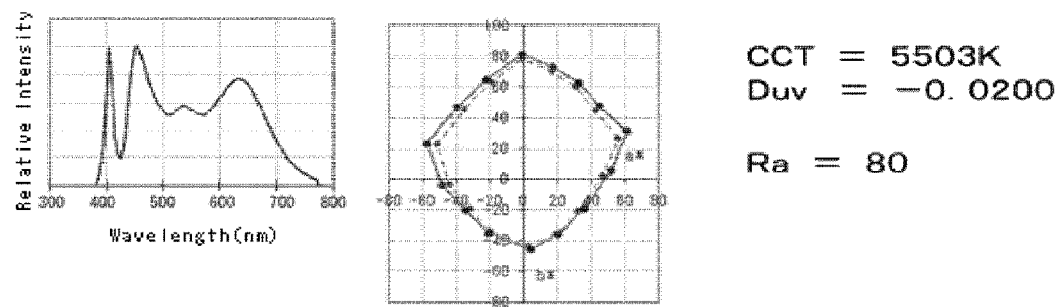
FIG. 29 is a diagram showing a spectral power distribution when assuming that light, emitted from a packaged LED which incorporates a semiconductor light-emitting element with a peak wavelength of 405 nm and which comprises a blue phosphor, a green phosphor, and a red phosphor, illuminates the 15 Munsell renotation color samples, and a CIELAB color space on which are respectively plotted a* values and b* values of the 15 Munsell renotation color samples when illuminated by the LED and when illuminated by reference light (Duv=−0.0200)
Figure 30:
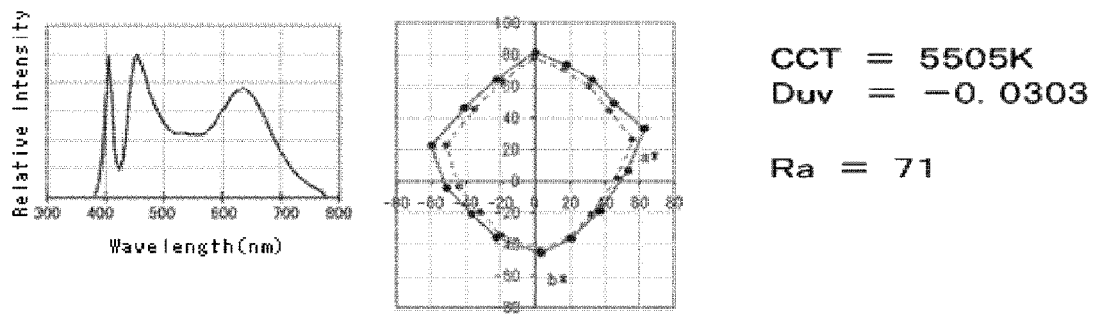
FIG. 30 is a diagram showing a spectral power distribution when assuming that light, emitted from a packaged LED which incorporates a semiconductor light-emitting element with a peak wavelength of 405 nm and which comprises a blue phosphor, a green phosphor, and a red phosphor, illuminates the 15 Munsell renotation color samples, and a CIELAB color space on which are respectively plotted a* values and b* values of the 15 Munsell renotation color samples when illuminated by the LED and when illuminated by reference light (Duv=−0.0303)
Figure 31:
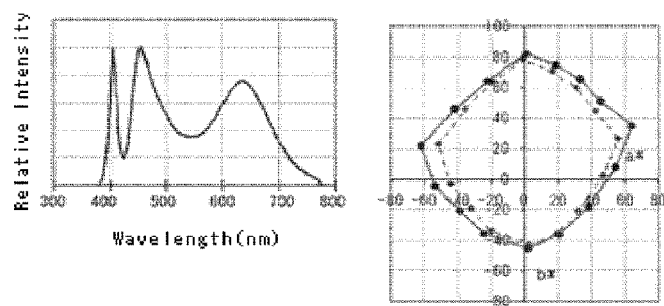
FIG. 31 is a diagram showing a spectral power distribution when assuming that light, emitted from a packaged LED which incorporates a semiconductor light-emitting element with a peak wavelength of 405 nm and which comprises a blue phosphor, a green phosphor, and a red phosphor, illuminates the 15 Munsell renotation color samples, and a CIELAB color space on which are respectively plotted a* values and b* values of the 15 Munsell renotation color samples when illuminated by the LED and when illuminated by reference light (Duv=−0.0403)
Figure 32:
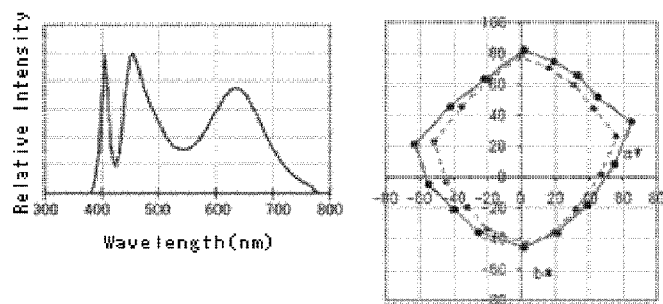
FIG. 32 is a diagram showing a spectral power distribution when assuming that light, emitted from a packaged LED which incorporates a semiconductor light-emitting element with a peak wavelength of 405 nm and which comprises a blue phosphor and a red phosphor, illuminates the 15 Munsell renotation color samples, and a CIELAB color space on which are respectively plotted a* values and b* values of the 15 Munsell renotation color samples when illuminated by the LED and when illuminated by reference light (Duv=−0.0448)

With the test light with $D_{uv}$=0.0001 shown in FIG. 22, it was predicted that the color appearances of the 15 color samples will closely resemble one another between a case of the calculational reference light and a case of the test light shown in FIG. 22. Ra calculated based on the spectral power distribution was high at 96.

The test lights shown in FIGS. 23 to 27 represent examples where $D_{uv}$ is shifted in a positive direction from +0.0100 to +0.0496. As shown, when $D_{uv}$ is shifted in the positive direction, it was found that the saturation of the 15 color samples can be varied over a wider hue range as compared to the case of the test light with $D_{uv}$=0.0001. It was also found that the saturation of the 15 color samples can be varied relatively uniformly as compared to the case of the test light with $D_{uv}$=0.0001. Moreover, it was predicted that the color appearances of almost all of the 15 color samples with the exception of the blue region will appear dull when $D_{uv}$ is shifted in the positive direction between a case where illumination by the calculational reference lights is assumed and a case where illumination by the test lights shown in FIGS. 23 to 27 is assumed. Furthermore, a trend was also predicted in that the greater the shift of $D_{uv}$ in the positive direction, the lower the saturation. Ra calculated based on the spectral power distributions of FIGS. 23 to 27 was 92, 85, 76, 69, and 62, respectively. According to currently prevailing belief, it was predicted that the greater the shift of $D_{uv}$ in the positive direction, the further the deviation of color appearance from a case of illumination with reference light and, therefore, the greater the deterioration of color appearance.

On the other hand, the test lights shown in FIGS. 28 to 32 represent examples where $D_{uv}$ is shifted in a negative direction from −0.0100 to −0.0448. As described earlier, $D_{uv}$= −0.0448 is realized as a system that does not include a green phosphor. As shown, when $D_{uv}$ is shifted in the negative direction, it was found that the saturation of the 15 color samples can be varied over a wider hue range as compared to the case of the test light with $D_{uv}$=0.0001. It was also found that the saturation of the 15 color samples can be varied relatively uniformly as compared to the case of the test light with $D_{uv}$=0.0001. Moreover, it was predicted that the color appearances of almost all of the 15 color samples with the exception of the blue region will appear vivid when $D_{uv}$ is shifted in the negative direction between a case where illumination by the calculational reference lights is assumed and a case where illumination by the test lights shown in FIGS. 28 to 32 is assumed. Furthermore, a trend was also predicted in that the greater the shift of $D_{uv}$ in the negative direction, the higher the saturation. Ra calculated based on the test lights of FIGS. 28 to 32 was 89, 80, 71, 61, and 56, respectively. According to currently prevailing belief, it was predicted that the greater the shift of $D_{uv}$ in the negative direction, the further the deviation of color appearance from a case of illumination with reference light and, therefore, the greater the deterioration of color appearance.

[Summary of Examination of Calculation Regarding Saturation Control and $D_{uv}$ Value]

From the examination of calculations thus far, the following was predicted "based on currently prevailing wisdom".

(1) Test light with a chromaticity point in a vicinity of $D_{uv}$=0.0000 has a low degree of freedom with respect to varying saturation of the 15 color samples. Specifically, it is difficult to simultaneously vary saturation of a large number of hues of the 15 high-chroma color samples, to relatively uniformly increase or decrease saturation of many hues, and the like.

(2) When $D_{uv}$ of test light is set to a positive value, saturation of the 15 color samples can be lowered relatively easily. The saturation of the 15 color samples can be lowered over a wider hue range and in a relatively uniform manner as compared to the case of the test light with $D_{uv}$=0.0000. Furthermore, the greater the shift of $D_{uv}$ in the positive direction, the lower the saturation. In addition, since Ra further decreases, it was predicted that in visual experiments or the like, the greater the shift of $D_{uv}$ in the positive direction, the greater the deviation of color appearance in a case of illumination by test light from a case where an actual illuminated object or the like is illuminated by experimental reference light or experimental pseudo-reference light and, therefore, the greater the deterioration of color appearance.

(3) When $D_{uv}$ is set to a negative value, saturation of the 15 color samples can be raised relatively easily. The saturation of the 15 color samples can be raised over a wider hue range and in a relatively uniform manner as compared to the case of the test light with $D_{uv}$=0.0000. Furthermore, the greater the shift of $D_{uv}$ in the negative direction, the higher the saturation. In addition, since Ra further decreases, it was predicted that the greater the shift of $D_{uv}$ in the negative direction, the greater the deviation of color appearance in a case of illumination by test light from a case where an actual illuminated object or the like is illuminated by experimental reference light or experimental pseudo-reference light and, therefore, the greater the deterioration of color appearance.

The above are predictions made "based on currently prevailing wisdom" from the examination of calculations thus far.

[Introduction of Quantitative Indices]

In the first to fifth inventions of the present invention, the following quantitative indices were introduced in preparation of a detailed discussion regarding characteristics of a spectral power distribution or a color appearance itself, luminous efficacy of radiation, and the like and in preparation of a detailed discussion regarding color appearance.

[Introduction of Quantitative Index Regarding Color Appearance]

First, it was decided that an a* value and a b* value of the 15 color samples in a CIE 1976 L*a*b* color space of test light as measured at a position of an object when the object is illuminated by the test light (according to the illumination method of the fourth invention of the present invention) and/or test light when a light-emitting device emits the test light in a main radiant direction (according to the light-emitting device of the first invention of the present invention) be respectively denoted by $a^*_{nSSL}$ and $b^*_{nSSL}$ (where n is a natural number from 1 to 15), hue angles of the 15 color samples be respectively denoted by $\theta_{nSSL}$ (degrees) (where n is a natural number from 1 to 15), an a* value and a b* value of the 15 color samples in a CIE 1976 L*a*b* color space when mathematically assuming illumination by calculational reference light that is selected according to a CCT of the test light (black-body radiator when lower than 5000 K and CIE daylight when equal to or higher than 5000 K) be respectively denoted by $a^*_{nref}$ and $b^*_{nref}$ (where n is a natural number from 1 to 15), hue angles of the 15 color samples be respectively denoted by $\theta_{nref}$ (degrees) (where n is a natural number from 1 to 15), and an absolute value of respective differences in hue angles $\Delta h_n$ (degrees) (where n is a natural number from 1 to 15) of the 15 Munsell renotation color samples when illuminated by the two lights be defined as $$|\Delta h_n| = |\theta_{nSSL} - \theta_{nref}|.$$

That is, $|\Delta h_n|$ involves "$\Delta h_1$, $\Delta h_2$, $\Delta h_3$, . . . and $\Delta h_{15}$".

This was done because mathematically-predicted differences in hue angles related to the 15 Munsell renotation color samples specially selected in the first to fifth inventions of the present invention were considered important indices for evaluating various objects or color appearances of the objects as a whole and realizing high visibility, good color appearance of chromatic colors and improved feeling of brightness when performing visual experiments using test light and experimental reference light or experimental pseudo-reference light.

In addition, each saturation differences $\Delta C_n$ (where n is a natural number from 1 to 15) of the 15 Munsell renotation color samples when assuming illumination by two lights, namely, test light and calculational reference light, were respectively defined as $$\Delta C_n = \sqrt{\{(a^*_{nSSL})^2 + (b^*_{nSSL})^2\}} - \sqrt{\{(a^*_{nref})^2 + (b^*_{nref})^2\}}.$$

Furthermore, formula (1) below which represents an average saturation difference of the 15 Munsell renotation color samples (hereinafter sometimes referred to as "$\text{SAT}_{av}$") was also considered to be an important index.

[Expression 41]

$$\frac{\sum_{n=1}^{15} \Delta C_n}{15} \quad (3)$$

Moreover, if a maximum saturation difference value among the 15 Munsell renotation color samples is denoted by $\Delta C_{max}$ and a minimum saturation difference value among the 15 Munsell renotation color samples is denoted by $\Delta C_{min}$, then $|\Delta C_{max} - \Delta C_{min}|$ representing a difference between the maximum saturation difference value and the minimum saturation difference value (difference among differences between maximum and minimum degrees of saturation) was also considered an important index. This was done because various characteristics related to differences in saturation among the 15 Munsell renotation color samples specially selected in the first to fifth inventions of the present invention were considered important indices for evaluating various objects or color appearances of the objects as a whole and realizing a color appearance or an object appearance that is natural, vivid, highly visible, and comfortable when performing visual experiments using test light and experimental reference light or experimental pseudo-reference light.

[Introduction of Quantitative Index Regarding Spectral Power Distribution]

In the first to fifth inventions of the present invention, the following two quantitative indices were introduced in order to further discuss radiometric properties and photometric properties of spectral power distributions. One is an index $A_{cg}$ and the other is luminous efficacy of radiation K (lm/W).

The index $A_{cg}$ is an attempt to describe a difference between a color appearance by experimental reference light or experimental pseudo-reference light and a color appearance by test light as a radiometric property and a photometric property of a spectral power distribution or a spectrum shape. As a result of various examinations, the index $A_{cg}$ has been defined in the first to fifth inventions of the present invention as follows.

Let $\phi_{ref}(\lambda)$ and $\phi_{SSL}(\lambda)$ respectively denote spectral power distributions of calculational reference light and test light which represent color stimuli that differ from one another when measuring light emitted in a main radiant direction from a light-emitting device (according to the light-emitting device of the first invention of the present invention) or when measured at a position of an illuminated object (according to the illumination method of the fourth invention of the present invention), $x(\lambda)$, $y(\lambda)$, and $z(\lambda)$ denote a color-matching function, and ($X_{ref}$, $Y_{ref}$, $Z_{ref}$) and ($X_{SSL}$, $Y_{SSL}$, $Z_{SSL}$) respectively denote tristimulus values corresponding to the calculational reference light and the test light. In this case, the following is satisfied regarding the calculational reference light and the test light, where k denotes a constant.

$$Y_{ref} = k\int\phi_{ref}(\lambda) \cdot y(\lambda) d\lambda$$

$$Y_{SSL} = k\int\phi_{SSL}(\lambda) \cdot y(\lambda) d\lambda$$

At this point, normalized spectral power distributions obtained by normalizing the spectral power distributions of the calculational reference light and the test light by their respective Y were defined as $$S_{ref}(\lambda) = \phi_{ref}(\lambda)/Y_{ref}$$

and $$S_{SSL}(\lambda) = \phi_{SSL}(\lambda)/Y_{SSL},$$

and a difference between the normalized reference light spectral power distribution and the normalized test light spectral power distribution was represented by $$\Delta S(\lambda) = S_{ref}(\lambda) - S_{SSL}(\lambda).$$

Furthermore, at this point, the index $A_{cg}$ was defined as follows.

$$A_{cg} = \int_{\Lambda 1}^{\Lambda 2} \Delta S(\lambda) d\lambda + \int_{\Lambda 2}^{\Lambda 3} (-\Delta S(\lambda)) d\lambda + \int_{\Lambda 3}^{\Lambda 4} \Delta S(\lambda) d\lambda \quad \text{[Expression 42]}$$

Moreover, upper and lower limit wavelengths of the integrals were respectively set to $\Lambda 1 = 380$ nm, $\Lambda 2 = 495$ nm, and $\Lambda 3 = 590$ nm.

In addition, $\Lambda 4$ was defined divided into the following two cases. First, in the normalized test light spectral power distribution $S_{SSL}(\lambda)$, when a wavelength which provides a longest wavelength local maximum value within 380 nm to 780 nm is denoted by $\lambda_R$ (nm) and a spectral intensity of the wavelength $\lambda_R$ (nm) is denoted by $S_{SSL}(\lambda_R)$, a wavelength which is on a longer wavelength-side of $\lambda_R$ and which has an intensity of $S_{SSL}(\lambda_R)/2$ was adopted as $\Lambda 4$. If no such wavelength exists within a range up to 780 nm, then $\Lambda 4$ was set to 780 nm.

Figure 33:
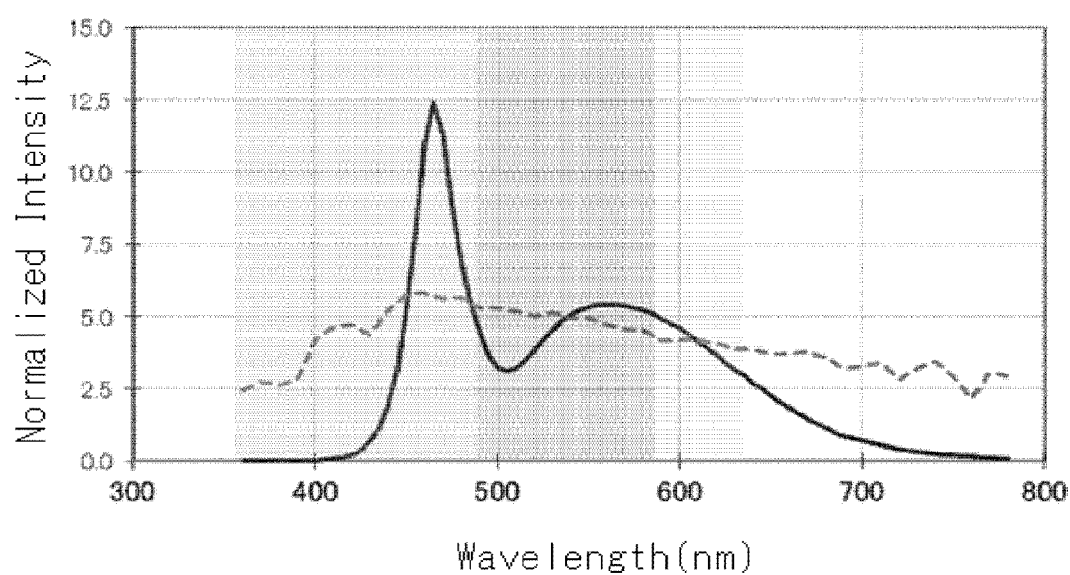
FIG. 33 is a diagram showing an integral range for a parameter $A_{cg}$ (when a CCT is 5000 K or higher)
Figure 34:
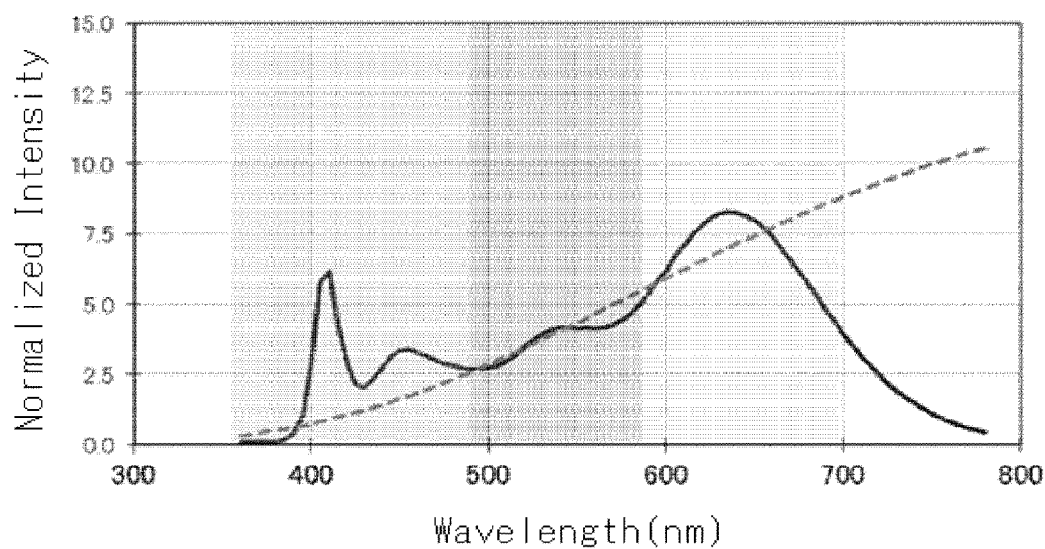
FIG. 34 is a diagram showing an integral range of the parameter $A_{cg}$ (when a CCT is lower than 5000 K)

The index $A_{cg}$ is used when a visible range related to radiations that are color stimuli is roughly divided into a short wavelength range (or the blue region including purple and the like), an intermediate wavelength range (the green region including yellow and the like), and a long wavelength range (the red region including orange and the like) in order to determine whether a concave and/or a convex shape of a spectrum exist at an appropriate intensity and at an appropriate position in a normalized test light spectral power distribution as compared to a mathematically normalized reference light spectral power distribution. As illustrated in FIGS. 33 and 34, long wavelength integral ranges differ according to positions of a longest wavelength local maximum value. In addition, selections of calculational reference light differ according to a CCT of test light. In the case of FIG. 33, since the CCT of the test light depicted by a solid line in FIG. 33 is equal to or higher than 5000 K, CIE daylight is selected as the reference light as depicted by a dotted line in FIG. 33. In the case of FIG. 34, since the CCT of the test light depicted by a solid line in FIG. 34 is lower than 5000 K, black-body radiator is selected as the reference light as depicted by a dotted line in FIG. 34. Moreover, shaded portions in the drawings schematically represent integral ranges of the short wavelength range, the intermediate wavelength range, and the long wavelength range.

In the short wavelength range, a first term of $A_{cg}$ (an integral of $\Delta S(\lambda)$) is more likely to have a negative value when a spectrum intensity of the normalized test light spectral power distribution is higher than that of the mathematically normalized reference light spectral power distribution. In the intermediate wavelength range, conversely, a second term of $A_{cg}$ (an integral of $-\Delta S(\lambda)$) is more likely to have a negative value when a spectrum intensity of the normalized test light spectral power distribution is lower than that of the normalized reference light spectral power distribution. Furthermore, in the long wavelength range, a third term of $A_{cg}$ (an integral of $\Delta S(\lambda)$) is more likely to have a negative value when a spectrum intensity of the normalized test light spectral power distribution is higher than that of the normalized reference light spectral power distribution.

In addition, as described earlier, the calculational reference light varies according to the CCT of the test light. In other words, black-body radiator is used as the calculational reference light when the CCT of the test light is lower than 5000 K, and defined CIE daylight is used as the calculational reference light when the CCT of the test light is equal to or higher than 5000 K. When deriving a value of the index $A_{cg}$, mathematically defined black-body radiator or CIE daylight was used for $\phi_{ref}(\lambda)$, while a function used based on a simulation or a value actually measured in an experiment was used for $\phi_{SSL}(\lambda)$.

Furthermore, when measuring light emitted in a main radiant direction from a light-emitting device (according to the light-emitting device of the first invention of the present invention) or when evaluating the test light spectral power distribution $\phi_{SSL}(\lambda)$ when measured at a position of an illuminated object (according to the illumination method of the present invention), the widely-used definition below was adopted for luminous efficacy of radiation K (lm/W).

$$K = Km \times \int_{380}^{780} \{\phi_{SSL}(\lambda) \times V(\lambda)\} d\lambda / [\cdot_{380}^{780} \phi_{SSL}(\lambda) d\lambda]$$ [Expression 43]

In the equation above, $K_m$: maximum luminous efficacy (lm/W), $V(\lambda)$: spectral luminous efficiency, and $\lambda$: wavelength (nm).

The luminous efficacy of radiation K (lm/W) of the test light spectral power distribution $\phi_{SSL}(\lambda)$ when measuring light emitted in a main radiant direction from a light-emitting device (according to the light-emitting device of the first invention of the present invention) or when measured at a position of an illuminated object (according to the illumination method of the fourth invention of the present invention) is an amount that equals luminous efficacy of a source η (lm/W) when an efficiency of the spectral power distribution which is attributable to its shape and which is related to characteristics of all materials constituting the light-emitting device (for example, efficiencies such as internal quantum efficiency and light extraction efficiency of a semiconductor light-emitting element, internal quantum efficiency and external quantum efficiency of a phosphor, and light transmission characteristics of an encapsulant) is 100%.

[Details of Second Step]

In the first embodiment of the first to fifth inventions of the present invention, as described earlier, as the second step, prototypes of a packaged LED light source and a lighting fixture were made based on the mathematically examined spectra (test lights). In addition, prototypes of a light source for light (experimental pseudo-reference light) with a high $R_a$ and a high $R_i$ and which produces a color appearance that is close to that of calculational reference light as well as prototypes of a lighting fixture incorporating the light source were also made.

In the second embodiment of the first, second, fourth and fifth inventions of the present invention, as described earlier, as the second step, prototypes of a packaged LED light source and a lighting fixture that does not include a control element were made based on the mathematically examined spectra (test lights). In addition, prototypes of a light source for light (experimental pseudo-reference light) with a high $R_a$ and a high $R_i$ and which produces a color appearance that is close to that of calculational reference light as well as prototypes of a lighting fixture incorporating the light source were also made.

Specifically, in the first to fifth inventions of the present invention, prototypes of a light source that excites a green phosphor and a red phosphor using a blue semiconductor light-emitting element, a light source that excites a yellow phosphor and a red phosphor using a blue semiconductor light-emitting element, and a light source that excites a blue phosphor, a green phosphor, and a red phosphor using a purple semiconductor light-emitting element were made and instrumentalized.

BAM or SBCA was used as the blue phosphor. BSS, β-SiAlON, or BSON was used as the green phosphor. YAG was used as the yellow phosphor. CASON or SCASN was used as the red phosphor.

A normally practiced method was used when making packaged LED prototypes. Specifically, a semiconductor light-emitting element (chip) was flip-chip-mounted on a ceramic package which incorporated metal wiring capable of providing electric contact. Next, a slurry created by mixing a phosphor to be used and a binder resin was arranged as a phosphor layer.

In the first embodiment of the first to fifth inventions of the present invention, after the packaged LEDs were prepared, the packaged LEDs were used to create LED bulbs of MR16 Gu10, and MR16 Gu5.3. The LED bulbs were made into a type of a lighting fixture by building a drive circuit into the LED bulbs and also mounting a reflecting mirror, a lens, and the like to the LED bulbs. In addition, some commercially available LED bulbs were also prepared. Furthermore, incandescent bulbs incorporating a tungsten filament were also prepared to be used as experimental reference light.

In the second embodiment of the first, second, fourth and fifth inventions of the present invention, after the packaged LEDs were prepared, the packaged LEDs were used to create LED bulbs of MR16 Gu10, and MR16 Gu5.3. The LED bulbs were made into a type of a lighting fixture by building a drive circuit into the LED bulbs and also mounting a reflecting mirror that does not affect an intensity modulation on emission wavelength, a lens, and the like to the LED bulbs. In addition, some commercially available LED bulbs were also prepared. Furthermore, incandescent bulbs incorporating a tungsten filament were also prepared to be used as experimental reference light.

In addition, in the first to fifth inventions of the present invention, a large number of the LED bulbs were arranged to produce a lighting system for conducting comparative visual experiments. In this case, a system capable of illumination by instantaneously switching among three kinds of bulbs was assembled. A type of drive power wire was dedicated for an incandescent bulb having a tungsten filament (experimental reference light), and an adjustable transformer was arranged at a subsequent stage so that the CCT can be varied by boosting drive voltage from 110 V to 130 V relative to 100 V input voltage. Furthermore, two remaining lines of the drive power wire were used for the LED bulbs, in which one system was used for experimental pseudo-reference light (LED light source) and the other for test light.

[Details of Third Step]

In the first to fifth inventions of the present invention, as the third step, comparative visual experiment were conducted in which subjects were asked to evaluate color appearances of a large number of observation objects while switching between experimental reference light (or experimental pseudo-reference light) and test light. The lighting system was installed in a dark room in order to remove disturbance. In addition, illuminance at the positions of the observation objects was set approximately the same by varying the number of fixtures of experimental reference light (or experimental pseudo-reference light) and test light which were mounted to the lighting system. The experiment was conducted within an illuminance range of approximately 150 lx to approximately 5000 lx.

Illuminated objects and observed objects which were actually used will be listed below. Due consideration was given to preparing chromatic objects so that colors of all hues including purple, bluish purple, blue, greenish blue, green, yellowish green, yellow, reddish yellow, red, and reddish purple were represented. Achromatic objects such as white objects and black objects were also prepared. In addition, these objects were prepared in wide varieties and in large numbers including still objects, fresh flowers, food, clothing, and printed material. Furthermore, the skins of the subjects (Japanese) themselves were also included in the experiment as observation objects. Moreover, the color names partially added to the object names listed below simply signify that such objects will appear in such colors in ordinary environments and are not accurate representations of the colors.

White ceramic plate, white asparagus, white mushroom, white gerbera, white handkerchief, white dress shirt, white rice, sesame and salt, salted rice cracker
Purple fresh flower
Bluish purple cloth handkerchief, blue jeans, greenish blue towel Green bell pepper, lettuce, shredded cabbage, broccoli, green lime, green apple
Yellow banana, yellow bell pepper, greenish yellow lemon, yellow gerbera fried egg
Orange orange, orange bell pepper, carrot
Red tomato, red apple, red bell pepper, red sausage, pickled plum Pink necktie, pink gerbera, salmon broiled with salt Russet necktie, beige work clothes, croquette, pork cutlet, burdock, cookie, chocolate peanut, woodenware
Skin of subjects (Japanese)
Newspaper, color printed matter including black letters on white background (polychromatic), paperback, weekly magazine Color samples for external wall material (ALPOLIC manufactured by Mitsubishi Plastics, Inc; white, blue, green, yellow and red) Color checkers (Color checker classic manufactured. by X-Rite; total of 24 color samples including 18 chromatic colors and six achromatic colors (one white, four grey, and one black)).

Moreover, names and Munsell notations of the respective color samples in the color checker are as follows.

| Name | Munsell Notation |
| --- | --- |
| Dark skin | 3.05 YR 3.69/3.20 |
| Light skin | 2.2 YR 6.47/4.10 |
| Blue sky | 4.3 PB 4.95/5.55 |

-continued

| Name | Munsell Notation |
| --- | --- |
| Foliage | 6.65 GY 4.19/4.15 |
| Blue flower | 9.65 PB 5.47/6.70 |
| Bluish green | 2.5 BG 7/6 |
| Orange | 5 YR 6/11 |
| Purplish blue | 7.5 PB 4/10.7 |
| Moderate red | 2.5 R 5/10 |
| Purple | 5 P 3/7 |
| Yellow green | 5 GY 7.08/9.1 |
| Orange yellow | 10 YR 7/10.5 |
| Blue | 7.5 PB 2.90/12.75 |
| Green | 0.1 G 5.38/9.65 |
| Red | 5 R 4/12 |
| Yellow | 5 Y 8/11.1 |
| Magenta | 2.5 RP 5/12 |
| Cyan | 5 B 5/8 |
| White | N 9.5/ |
| Neutral 8 | N 8/ |
| Neutral 6.5 | N 6.5/ |
| Neutral 5 | N 5/ |
| Neutral 3.5 | N 3.5/ |
| Black | N 2/ |

Moreover, it is not always self-evident that a correlation exists between color appearances of the various illuminated objects used in the comparative visual experiments and the various mathematical indices related to the color appearances of the 15 Munsell color samples used in the calculations. Such a correlation is to be revealed through the visual experiments.

The visual experiments were performed by the following procedure.

The prepared experimental reference light, experimental pseudo-reference light, and test light were divided per CCT as measured at the position of illuminated objects (according to the illumination method of the fourth invention of the present invention) or lights emitted in the main radiant directions among the prepared experimental reference light, experimental pseudo-reference light, and test light were divided per CCT (according to the light-emitting device of the first invention of the present invention) into six experiments. Details are as follows.

TABLE 1

| CCT classification in visual experiments | | |
| --- | --- | --- |
| Experiment | CCT range (K) | |
| A | 2500 or higher | lower than 2600 |
| B | 2600 or higher | lower than 2700 |
| C | 2700 or higher | lower than 2900 |
| D | 2900 or higher | lower than 3250 |
| E | 3500 or higher | lower than 4100 |
| F | 5400 or higher | lower than 5700 |

In each visual experiment, a same object was illuminated by switching between experimental reference light (or experimental pseudo-reference light) and test light, and subjects were asked to relatively judge which light was capable of realizing a color appearance or an object appearance that is as natural, vivid, highly visible, and comfortable as though perceived outdoors. The subjects were also asked the reasons for their judgment regarding which is superior or inferior.

[Details of Fourth Step, Experiment Result]

In the fourth step of the first embodiment of the first to fourth inventions of the present invention, results of comparative visual experiments conducted in the third step using the prototypes of LED light sources/fixtures/systems made in the second step were compiled.

In the fourth step of the second embodiment of the first, second, fourth and fifth inventions of the present invention, results of comparative visual experiments conducted in the third step using the prototypes of LED light sources/fixtures/systems that do not include a control element made in the second step were compiled. Both results are the same.

Table 2 represents results corresponding to experiment A and Table 3 represents results corresponding to experiment B. The same shall apply thereafter, with Table 7 representing results corresponding to experiment F. Regarding comprehensive evaluations of the test lights relative to the reference light shown in Tables 2 to 7, a comparable appearance is represented by a central "0", an evaluation that the test light is slightly favorable is represented by "1", an evaluation that the test light is favorable is represented by "2", an evaluation that the test light is more favorable is represented by "3", an evaluation that the test light is extremely favorable is represented by "4", and an evaluation that the test light is dramatically favorable is represented by "5". On the other hand, an evaluation that the test light is slightly unfavorable is represented by "−1", an evaluation that the test light is unfavorable is represented by "−2", an evaluation that the test light is more unfavorable is represented by "−3", an evaluation that the test light is extremely unfavorable is represented by "−4", and an evaluation that the test light is dramatically unfavorable is represented by "−5".

In the fourth step, in particular, an attempt was made to extract a radiometric property and a photometric property of a spectral power distribution shared by the test light from an actually measured spectrum in a case where the color appearance of an illuminated object when illuminated by the test light was judged to be more favorable than when illuminated by experimental reference light or experimental pseudo-reference light in a visual experiment. In other words, with respect to numerical values of $A_{cg}$, luminous efficacy of radiation K (lm/W), CCT (K), $D_{uv}$, and the like, characteristics of light emitted in the main radiant direction from the light-emitting device (according to the light-emitting device of the first invention of the present invention) and a position of the illuminated object (according to the illumination method of the fourth invention of the present invention) were extracted. At the same time, differences between color appearances of the 15 color samples when assuming illumination by calculational reference lights and color appearances of the 15 color samples when assuming a test light spectral power distribution when actually measuring light emitted in the main radiant direction from the light-emitting device (according to the light-emitting device of the first invention of the present invention) or a test light spectral power distribution actually measured at the position of the illuminated object (according to the illumination method of the fourth invention of the present invention) were also compiled using $|\Delta h_n|$, $SAT_{av}$, $\Delta C_n$, and $|\Delta C_{max}-\Delta C_{min}|$ as indices. Moreover, while values of $|\Delta h_n|$ and $\Delta C_n$ vary when n is selected, in this case, maximum and minimum values are shown. These values are also described in Tables 2 to 7. Moreover, since it was found that, with respect to the color appearance of the illuminated object, results of comprehensive evaluation by the subjects were relatively dependent on $D_{uv}$ values of test light emitted in the main radiant direction from the light-emitting device (according to the light-emitting device of the first invention of the present invention) or test light at the position of the illuminated object (according to the illumination method of the fourth invention of the present invention), Tables 2 to 7 have been sorted in a descending order of $D_{uv}$ values.

Overall, it was determined by the present experiment that the object appearance or the color appearance of an object being illuminated by test light is more favorable than when being illuminated by experimental reference light if $D_{uv}$ takes an appropriate negative value and the index $A_{cg}$ and the like are within appropriate ranges or if $|\Delta h_n|$, $SAT_{av}$, $\Delta C_n$, $|\Delta C_{max}-\Delta C_{min}|$, and the like are within appropriate ranges. This result was unexpected in view of "results based on currently prevailing wisdom" described in step 1.

TABLE 2

Summary of Experiment A (results of visual experiment and various indices)

| | Light-emitting element | CCT (K) | $D_{uv}$ | $\|\Delta h_n\|$ maximum value | $\|\Delta h_n\|$ minimum value | $\sum_{n=1}^{15} \Delta C_n / 15$ | $\Delta C_{max}$ | $\Delta C_{min}$ | $\|\Delta C_{max} - \Delta C_{min}\|$ | $A_{cg}$ | Luminous efficacy of radiation (lm/W) | Ra | Comprehensive evaluation |
|---|---|---|---|---|---|---|---|---|---|---|---|---|---|
| Reference light | Tungsten filament Incandescent bulb (110 V) | 2,589 | −0.00023 | 0.20 | 0.02 | 0.07 | 0.30 | −0.10 | 0.40 | 18.05 | 140 | 100 | — |
| Comparative test light 1 | Purple LED BAM BSS CASON | 2,559 | −0.00169 | 6.14 | 0.01 | 0.45 | 3.50 | −2.04 | 5.54 | −2.04 | 240 | 97 | 0 |
| Test light 1 | Purple LED SBCA β-SiAlON CASON | 2,548 | −0.00516 | 8.22 | 0.20 | 1.95 | 9.41 | −3.44 | 12.84 | −32.01 | 235 | 94 | 1 |
| Test light 2 | Purple LED SBCA β-SiAlON CASON | 2,538 | −0.01402 | 6.90 | 0.00 | 4.39 | 13.90 | −0.83 | 14.73 | −41.70 | 229 | 92 | 4 |

TABLE 3

Summary of Experiment B (results of visual experiment and various indices)

| | Light-emitting element | CCT (K) | $D_{uv}$ | $|\Delta h_n|$ maximum value | $|\Delta h_n|$ minimum value | $\dfrac{\sum_{n=1}^{15}\Delta C_n}{15}$ | $\Delta C_{max}$ | $\Delta C_{min}$ | $|\Delta C_{max} - \Delta C_{min}|$ | $A_{cg}$ | Luminous efficacy of radiation (lm/W) | Ra | Comprehensive evaluation |
|---|---|---|---|---|---|---|---|---|---|---|---|---|---|
| Reference light | Tungsten filament Incandescent bulb (120 V) | 2,679 | −0.00010 | 0.10 | 0.00 | 0.03 | 0.14 | −0.05 | 0.19 | 3.40 | 145 | 100 | — |
| Comparative test light 2 | Purple LED BAM BSS CASON | 2,631 | −0.00255 | 6.24 | 0.00 | 0.71 | 4.23 | −1.91 | 6.14 | 20.42 | 239 | 97 | 0 |
| Test light 3 | Purple LED SBCA β-SiAlON CASON | 2,672 | −0.00464 | 7.02 | 0.08 | 1.32 | 6.08 | −1.85 | 7.93 | −11.06 | 236 | 96 | 1 |
| Test light 4 | Purple LED SBCA β-SiAlON CASON | 2,636 | −0.01299 | 8.32 | 0.04 | 3.50 | 13.41 | −2.43 | 15.83 | −63.83 | 229 | 95 | 4 |
| Test light 5 | Purple LED SBCA β-SiAlON CASON | 2,668 | −0.01803 | 7.23 | 0.10 | 4.68 | 14.47 | −0.67 | 15.14 | −114.08 | 222 | 91 | 5 |
| Test light 6 | Purple LED SBCA β-SiAlON CASON | 2,628 | −0.02169 | 7.42 | 0.40 | 5.09 | 16.84 | −0.96 | 17.81 | −126.42 | 216 | 90 | 4 |

TABLE 4

Summary of Experiment C (results of visual experiment and various indices)

| | Light-emitting element | CCT (K) | $D_{uv}$ | $|\Delta h_n|$ maximum value | $|\Delta h_n|$ minimum value | $\dfrac{\sum_{n=1}^{15}\Delta C_n}{15}$ | $\Delta C_{max}$ | $\Delta C_{min}$ | $|\Delta C_{max} - \Delta C_{min}|$ | $A_{cg}$ | Luminous efficacy of radiation (lm/W) | Ra | Comprehensive evaluation |
|---|---|---|---|---|---|---|---|---|---|---|---|---|---|
| Comparative test light 3 | Blue LED BSON SCASN | 2,811 | 0.01380 | 9.51 | 0.29 | −6.42 | −0.11 | −18.50 | 18.39 | 142.46 | 322 | 91 | −4 |
| Comparative test light 4 | Blue LED BSON SCASN | 2,788 | 0.00970 | 5.00 | 0.51 | −3.49 | 0.05 | −11.04 | 11.10 | 102.87 | 309 | 94 | −2 |
| Comparative test light 5 | Commercially available LED | 2,880 | 0.00819 | 5.78 | 0.29 | −3.33 | −0.07 | −8.02 | 7.95 | 211.76 | 294 | 92 | −2 |
| Comparative test light 6 | Blue LED BSON SCASN | 2,723 | 0.00020 | 1.84 | 0.00 | 0.51 | 3.47 | −2.37 | 5.84 | 15.58 | 299 | 94 | 0 |
| Reference light | Tungsten filament Incandescent bulb (130 V) | 2,749 | −0.00017 | 0.12 | 0.00 | 0.04 | 0.18 | −0.08 | 0.26 | 16.59 | 150 | 100 | — |
| Comparative test light 7 | Purple LED BAM BSS CASON | 2,703 | −0.00331 | 6.26 | 0.08 | 0.91 | 4.76 | −1.78 | 6.53 | 22.48 | 238 | 97 | 0 |
| Test light 7 | Purple LED BAM BSS CASON | 2,784 | −0.00446 | 6.30 | 0.06 | 1.17 | 5.46 | −1.92 | 7.37 | −13.19 | 235 | 96 | 1 |
| Test light 8 | Purple LED BAM BSS CASON | 2,761 | −0.00561 | 7.16 | 0.07 | 1.48 | 6.60 | −2.16 | 8.76 | −46.26 | 232 | 96 | 1 |
| Test light 9 | Blue LED BSON SCASN | 2,751 | −0.01060 | 5.22 | 0.28 | 2.79 | 8.47 | −2.02 | 10.49 | −28.57 | 289 | 93 | 3 |
| Test light 10 | Purple LED SBCA β-SiAlON CASON | 2,798 | −0.01991 | 6.11 | 0.06 | 4.25 | 13.37 | −0.63 | 14.01 | −141.79 | 221 | 91 | 5 |
| Test light 11 | Purple LED SBCA β-SiAlON CASON | 2,803 | −0.02141 | 7.56 | 0.30 | 4.82 | 14.26 | −0.84 | 15.10 | −176.30 | 216 | 90 | 4 |
| Test light 12 | Blue LED BSON SCASN | 2,736 | −0.02210 | 4.56 | 0.07 | 4.99 | 12.13 | −0.97 | 13.11 | −139.12 | 257 | 85 | 4 |
| Test light 13 | Blue LED BSON SCASN | 2,718 | −0.02840 | 7.10 | 0.23 | 6.36 | 16.62 | 0.89 | 15.72 | −174.29 | 251 | 84 | 2 |
| Comparative test light 8 | Blue LED BSON SCASN | 2,711 | −0.03880 | 7.83 | 0.84 | 7.42 | 20.26 | 0.49 | 19.77 | −253.28 | 240 | 80 | −1 |
| Comparative test light 9 | Blue LED BSON SCASN | 2,759 | −0.04270 | 7.61 | 0.16 | 7.86 | 20.06 | 1.04 | 19.03 | −228.40 | 231 | 77 | −2 |
| Comparative test light 10 | Blue LED BSON SCASN | 2,792 | −0.04890 | 5.92 | 0.24 | 7.50 | 19.12 | 1.22 | 17.90 | −267.67 | 227 | 70 | −3 |

TABLE 5

Summary of Experiment D (results of visual experiment and various indices)

|  | Light-emitting element | CCT (K) | $D_{uv}$ | $|\Delta h_n|$ maximum value | $|\Delta h_n|$ minimum value | $\dfrac{\sum_{n=1}^{15}\Delta C_n}{15}$ | $\Delta C_{max}$ | $\Delta C_{min}$ | $|\Delta C_{max} - \Delta C_{min}|$ | $A_{cg}$ | Luminous efficacy of radiation (lm/W) | Ra | Comprehensive evaluation |
|---|---|---|---|---|---|---|---|---|---|---|---|---|---|
| Comparative test light 11 | Blue LED YAG CASON | 3,005 | 0.01411 | 18.54 | 0.18 | −5.95 | 4.13 | −13.83 | 17.96 | 197.80 | 376 | 69 | −4 |
| Pseudo-reference light | Purple LED BAM BSS CASON | 2,973 | 0.00064 | 3.48 | 0.02 | −0.04 | 1.49 | −1.48 | 2.98 | 31.87 | 245 | 97 | — |
| Comparative test light 12 | Blue LED YAG CASON | 2,911 | −0.00667 | 18.39 | 0.62 | 0.82 | 14.09 | −11.10 | 25.20 | 61.34 | 330 | 72 | −2 |
| Test light 14 | Purple LED SBCA β-SiAlON CASON | 3,026 | −0.00742 | 3.77 | 0.18 | 2.53 | 6.06 | −0.15 | 6.21 | −17.86 | 281 | 92 | 1 |
| Comparative test light 13 | Blue LED YAG CASON | 3,056 | −0.01276 | 16.81 | 0.95 | 1.79 | 16.35 | −10.53 | 26.88 | 25.24 | 319 | 74 | −2 |
| Test light 15 | Purple LED SBCA β-SiAlON CASON | 2,928 | −0.01742 | 5.87 | 0.33 | 4.15 | 10.17 | 0.10 | 10.07 | −177.14 | 216 | 88 | 5 |
| Comparative test light 14 | Blue LED YAG CASON | 3,249 | −0.01831 | 15.98 | 1.15 | 2.37 | 17.15 | −10.01 | 27.16 | −6.20 | 310 | 75 | −2 |
| Test light 16 | Purple LED SBCA β-SiAlON CASON | 2,992 | −0.02498 | 7.63 | 0.33 | 4.86 | 13.54 | −1.11 | 14.65 | −247.50 | 210 | 88 | 3 |
| Test light 17 | Purple LED SBCA β-SiAlON CASON | 3,001 | −0.02525 | 7.66 | 0.34 | 4.88 | 13.55 | −1.14 | 14.69 | −253.58 | 209 | 88 | 2 |

TABLE 6

Summary of Experiment E (results of visual experiment and various indices)

|  | Light-emitting element | CCT (K) | $D_{uv}$ | $|\Delta h_n|$ maximum value | $|\Delta h_n|$ minimum value | $\dfrac{\sum_{n=1}^{15}\Delta C_n}{15}$ | $\Delta C_{max}$ | $\Delta C_{min}$ | $|\Delta C_{max} - \Delta C_{min}|$ | $A_{cg}$ | Luminous efficacy of radiation (lm/W) | Ra | Comprehensive evaluation |
|---|---|---|---|---|---|---|---|---|---|---|---|---|---|
| Pseudo-reference light | Purple LED SBCA β-SiAlON CASON | 3,866 | 0.00006 | 4.76 | 0.05 | 0.52 | 3.37 | −2.13 | 5.50 | −6.84 | 249 | 94 | — |
| Test light 18 | Purple LED SBCA β-SiAlON CASON | 3,673 | −0.01302 | 2.86 | 0.04 | 2.32 | 5.16 | −0.20 | 5.36 | −82.35 | 236 | 93 | 4 |
| Test light 19 | Purple LED SBCA β-SiAlON CASON | 4,072 | −0.01666 | 1.97 | 0.10 | 2.69 | 4.63 | 0.60 | 4.03 | −116.16 | 230 | 89 | 5 |
| Test light 20 | Purple LED SBCA β-SiAlON CASON | 3,631 | −0.02102 | 3.29 | 0.11 | 3.38 | 6.72 | 0.53 | 6.19 | −173.43 | 223 | 87 | 4 |

TABLE 7

Summary of Experiment F (results of visual experiment and various indices)

| | Light-emitting element | CCT (K) | $D_{uv}$ | $|\Delta h_n|$ maximum value | $|\Delta h_n|$ minimum value | $\dfrac{\sum_{n=1}^{15}\Delta C_n}{15}$ | $\Delta C_{max}$ | $\Delta C_{min}$ | $|\Delta C_{max} - \Delta C_{min}|$ | $A_{cg}$ | Luminous efficacy of radiation (lm/W) | Ra | Comprehensive evaluation |
|---|---|---|---|---|---|---|---|---|---|---|---|---|---|
| Comparative test light 15 | Purple LED SBCA β-SiAlON CASON | 5,490 | 0.0073137 | 5.45 | 0.03 | −0.07 | 2.20 | −2.45 | 4.65 | 56.25 | 255 | 94 | −2 |
| Pseudo-reference light | Purple LED BAM BSS CASON | 5,451 | −0.002917 | 4.50 | 0.02 | 0.07 | 2.21 | −3.05 | 5.26 | 94.78 | 275 | 96 | — |
| Test light 21 | Purple LED SBCA β-SiAlON CASON | 5,484 | −0.005339 | 3.32 | 0.02 | 1.61 | 3.19 | 0.03 | 3.16 | −84.44 | 234 | 92 | 1 |
| Test light 22 | Purple LED SBCA β-SiAlON CASON | 5,538 | −0.007788 | 2.95 | 0.10 | 1.91 | 3.94 | 0.58 | 3.36 | −86.47 | 231 | 90 | 2 |
| Test light 23 | Purple LED SBCA β-SiAlON CASON | 5,661 | −0.009926 | 3.32 | 0.27 | 2.17 | 4.70 | 0.91 | 3.80 | −114.17 | 229 | 88 | 2 |
| Test light 24 | Purple LED SBCA β-SiAlON CASON | 5,577 | −0.012668 | 3.72 | 0.08 | 2.49 | 5.31 | 0.95 | 4.36 | −136.35 | 226 | 86 | 4 |
| Test light 25 | Purple LED SBCA β-SiAlON CASON | 5,504 | −0.01499 | 4.05 | 0.07 | 2.76 | 5.79 | 0.99 | 4.81 | −155.28 | 224 | 84 | 4 |
| Test light 26 | Purple LED SBCA β-SiAlON CASON | 5,531 | −0.017505 | 4.53 | 0.06 | 3.04 | 6.48 | 0.93 | 5.55 | −173.79 | 222 | 82 | 5 |
| Test light 27 | Purple LED SBCA β-SiAlON CASON | 5,650 | −0.020101 | 5.14 | 0.13 | 3.34 | 7.34 | 0.79 | 6.56 | −180.73 | 220 | 79 | 4 |
| Test light 28 | Purple LED SBCA β-SiAlON CASON | 5,470 | −0.026944 | 6.06 | 0.25 | 4.06 | 8.68 | 0.82 | 7.86 | −239.07 | 214 | 73 | 2 |
| Test light 29 | Purple LED SBCA β-SiAlON CASON | 5,577 | −0.033351 | 6.98 | 0.17 | 4.73 | 10.23 | 0.67 | 9.56 | −322.02 | 205 | 66 | 1 |
| Comparative test light 16 | Purple LED SBCA β-SiAlON CASON | 5,681 | −0.038497 | 7.53 | 0.04 | 5.26 | 11.36 | 0.51 | 10.86 | −419.02 | 194 | 61 | −1 |
| Comparative test light 17 | Purple LED SBCA β-SiAlON CASON | 5,509 | −0.043665 | 7.95 | 0.39 | 5.74 | 12.04 | 0.37 | 11.66 | −486.05 | 189 | 56 | −2 |

[Details of Fourth Step, Consideration]

Hereinafter, the experiment results will be considered. Moreover, the test lights and comparative test lights in the tables may sometimes be collectively referred to as a "test light".

1) When $D_{uv}$ of test light is on positive side of experimental reference light (or experimental pseudo-reference light)

Tables 4, 5, and 7 include results in which the $D_{uv}$ of test light is on the positive side of experimental reference light (or experimental pseudo-reference light). From these results, it is found that the greater the positive value of the $D_{uv}$ of the test light, the less favorable the color appearance or the object appearance of the illuminated object as judged by the subjects. A more specific description will be given below.

With respect to the appearance of an illuminated white object, the subjects judged that the greater the positive value of $D_{uv}$, the more yellowish (greenish) the appearance and the greater a feeling of strangeness. With respect to the appearance of gray portions of the illuminated color checkers, the subjects judged that differences in lightness became less visible. Furthermore, the subjects pointed out that characters in illuminated printed matter became more illegible. Moreover, with respect to the color appearances of various illuminated chromatic colors, the subjects judged that the greater the positive value of the $D_{uv}$ of the test light, the more unnatural and dull the color appearances as compared to when illuminated by experimental reference light (or experimental pseudo-reference light). The subjects pointed out that the various illuminated exterior wall color samples were perceived as being extremely different from the same colors when viewed outdoors, and their own skin colors also appeared unnatural and unhealthy. In addition, the subjects pointed out that differences in color of petals of fresh flowers with similar and analogous colors became less distinguishable and contours became less visible as compared to when illuminated by experimental reference light.

Furthermore, it was found that these results were not noticeably dependent on the CCT of the test lights described in Tables 4, 5, and 7, and also were not noticeably dependent on the configuration of the light-emitting elements (light-emitting materials) of the light-emitting device.

Since the greater the positive value of the $D_{uv}$ of the test light, the lower the value of Ra as an overall trend, one could argue that some of the results described above were within a range predictable from the detailed mathematical examination performed in step 1.

2) When $D_{uv}$ of test light is on negative side of experimental reference light (or experimental pseudo-reference light)

All of the Tables 2 to 7 include results in which the $D_{uv}$ of test light is on the negative side of experimental reference light (or experimental pseudo-reference light). These results show that when the $D_{uv}$ of the test light was in an appropriate negative range and the various indices in the tables were in appropriate ranges, the subjects judged the color appearance or the object appearance of the illuminated object to be favorable, more favorable, extremely favorable, or dramatically favorable. On the other hand, it is also shown that even if the $D_{uv}$ of the test light was in a similar range, the color appearance or the object appearance of the illuminated object was judged to be unfavorable or slightly favorable when the various indices in the tables were not in appropriate ranges as shown in Tables 2 to 5.

Among the results described above, it was totally unexpected that the color appearance of an object illuminated by test light would be a natural and favorable color appearance and a favorable object appearance as compared to being illuminated by experimental reference light (or experimental pseudo-reference light) when the $D_{uv}$ of the test light was in an appropriate negative range and the various indices in the tables were in appropriate ranges. Details of features pointed out by the subjects were as follows.

With white objects, the subjects judged that yellowness (greenness) had decreased and the objects appeared slightly white, white, more white, extremely white, or dramatically white in comparison to being illuminated by experimental reference light (or experimental pseudo-reference light) when the $D_{uv}$ of the test light was in an appropriate negative range and the various indices in the tables were in appropriate ranges. It was also pointed out that the closer to an optimum range, the more natural and the more favorable the appearance. This was a totally unexpected result.

Furthermore, with gray portions of the color checkers, the subjects judged that differences in lightness had slightly increased, increased, further increased, extremely increased, or dramatically increased in comparison to being illuminated by experimental reference light (or experimental pseudo-reference light) when the $D_{uv}$ of the test light was in an appropriate negative range and the various indices in the tables were in appropriate ranges. The subjects also pointed out that the closer to an optimum range, the more natural and the higher the visibility of the appearance. This was a totally unexpected result.

In addition, with contours of achromatic color samples, the subjects judged that clearness had slightly increased, increased, further increased, extremely increased, or dramatically increased in comparison to being illuminated by experimental reference light (or experimental pseudo-reference light) when the $D_{uv}$ of the test light was in an appropriate negative range and the various indices in the tables were in appropriate ranges. The subjects also pointed out that the closer to an optimum range, the more natural and the higher the visibility of the appearance. This was a totally unexpected result.

Furthermore, with characters in printed matter, the subjects judged that legibility had slightly increased, increased, further increased, extremely increased, or dramatically increased in comparison to being illuminated by experimental reference light (or experimental pseudo-reference light) when the $D_{uv}$ of the test light was in an appropriate negative range and the various indices in the tables were in appropriate ranges. The subjects also pointed out that the closer to an optimum range, the more natural and the higher the legibility of the appearance of characters. This was a totally unexpected result.

In addition, with the illuminated objects in various chromatic colors, the subjects judged that the color appearances of the illuminated objects had a slightly natural vividness, a natural vividness, a further natural vividness, an extremely natural vividness, or a dramatically natural vividness in comparison to being illuminated by experimental reference light (or experimental pseudo-reference light) when the $D_{uv}$ of the test light was in an appropriate negative range and the various indices in the tables were in appropriate ranges. The subjects also pointed out that the closer to an optimum range, the more natural and favorable the color appearance. This was a totally unexpected result.

Furthermore, with the various exterior wall color samples, the subjects judged that the color appearances of the color samples were slightly close, close, further close, extremely close, or dramatically close to their memories when seeing the color samples outdoors in comparison to being illuminated by experimental reference light (or experimental pseudo-reference light) when the $D_{uv}$ of the test light was in an appropriate negative range and the various indices in the tables were in appropriate ranges. The subjects also pointed out that the closer to an optimum range, the more natural and favorable the color appearance, which more closely resembled their memories when seeing the color samples outdoors. This was a totally unexpected result.

In addition, with the color appearances of the skin of the subjects themselves (Japanese), the subjects judged that their skin appeared slightly natural, natural, further natural, extremely natural, or dramatically natural in comparison to being illuminated by experimental reference light (or experimental pseudo-reference light) when the $D_{uv}$ of the test light was in an appropriate negative range and the various indices in the tables were in appropriate ranges. The subjects also pointed out that the closer to an optimum range, the more natural, healthy, and favorable the color appearance. This was a totally unexpected result.

Furthermore, with differences in colors of petals of fresh flowers with similar and analogous colors, the subjects judged that the differences became slightly distinguishable, distinguishable, further distinguishable, extremely distinguishable, or dramatically distinguishable in comparison to being illuminated by experimental reference light (or experimental pseudo-reference light) when the $D_{uv}$ of the test light was in an appropriate negative range and the various indices in the tables were in appropriate ranges. The subjects also pointed out that the greater the negative value of $D_{uv}$ relative to an appropriate upper limit within the experiment range, the greater the distinguishability. This was a totally unexpected result.

In addition, with various illuminated objects, the subjects judged that contours appeared slightly clear, clear, further clear, extremely clear, or dramatically clear in comparison to being illuminated by experimental reference light (or experimental pseudo-reference light) when the $D_{uv}$ of the test light was in an appropriate negative range and the various indices in the tables were in appropriate ranges. The subjects also pointed out that the greater the negative value of $D_{uv}$ relative to an appropriate upper limit within the experiment range, the clearer the appearance of the contours. This was a totally unexpected result.

Particularly since the greater the negative value of the $D_{uv}$ of the test light, the lower the value of Ra as an overall trend, one could argue that these results were totally unexpected from the detailed mathematical examination performed in step 1. As shown in Tables 2 to 7, purely focusing on Ra values reveal that, for example, Ra of test lights comprehensively judged to be "dramatically favorable" ranged from around 82 and 91 despite the fact that there were a large number of test lights with Ra of 95 or higher. In addition, the comparative visual experiments were performed beyond the $D_{uv}$ range described in ANSI C78.377-2008. Therefore, one can argue that the results described above represent a novel discovery of a perceptually favorable region related to the color appearance of an illuminated object outside of a current common-sense recommended chromaticity range.

Meanwhile, with the light-emitting device according to the first invention of the present invention, it was shown that in order to obtain such perceptions, the indices $A_{cg}$ described in Tables 2 to 7 must be within appropriate ranges in addition to $D_{uv}$. In addition, it was revealed that the various indices, namely, the luminous efficacy of radiation K (lm/W), $|\Delta h_n|$, $SAT_{av}$, $\Delta C_n$, and $|\Delta C_{max} - \Delta C_{min}|$ are favorably within appropriate ranges. This requirement is the same for the method for designing the light-emitting device according to the second invention of the present invention, and the method for driving the light-emitting device according to the third invention. This requirement is also the same for the method for manufacturing the light-emitting device according to the second embodiment of the fifth invention of the present invention.

Firstly, results of the test lights judged to be favorable in the visual experiments revealed the following with respect to $D_{uv}$ and the index $A_{cg}$.

First, $D_{uv}$ was as considered heretofore and was −0.0040 or lower, slightly favorably −0.0042 or lower, favorably −0.0070 or lower, more favorably −0.0100 or lower, extremely favorably −0.0120 or lower, and dramatically favorably −0.0160 or lower.

In addition, $D_{uv}$ in the first to fifth inventions of the present invention was −0.0350 or higher, slightly favorably −0.0340 or higher, favorably −0.0290 or higher, more favorably −0.0250 or higher, extremely favorably −0.0230 or higher, and dramatically favorably −0.0200 or higher.

Furthermore, from results shown in Tables 2 to 7, $A_{cg}$ in spectral power distributions produced by the light-emitting device according to the first invention of the present invention was −10 or lower and −360 or higher. Although a precise definition of $A_{cg}$ is as described earlier, a rough physical meaning or a clear interpretation thereof is as follows. "$A_{cg}$ assumes a negative value in an appropriate range" means that there are appropriate existence of a concave and/or a convex shape in a normalized test light spectral power distribution, and radiant flux intensity of the normalized test light spectral power distribution tends to be higher than that of a mathematical normalized reference light spectral power distribution in a short wavelength range between 380 nm and 495 nm, and/or radiant flux intensity of the normalized test light spectral power distribution tends to be lower than that of a mathematical normalized reference light spectral power distribution in an intermediate wavelength range between 495 nm and 590 nm, and/or radiant flux intensity of the normalized test light spectral power distribution tends to be higher than that of a mathematical normalized reference light spectral power distribution in a long wavelength range between 590 nm and Λ4. Based on the above, it is understood that a favorable color appearance or a favorable object appearance was produced when $A_{cg}$ is quantitatively −10 or lower and −360 or higher.

$A_{cg}$ as derived from a spectral power distribution of light emitted in a main radiant direction from the light-emitting device according to the first invention of the present invention was −10 or lower, slightly favorably −11 or lower, more favorably −28 or lower, extremely favorably −41 or lower, and dramatically favorably −114 or lower.

In addition, $A_{cg}$ as derived from a spectral power distribution of light emitted in a main radiant direction from the light-emitting device according to the first invention of the present invention was −360 or higher, slightly favorably −330 or higher, favorably −260 or higher, extremely favorably −181 or higher, and dramatically favorably −178 or higher.

Moreover, an examination performed using actual test light during the visual experiments revealed that a favorable range of $A_{cg}$ within favorable experiment results under examination was −322 or higher and −12 or lower.

Furthermore, while the first to fifth inventions of the present invention aimed for the realization of test light with favorable color appearance and high efficiency, results regarding luminous efficacy of radiation K were as follows.

The luminous efficacy of radiation of the spectral power distribution produced by the light-emitting device according to the first invention of the present invention favorably ranged from 180 (lm/W) to 320 (lm/W) and was higher by approximately 20% or more than 150 (lm/W) which is a value of an ordinary incandescent bulb or the like. The reason for this is believed to be that radiation from the semiconductor light-emitting element and radiation from the phosphor were internal. The reason for this is also believed to be that an appropriate concave and/or convex shape was present at an appropriate position in the spectral power distributions with respect to a relationship with V (λ). From the perspective of achieving a balance with color appearance, the luminous efficacy of radiation as obtained from a spectral power distribution of light emitted in a main radiant direction by the light-emitting device according to the first invention of the present invention favorably ranged as described below.

Although the luminous efficacy of radiation K produced by the light-emitting device according to the first invention of the present invention was preferably 180 (lm/W) or higher, the luminous efficacy of radiation K was slightly favorably 205 (lm/W) or higher, favorably 208 (lm/W) or higher, and extremely favorably 215 (lm/W) or higher. On the other hand, while, ideally, the higher the luminous efficacy of radiation K, the better, the luminous efficacy of radiation K in the first to fifth inventions of the present invention was preferably 320 (lm/W) or lower. In consideration of achieving a balance with color appearance, the luminous efficacy of radiation K was slightly favorably 282 (lm/W) or lower, favorably 232 (lm/W) or lower, and dramatically favorably 231 (lm/W) of lower.

Moreover, an examination performed using actual test light during the visual experiments revealed that a favorable range of K within favorable experiment results under examination was 206 (lm/W) or higher and 288 (lm/W) or lower.

Thirdly, when considering the characteristics of $|\Delta h_n|$, $SAT_{av}$, $\Delta C_n$, and $|\Delta C_{max}-\Delta C_{min}|$, it was found that the following trends exist. Specifically, test lights which produced a favorable color appearance or a favorable object appearance had the following characteristics with respect to the color appearance of the 15 color samples when illumination by calculational reference light is assumed and the color appearance of the 15 color samples when illumination by an actually measured test light spectral power distribution is assumed.

The difference in hue angles ($|\Delta h_n|$) of the 15 color samples between illumination by test lights and illumination by calculational reference light is relatively small, and an average saturation, $SAT_{av}$, of the 15 color samples when illuminated by the test lights had increased in an appropriate range as compared to that when illuminated by the calculational reference light. Moreover, in addition to the average values, individual saturations ($\Delta C_n$) of the 15 color samples also show that none of the respective $\Delta C_n$ of the 15 color samples when illuminated by the test lights was excessively lower or higher than the same values when illuminated by the calculational reference light and were all in appropriate ranges. As a result, the difference among differences between maximum and minimum degrees of saturation $|\Delta C_{max}-\Delta C_{min}|$ was narrow in an appropriate range. When further simplified, it is inferable that an ideal case features small differences in hue angles among the hues of all 15 color samples and a relatively uniform increase in saturation of the 15 color samples within appropriate ranges when assuming illumination by test light as compared to when assuming illumination of the 15 color samples by reference light.

Figure 35:
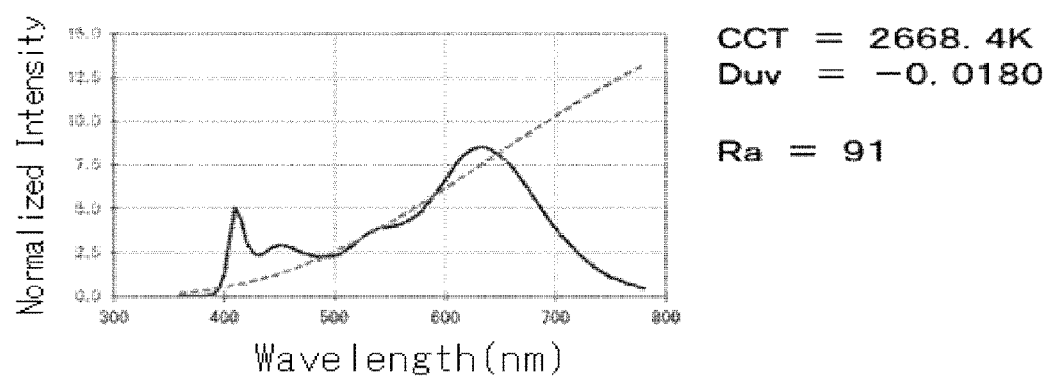
FIG. 35 is a diagram showing a normalized test light spectral power distribution (solid line) of test light 5 and a normalized reference light spectral power distribution (dotted line) of calculational reference light corresponding to the test light 5.
Figure 36:
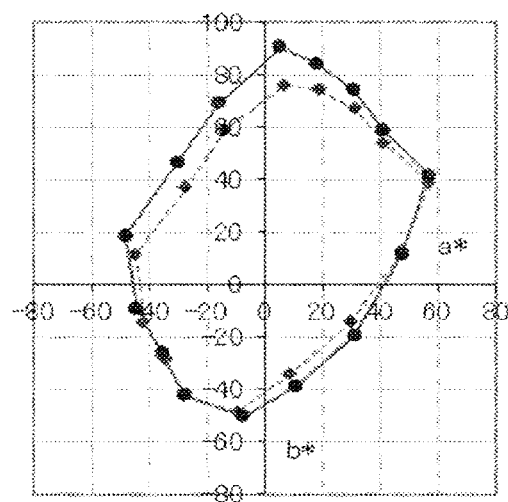
FIG. 36 is a diagram showing a CIELAB color space on which are respectively plotted a* values and b* values of the 15 Munsell renotation color samples when respectively assuming a case (solid line) where an object is illuminated by the test light 5 and a case where the object is illuminated by calculational reference light corresponding to the test light 5.

A solid line in FIG. 35 represents a normalized test light spectral power distribution of the test light 5 judged to be "dramatically favorable" in the comprehensive judgment shown in Table 3. In addition, a dotted line in FIG. 35 represents a normalized spectral power distribution of calculational reference light (black-body radiator) calculated based on a CCT of the test light. On the other hand, FIG. 36 represents a CIELAB plot related to color appearances of the 15 color samples when assuming illumination by the test light 5 (solid line) and assuming illumination by the calculational reference light (black-body radiator) (dotted line). Moreover, while a direction perpendicular to the plane of paper represents lightness, only a* and b* axes were plotted for the sake of convenience.

Figure 37:
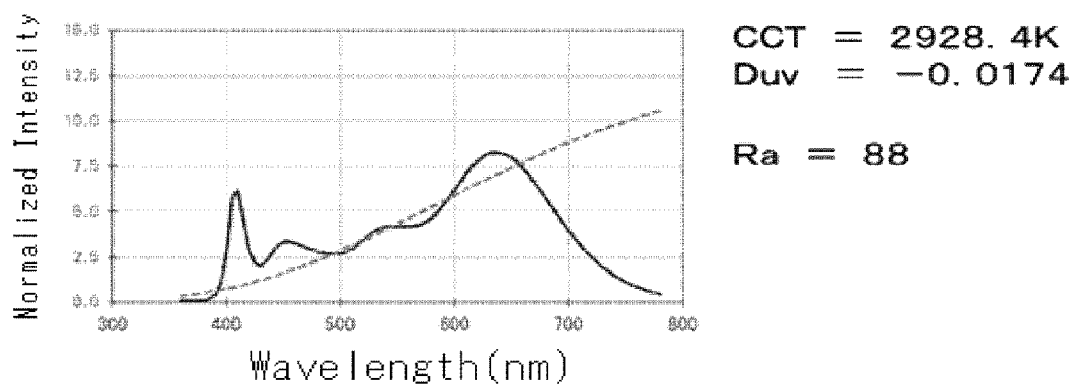
FIG. 37 is a diagram showing a normalized test light spectral power distribution (solid line) of test light 15 and a normalized reference light spectral power distribution (dotted line) of calculational reference light corresponding to the test light 15.
Figure 38:
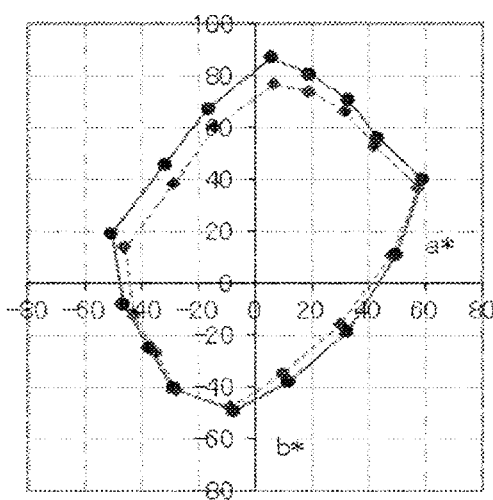
FIG. 38 is a diagram showing a CIELAB color space on which are respectively plotted a* values and b* values of the 15 Munsell renotation color samples when respectively assuming a case (solid line) where an object is illuminated by the test light 15 and a case where the object is illuminated by calculational reference light corresponding to the test light 15.
Figure 39:
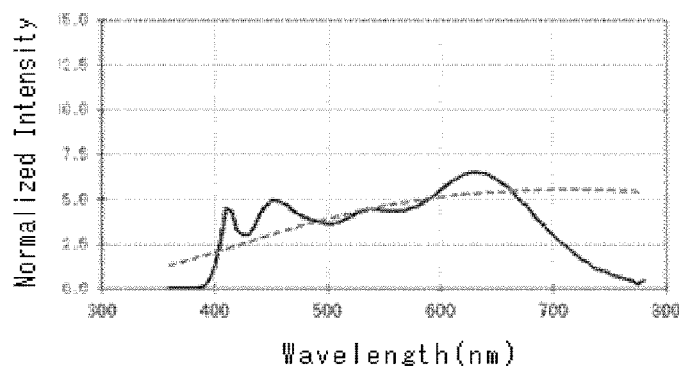
FIG. 39 is a diagram showing a normalized test light spectral power distribution (solid line) of test light 19 and a normalized reference light spectral power distribution (dotted line) of calculational reference light corresponding to the test light 19.
Figure 40:
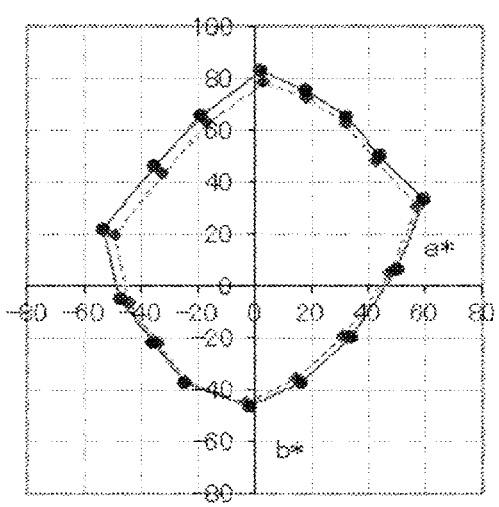
FIG. 40 is a diagram showing a CIELAB color space on which are respectively plotted a* values and b* values of the 15 Munsell renotation color samples when respectively assuming a case (solid line) where an object is illuminated by the test light 19 and a case where the object is illuminated by calculational reference light corresponding to the test light 19.

Furthermore, FIGS. 37 and 38 summarize results of test light 15 judged to be "dramatically favorable" in the comprehensive judgment shown in Table 5 in a similar manner to that described above, and FIGS. 39 and 40 summarize results of test light 19 judged to be "dramatically favorable" in the comprehensive judgment shown in Table 6 in a similar manner to that described above.

In this manner, it is shown that when a favorable color appearance or a favorable object appearance is obtained in the visual experiments, differences in hue angles among the hues of all 15 color samples are small and saturation of the 15 color samples increase relatively uniformly within appropriate ranges when assuming illumination by the test light as compared to when assuming illumination of the 15 color samples by the reference light. It is also shown that, from this perspective, a CCT in a vicinity of 4000 K is favorable.

Figure 41:
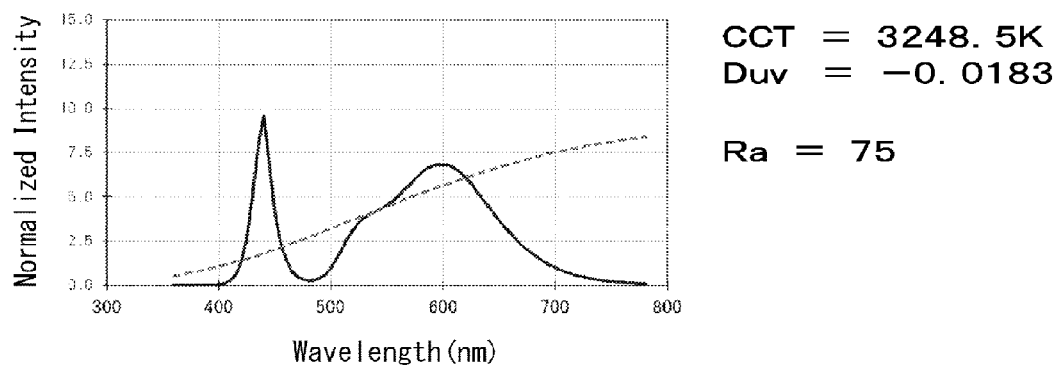
FIG. 41 is a diagram showing a normalized test light spectral power distribution (solid line) of comparative test light 14 and a normalized reference light spectral power distribution (dotted line) of calculational reference light corresponding to the comparative test light 14.
Figure 42:
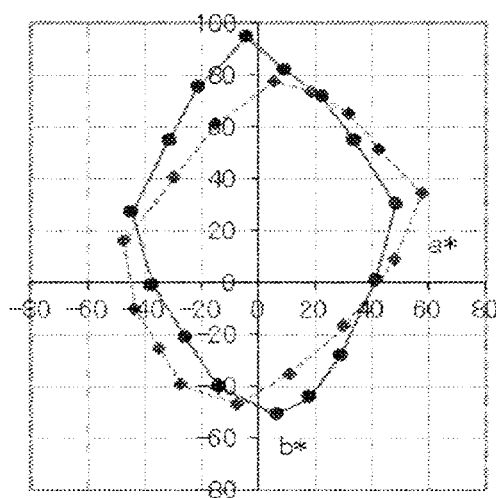
FIG. 42 is a diagram showing a CIELAB color space on which are respectively plotted a* values and b* values of the 15 Munsell renotation color samples when respectively assuming a case (solid line) where an object is illuminated by the comparative test light 14 and a case where the object is illuminated by calculational reference light corresponding to the comparative test light 14.

On the other hand, even if $D_{uv}$ has a negative value in an appropriate range, for example, the comparative test light 14 with $D_{uv} \cong -0.01831$ in Table 5 is judged in the visual experiments to have an unfavorable appearance created by the test lights. This is conceivably due to the fact that characteristics of the index $A_{cg}$ were not appropriate. FIGS. 41 and 42 represent a result of a CIELAB plot performed with respect to a normalized spectral power distribution and color appearances of the 15 color samples for the comparative test light 14 in a similar manner to FIGS. 35, 36, and the like. As is apparent from FIGS. 41 and 42, there is a large difference in hue angles among several hues of the 15 color samples and saturation of the 15 color samples vary in an extremely non-uniform manner when comparing a case where illumination of the 15 color samples by the reference light is assumed with a case where illumination by the test lights is assumed.

The results of the visual experiments and the consideration thereof show that the respective quantitative indices favorably fall within the following ranges.

As described earlier, $D_{uv}$ in the light-emitting device according to the first invention of the present invention was −0.0040 or lower, slightly favorably −0.0042 or lower, favorably −0.0070 or lower, more favorably −0.0100 or lower, extremely favorably −0.0120 or lower, and dramatically favorably −0.0160 or lower.

In addition, $D_{uv}$ in the light-emitting device according to the first invention of the present invention was −0.0350 or higher, slightly favorably −0.0340 or higher, favorably −0.0290 or higher, more favorably −0.0250 or higher, extremely favorably −0.0230 or higher, and dramatically favorably −0.0200 or higher.

Each $|\Delta h_n|$ in the light-emitting device according to the first invention of the present invention was preferably 9.0 or lower, extremely favorably 8.4 or lower, and dramatically favorably 7.3 or lower. In addition, it is conceivable that a lower $|\Delta h_n|$ is more favorable and that each $|\Delta h_n|$ is more dramatically favorably 6.0 or lower, further dramatically favorably 5.0 or lower, and particularly dramatically favorably 4.0 or lower.

Moreover, each $|\Delta h_n|$ in the light-emitting device according to the first invention of the present invention was preferably 0 or higher and a minimum value thereof during the visual experiments was 0.0029. Furthermore, an examination performed using actual test light during the visual experiments revealed that a favorable range of each $|\Delta h_n|$ within favorable experiment results under examination was 8.3 or lower and 0.003 or higher.

$SAT_{av}$ in the light-emitting device according to the first invention of the present invention was preferably 1.0 or higher, slightly favorably 1.1 or higher, favorably 1.9 or higher, extremely favorably 2.3 or higher, and dramatically favorably 2.6 or higher; and preferably 7.0 or lower, favorably 6.4 or lower, extremely favorably 5.1 or lower, and dramatically favorably 4.7 or lower.

Furthermore, an examination performed using actual test light during the visual experiments revealed that a favorable range of the above index within favorable experiment results under examination was 1.2 or higher and 6.3 or lower.

Each $\Delta C_n$ in the light-emitting device according to the first invention of the present invention was preferably −3.8 or higher, slightly favorably −3.5 or higher, extremely favorably −2.5 or higher, and dramatically favorably −0.7 or higher.

In addition, each $\Delta C_n$ in the light-emitting device according to the first invention of the present invention was preferably 18.6 or lower, favorably 17.0 or lower, and dramatically favorably 15.0 or lower.

Furthermore, an examination performed using actual test light during the visual experiments revealed that a favorable range of each $\Delta C_n$ within favorable experiment results under examination was −3.4 or higher and 16.8 or lower.

While $|\Delta C_{max} - \Delta C_{min}|$ in the light-emitting device according to the first invention of the present invention was preferably 19.6 or lower, $|\Delta C_{max} - \Delta C_{min}|$ was extremely favorably 17.9 or lower, and dramatically favorably 15.2 or lower. In addition, it is conceivable that a lower $|\Delta C_{max} - \Delta C_{min}|$ is more favorable and that $|\Delta C_{max} - \Delta C_{min}|$ is further dramatically favorably 14.0 or lower and extremely dramatically favorably 13.0 or lower.

Moreover, $|\Delta C_{max} - \Delta C_{min}|$ in the light-emitting device according to the first invention of the present invention was preferably 2.8 or higher and a minimum value thereof during the visual experiments was 3.16. Moreover, an examination performed using actual test light during the visual experiments revealed that a favorable range of $|\Delta C_{max} - \Delta C_{min}|$ within favorable experiment results under examination is 3.2 or higher and 17.8 or lower.

Fourthly, the following findings were made regarding a CCT in the light-emitting device according to the first invention of the present invention. In order to have the various indices, namely, $|\Delta h_n|$, $SAT_{av}$, $\Delta C_n$, and $|\Delta C_{max} - \Delta C_{min}|$ assume more appropriate values which were judged as being favorable in the comparative visual experiments, CCT favorably assumed a value near 4000 K in the light-emitting device according to the first invention of the present invention. This is conceivably due to a spectral power distribution of light near 4000 K being hardly dependent on wavelength and is equi-energetic as also exhibited by reference light, and a test light spectral power distribution in which a concave and/or a convex shape is formed can be easily realized with respect to reference light. In other words, even in comparison to CCTs in other cases, $SAT_{av}$, can be increased while keeping $|\Delta h_n|$ and $|\Delta C_{max} - \Delta C_{min}|$ at low levels to easily control $\Delta C_n$ with respect to a large number of color samples so that each $\Delta C_n$ assumes a desired value.

Therefore, a CCT in the light-emitting device according to the first invention of the present invention ranges slightly favorably from 1800 K to 15000 K, favorably from 2000 K to 10000 K, more favorably from 2300 K to 7000 K, extremely favorably from 2600 K to 6600 K, dramatically favorably from 2900 K to 5800 K, and most favorably from 3400 K to 5100 K.

Moreover, an examination performed using actual test light during the visual experiments revealed that a favorable range of a CCT within favorable experiment results under examination was 2550 (K) or higher and 5650 (K) or lower.

Each parameter related to the method for manufacturing the light-emitting device according to the second embodiment of the fifth invention of the present invention, and the method for designing the light-emitting device according to the second embodiment of the second invention of the present invention are also the same as each parameter of the light-emitting device according to the second embodiment of the first invention of the present invention.

Furthermore, with the illumination method according to the fourth invention of the present invention, it was shown that, in addition to $D_{uv}$, the various indices described in Tables 2 to 7 or, in other words, $|\Delta h_n|$, $SAT_{av}$, $\Delta C_n$, and $|\Delta C_{max} - \Delta C_{min}|$ must be within appropriate ranges in order to obtain such perceptions. In addition, it was found that the index $A_{cg}$ and the luminous efficacy of radiation K (lm/W) are favorably within appropriate ranges.

In particular, from the results of the test lights judged to be favorable in the visual experiments, in consideration of the characteristics of $|\Delta h_n|$, $SAT_{av}$, $\Delta C_n$, and $|\Delta C_{max} - \Delta C_{min}|$, it was found that the following trends exist. Specifically, test lights which produced a favorable color appearance or a favorable object appearance had the following characteristics with respect to the color appearance of the 15 color samples when illumination by calculational reference light is assumed and the color appearance of the 15 color samples when illumination by an actually measured test light spectral power distribution is assumed.

The difference in hue angles ($|\Delta h_n|$) of the 15 color samples between illumination by test lights and illumination by calculational reference light is relatively small, and an average saturation, $SAT_{av}$, of the 15 color samples when illuminated by the test lights had increased in an appropriate range as compared to that when illuminated by the calculational reference light. Moreover, in addition to the average values, individual saturations ($\Delta C_n$) of the 15 color samples also show that none of the respective $\Delta C_n$ of the 15 color samples when illuminated by the test lights was excessively lower or higher than the same values when illuminated by the calculational reference light and were all in appropriate ranges. As a result, the difference among differences between maximum and minimum degrees of saturation $|\Delta C_{max} - \Delta C_{min}|$ was narrow in an appropriate range. When further simplified, it is inferable that an ideal case features small differences in hue angles among the hues of all 15 color samples and a relatively uniform increase in saturation of the 15 color samples within appropriate ranges when assuming illumination by test light as compared to when assuming illumination of the 15 color samples by reference light.

A solid line in FIG. 35 represents a normalized test light spectral power distribution of test light 5 judged to be "dramatically favorable" in the comprehensive judgment shown in Table 3. In addition, a dotted line in FIG. 35 represents a normalized spectral power distribution of calculational reference light (black-body radiator) calculated based on a CCT of the test light. On the other hand, FIG. 36 represents a CIELAB plot related to color appearances of the 15 color samples when assuming illumination by the test light 5 (solid line) and assuming illumination by the calculational reference light (black-body radiator) (dotted line). Moreover, while a direction perpendicular to the plane of paper represents lightness, only a* and b* axes were plotted for the sake of convenience.

Furthermore, FIGS. 37 and 38 summarize results of test light 15 judged to be "dramatically favorable" in the comprehensive judgment shown in Table 5 in a similar manner to that described above, and FIGS. 39 and 40 summarize results of test light 19 judged to be "dramatically favorable" in the comprehensive judgment shown in Table 6 in a similar manner to that described above.

In this manner, it is shown that when a favorable color appearance or a favorable object appearance is obtained in the visual experiments, differences in hue angles among the hues of all 15 color samples are small and saturation of the 15 color samples increase relatively uniformly within appropriate ranges when assuming illumination by the test light as compared to when assuming illumination of the 15 color samples by the reference light. It is also shown that, from this perspective, a CCT in a vicinity of 4000 K is favorable.

On the other hand, even if $D_{uv}$ has a negative value in an appropriate range, for example, comparative test light 14 with $D_{uv} \cong -0.01831$ in Table 5 is judged in the visual experiments to have an unfavorable appearance created by the test lights. This is conceivably due to the fact that some characteristics among $|\Delta h_n|$, $SAT_{av}$, $\Delta C_n$, and $|\Delta C_{max}-\Delta C_{min}|$ were inappropriate. FIGS. 41 and 42 represent a result of a CIELAB plot performed with respect to a normalized spectral power distribution and color appearances of the 15 color samples for the comparative test light 14 in a similar manner to FIGS. 35, 36, and the like. As is apparent from FIGS. 41 and 42, there is a large difference in hue angles among several hues of the 15 color samples and saturation of the 15 color samples vary in an extremely non-uniform manner when comparing a case where illumination of the 15 color samples by the reference light is assumed with a case where illumination by the test lights is assumed.

The results of the visual experiments and the consideration thereof show that the respective quantitative indices favorably fall within the following ranges.

$D_{uv}$ in the illumination method according to the fourth invention of the present invention was −0.0040 or lower, slightly favorably −0.0042 or lower, favorably −0.0070 or lower, more favorably −0.0100 or lower, extremely favorably −0.0120 or lower, and dramatically favorably −0.0160 or lower.

In addition, $D_{uv}$ in the illumination method according to the fourth invention of the present invention was −0.0350 or higher, slightly favorably −0.0340 or higher, favorably −0.0290 or higher, more favorably −0.0250 or higher, extremely favorably −0.0230 or higher, and dramatically favorably −0.0200 or higher.

Each $|\Delta h_n|$ in the illumination method according to the fourth invention of the present invention was 9.0 or lower, extremely favorably 8.4 or lower, and dramatically favorably 7.3 or lower. In addition, it is conceivable that a lower $|\Delta h_u|$ is more favorable and that each $|\Delta h_n|$ is more dramatically favorably 6.0 or lower, further dramatically favorably 5.0 or lower, and particularly dramatically favorably 4.0 or lower.

Moreover, each $|\Delta h_n|$ in the illumination method according to the fourth invention of the present invention was 0 or higher and a minimum value thereof during the visual experiments was 0.0029. Furthermore, an examination performed using actual test light during the visual experiments revealed that a favorable range of each $|\Delta h_n|$ within favorable experiment results under examination was 8.3 or lower and 0.003 or higher.

$SAT_{av}$ in the illumination method according to the fourth invention of the present invention was 1.0 or higher, slightly favorably 1.1 or higher, favorably 1.9 or higher, extremely favorably 2.3 or higher, and dramatically favorably 2.6 or higher; and 7.0 or lower, favorably 6.4 or lower, extremely favorably 5.1 or lower, and dramatically favorably 4.7 or lower.

Furthermore, an examination performed using actual test light during the visual experiments revealed that a favorable range of the above index within favorable experiment results under examination was 1.2 or higher and 6.3 or lower.

Each $\Delta C_n$ in the illumination method according to the fourth invention of the present invention was −3.8 or higher, slightly favorably −3.5 or higher, extremely favorably −2.5 or higher, and dramatically favorably −0.7 or higher.

In addition, each $\Delta C_n$ in the illumination method according to the fourth invention of the present invention was 18.6 or lower, extremely favorably 17.0 or lower, and dramatically favorably 15.0 or lower. Moreover, an examination performed using actual test light during the visual experiments revealed that a favorable range of each $\Delta C_n$ within favorable experiment results under examination was −3.4 or higher and 16.8 or lower.

While $|\Delta C_{max}-\Delta C_{min}|$ in the illumination method according to the fourth invention of the present invention was 19.6 or lower, extremely favorably 17.9 or lower, and dramatically favorably 15.2 or lower. In addition, it is conceivable that a lower $|\Delta C_{max}-\Delta C_{min}|$ is more favorable and that $|\Delta C_{max}-\Delta C_{min}|$ is more dramatically favorably 14.0 or lower and extremely dramatically favorably 13.0 or lower.

Moreover, $|\Delta C_{max}-\Delta C_{min}|$ in the illumination method according to the fourth invention of the present invention was 2.8 or higher, and a minimum value thereof during the visual experiments was 3.16.

Moreover, an examination performed using actual test light during the visual experiments revealed that a favorable range of $|\Delta C_{max}-\Delta C_{min}|$ within favorable experiment results under examination was 3.2 or higher and 17.8 or lower.

Meanwhile, an attempt was made using Tables 2 to 7 to have a radiometric property and a photometric property of a test light spectral power distribution represent characteristics associated with test lights which had been comprehensively judged to have favorable characteristics in the visual experiments.

Again, $D_{uv}$ was as considered heretofore and was −0.0040 or lower, slightly favorably −0.0042 or lower, favorably −0.0070 or lower, more favorably −0.0100 or lower, extremely favorably −0.0120 or lower, and dramatically favorably −0.0160 or lower.

In addition, $D_{uv}$ in the illumination method according to the first to fifth inventions of the present invention was −0.0350 or higher, slightly favorably −0.0340 or higher, favorably −0.0290 or higher, more favorably −0.0250 or higher, extremely favorably −0.0230 or higher, and dramatically favorably −0.0200 or higher.

On the other hand, the following observation was made regarding the index $A_{cg}$.

From results shown in Tables 2 to 7, $A_{cg}$ in favorable spectral power distributions in the illumination method according to the fourth invention of the present invention was −10 or lower and −360 or higher. Although a precise definition of $A_{cg}$ is as described earlier, a rough physical meaning or a clear interpretation thereof is as follows. "$A_{cg}$ assumes a negative value in an appropriate range" means that there are appropriate existence of a concave and/or a convex shape in a normalized test light spectral power distribution, and radiant flux intensity of the normalized test light spectral power distribution tends to be higher than that of a mathematical normalized reference light spectral power distribution in a short wavelength range between 380 nm and 495 nm, and/or radiant flux intensity of the normalized test light spectral power distribution tends to be lower than that of a mathematical normalized reference light spectral power distribution in an intermediate wavelength range between 495 nm and 590 nm, and/or radiant flux intensity of the normalized test light spectral power distribution tends to be higher than that of a mathematical normalized reference light spectral power distribution in a long wavelength range between 590 nm and Λ4. Since $A_{cg}$ is a sum of respective elements in the short wavelength range, the intermediate wavelength range, and the long wavelength range, individual elements may not necessarily exhibit the tendencies described above. Based on the above, it is understood that a favorable color appearance or a favorable object appearance was produced when $A_{cg}$ is quantitatively −10 or lower and −360 or higher.

$A_{cg}$ in the illumination method according to the fourth invention of the present invention was preferably −10 or lower, slightly favorably −11 or lower, more favorably −28 or lower, extremely favorably −41 or lower, and dramatically favorably −114 or lower.

In addition, in the illumination method according to the fourth invention of the present invention, $A_{cg}$ was preferably −360 or higher, slightly favorably −330 or higher, favorably −260 or higher, extremely favorably −181 or higher, and dramatically favorably −178 or higher.

Moreover, an examination performed using actual test light during the visual experiments revealed that a favorable range of $A_{cg}$ within favorable experiment results under examination was −322 or higher and −12 or lower.

Furthermore, while the fourth invention of the present invention aimed for the realization of test light with favorable color appearance and high efficiency, results regarding luminous efficacy of radiation K were as follows.

The luminous efficacy of radiation of the spectral power distributions produced by the illumination method according to the fourth invention of the present invention favorably ranged from 180 (lm/W) to 320 (lm/W) and was higher by approximately 20% or more than 150 (lm/W) which is a value of an ordinary incandescent bulb or the like. The reason for this is believed to be that radiation from the semiconductor light-emitting element and radiation from the phosphor were internal. The reason for this is also believed to be that an appropriate concave and/or convex shape was present at an appropriate position in the spectral power distributions with respect to a relationship with V (λ). From the perspective of achieving a balance with color appearance, the luminous efficacy of radiation in the illumination method according to the present invention favorably ranged as described below.

Although the luminous efficacy of radiation K in the illumination method according to the fourth invention of the present invention was preferably 180 (lm/W) or higher, the luminous efficacy of radiation K was slightly favorably 205 (lm/W) or higher, favorably 208 (lm/W) or higher, and extremely favorably 215 (lm/W) or higher. On the other hand, while, ideally, the higher the luminous efficacy of radiation K, the better, the luminous efficacy of radiation K in the first to fifth inventions of the present invention was preferably 320 (lm/W) or lower. In consideration of achieving a balance with color appearance, the luminous efficacy of radiation K was slightly favorably 282 (lm/W) or lower, favorably 232 (lm/W) or lower, and dramatically favorably 231 (lm/W) or lower.

Moreover, an examination performed using actual test light during the visual experiments revealed that a favorable range of K within favorable experiment results under examination was 206 (lm/W) or higher and 288 (lm/W) or lower.

Furthermore, the following findings were made regarding a CCT in the illumination method according to the fourth invention of the present invention. In order to have the various indices, namely, $|\Delta h_n|$, $SAT_{av}$, $\Delta C_n$, and $|\Delta C_{max} - \Delta C_{min}|$ assume more appropriate values which were judged as being favorable in the comparative visual experiments, CCT favorably assumed a value near 4000 K in the illumination method according to the fourth invention of the present invention. This is conceivably due to a spectral power distribution of light near 4000 K being hardly dependent on wavelength and is equi-energetic as also exhibited by reference light, and a test light spectral power distribution in which a concave and/or a convex shape are formed can be easily realized with respect to reference light. In other words, even in comparison to CCTs in other cases, $SAT_{av}$ can be increased while keeping $|\Delta h_n|$ and $|\Delta C_{max} - \Delta C_{min}|$ at low levels to easily control $\Delta C_n$ with respect to a large number of color samples so that each $\Delta C_n$ assumes a desired value.

Therefore, a CCT in the illumination method according to the fourth invention of the present invention ranges slightly favorably from 1800 K to 15000 K, favorably from 2000 K to 10000 K, more favorably from 2300 K to 7000 K, extremely favorably from 2600 K to 6600 K, dramatically favorably from 2900 K to 5800 K, and most favorably from 3400 K to 5100 K.

Moreover, an examination performed using actual test light during the visual experiments revealed that a favorable range of a CCT within favorable experiment results under examination was 2550 (K) or higher and 5650 (K) or lower.

Details of Fifth Step (1): Examination with
Light-Emitting Device Including a Plurality of
Light Emitting Areas First Embodiment of First Invention of the Present
Invention In the fifth step, the inventor assumed that the light-emitting device included a plurality of light emitting areas, and examined how the appearance of colors of the light-emitting device change by adjusting the radiant flux amount (luminous flux amount) of each light emitting area. In other words, the characteristics of numeric values, such as the index $A_{cg}$, CCT (K), $D_{uvSSL}$ and the luminous efficacy of radiation K (lm/W) of the light emitted from each light emitting area and the light-emitting device in the main radiant direction, were extracted. At the same time, differences between color appearances of the 15 color samples when assuming illumination by calculational reference lights and color appearances of the 15 color samples when assuming a test light spectral power distribution actually measured were also compiled using $|\Delta h_n|$, $SAT_{av}$, $\Delta C_n$, and $|\Delta C_{max} - \Delta C_{min}|$ as indices. Moreover, while values of $|\Delta h_n|$ and $\Delta C_n$ vary when n is selected, in this case, maximum and minimum values are shown. These values are also described in Tables 8 to 12. The examination in the fifth step also represents the examples and comparative examples according to the first embodiment of the first to fourth inventions of the present invention.

In concrete terms, the inventor experimented on how $\phi_{SSL}(\lambda)$, which is the sum of the spectral power distribution of the light emitted from each light emitting area in the main radiant direction, will change by changing the luminous flux amount and/or radiant flux amount emitted from each light emitting area in the main radiant direction.

Details of Fifth Step (2): Examination Related to
Control Element

Second Embodiment of First Invention of the
Present Invention

In the fifth step, the inventor introduced a control element, which was produced experimentally in the second step, to the LED light source/fixture/system which does not include a control element, and extracted the meteorological characteristics and photometric characteristics of the spectral power distribution of the light irradiated from the light-emitting device which includes the control element, based on the measured spectrum. In other words, the characteristics of numeric values, such as the index $A_{cg}$, the luminous efficacy of radiation K (lm/W), CCT (K) and $D_{uv}$ of the light emitted from each light emitting area and the light-emitting device in the main radiant direction, were extracted. At the same time, differences between color appearances of the 15 color samples when assuming illumination by calculational reference lights and color appearances of the 15 color samples when assuming a test light spectral power distribution actually measured were also compiled using $|\Delta h_n|$, $SAT_{av}$, $\Delta C_n$, and $|\Delta C_{max} - \Delta C_{max}|$ as indices. Moreover, while values of $|\Delta h_n|$ and $\Delta C_n$ vary when n is selected, in this case, maximum and minimum values are shown. These values are also described in Tables 17 and 18. The examination in the fifth step also represents the examples and comparative examples according to the second embodiment of the first, second, fourth and fifth inventions of the present invention.

In concrete terms, the inventor experimented how $\Phi_{elm}(\lambda)$, which is the spectral power distribution of the light emitted from the light-emitting element in the main radiant direction, and $\phi_{SSL}(\lambda)$ which is the spectral power distribution of the light emitted from the light-emitting device in the main radiant direction, will change if the control element is included.

The experiments related to the present invention will now be described.

First Embodiment of First to Fourth Inventions of the Present Invention

Example 1

Figure 43:
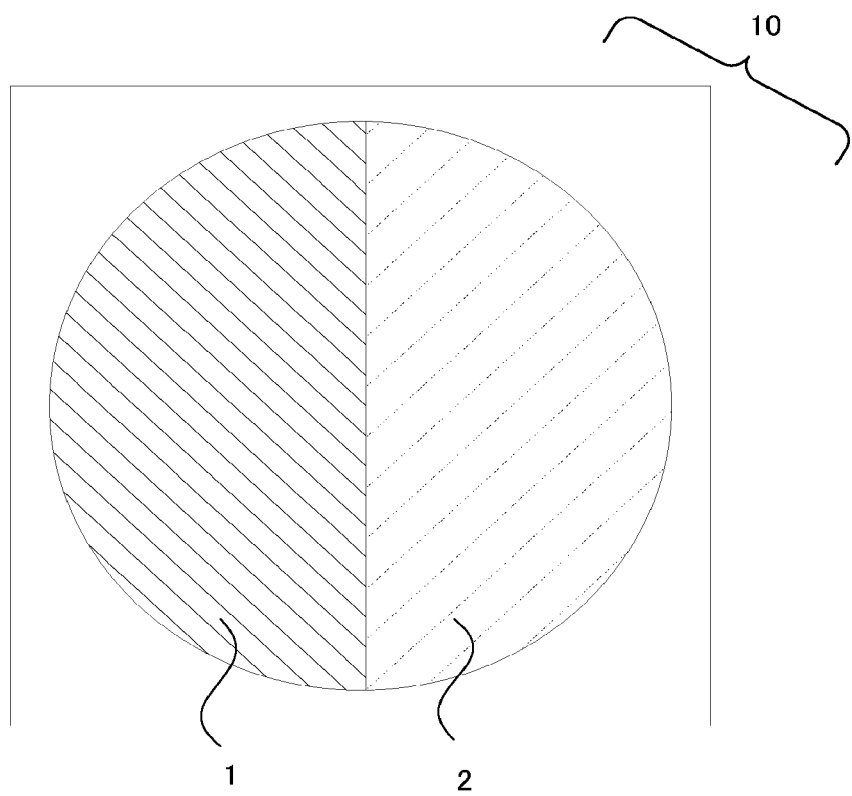
FIG. 43 is a diagram showing a disposition of light emitting areas of the packaged LED used for Example 1.

A 5 mm diameter resin package in which two light emitting units exist, as shown in FIG. 43, is prepared. In the light emitting area 1, a blue semiconductor light-emitting element, a green phosphor and a red phosphor are mounted and encapsulated. The blue semiconductor light-emitting element in the light emitting area 1 constitutes a wiring of the packaged LED, so as to be one independent circuit configuration, and is connected to a power supply. In the light emitting area 2, on the other hand, a purple semiconductor light-emitting element, a blue phosphor, a green phosphor and a red phosphor are mounted and encapsulated. The purple semiconductor light-emitting element in the light emitting area 2 constitutes a wiring of the packaged LED, so as to be one independent circuit configuration, and is connected to another independent power supply. In this way, current can be injected independently into the light emitting area 1 and the light emitting area 2 respectively.

Figure 44:
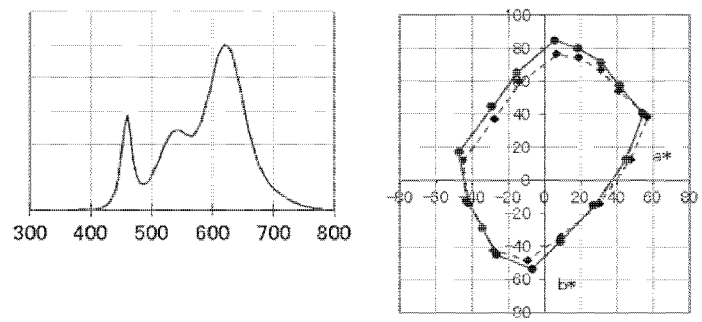
FIG. 44 is a diagram showing a spectral power distribution when the radiant flux ratio of the light emitting area 1 and the light emitting area 2 is 3:0 in Example 1, and a CIELAB color space on which are respectively plotted a* values and b* values of the 15 Munsell renotation color samples when respectively assuming a case (solid line) where an object is illuminated by the spectral power distribution and a case (dotted line) where an object is illuminated by calculational reference light corresponding to the spectral power distribution (drive point A)
Figure 45:
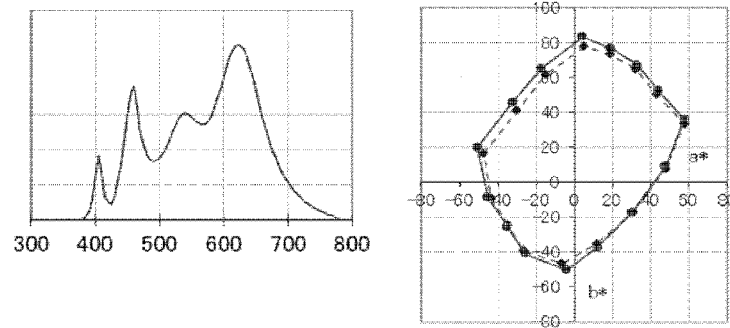
FIG. 45 is a diagram showing a spectral power distribution when the radiant flux ratio of the light emitting area 1 and the light emitting area 2 is 2:1 in Example 1, and a CIELAB color space on which are respectively plotted a* values and b* values of the 15 Munsell renotation color samples when respectively assuming a case (solid line) where an object is illuminated by the spectral power distribution and a case (dotted line) where an object is illuminated by calculational reference light corresponding to the spectral power distribution (drive point B)
Figure 46:
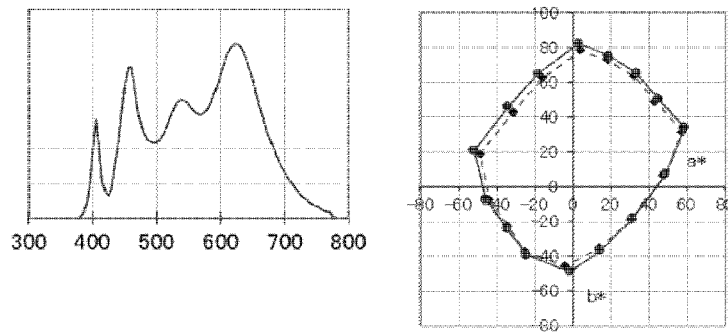
FIG. 46 is a diagram showing a spectral power distribution when the radiant flux ratio of the light emitting area 1 and the light emitting area 2 is 1.5:1.5 in Example 1, and a CIELAB color space on which are respectively plotted a* values and b* values of the 15 Munsell renotation color samples when respectively assuming a case (solid line) where an object is illuminated by the spectral power distribution and a case (dotted line) where an object is illuminated by calculational reference light corresponding to the spectral power distribution (drive point C)
Figure 47:
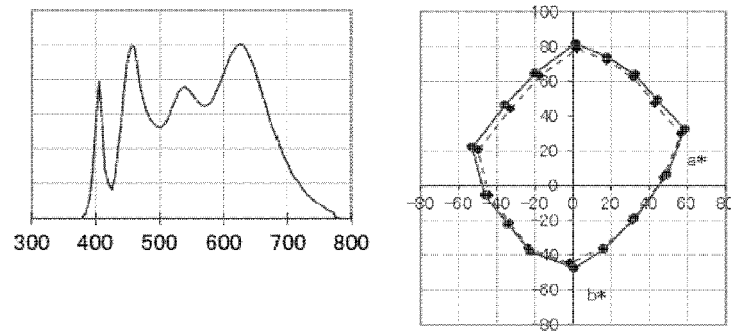
FIG. 47 is a diagram showing a spectral power distribution when the radiant flux ratio of the light emitting area 1 and the light emitting area 2 is 1:2 in Example 1, and a CIELAB color space on which are respectively plotted a* values and b* values of the 15 Munsell renotation color samples when respectively assuming a case (solid line) where an object is illuminated by the spectral power distribution and a case (dotted line) where an object is illuminated by calculational reference light corresponding to the spectral power distribution (drive point D)
Figure 48:
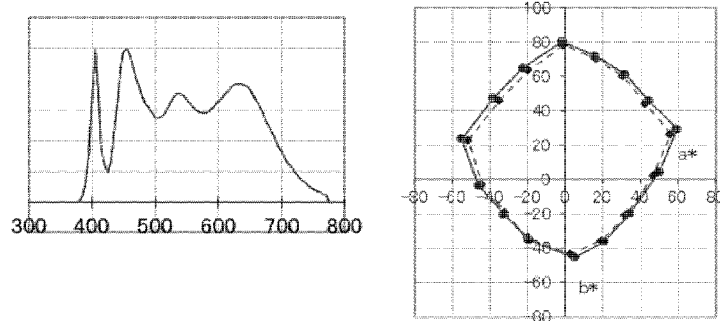
FIG. 48 is a diagram showing a spectral power distribution when the radiant flux ratio of the light emitting area 1 and the light emitting area 2 is 0:3 in Example 1, and a CIELAB color space on which are respectively plotted a* values and b* values of the 15 Munsell renotation color samples when respectively assuming a case (solid line) where an object is illuminated by the spectral power distribution and a case (dotted line) where an object is illuminated by calculational reference light corresponding to the spectral power distribution (drive point E)
Figure 49:
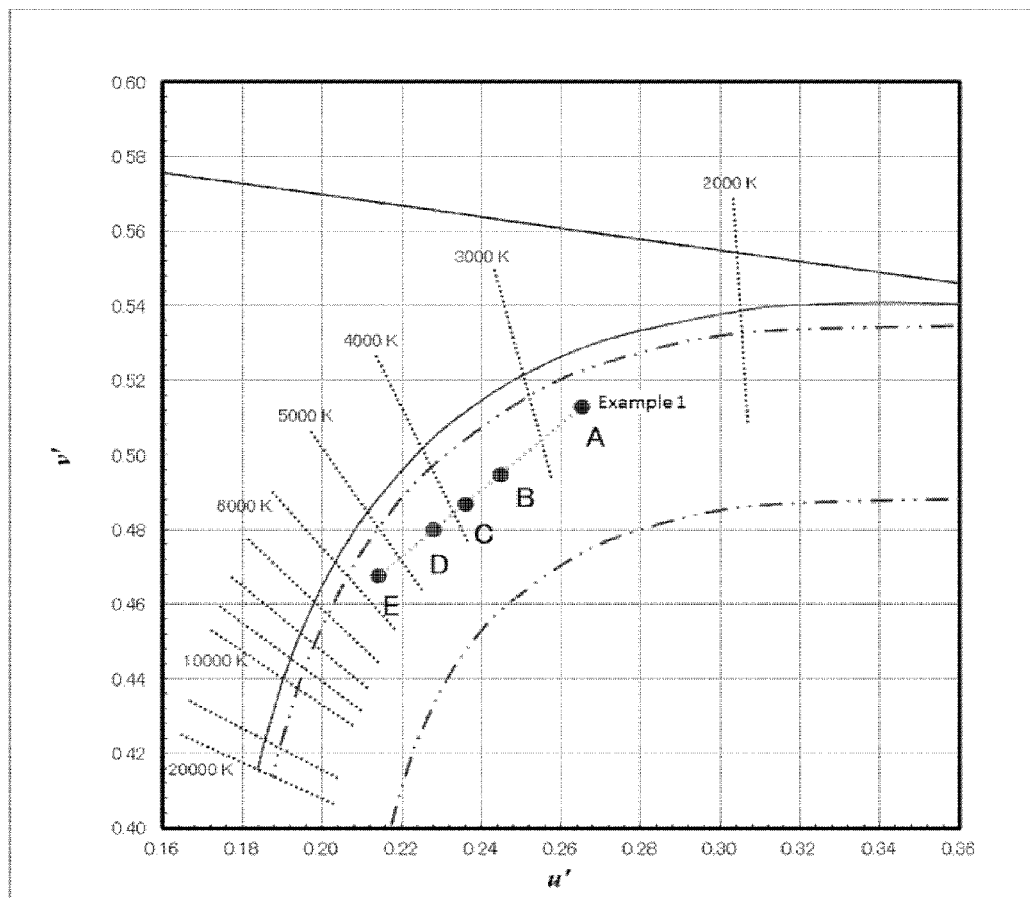
FIG. 49 is the CIE 1976 u'v' chromaticity diagram on which the chromaticity of the drive points A to E in Example 1 are indicated. The two-dot chain line in FIG. 49 is a range of $D_{uv}$ that satisfies Condition 1 of the first embodiment of the first to fourth inventions of the present invention.

Next, if the current value of the current supplied to each light emitting area of the packaged LED, which includes the light emitting area 1 and the light emitting area 2, is appropriately adjusted, then five types of spectral power distributions shown in FIG. 44 to FIG. 48, irradiated onto the axis of the packaged LED for example, are implemented. FIG. 44 is the case when the current is injected only into the light emitting area 1, and the radiant flux ratio of the light emitting area 1 and the light emitting area 2 is set to 3:0, and FIG. 48 is a case when current is injected only into the light emitting area 2, and the radiant flux ratio of the light emitting area 1 and the light emitting area 2 is set to 0:3. FIG. 45 is a case when the radiant flux ratio of the light emitting area 1 and the light emitting area 2 is set to 2:1, FIG. 46 is a case when the radiant flux ratio is set to 1.5:1.5, and FIG. 47 is a case when the radiant flux ratio is set to 1:2. By changing the current that is injected into each area of the packaged LED 10, the radiant flux irradiated from the packaged LED main body onto the axis can be changed. The CIELAB plot in each drawing indicates the a* values and the b* values which are plotted: when 15 Munsell renotation color samples #01 to #15 are mathematically assumed as the illumination objects, and these illumination objects are illuminated using this packaged LED; and when these illumination objects are illuminated by a reference light derived from the correlated color temperature of the packaged LED. Here, the drive point names A to E are assigned to the radiant flux of the light-emitting device in descending order of contribution of the radiant flux of the light emitting area 1. FIG. 49 shows the chromaticity point at each of the drive points A to E on the CIE 1976 u'v' chromaticity diagram. Table 8 shows the photometric characteristics and colormetric characteristics that are expected at each drive point.

TABLE 8

Example 1

| Drive Point | (*1) | (*2) | $T_{SSL}$ (K) | $D_{uvSSL}$ | $\|\Delta h_n\|$ maximum value | $\|\Delta h_n\|$ minimum value | $\sum_{n=1}^{15} \Delta C_n / 15$ | $\Delta C_{max}$ | $\Delta C_{min}$ | $\|\Delta C_{max} - \Delta C_{min}\|$ | $A_{cg}$ | Luminous efficacy of radiation (lm/W) | Ra |
|---|---|---|---|---|---|---|---|---|---|---|---|---|---|
| Drive Point A | (*3) | 3:0 | 2,700 | −0.01000 | 5.33 | 0.03 | 2.80 | 8.49 | −2.61 | 11.10 | −62.63 | 298 | 92 |
| Drive Point B | | 2:1 | 3,392 | −0.01399 | 3.44 | 0.23 | 2.51 | 5.58 | −0.38 | 5.95 | −108.18 | 267 | 91 |
| Drive Point C | | 1.5:1.5 | 3,827 | −0.01420 | 3.27 | 0.14 | 2.34 | 4.39 | 0.03 | 4.36 | −107.89 | 256 | 90 |
| Drive Point D | | 1:2 | 4,325 | −0.01346 | 3.05 | 0.08 | 2.17 | 3.81 | 0.23 | 3.57 | −79.45 | 245 | 90 |
| Drive Point E | | 0:3 | 5,505 | −0.00997 | 3.11 | 0.12 | 2.17 | 4.47 | 0.88 | 3.59 | −105.25 | 229 | 89 |

(*1) Light-emitting elements constituting each light emitting area
(*2) Radiant flux ratio of spectral power distribution $\phi_{SSL}1$ of light emitting area 1 and spectral power distribution $\phi_{SSL}2$ of light emitting area 2 ($\phi_{SSL}1:\phi_{SSL}2$)
(*3) Light emitting area 1: blue semiconductor light-emitting element, green phosphor and red phosphor; Light emitting area 2: purple semiconductor light-emitting element, blue phosphor, green phosphor and red phosphor The spectral power distributions in FIG. 44 to FIG. 48, the CIELAB plots in FIG. 44 and FIG. 48, the CIE 1976 u'v' chromaticity diagram in FIG. 49 and Table 8 clarify the following.

At the drive point A to the drive point E, and in areas between these drive points, a natural, vivid, highly visible and comfortable appearance of colors and appearance of objects, as if the object are seen outdoors, can be implemented. For example, between the drive point A and the drive point E, the correlated color temperature of the packaged LED can be variable in a 2700K to 5505K range, and $D_{uvSSL}$ can also be variable in the −0.00997 to −0.01420 range. Further, the average saturation difference of the 15 Munsell renotation color samples can also be variable in a 2.80 to 2.17 range while implementing such an appearance of colors. Thus in the area where a preferable appearance of colors can be implemented, optimum illumination conditions can be easily selected from the variable range in accordance with the age, gender or the like of the user of the light-emitting device, or in accordance with space, purpose or the like of the illumination.

In this case, the following drive control is also possible.

First, when at least one of the index $A_{cg}$, correlated color temperature $T_{SSL}$ (K), and distance $D_{uvSSL}$ from the blackbody radiation locus, is changed, the luminous flux and/or radiant flux emitted from the light-emitting device in the main radiant direction can be unchangeable. If this control is performed, a difference of appearance of colors, caused by a change of the shape of the spectral power distribution, can be easily checked without depending on the luminance of the illumination object, which is preferable.

Second, when the index $A_{cg}$ is decreased in an appropriate range, the luminous flux and/or radiant flux of the light-emitting device can be decreased, so as to decrease the luminance of the illumination object.

Third, when $D_{uvSSL}$ is decreased in an appropriate range as well, the luminous flux and/or radiant flux of the light-emitting device can be decreased, so as to decrease the luminance of the illumination object. In the second and third cases, brightness is normally increased, hence energy consumption can be suppressed by decreasing luminance, which is preferable.

Fourth, when the correlated color temperature is increased, the luminous flux and/or radiant flux of the light-emitting device can be increased, so as to increase the luminance of the illumination object. Under a general illumination environment, a relatively low luminance environment is often felt to be comfortable when the color temperature is in a low range, and a relatively high luminance environment is often felt to be comfortable when the color temperature is in a high range. This psychological effect is known as the Kruithof Effect, and performing control integrating this effect is also possible, and when the correlated color temperature is increased, it is preferable to increase the luminance of the illumination object by increasing the luminous flux and/or radiant flux of the light-emitting device.

Example 2

Figure 50:
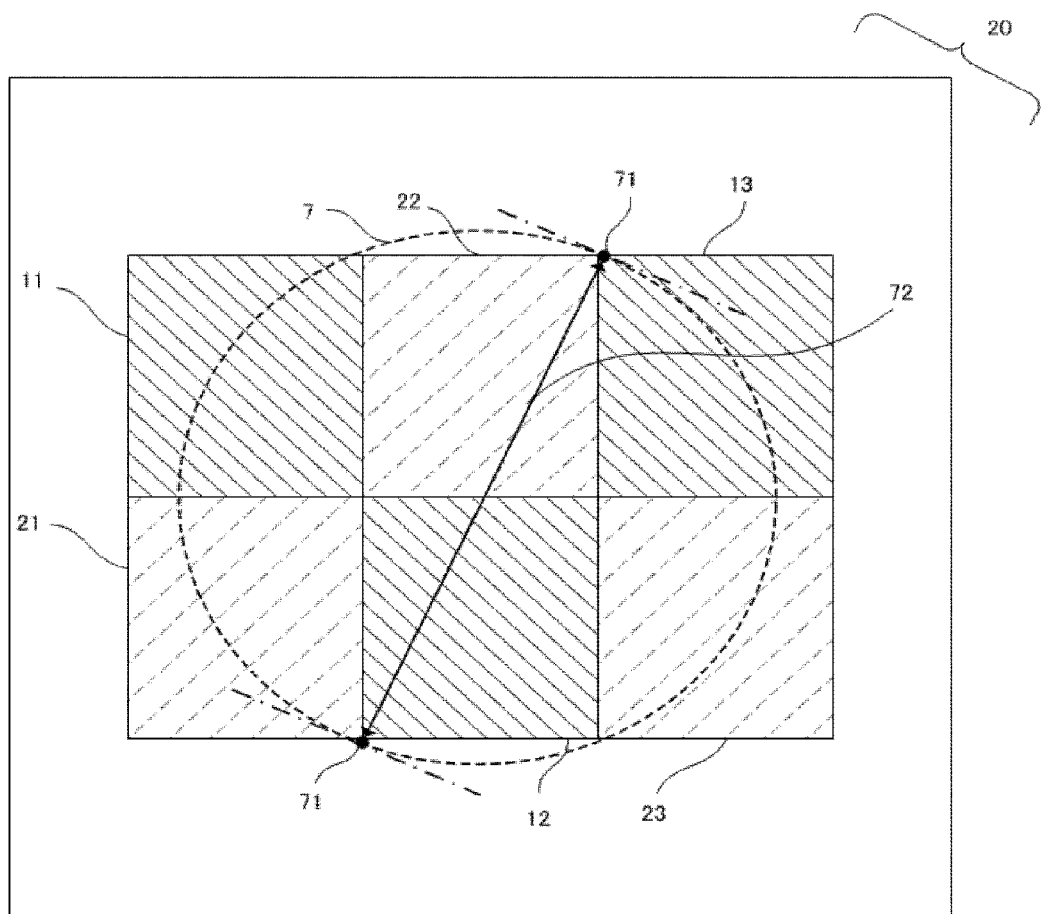
FIG. 50 is a diagram showing a disposition of light emitting areas of the packaged LED used for Example 2.

A 6 mm×9 mm ceramic package which includes a total of six light emitting units, as shown in FIG. 50, is prepared. Here a blue semiconductor light-emitting element, a green phosphor and a red phosphor are mounted and encapsulated in a light emitting area 1-1, a light emitting area 1-2 and a light emitting area 1-3, whereby equivalent light emitting areas are formed. The semiconductor light-emitting elements in the light emitting area 1-1, the light emitting area 1-2 and the light emitting area 1-3 are connected in series, and connected to one independent power supply. On the other hand, a purple semiconductor light-emitting element, a blue phosphor, a green phosphor and a red phosphor are mounted and encapsulated in a light emitting area 2-1, a light emitting area 2-2 and a light emitting area 2-3, whereby equivalent light emitting areas are formed. The semiconductor light-emitting elements in the light emitting area 2-1, the light emitting area 2-2 and the light emitting area 2-3 are connected in series, and connected to another independent power supply. Current can be injected into the light emitting area 1 and the light emitting area 2 independently from each other.

Figure 51:
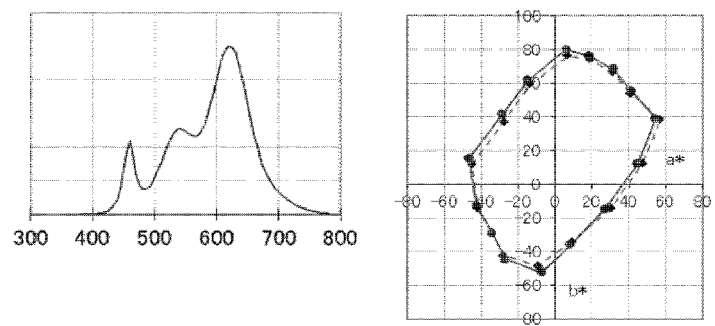
FIG. 51 is a diagram showing a spectral power distribution when the radiant flux ratio of the light emitting area 1 and the light emitting area 2 is 3:0 in Example 2, and a CIELAB color space on which are respectively plotted a* values and b* values of the 15 Munsell renotation color samples when respectively assuming a case (solid line) where an object is illuminated by the spectral power distribution and a case (dotted line) where an object is illuminated by calculational reference light corresponding to the spectral power distribution (drive point A)
Figure 52:
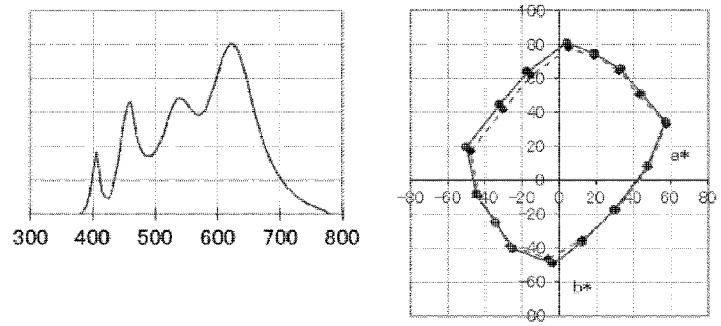
FIG. 52 is a diagram showing a spectral power distribution when the radiant flux ratio of the light emitting area 1 and the light emitting area 2 is 2:1 in Example 2, and a CIELAB color space on which are respectively plotted a* values and b* values of the 15 Munsell renotation color samples when respectively assuming a case (solid line) where an object is illuminated by the spectral power distribution and a case (dotted line) where an object is illuminated by calculational reference light corresponding to the spectral power distribution (drive point B)
Figure 53:
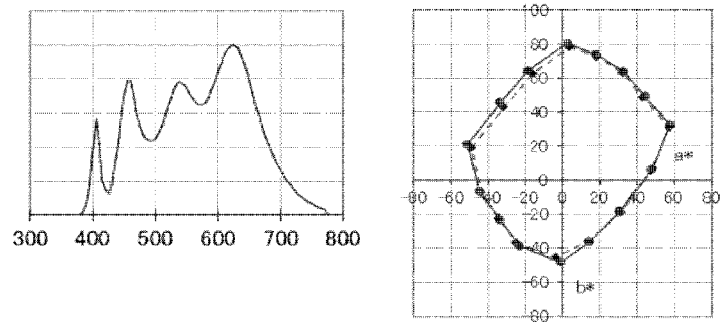
FIG. 53 is a diagram showing a spectral power distribution when the radiant flux ratio of the light emitting area 1 and the light emitting area 2 is 1.5:1.5 in Example 2, and a CIELAB color space on which are respectively plotted a* values and b* values of the 15 Munsell renotation color samples when respectively assuming a case (solid line) where an object is illuminated by the spectral power distribution and a case (dotted line) where an object is illuminated by calculational reference light corresponding to the spectral power distribution (drive point C)
Figure 54:
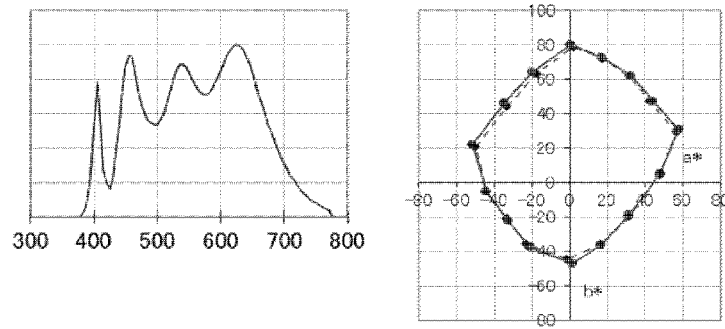
FIG. 54 is a diagram showing a spectral power distribution when the radiant flux ratio of the light emitting area 1 and the light emitting area 2 is 1:2 in Example 2, and a CIELAB color space on which are respectively plotted a* values and b* values of the 15 Munsell renotation color samples when respectively assuming a case (solid line) where an object is illuminated by the spectral power distribution and a case (dotted line) where an object is illuminated by calculational reference light corresponding to the spectral power distribution (drive point D)
Figure 55:
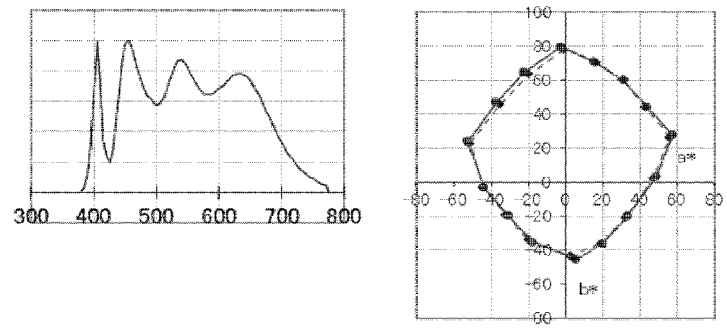
FIG. 55 is a diagram showing a spectral power distribution when the radiant flux ratio of the light emitting area 1 and the light emitting area 2 is 0:3 in Example 2, and a CIELAB color space on which are respectively plotted a* values and b* values of the 15 Munsell renotation color samples when respectively assuming a case (solid line) where an object is illuminated by the spectral power distribution and a case (dotted line) where an object is illuminated by calculational reference light corresponding to the spectral power distribution (drive point E)
Figure 56:
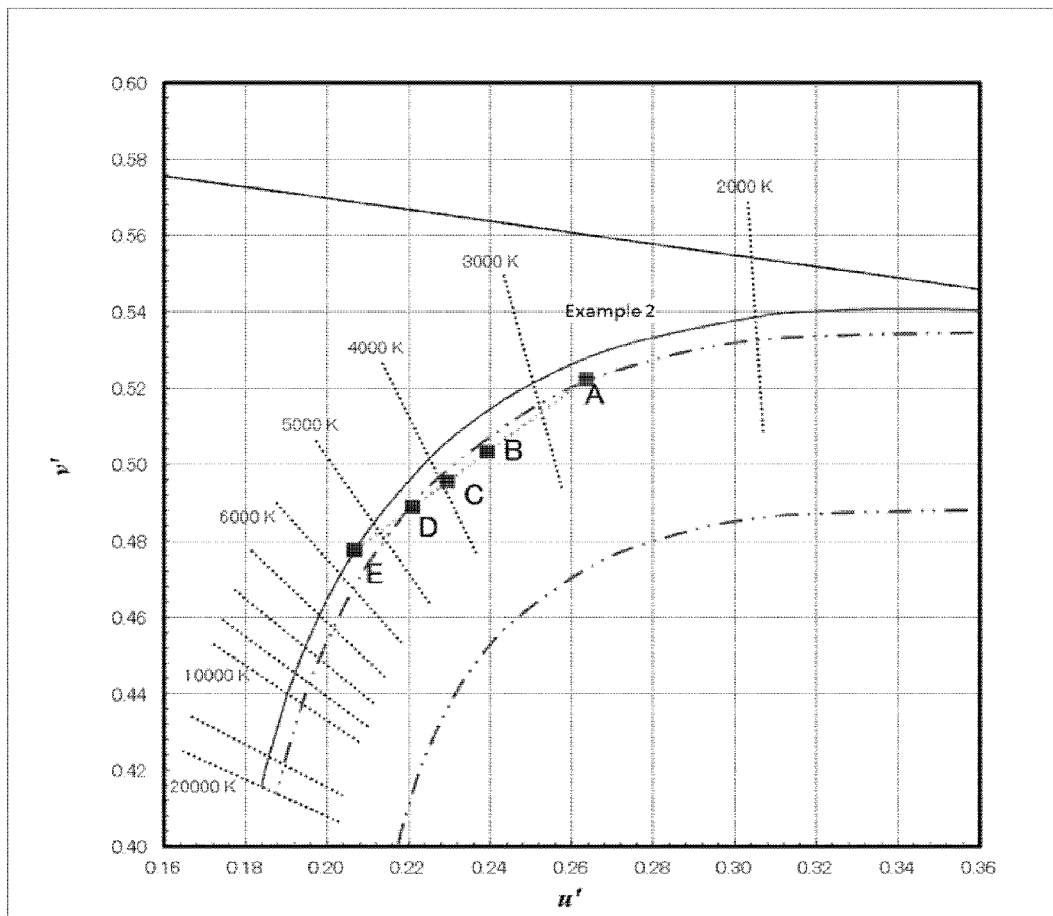
FIG. 56 is the CIE 1976 u'v' chromaticity diagram on which the chromaticity of the drive points A to E in Example 2 are indicated. The two-dot chain line in FIG. 56 is a range of $D_{uv}$ that satisfies Condition 1 of the first embodiment of the first to fourth inventions of the present invention.

Then if the current value of the current injected into each light emitting area of the packaged LED having the light emitting area 1 and the light emitting area 2 is appropriately adjusted, the five types of spectral power distributions shown in FIG. 51 to FIG. 55, irradiated onto the axis of the packaged LED, for example, are implemented. FIG. 51 is a case when current is injected only into the light emitting area 1 and the radiant flux ratio of the light emitting area 1 and the light emitting area 2 is set to 3:0, and FIG. 55 is a case when current is injected only into the light emitting area 2 and the radiant flux ratio of the light emitting area 1 and the light emitting area 2 is set to 0:3. FIG. 52 is a case when the radiant flux ratio of the light emitting area 1 and the light emitting area 2 is set to 2:1, FIG. 53 is a case when the radiant flux ratio is set to 1.5:1.5, and FIG. 54 is a case when the radiant flux ratio is set to 1:2. By changing the current to be injected into each area of the packaged LED 20, the radiant flux irradiated from the packaged LED main body onto the axis can be changed. The CIELAB plot in each drawing indicates the a* values and the b* values which are plotted respectively: when 15 Munsell renotation color samples #01 to #15 are mathematically assumed as the illumination objects, and these illumination objects are illuminated by the packaged LED; and when these illumination objects are illuminated by a reference light derived from the correlated color temperature of the packaged LED. Here the drive point names A to E are assigned to the radiant flux of the light-emitting device in descending order of contribution of the radiant flux of the light emitting area 1. FIG. 56 shows the chromaticity point at each of the drive points A to E on the CIE 1976 u'v' chromaticity diagram. Table 9 shows the photometric characteristics and colormetric characteristics that are expected at each drive point.

TABLE 9

Example 2

| Drive Point | (*1) | (*2) | $T_{SSL}$ (K) | $D_{uvSSL}$ | $|\Delta h_n|$ maximum value | $|\Delta h_n|$ minimum value | $\dfrac{\sum_{n=1}^{15} \Delta C_n}{15}$ | $\Delta C_{max}$ | $\Delta C_{min}$ | $|\Delta C_{max} - \Delta C_{min}|$ | $A_{cg}$ | Luminous efficacy of radiation (lm/W) | Ra |
|---|---|---|---|---|---|---|---|---|---|---|---|---|---|
| Drive Point A | (*3) | 3:0 | 2,700 | −0.00350 | 3.57 | 0.16 | 1.22 | 4.17 | −2.80 | 6.97 | 6.32 | 308 | 94 |
| Drive Point B | | 2:1 | 3,475 | −0.00642 | 3.29 | 0.15 | 1.42 | 3.79 | −0.93 | 4.72 | −41.37 | 279 | 95 |
| Drive Point C | | 1.5:1.5 | 3,931 | −0.00585 | 3.44 | 0.10 | 1.26 | 3.19 | −0.64 | 3.83 | −27.96 | 268 | 95 |

TABLE 9-continued

Example 2

| Drive Point | (*1) | (*2) | $T_{SSL}$ (K) | $D_{uvSSL}$ | $|\Delta h_n|$ maximum value | $|\Delta h_n|$ minimum value | $\dfrac{\sum_{n-1}^{15} \Delta C_n}{15}$ | $\Delta C_{max}$ | $\Delta C_{min}$ | $|\Delta C_{max} - \Delta C_{min}|$ | $A_{cg}$ | Luminous efficacy of radiation (lm/W) | Ra |
|---|---|---|---|---|---|---|---|---|---|---|---|---|---|
| Drive Point D | | 1:2 | 4,428 | −0.00439 | 3.50 | 0.05 | 1.05 | 2.58 | −0.56 | 3.14 | 3.50 | 259 | 95 |
| Drive Point E | | 0:3 | 5,506 | 0.00007 | 4.14 | 0.01 | 0.90 | 2.32 | −0.80 | 3.13 | −7.04 | 245 | 96 |

(*1) Light-emitting elements constituting each light emitting area
(*2) Radiant flux ratio of spectral power distribution $\phi_{SSL}1$ of light emitting area 1 and spectral power distribution $\phi_{SSL}2$ of light emitting area 2 ($\phi_{SSL}1:\phi_{SSL}2$)
(*3) Light emitting area 1: blue semiconductor light-emitting element, green phosphor and red phosphor; Light emitting area 2: purple semiconductor light-emitting element, blue phosphor, green phosphor and red phosphor The spectral power distributions in FIG. 51 to FIG. 55, the CIELAB plots in FIG. 51 to FIG. 55, the CIE 1976 u'v' chromaticity diagram in FIG. 56 and Table 9 clarify the following.

At the drive point A, the drive point D and the drive point E, one or both of $D_{uvSSL}$ and $A_{cg}$ is/are not in an appropriate range of the first embodiment of the first to fourth inventions of the present invention, but at the drive point B, the drive point C and in the areas between these drive points, a natural, vivid, highly visible and comfortable appearance of colors and appearance of objects, as if the objects are seen outdoors, can be implemented. For example, between the drive point B and the drive point C, the correlated color temperature of the packaged LED can be variable in a 3475 K to 3931 K range, and $D_{uvSSL}$ can also be variable in a −0.00642 to −0.00585 range, while implementing the above mentioned an appearance of colors. Further, the average saturation difference of the 15 Munsell renotation color samples can also be variable in a 1.42 to 1.26 range. Thus in the area where a preferable appearance of colors can be implemented, optimum illumination conditions can easily be selected from the variable range in accordance with the age, gender or the like of the user of the light-emitting device, or in accordance with the space, purpose or the like of the illumination.

In this case, the following drive control is also possible.

First, when at least one of the index $A_{cg}$, correlated color temperature $T_{SSL}$ (K), and distance $D_{uvSSL}$ from the black-body radiation locus, is changed, the luminous flux and/or radiant flux emitted from the light-emitting device in the main radiant direction can be unchangeable. If this control is performed, a difference of appearance of colors, caused by a change of the shape of the spectral power distribution, can be easily checked without depending on the luminance of the illumination object, which is preferable.

Second, when the index $A_{cg}$ is decreased in an appropriate range, the luminous flux and/or radiant flux of the light-emitting device can be decreased, so as to decrease the luminance of the illumination object.

Third, when $D_{uvSSL}$ is decreased in an appropriate range as well, the luminous flux and/or radiant flux of the light-emitting device can be decreased, so as to decrease the luminance of the illumination object. In the second and third cases, brightness is normally increased, hence if luminance is decreased then energy consumption can be suppressed, which is preferable.

Fourth, when the correlated color temperature is increased, the luminous flux and/or radiant flux of the light-emitting device can be increased, so as to increase the luminance of the illumination object. Under a general illumination environment, a relatively low luminance environment is often felt to be comfortable when the color temperature is in a low range, and a relatively high luminance environment is often felt to be comfortable when the color temperature is in a high range. This psychological effect is known as the Kruithof Effect, and performing control integrating this effect is also possible, and when the correlated color temperature is increased, it is preferable to increase the luminance of the illumination object by increasing the luminous flux and/or radiant flux of the light-emitting device.

Example 3

Figure 57:
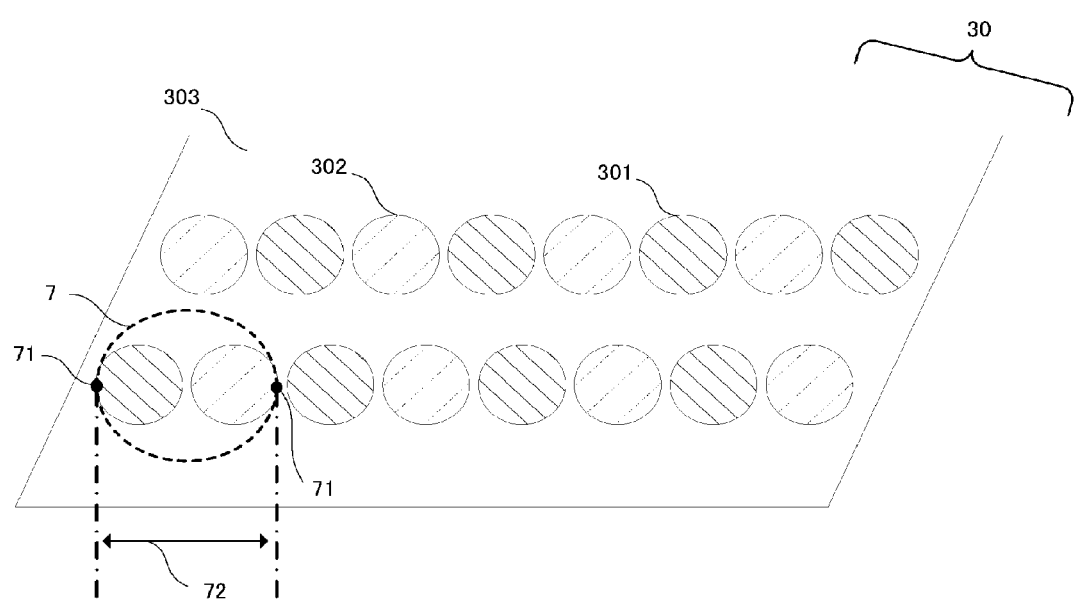
FIG. 57 is a diagram showing a disposition of the light emitting areas of the illumination system used for Example 3.

A light-emitting device, which is a 60 cm×120 cm illumination system embedded in a ceiling, and includes 16 LED light bulbs (light emitting units), is prepared, as shown in FIG. 57. Here each portion shaded by solid lines is a light emitting area 1, where the same LED bulb is mounted to form an equivalent light emitting area. Each portion shaded by the dotted lines in FIG. 57 is a light emitting area 2, where the same LED bulb is mounted to form an equivalent light emitting area. The LED light bulbs mounted in the plurality of light emitting areas 1 are connected in parallel, and connected to one independent power supply. On the other hand, the LED light bulbs mounted in the plurality of light emitting areas 2 are connected in parallel and connected to another independent power supply. The light emitting areas 1 and the light emitting areas 2 can be driven independently. The LED light bulb constituting the light emitting area 1 includes a blue semiconductor light-emitting element, a green phosphor and a red phosphor, and the LED light bulb constituting the light emitting area 2 includes a blue semiconductor light-emitting element, a green phosphor and a red phosphor which are adjusted differently.

Figure 58:
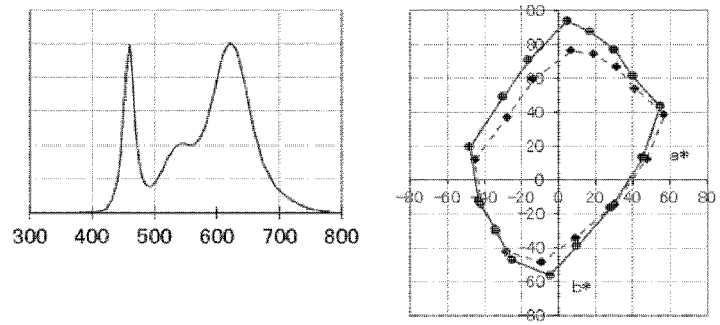
FIG. 58 is a diagram showing a spectral power distribution when the radiant flux ratio of the light emitting area 1 and the light emitting area 2 is 3:0 in Example 3, and a CIELAB color space on which are respectively plotted a* values and b* values of the 15 Munsell renotation color samples when respectively assuming a case (solid line) where an object is illuminated by the spectral power distribution and a case (dotted line) where an object is illuminated by calculational reference light corresponding to the spectral power distribution (drive point A)
Figure 59:
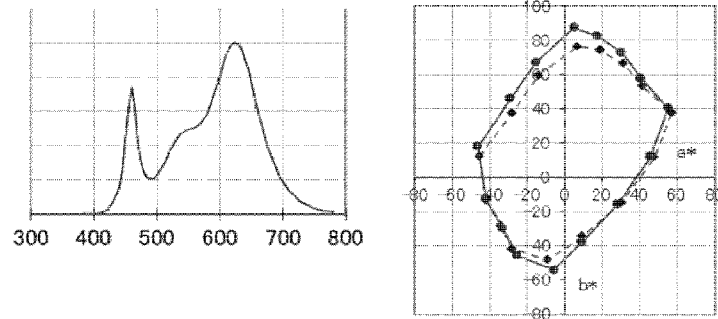
FIG. 59 is a diagram showing a spectral power distribution when the radiant flux ratio of the light emitting area 1 and the light emitting area 2 is 2:1 in Example 3, and a CIELAB color space on which are respectively plotted a* values and b* values of the 15 Munsell renotation color samples when respectively assuming a case (solid line) where an object is illuminated by the spectral power distribution and a case (dotted line) where an object is illuminated by calculational reference light corresponding to the spectral power distribution (drive point B)
Figure 60:
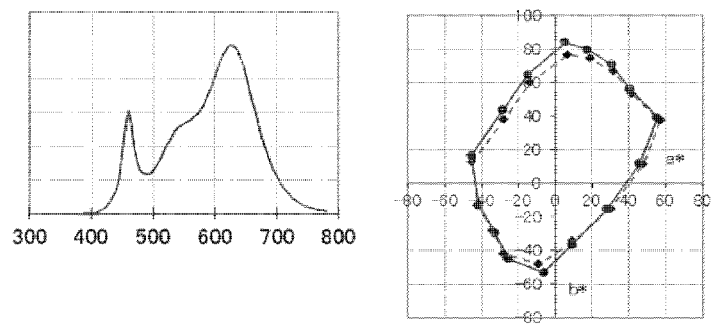
FIG. 60 is a diagram showing a spectral power distribution when the radiant flux ratio of the light emitting area 1 and the light emitting area 2 is 1.5:1.5 in Example 3, and a CIELAB color space on which are respectively plotted a* values and b* values of the 15 Munsell renotation color samples when respectively assuming a case (solid line) where an object is illuminated by the spectral power distribution and a case (dotted line) where an object is illuminated by calculational reference light corresponding to the spectral power distribution (drive point C)
Figure 61:
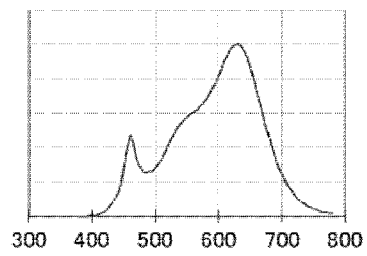
FIG. 61 is a diagram showing a spectral power distribution when the radiant flux ratio of the light emitting area 1 and the light emitting area 2 is 1:2 in Example 3, and a CIELAB color space on which are respectively plotted a* values and b* values of the 15 Munsell renotation color samples when respectively assuming a case (solid line) where an object is illuminated by the spectral power distribution and a case (dotted line) where an object is illuminated by calculational reference light corresponding to the spectral power distribution (drive point D)
Figure 61:
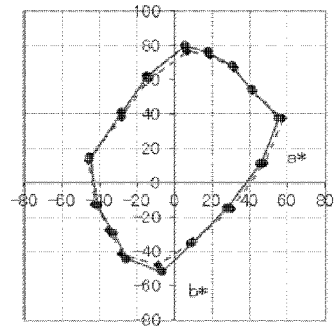
Figure 62:
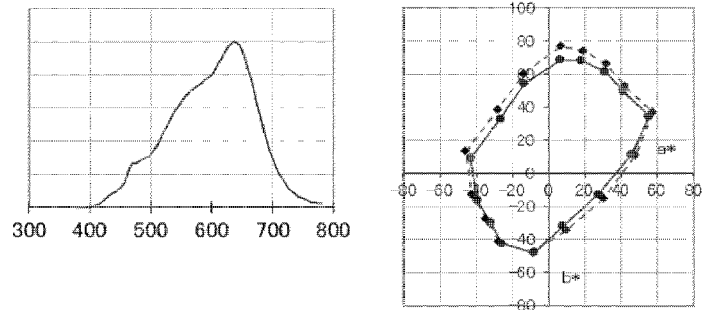
FIG. 62 is a diagram showing a spectral power distribution when the radiant flux ratio of the light emitting area 1 and the light emitting area 2 is 0:3 in Example 3, and a CIELAB color space on which are respectively plotted a* values and b* values of the 15 Munsell renotation color samples when respectively assuming a case (solid line) where an object is illuminated by the spectral power distribution and a case (dotted line) where an object is illuminated by calculational reference light corresponding to the spectral power distribution (drive point E)

Next, if the radiant fluxes of the LED light bulbs constituting the light emitting area 1 and the light emitting area 2 are appropriately adjusted using dimming controllers connected to the independent power supplies respectively, five types of spectral power distributions shown in FIG. 58 to FIG. 62 irradiated onto the central axis of the illumination system, for example, are implemented. FIG. 58 is a case when only the LED light bulbs constituting the light emitting areas 1 are driven, and the radiant flux ratio of the light emitting area 1 and the light emitting area 2 is set to 3:0, and FIG. 62 is a case when only the LED light bulbs constituting the light emitting areas 2 are driven and the radiant flux ratio of the light emitting area 1 and the light emitting area 2 is set to 0:3. FIG. 59 is a case when the radiant flux ratio of the LED light bulbs constituting the light emitting area 1 and the LED light emitting area 2 is set to 2:1. FIG. 60 is a case when the radiant flux ratio is set to 1.5:1.5, and FIG. 61 is a case when the radiant flux ratio is set to 1:2. By changing the driving conditions of the LED light values constituting each light emitting area, the radiant flux irradiated onto the central axis of the illumination system can be changed.

Figure 63:
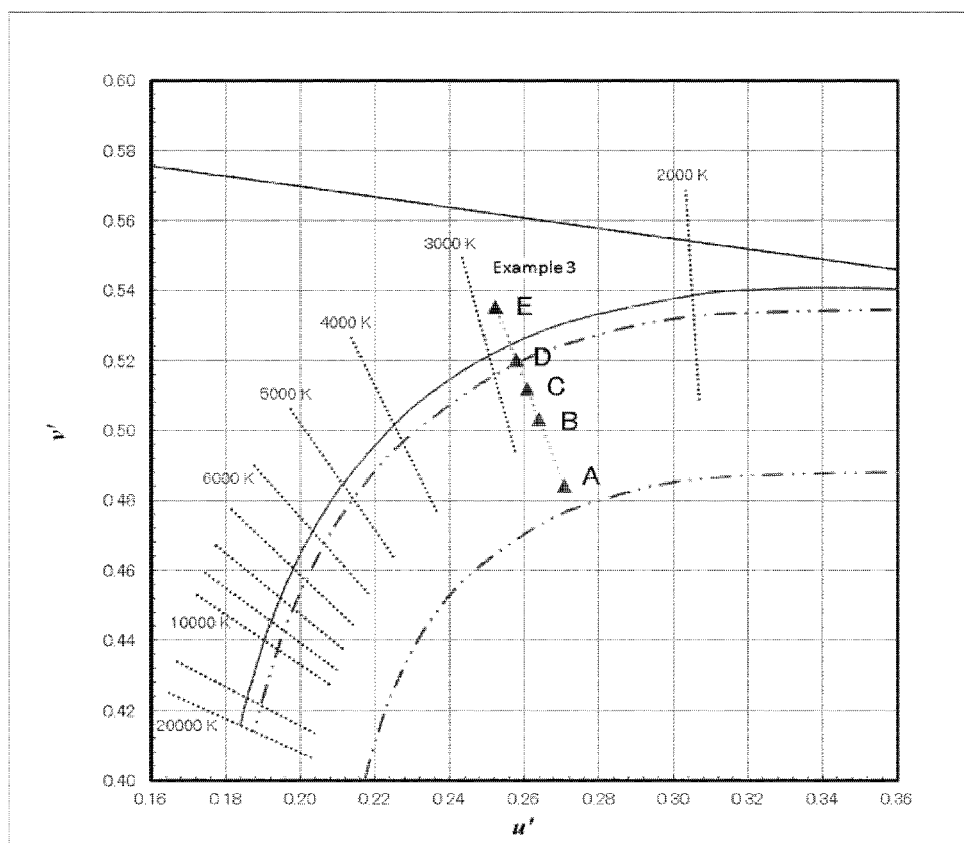
FIG. 63 is the CIE 1976 u'v' chromaticity diagram on which the chromaticity of the drive points A to E in Example 3 are indicated. The two-dot chain line in FIG. 63 is a range of $D_{uv}$ that satisfies Condition 1 of the first embodiment of the first to fourth inventions of the present invention.

The CIELAB plot in each drawing indicates the a* values and the b* values which are plotted respectively: when 15 Munsell renotation color samples #01 to #15 are mathematically assumed as the illumination objects and these illumination objects are illuminated using this illumination system; and when these illumination objects are illuminated by a reference light derived from the correlated color temperature of the light-emitting device of this illumination system. Here the drive point names A to E are assigned to the radiant flux of the illumination system (light-emitting device) in descending order of contribution of the radiant flux of the LED light bulb constituting the light emitting area 1. FIG. 63 shows the chromaticity points at each of the drive points A to E on the CIE 1976 u'v' chromaticity diagram. Table 10 shows the photometric characteristics and colormetric characteristics that are expected at each drive point.

In this case, the following drive control is also possible.

First, when at least one of the index $A_{cg}$, correlated color temperature $T_{SSL}$ (K), and distance $D_{uvSSL}$ from the black-body radiation locus, is changed, the luminous flux and/or the radiant flux emitted from the light-emitting device in the main radiant direction can be unchangeable. If this control is performed, a difference of appearance of colors, caused by a change of the shape of the spectral power distribution, can be easily checked without depending on the luminance of the illumination object, which is preferable.

Second, when the index $A_{cg}$ is decreased in an appropriate range, the luminous flux and/or radiant flux of the light-emitting device can be decreased, so as to decrease the luminance of the illumination object.

Third, when $D_{uvSSL}$ is decreased in an appropriate range as well, the luminous flux and/or radiant flux of the light-emitting device can be decreased, so as to decrease the luminance of the illumination object. In the second and third cases, brightness is normally increased, hence energy consumption can be suppressed by decreasing luminance, which is preferable.

TABLE 10

Example 3

| Drive Point | (*1) | (*2) | $T_{SSL}$ (K) | $D_{uvSSL}$ | $\|\Delta h_n\|$ maximum value | $\|\Delta h_n\|$ minimum value | $\dfrac{\sum_{n=1}^{15} \Delta C_n}{15}$ | $\Delta C_{max}$ | $\Delta C_{min}$ | $\|\Delta C_{max} - \Delta C_{min}\|$ | $A_{cg}$ | Luminous efficacy of radiation (lm/W) | Ra |
|---|---|---|---|---|---|---|---|---|---|---|---|---|---|
| Drive Point A | (*3) | 3:0 | 2,700 | −0.03000 | 7.42 | 0.05 | 5.78 | 17.43 | −1.97 | 19.41 | −218.09 | 270 | 83 |
| Drive Point B |  | 2:1 | 2,775 | −0.01591 | 5.66 | 0.08 | 3.46 | 10.87 | −1.91 | 12.78 | −87.63 | 279 | 91 |
| Drive Point C |  | 1.5:1.5 | 2,806 | −0.00942 | 4.34 | 0.02 | 2.14 | 7.20 | −1.92 | 9.12 | −21.42 | 283 | 94 |
| Drive Point D |  | 1:2 | 2,833 | −0.00325 | 3.92 | 0.13 | 0.64 | 3.28 | −2.09 | 5.37 | 40.74 | 287 | 96 |
| Drive Point E |  | 0:3 | 2,880 | 0.00819 | 5.78 | 0.29 | −3.33 | −0.07 | −8.02 | 7.95 | 133.16 | 294 | 92 |

(*1) Light-emitting elements constituting each light emitting area
(*2) Radiant flux ratio of spectral power distribution $\phi_{SSL}1$ of light emitting area 1 and spectral power distribution $\phi_{SSL}2$ of light emitting area 2 ($\phi_{SSL}1:\phi_{SSL}2$)
(*3) Light emitting area 1: blue semiconductor light-emitting element, green phosphor and red phosphor; Light emitting area 2: blue semiconductor light-emitting element, green phosphor and red phosphor The spectral power distributions in FIG. 58 to FIG. 62, the CIELAB plots in FIG. 58 to FIG. 62, the CIE 1976 u'v' chromaticity diagram in FIG. 63 and Table 10 clarify the following.

At the drive point D and the drive point E, both $D_{uvSSL}$ and $A_{cg}$ are not in an appropriate range of the first embodiment of the first to fourth inventions of the present invention, but at the drive point A, the drive point B, the drive point C, and areas between and near these drive points, a natural, vivid, highly visible and comfortable appearance of colors and appearance of objects, as of the objects are seen outdoors, can be implemented. For example, between the drive point A and the drive point C, the correlated color temperature of the illumination system can be variable in a 2700 K to 2806 K range, and $D_{uvSSL}$ can also be variable in a −0.03000 to −0.00942 range, while implementing the above mentioned appearance of colors. Further, the average saturation difference of the 15 Munsell renotation color samples can also be variable in a 5.78 to 2.14 range. Thus in the area where a preferable appearance of colors can be implemented, optimum illumination conditions can easily be selected from the variable range in accordance with the age, gender or the like of the user of the light-emitting device, or in accordance with the space, purpose or the like of the illumination.

Fourth, when the correlated color temperature is increased, the luminous flux and/or radiant flux of the light-emitting device can be increased, so as to increase the luminance of the illumination object. Under a general illumination environment, a relatively low luminance environment is often felt to be comfortable when the color temperature is in a low range, and a relatively high luminance environment is often felt to be comfortable when the color temperature is in a high range. This psychological effect is known as the Kruithof Effect, and performing control integrating this effect is also possible, and when the correlated color temperature is increased, it is preferable to increase the luminance of the illumination object by increasing the luminous flux and/or radiant flux of the light-emitting device.

Example 4

Figure 64:
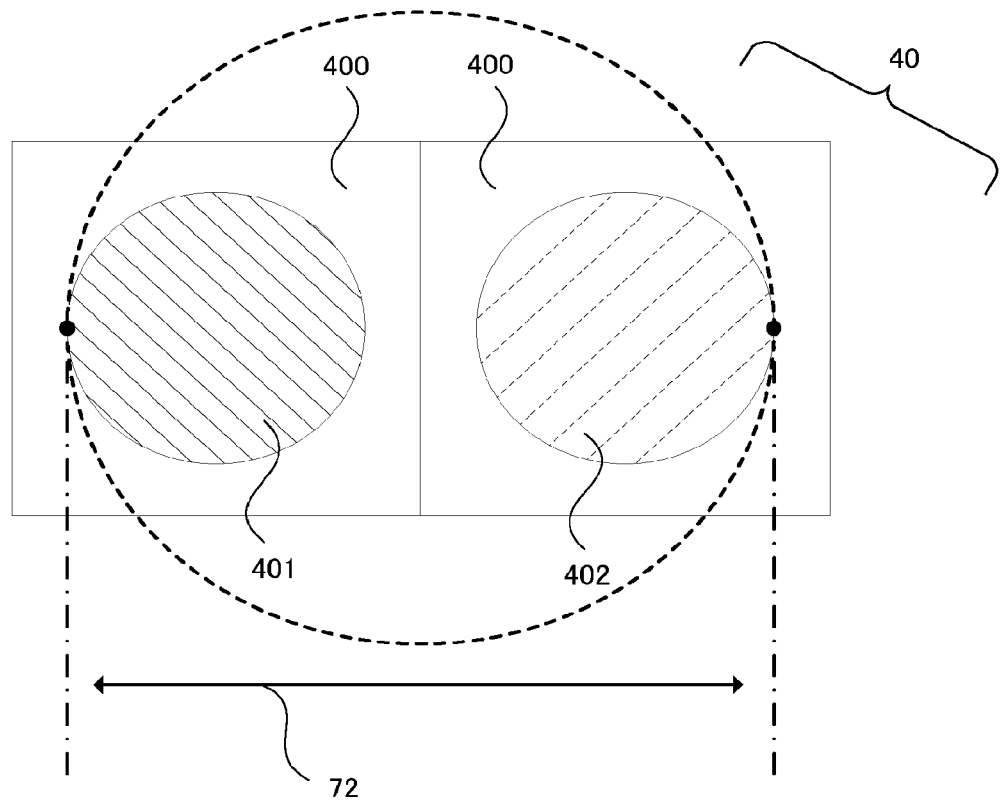
FIG. 64 is a diagram showing the deposition of the light emitting areas of the light-emitting device (pair of packaged LEDs) used for Example 4.

A pair of ceramic packages, in which two 5 mm×5 mm ceramic packages, including one light emitting area respectively, are disposed close to each other, is prepared as shown in FIG. 64. Here one of the ceramic packages becomes the light emitting area 1 and the other becomes the light emitting area 2. In the light emitting area 1, a purple semiconductor light-emitting element, a blue phosphor, a green phosphor and a red phosphor are mounted and encapsulated. The light emitting area 1 is connected to one independent power supply. In the light emitting area 2, on the other hand, a blue semiconductor light-emitting element and a yellow phosphor are mounted and encapsulated. The light emitting area 2 is connected to another independent power supply. Thereby current can be injected into the light emitting area 1 and the light emitting area 2 independently.

Figure 65:
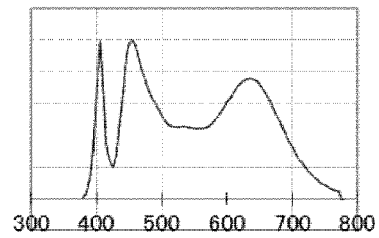
FIG. 65 is a diagram showing a spectral power distribution when the radiant flux ratio of the light emitting area 1 and the light emitting area 2 is 9:0 in Example 4, and a CIELAB color space on which are respectively plotted a* values and b* values of the 15 Munsell renotation color samples when respectively assuming a case (solid line) where an object is illuminated by the spectral power distribution and a case (dotted line) where an object is illuminated by calculational reference light corresponding to the spectral power distribution (drive point A)
Figure 65:
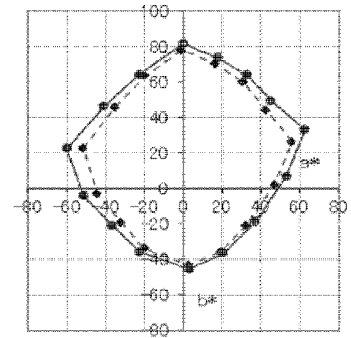
Figure 66:
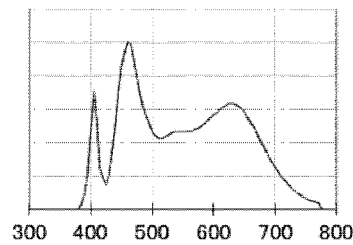
FIG. 66 is a diagram showing a spectral power distribution when the radiant flux ratio of the light emitting area 1 and the light emitting area 2 is 6:3 in Example 4, and a CIELAB color space on which are respectively plotted a* values and b* values of the 15 Munsell renotation color samples when respectively assuming a case (solid line) where an object is illuminated by the spectral power distribution and a case (dotted line) where an object is illuminated by calculational reference light corresponding to the spectral power distribution (drive point B)
Figure 66:
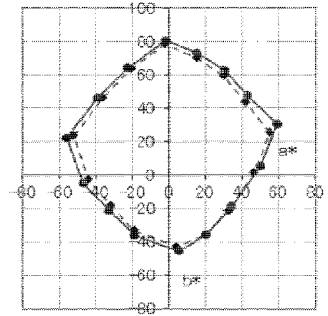
Figure 67:
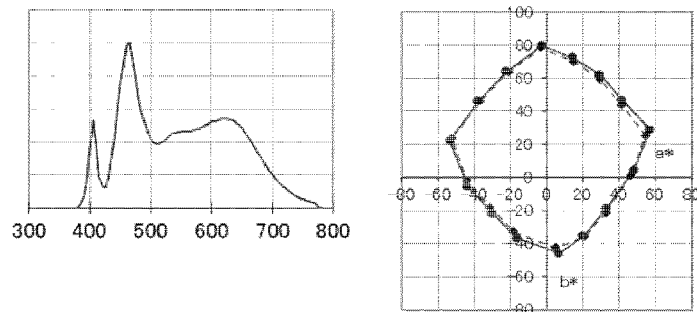
FIG. 67 is a diagram showing a spectral power distribution when the radiant flux ratio of the light emitting area 1 and the light emitting area 2 is 4.5:4.5 in Example 4, and a CIELAB color space on which are respectively plotted a* values and b* values of the 15 Munsell renotation color samples when respectively assuming a case (solid line) where an object is illuminated by the spectral power distribution and a case (dotted line) where an object is illuminated by calculational reference light corresponding to the spectral power distribution (drive point C)
Figure 68:
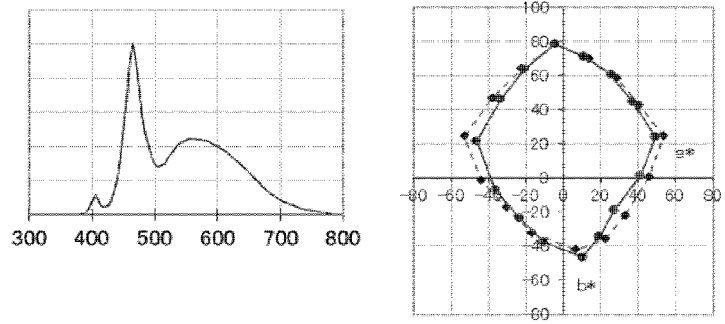
FIG. 68 is a diagram showing a spectral power distribution when the radiant flux ratio of the light emitting area 1 and the light emitting area 2 is 1:8 in Example 4, and a CIELAB color space on which are respectively plotted a* values and b* values of the 15 Munsell renotation color samples when respectively assuming a case (solid line) where an object is illuminated by the spectral power distribution and a case (dotted line) where an object is illuminated by calculational reference light corresponding to the spectral power distribution (drive point D)
Figure 69:
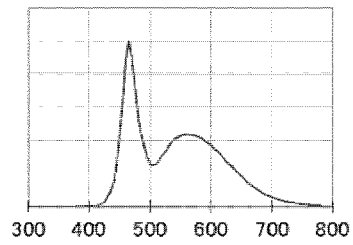
FIG. 69 is a diagram showing a spectral power distribution when the radiant flux ratio of the light emitting area 1 and the light emitting area 2 is 0:9 in Example 4, and a CIELAB color space on which are respectively plotted a* values and b* values of the 15 Munsell renotation color samples when respectively assuming a case (solid line) where an object is illuminated by the spectral power distribution and a case (dotted line) where an object is illuminated by calculational reference light corresponding to the spectral power distribution (drive point E)
Figure 69:
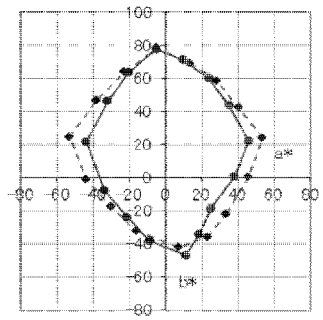
Figure 70:
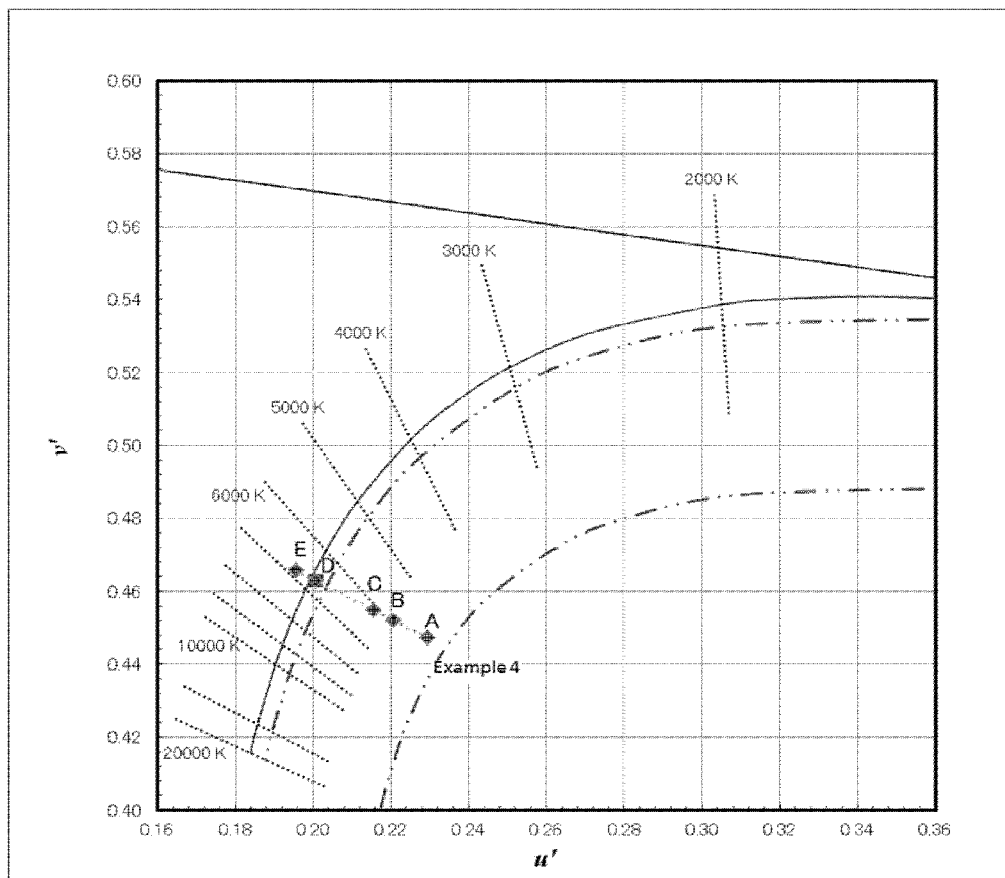
FIG. 70 is the CIE 1976 u'v' chromaticity diagram on which the chromaticity of the drive points A to E in Example 4 are indicated. The two-dot chain line in FIG. 70 is a range of $D_{uv}$ that satisfies Condition 1 of the first embodiment of the first to fourth inventions of the present invention.

Next, if the current value of the current injected into each light emitting area of the pair of packaged LEDs 40, which are the light emitting area 1 and the light emitting area 2, is appropriately adjusted, five types of spectral power distributions shown in FIG. 65 to FIG. 69 irradiated onto the axis of the pair of packaged LEDs, for example, are implemented. FIG. 65 is a case when current is injected only into the light emitting area 1 and the radiant flux ratio of the light emitting area 1 and the light emitting area 2 is set to 9:0, and FIG. 69 is a case when current is injected only into the light emitting area 2 and the radiant flux ratio of the light emitting area 1 and the light emitting area 2 is set to 0:9. FIG. 66 is a case when the radiant flux ratio of the light emitting area 1 and the light emitting area 2 is set to 6:3, FIG. 67 is a case when the radiant flux ratio is set to 4.5:4.5, and FIG. 68 is a case when the radiant flux ratio is set to 1:8. By changing the current to be injected into each area of the pair of packaged LEDs 40, the radiant flux irradiated from the main body of the pair of packaged LEDs onto the central axis can be changed. The CIELAB plot in each drawing indicates the a* values and the b* values which are plotted respectively: when 15 Munsell renotation color samples #01 to #15 are mathematically assumed as the illumination objects, and these illumination objects are illuminated by the pair of packaged LEDs; and when these illumination objects are illuminated by a reference light derived from the correlated color temperature of the pair of packaged LEDs. Here the drive point names A to E are assigned to the radiant flux of the light-emitting device in descending order of contribution of the radiant flux of the light emitting area 1. FIG. 70 shows the chromaticity points at each of the drive points A to E on the CIE 1976 u'v' chromaticity diagram. Table 11 shows the photometric characteristics and colormetric characteristics that are expected at each drive point.

The spectral power distributions in FIG. 65 to FIG. 69, the CIELAB plots in FIG. 65 to FIG. 69, the CIE 1976 u'v' chromaticity diagram in FIG. 70 and Table 11 clarify the following.

At the drive point A, the drive point D and the drive point E, one or both of $D_{uvSSL}$ and $A_{cg}$ is/are not in an appropriate range of the first embodiment of the first to fourth inventions of the present invention, but at the drive point B, the drive point C and areas between and near these drive points, a natural, vivid, highly visible and comfortable appearance of colors and appearance of objects, as if the objects are seen outdoors, can be implemented. For example, between the drive point B and the drive point C, the correlated color temperature as the packaged LED can be variable in a 5889 K to 6100 K, and $D_{uvSSL}$ can also be variable in a −0.02163 to −0.01646 range, while implementing the above mentioned appearance of colors. Further, the average saturation difference of the 15 Munsell renotation color samples can also be variable in a 2.57 to 1.43 range. Thus in the area where a preferable appearance of colors can be implemented, optimum illumination conditions can easily by selected from the variable range in accordance with the age, gender or the like of the user of the light-emitting device, or in accordance with the space, purpose or the like of the illumination.

In this case, the following drive control is also possible.

First, when at least one of the index $A_{cg}$, correlated color temperature $T_{SSL}$ (K), and distance $D_{uvSSL}$ from the blackbody radiation locus, is changed, the luminous flux and/or radiant flux emitted from the light-emitting device in the main radiant direction can be unchangeable. If this control is performed, a difference of appearance of colors, caused by a change of the shape of the spectral power distribution, can be easily checked without depending on the luminance of the illumination object, which is preferable.

Second, when the index $A_{cg}$ is decreased in an appropriate range, the luminous flux and/or radiant flux of the light-emitting device can be decreased, so as to decrease the luminance of the illumination object.

Third, when $D_{uvSSL}$ is decreased in an appropriate range as well, the luminous flux and/or radiant flux of the light-emitting device can be decreased, so as to decrease the luminance of the illumination object. In the second and third cases, brightness is normally increased, hence energy consumption can be suppressed by decreasing luminance, which is preferable.

TABLE 11

Example 4

| Example 4 | (*1) | (*2) | $T_{SSL}$ (K) | $D_{uvSSL}$ | $\|\Delta h_n\|$ maximum value | $\|\Delta h_n\|$ minimum value | $\sum_{n=1}^{15} \Delta C_n / 15$ | $\Delta C_{max}$ | $\Delta C_{min}$ | $\|\Delta C_{max} - \Delta C_{min}\|$ | $A_{cg}$ | Luminous efficacy of radiation (lm/W) | Ra |
|---|---|---|---|---|---|---|---|---|---|---|---|---|---|
| Drive Point A | (*3) | 9:0 | 5,500 | −0.03029 | 5.94 | 0.19 | 4.47 | 9.11 | 1.32 | 7.79 | −363.31 | 200 | 71 |
| Drive Point B | | 6:3 | 5,889 | −0.02163 | 4.50 | 0.11 | 2.57 | 5.90 | −0.03 | 5.93 | −211.44 | 219 | 80 |
| Drive Point C | | 4.5:4.5 | 6,100 | −0.01646 | 5.57 | 0.24 | 1.43 | 3.68 | −1.35 | 5.03 | −128.01 | 231 | 85 |
| Drive Point D | | 1:8 | 6,644 | −0.00145 | 14.57 | 0.16 | −1.97 | 4.99 | −6.99 | 11.98 | 69.36 | 275 | 86 |
| Drive Point E | | 0:9 | 6,814 | 0.00382 | 18.10 | 0.31 | −3.20 | 5.55 | −9.51 | 15.06 | 116.79 | 294 | 81 |

(*1) Light-emitting elements constituting each light emitting area
(*2) Radiant flux ratio of spectral power distribution $\phi_{SSL}1$ of light emitting area 1 and spectral power distribution $\phi_{SSL}2$ of light emitting area 2 ($\phi_{SSL}1:\phi_{SSL}2$)
(*3) Light emitting area 1: purple semiconductor light-emitting element, blue phosphor, green phosphor and red phosphor; Light emitting area 2: blue semiconductor light-emitting element and yellow phosphor Fourth, when the correlated color temperature is increased, the luminous flux and/or radiant flux of the light-emitting device can be increased, so as to increase the luminance of the illumination object. Under a general illumination environment, a relatively low luminance environment is often felt to be comfortable when the color temperature is in a low range, and a relatively high luminance environment is often felt to be comfortable when the color temperature is in a high range. This psychological effect is known as the Kruithof Effect, and performing control integrating this effect is also possible, and when the correlated color temperature is increased, it is preferable to increase the luminance of the illumination object by increasing the luminous flux and/or radiant flux of the light-emitting device.

Comparative Example 1

A resin packaged LED similar to Example 1 is prepared except for the following difference. In the light emitting area 1, a blue semiconductor light-emitting element, a green phosphor and a red phosphor are mounted and encapsulated, but unlike Example 1, the mixing ratio thereof is changed so that the spectral power distribution, when power is supplied only to the light emitting area 1, becomes the same as the case of the drive point E of Example 3. In the light emitting area 2, a blue semiconductor light-emitting element and a yellow phosphor are mounted and encapsulated unlike Example 1, so that the spectral power distribution when power is supplied only to the light emitting area 2 becomes the same as the case of the drive point E of Example 4.

Figure 71:
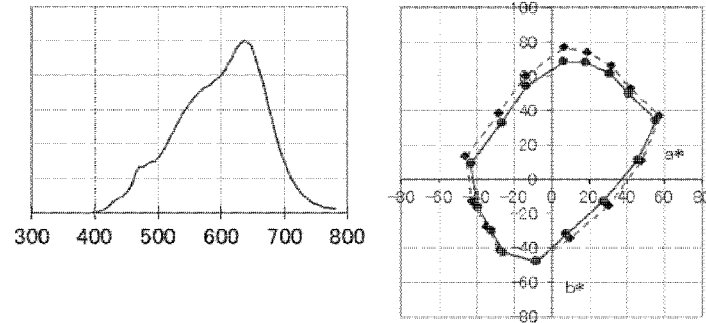
FIG. 71 is a diagram showing a spectral power distribution when the radiant flux ratio of the light emitting area 1 and the light emitting area 2 is 3:0 in Comparative Example 1, and a CIELAB color space on which are respectively plotted a* values and b* values of the 15 Munsell renotation color samples when respectively assuming a case (solid line) where an object is illuminated by the spectral power distribution and a case (dotted line) where an object is illuminated by calculational reference light corresponding to the spectral power distribution (drive point A)
Figure 72:
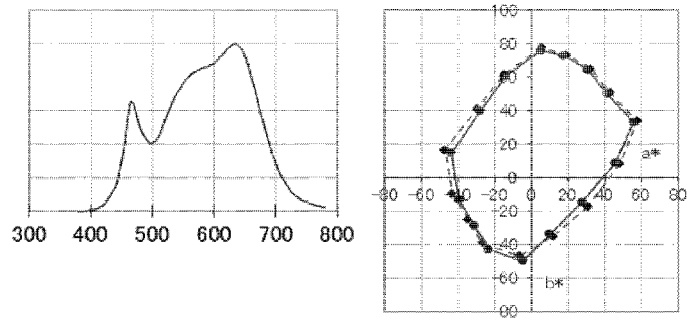
FIG. 72 is a diagram showing a spectral power distribution when the radiant flux ratio of the light emitting area 1 and the light emitting area 2 is 2:1 in Comparative Example 1, and a CIELAB color space on which are respectively plotted a* values and b* values of the 15 Munsell renotation color samples when respectively assuming a case (solid line) where an object is illuminated by the spectral power distribution and a case (dotted line) where an object is illuminated by calculational reference light corresponding to the spectral power distribution (drive point B)
Figure 73:
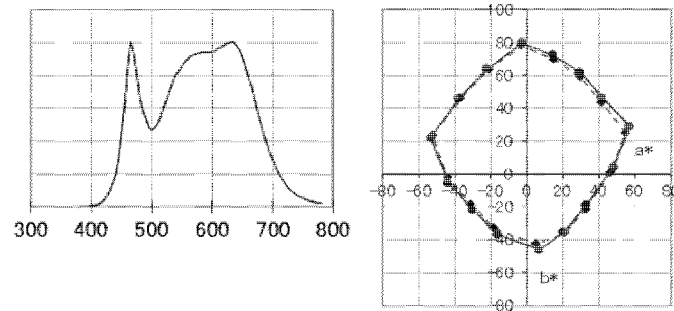
FIG. 73 is a diagram showing a spectral power distribution when the radiant flux ratio of the light emitting area 1 and the light emitting area 2 is 1.5:1.5 in Comparative Example 1, and a CIELAB color space on which are respectively plotted a* values and b* values of the 15 Munsell renotation color samples when respectively assuming a case (solid line) where an object is illuminated by the spectral power distribution and a case (dotted line) where an object is illuminated by calculational reference light corresponding to the spectral power distribution (drive point C)
Figure 74:
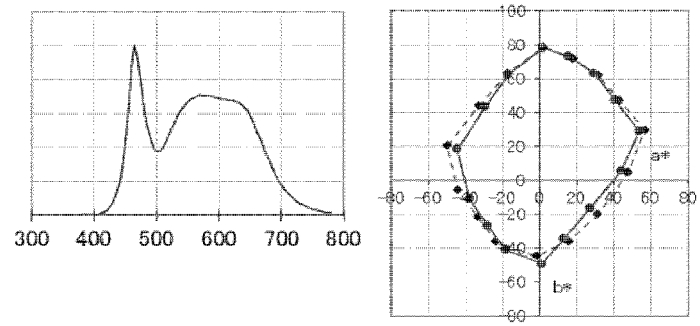
FIG. 74 is a diagram showing a spectral power distribution when the radiant flux ratio of the light emitting area 1 and the light emitting area 2 is 1:2 in Comparative Example 1, and a CIELAB color space on which are respectively plotted a* values and b* values of the 15 Munsell renotation color samples when respectively assuming a case (solid line) where an object is illuminated by the spectral power distribution and a case (dotted line) where an object is illuminated by calculational reference light corresponding to the spectral power distribution (drive point D)
Figure 75:
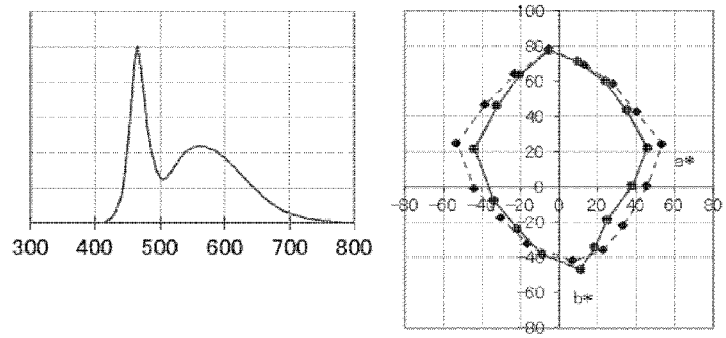
FIG. 75 is a diagram showing a spectral power distribution when the radiant flux ratio of the light emitting area 1 and the light emitting area 2 is 0:3 in Comparative Example 1, and a CIELAB color space on which are respectively plotted a* values and b* values of the 15 Munsell renotation color samples when respectively assuming a case (solid line) where an object is illuminated by the spectral power distribution and a case (dotted line) where an object is illuminated by calculational reference light corresponding to the spectral power distribution (drive point E)
Figure 76:
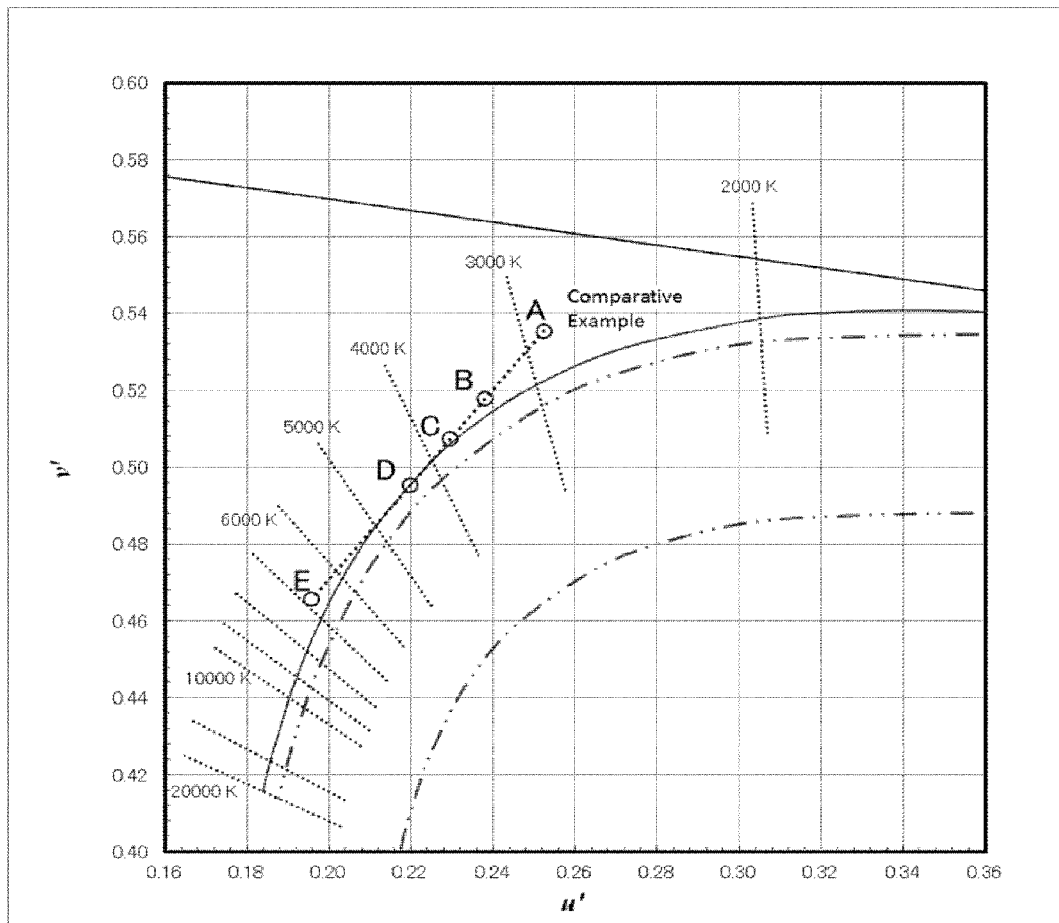
FIG. 76 is the CIE 1976 u'v' chromaticity diagram on which the chromaticity of the drive points A to E in Comparative Example 1 are indicated. The two-dot chain line in FIG. 76 is a range of $D_{uv}$ that satisfies Condition 1 of the first embodiment of the first to fourth inventions of the present invention.

Next, if the current value of current injected into each light emitting area of the packaged LED having the light emitting area 1 and the light emitting area 2 is appropriately adjusted, five types of spectral power distributions shown in FIG. 71 to FIG. 75 irradiated onto the axis of the packaged LED, for example, are implemented. FIG. 71 is a case when current is injected only into the light emitting area 1 and the radiant flux ratio of the light emitting area 1 and the light emitting area 2 is set to 3:0, and FIG. 75 is a case when current is injected only into the light emitting area 2 and the radiant flux ratio of the light emitting area 1 and the light emitting area 2 is set to 0:3. FIG. 72 is a case when the radiant flux ratio of the light emitting area 1 and the light emitting area 2 is set to 2:1, FIG. 73 is a case when the radiant flux ratio is set to 1.5:1.5, and FIG. 74 is a case when the radiant flux ratio is set to 1:2. By changing the current to be injected into each area of the packaged LED, the radiant flux irradiated from the packaged LED main body onto the axis can be changed. The CIELAB plot in each drawing indicates the a* values and the b* values which are plotted respectively: when 15 Munsell renotation color samples #01 to #15 are mathematically assumed as the illumination objects and these illumination objects are illuminated by the packaged LED; and when these illumination objects are illuminated by a reference light derived from the correlated color temperature of the packaged LED. Here the drive point names A to E are assigned to the radiant flux of the light-emitting device in descending order of contribution of the radiant flux of the light emitting area 1. FIG. 76 shows the chromaticity points at each of the drive points A to E on the CIE 1976 u'v' chromaticity diagram. Table 12 shows the photometric characteristics and colormetric characteristics that are expected at each drive point.

TABLE 12

Comparative Example 1

| Comparative Example 1 | (*1) | (*2) | $T_{SSL}$ (K) | $D_{uvSSL}$ | $\|\Delta h_n\|$ maximum value | $\|\Delta h_n\|$ minimum value | $\dfrac{\sum_{n=1}^{15} \Delta C_n}{15}$ | $\Delta C_{max}$ | $\Delta C_{min}$ | $\|\Delta C_{max} - \Delta C_{min}\|$ | $A_{cg}$ | Luminous efficacy of radiation (lm/W) | Ra |
|---|---|---|---|---|---|---|---|---|---|---|---|---|---|
| Drive Point A | (*3) | 3:0 | 2,880 | 0.00819 | 5.78 | 0.29 | −3.33 | −0.07 | −8.02 | 7.95 | 133.16 | 294 | 92 |
| Drive Point B | | 2:1 | 3,360 | 0.00280 | 7.02 | 0.04 | −1.36 | 2.81 | −3.93 | 6.73 | 101.00 | 294 | 93 |
| Drive Point C | | 1.5:1.5 | 3,749 | 0.00077 | 8.74 | 0.04 | −1.25 | 3.67 | −4.54 | 8.21 | 97.77 | 294 | 92 |
| Drive Point D | | 1:2 | 4,328 | −0.00025 | 11.08 | 0.17 | −1.56 | 4.41 | −5.60 | 10.02 | 102.18 | 294 | 89 |
| Drive Point E | | 0:3 | 6,814 | 0.00382 | 18.10 | 0.31 | −3.20 | 5.55 | −9.51 | 15.06 | 116.79 | 294 | 81 |

(*1) Light-emitting elements constituting each light emitting area
(*2) Radiant flux ratio of spectral power distribution $\phi_{SSL}1$ of light emitting area 1 and spectral power distribution $\phi_{SSL}2$ of light emitting area 2 ($\phi_{SSL}1:\phi_{SSL}2$)
(*3) Light emitting area 1: blue semiconductor light-emitting element, green phosphor and red phosphor; Light emitting area 2: blue semiconductor light-emitting element and yellow phosphor The spectral power distributions in FIG. 71 to FIG. 75, the CIELAB plots in FIG. 71 to FIG. 75, the CIE 1976 u'v' chromaticity diagram in FIG. 76 and Table 12 clarify the following.

At any of the drive points A to E, one or both of $D_{uvSSL}$ and $A_{cg}$ is/are not in an appropriate range of the first embodiment of the first to fourth inventions of the present invention. Therefore at any drive point, a natural, vivid, highly visible and comfortable appearance of colors and appearance of objects, as if the objects are seen outdoors, is not implemented in a variable range as the packaged LED.

Example 5

A 6 mm×9 mm ceramic package, which includes a total of six light emitting units, as shown in FIG. 50, is prepared. Here a blue semiconductor light-emitting element, a green phosphor and a red phosphor are mounted and encapsulated in a light emitting area 1-1, a light emitting area 1-2 and a light emitting area 1-3 so as to be equivalent light emitting areas. The semiconductor light-emitting elements in the light emitting area 1-1, the light emitting area 1-2 and the light emitting area 1-3 are connected in series and connected to one independent power supply. On the other hand, a blue semiconductor light-emitting element, a green phosphor and a red phosphor, which are adjusted differently, are mounted and encapsulated in a light emitting area 2-1, a light emitting area 2-2 and a light emitting area 2-3, so as to be equivalent light emitting areas. The semiconductor light-emitting elements in the light emitting area 2-1, the light emitting area 2-2 and the light emitting area 2-3 are connected in series and connected to another independent power supply. Current can be injected into the light emitting area 1 and the light emitting area 2 independently from each other.

Figure 77:
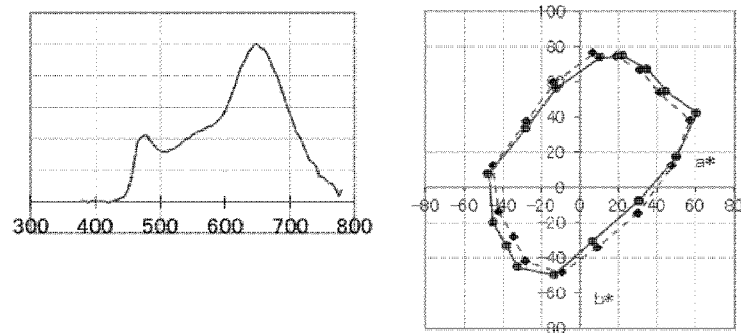
FIG. 77 is a diagram showing a spectral power distribution when the radiant flux ratio of the light emitting area 1 and the light emitting area 2 is 3:0 in Example 5, and a CIELAB color space on which are respectively plotted a* values and b* values of the 15 Munsell renotation color samples when respectively assuming a case (solid line) where an object is illuminated by the spectral power distribution and a case (dotted line) where an object is illuminated by calculational reference light corresponding to the spectral power distribution (drive point A)
Figure 78:
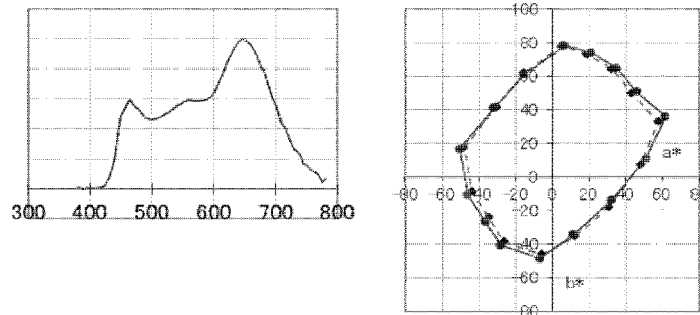
FIG. 78 is a diagram showing a spectral power distribution when the radiant flux ratio of the light emitting area 1 and the light emitting area 2 is 2:1 in Example 5, and a CIELAB color space on which are respectively plotted a* values and b* values of the 15 Munsell renotation color samples when respectively assuming a case (solid line) where an object is illuminated by the spectral power distribution and a case (dotted line) where an object is illuminated by calculational reference light corresponding to the spectral power distribution (drive point B)
Figure 79:
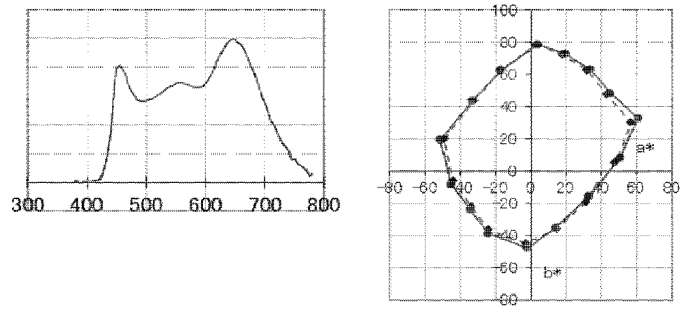
FIG. 79 is a diagram showing a spectral power distribution when the radiant flux ratio of the light emitting area 1 and the light emitting area 2 is 1.5:1.5 in Example 5, and a CIELAB color space on which are respectively plotted a* values and b* values of the 15 Munsell renotation color samples when respectively assuming a case (solid line) where an object is illuminated by the spectral power distribution and a case (dotted line) where an object is illuminated by calculational reference light corresponding to the spectral power distribution (drive point C)
Figure 80:
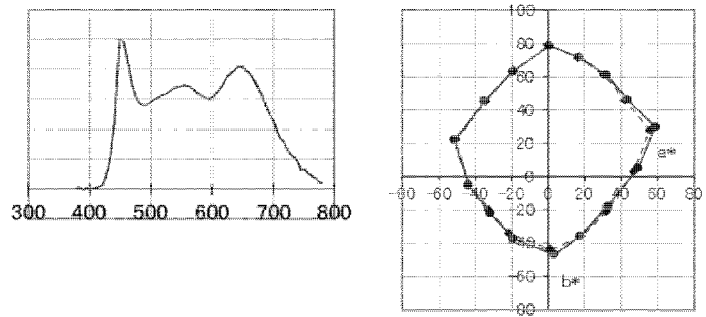
FIG. 80 is a diagram showing a spectral power distribution when the radiant flux ratio of the light emitting area 1 and the light emitting area 2 is 1:2 in Example 5, and a CIELAB color space on which are respectively plotted a* values and b* values of the 15 Munsell renotation color samples when respectively assuming a case (solid line) where an object is illuminated by the spectral power distribution and a case (dotted line) where an object is illuminated by calculational reference light corresponding to the spectral power distribution (drive point D)
Figure 81:
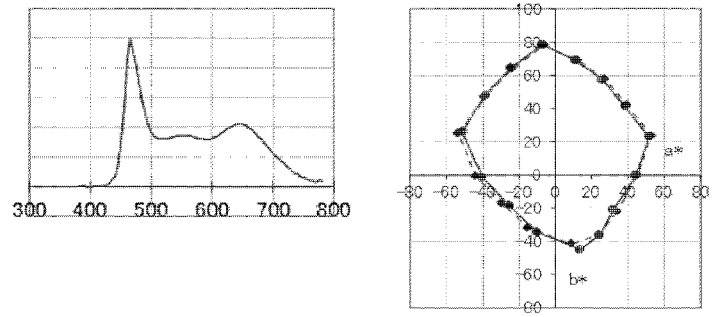
FIG. 81 is a diagram showing a spectral power distribution when the radiant flux ratio of the light emitting area 1 and the light emitting area 2 is 0:3 in Example 5, and a CIELAB color space on which are respectively plotted a* values and b* values of the 15 Munsell renotation color samples when respectively assuming a case (solid line) where an object is illuminated by the spectral power distribution and a case (dotted line) where an object is illuminated by calculational reference light corresponding to the spectral power distribution (drive point E)
Figure 82:
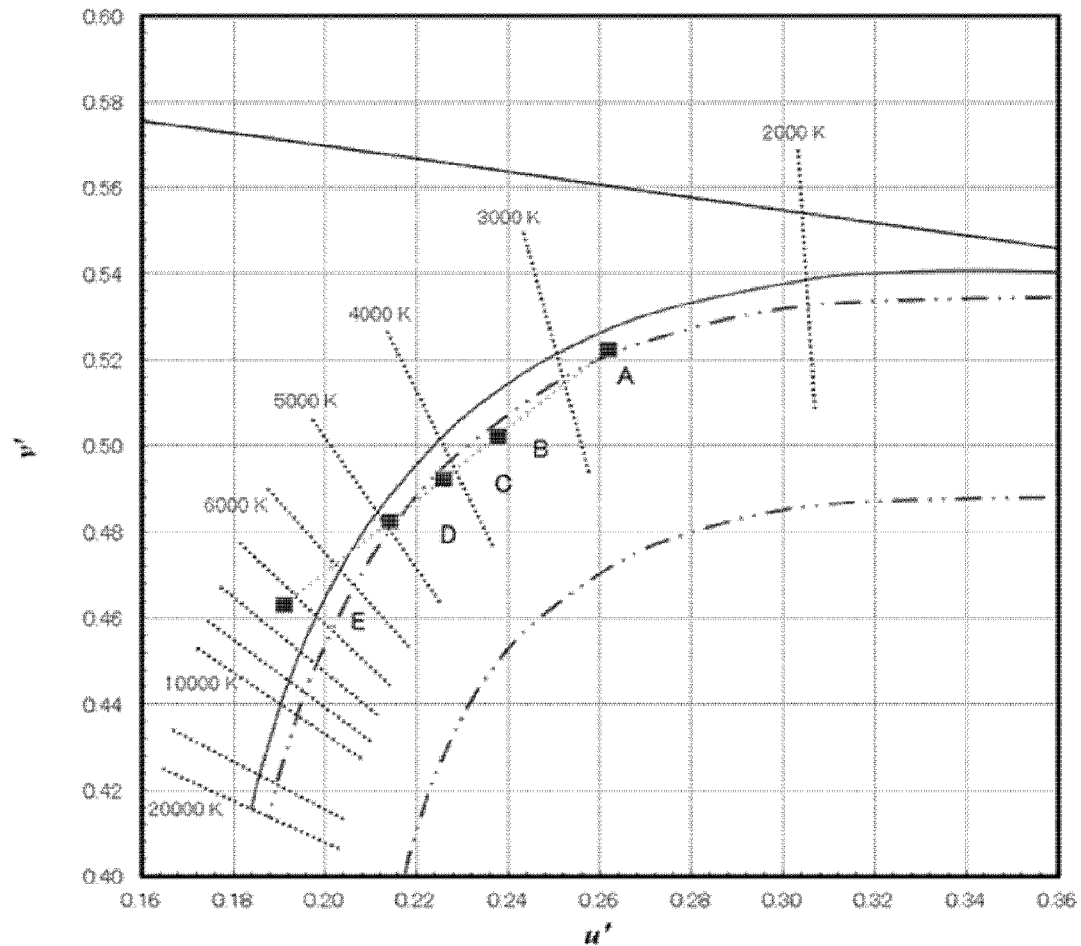
FIG. 82 is the CIE 1976 u'v' chromaticity diagram on which the chromaticity of the drive points A to E in Example 5 are indicated. The two-dot chain line in FIG. 82 is a range of $D_{uv}$ that satisfies Condition 1 of the first embodiment of the first to fourth inventions of the present invention.

Next, if the current value of current injected into each light emitting area of the packaged LED having the light emitting area 1 and the light emitting are 2 is appropriately adjusted, five types of spectral power distributions shown in FIG. 77 to FIG. 81 irradiated onto the axis of the packaged LED, for example, are implemented. FIG. 77 is a case when current is injected only into the light emitting area 1, and the radiant flux ratio of the light emitting area 1 and the light emitting area 2 is set to 3:0, and FIG. 81 is a case when current is injected only into the light emitting area 2, and the radiant flux ratio of the light emitting area 1 and the light emitting area 2 is set to 0:3. FIG. 78 is a case when the radiant flux ratio of the light emitting area 1 and the light emitting area 2 is set to 2:1, FIG. 79 is a case when the radiant flux ratio is set to 1.5:1.5, and FIG. 80 is a case when the radiant flux is set to 1:2. By changing the current to be injected into each area of the packaged LED 20, the radiant flux irradiated from the packaged LED main body onto the axis can be changed. The CIELAB plot in each drawing indicates the a* values and the b* values which are plotted respectively: when 15 Munsell renotation color samples #01 to #15 are mathematically assumed as the illumination objects and these illumination objects are illuminated by the packaged LED; and when these illumination objects are illuminated by a reference light derived from the correlated color template of the packaged LED. Here the drive point names A to E are assigned to the radiant flux of the light-emitting device in descending order of contribution of the radiant flux of the light emitting area 1. FIG. 82 shows the chromaticity points at each of the drive points A to E on the CIE 1976 u'v' chromaticity diagram. Table 13 shows the photometric characteristics and colormetric characteristics that are expected at each drive point.

The spectral power distributions in FIG. 77 to FIG. 81, the CIELAB plots in FIG. 77 to FIG. 81, the CIE 1976 u'v' chromaticity diagram in FIG. 82 and Table 13 clarify the following.

At the drive point A, the drive point C, the drive point D and the drive point E, one or both of the $D_{uvSSL}$ and $A_{cg}$ is/are not in an appropriate range of the first embodiment of the first to fourth inventions of the present invention, but in an area near the drive point B, a natural, vivid, highly visible and comfortable appearance of colors and appearance of objects, as if the objects are seen outdoors, can be implemented. For example, in an area near the drive point B, the correlated color temperature of the packaged LED can be variable at around 3542 K, and $D_{uvSSL}$ can also be variable at around −0.00625 while implementing the above mentioned appearance of colors. Further, the average saturation difference of 15 Munsell renotation color samples can also be variable at around 1.72. Thus in the area where a preferable appearance of colors can be implemented, optimum illumination conditions can easily be selected from the variable range in accordance with the age, gender or the like of the user of the light-emitting device, or in accordance with the space, purpose or the like of the illumination.

In this case, the following drive control is also possible.

First, when at least one of the index $A_{cg}$, correlated color temperature $T_{SSL}$ (K), and distance $D_{uvSSL}$ from the blackbody radiation locus, is changed, the luminous flux and/or the radiant flux emitted from the light-emitting device in the main radiant direction can be unchangeable. If this control is performed, a difference of appearance of colors, caused by a change of the shape of the spectral power distribution, can be easily checked without depending on the luminance of the illumination object, which is preferable.

Second, when the index $A_{cg}$ is decreased in an appropriate range, the luminous flux and/or radiant flux of the light-emitting device can be decreased, so as to decrease the luminance of the illumination object.

Third, when $D_{uvSSL}$ is decreased in an appropriate range as well, the luminous flux and/or radiant flux of the light-emitting device can be decreased, so as to decrease the luminance of the illumination object. In the second and third cases, brightness is normally increased, hence energy consumption can be suppressed by decreasing luminance, which is preferable.

TABLE 13

Example 5

| Example 5 | (*1) | (*2) | $T_{SSL}$ (K) | $D_{uvSSL}$ | $|\Delta h_n|$ maximum value | $|\Delta h_n|$ minimum value | $\sum_{n-1}^{15} \Delta C_n / 15$ | $\Delta C_{max}$ | $\Delta C_{min}$ | $|\Delta C_{max} - \Delta C_{min}|$ | $A_{cg}$ | Luminous efficacy of radiation (lm/W) | Ra |
|---|---|---|---|---|---|---|---|---|---|---|---|---|---|
| Drive Point A | (*3) | 3:0 | 2,734 | −0.00297 | 12.23 | 0.72 | 1.32 | 5.81 | −4.18 | 9.99 | 4.99 | 218 | 85 |
| Drive Point B | | 2:1 | 3,542 | −0.00625 | 7.04 | 0.12 | 1.72 | 5.12 | −1.27 | 6.39 | −16.87 | 230 | 88 |
| Drive Point C | | 1.5:1.5 | 4,146 | −0.00547 | 5.90 | 0.52 | 1.40 | 4.72 | −0.78 | 5.50 | 20.03 | 237 | 91 |
| Drive Point D | | 1:2 | 4,938 | −0.00292 | 4.57 | 0.37 | 0.84 | 3.71 | −1.15 | 4.86 | 94.64 | 245 | 94 |
| Drive Point E | | 0:3 | 7,321 | 0.00690 | 8.81 | 0.22 | −0.52 | 4.46 | −3.63 | 8.09 | 245.15 | 263 | 93 |

(*1) Light-emitting elements constituting each light emitting area
(*2) Radiant flux ratio of spectral power distribution $\phi_{SSL}1$ of light emitting area 1 and spectral power distribution $\phi_{SSL}2$ of light emitting area 2 ($\phi_{SSL}1:\phi_{SSL}2$)
(*3) Light emitting area 1: blue semiconductor light-emitting element, green phosphor and red phosphor; Light emitting area 2: blue semiconductor light-emitting element, green phosphor and red phosphor Fourth, when the correlated color temperature is increased, the luminous flux and/or radiant flux of the light-emitting device can be increased, so as to increase the luminance of the illumination object. Under a general illumination environment, a relatively low luminance environment is often felt to be comfortable when the color temperature is in a low range, and a relatively high luminance environment is often felt to be comfortable when the color temperature is in a high range. This psychological effect is known as the Kruithof Effect, and performing control integrating this effect is also possible, and when the correlated color temperature is increased, it is preferable to increase the luminance of the illumination object by increasing the luminous flux and/or radiant flux of the light-emitting device.

Example 6

Figure 84:
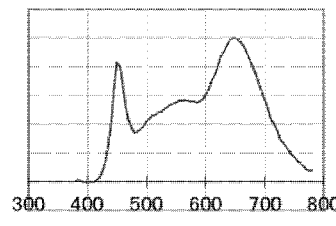
FIG. 84 is a diagram showing a spectral power distribution when the radiant flux ratio of the light emitting area 1 and the light emitting area 2 is 2:1 in Example 6, and a CIELAB color space on which are respectively plotted a* values and b* values of the 15 Munsell renotation color samples when respectively assuming a case (solid line) where an object is illuminated by the spectral power distribution and a case (dotted line) where an object is illuminated by calculational reference light corresponding to the spectral power distribution (drive point B)
Figure 84:
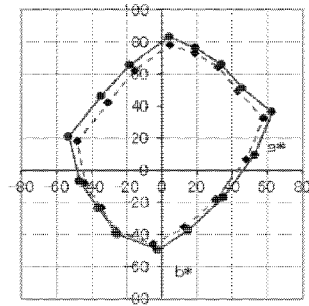
Figure 85:
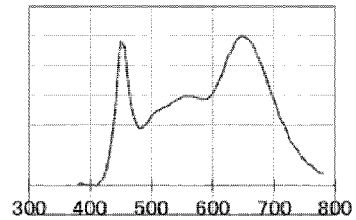
FIG. 85 is a diagram showing a spectral power distribution when the radiant flux ratio of the light emitting area 1 and the light emitting area 2 is 1.5:1.5 in Example 6, and a CIELAB color space on which are respectively plotted a* values and b* values of the 15 Munsell renotation color samples when respectively assuming a case (solid line) where an object is illuminated by the spectral power distribution and a case (dotted line) where an object is illuminated by calculational reference light corresponding to the spectral power distribution (drive point C)
Figure 85:
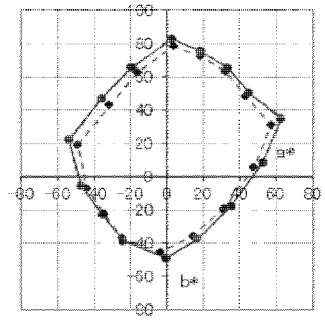
Figure 86:
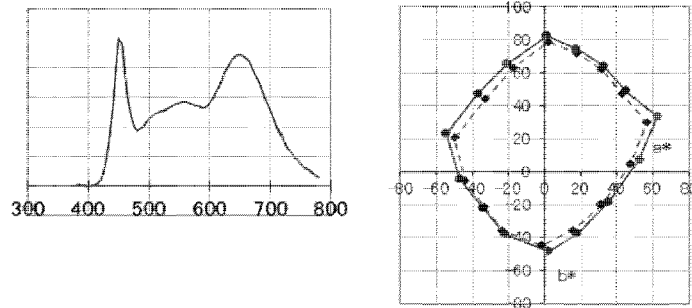
FIG. 86 is a diagram showing a spectral power distribution when the radiant flux ratio of the light emitting area 1 and the light emitting area 2 is 1:2 in Example 6, and a CIELAB color space on which are respectively plotted a* values and b* values of the 15 Munsell renotation color samples when respectively assuming a case (solid line) where an object is illuminated by the spectral power distribution and a case (dotted line) where an object is illuminated by calculational reference light corresponding to the spectral power distribution (drive point D)
Figure 88:
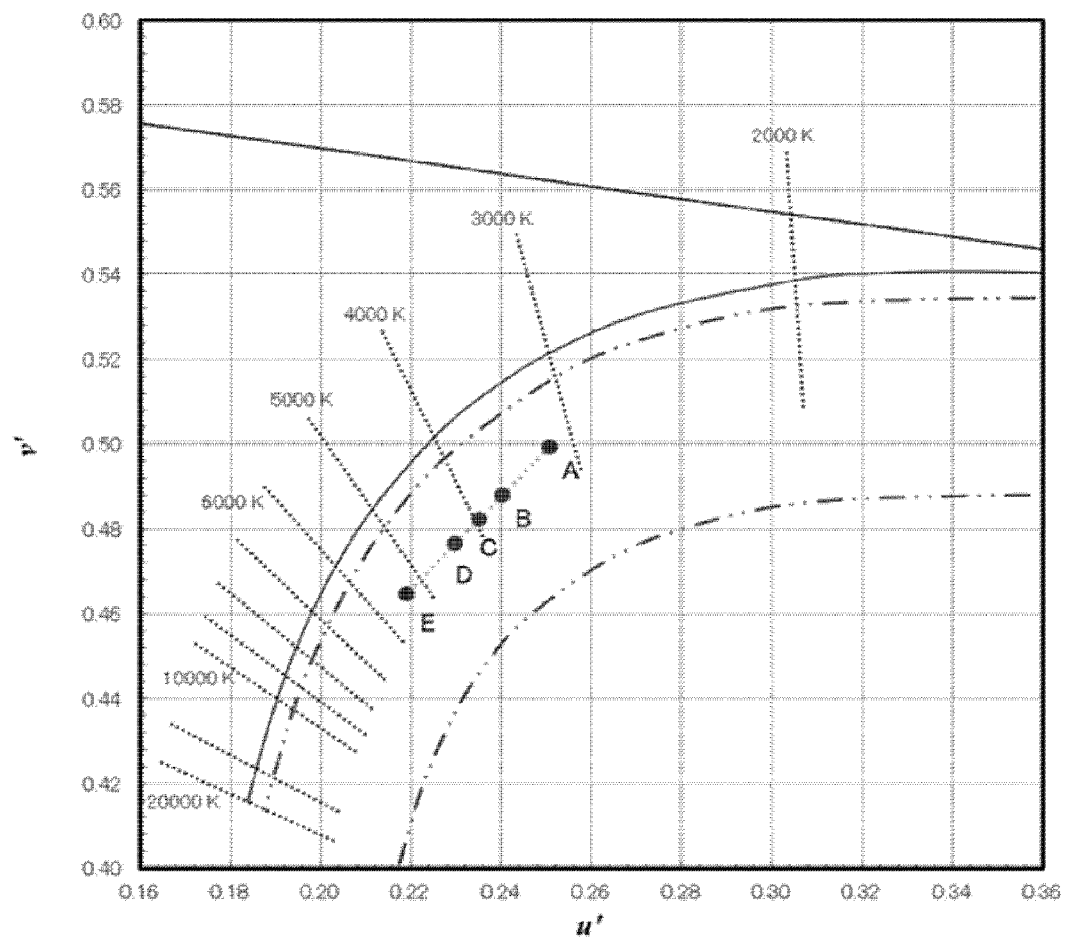
FIG. 88 is the CIE 1976 u'v' chromaticity diagram on which the chromaticity of the drive points A to E in Example 6 are indicated. The two-dot chain line in FIG. 88 is a range of $D_{uv}$ that satisfies Condition 1 of the first embodiment of the first to fourth inventions of the present invention.

A 5 mm diameter resin package in which two light emitting units exist, as shown in FIG. 43, is prepared. In the light emitting area 1, a blue semiconductor light-emitting element, a green phosphor and a red phosphor are mounted and encapsulated. The blue semiconductor light-emitting element in the light emitting area 1 constitutes a wiring of area 2, and the radiant flux ratio of the light emitting area 1 and the light emitting area 2 is set to 0:3. FIG. 84 is a case when the radiant flux ratio of the light emitting area 1 and the light emitting area 2 is set to 2:1, FIG. 85 is a case when the radiant flux ratio is set to 1.5:1.5, and FIG. 86 is a case when the radiant flux ratio if set to 1:2. By changing the current that is injected into each area of the packaged LED 10, the radiant flux irradiated from the packaged LED main body onto the axis can be changed. The CIELAB plot in each drawing indicates the a* values and the b* values which are plotted: when 15 Munsell renotation color samples #01 to #15 are mathematically assumed as the illumination objects and these illumination objects are illuminated using this packaged LED; and when these illumination objects are illuminated by a reference light derived from the correlated color temperature of the packaged LED. Here the drive point names A to E are assigned to the radiant flux of the light-emitting device in descending order of contribution of the radiant flux of the light emitting area 1. FIG. 88 shows the chromaticity points at each of the driving points A to E, on the CIE 1976 u'v' chromaticity diagram. Table 14 shows the photometric characteristics and colormetric characteristics that are expected at each drive point.

TABLE 14

Example 6

| Example 6 | (*1) | (*2) | $T_{SSL}$ (K) | $D_{uvSSL}$ | $|\Delta h_n|$ maximum value | $|\Delta h_n|$ minimum value | $\dfrac{\sum_{n=1}^{15} \Delta C_n}{15}$ | $\Delta C_{max}$ | $\Delta C_{min}$ | $|\Delta C_{max} - \Delta C_{min}|$ | $A_{cg}$ | Luminous efficacy of radiation (lm/W) | Ra |
|---|---|---|---|---|---|---|---|---|---|---|---|---|---|
| Drive Point A | (*3) | 3:0 | 3,160 | −0.01365 | 3.98 | 0.08 | 3.79 | 6.05 | 1.50 | 4.56 | −68.30 | 217 | 87 |
| Drive Point B | | 2:1 | 3,639 | −0.01579 | 4.70 | 0.09 | 3.66 | 6.26 | 1.18 | 5.08 | −87.63 | 219 | 86 |
| Drive Point C | | 1.5:1.5 | 3,950 | −0.01627 | 5.04 | 0.04 | 3.54 | 6.53 | 1.07 | 5.47 | −84.96 | 221 | 85 |
| Drive Point D | | 1:2 | 4,325 | −0.01629 | 5.28 | 0.02 | 3.40 | 6.75 | 0.99 | 5.76 | −71.80 | 222 | 85 |
| Drive Point E | | 0:3 | 5,328 | −0.01483 | 5.83 | 0.01 | 3.43 | 6.78 | 0.53 | 6.24 | −80.15 | 225 | 85 |

(*1) Light-emitting elements constituting each light emitting area
(*2) Radiant flux ratio of spectral power distribution $\phi_{SSL}1$ of light emitting area 1 and spectral power distribution $\phi_{SSL}2$ of light emitting area 2 ($\phi_{SSL}1:\phi_{SSL}2$)
(*3) Light emitting area 1: blue semiconductor light-emitting element, green phosphor and red phosphor; Light emitting area 2: blue semiconductor light-emitting element, green phosphor and red phosphor the packaged LED, so as to be one independent circuit configuration, and is connected to a power supply. In the light emitting area 2 as well, a blue semiconductor light-emitting element, a green phosphor and a red phosphor, which are adjusted differently, are mounted and encapsulated. The blue semiconductor light-emitting element in the light emitting area 2 constitutes a wiring of the packaged LED, so as to be one independent circuit configuration, and is connected to another independent power supply. In this way, current can be injected independently into the light emitting area 1 and the light emitting area 2 respectively.

Figure 83:
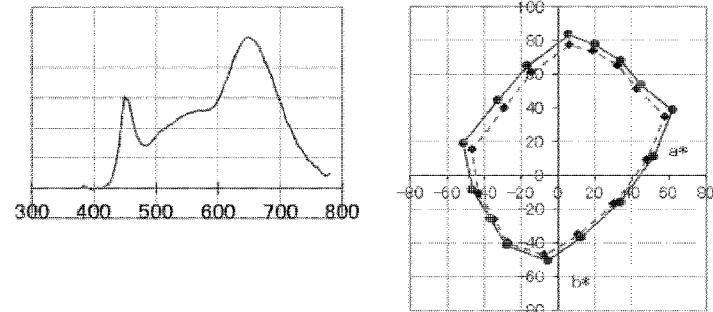
FIG. 83 is a diagram showing a spectral power distribution when the radiant flux ratio of the light emitting area 1 and the light emitting area 2 is 3:0 in Example 6, and a CIELAB color space on which are respectively plotted a* values and b* values of the 15 Munsell renotation color samples when respectively assuming a case (solid line) where an object is illuminated by the spectral power distribution and a case (dotted line) where an object is illuminated by calculational reference light corresponding to the spectral power distribution (drive point A)
Figure 87:
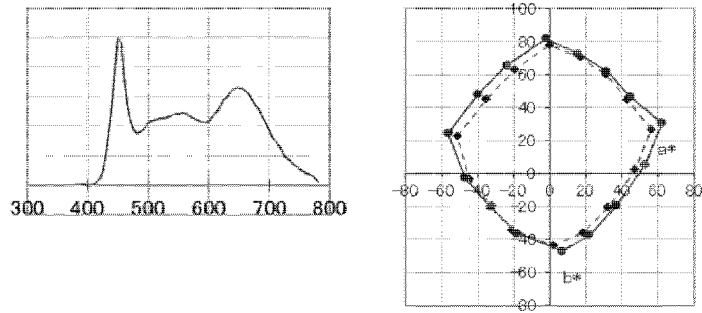
FIG. 87 is a diagram showing a spectral power distribution when the radiant flux ratio of the light emitting area 1 and the light emitting area 2 is 0:3 in Example 6, and a CIELAB color space on which are respectively plotted a* values and b* values of the 15 Munsell renotation color samples when respectively assuming a case (solid line) where an object is illuminated by the spectral power distribution and a case (dotted line) where an object is illuminated by calculational reference light corresponding to the spectral power distribution (drive point E)

Next, if the current value of the current injected into each light emitting area of the packaged LED 10 including the light emitting area 1 and the light emitting area 2 is appropriately adjusted, five types of spectral power distributions shown in FIG. 83 to FIG. 87 irradiated onto the axis of the packaged LED, for example, are implemented. FIG. 83 is the case when the current is injected only into the light emitting area 1 and the radiant flux ratio of the light emitting area 1 and the light emitting area 2 is set to 3:0, and FIG. 87 is a case when current is injected only into the light emitting The spectral power distributions in FIG. 83 to FIG. 87, the CIELAB plots in FIG. 83 and FIG. 87, the CIE 1976 u'v' chromaticity diagram in FIG. 88 and Table 14 clarify the following.

At the drive point A to the drive point E, and in areas between these drive points, a natural, vivid, highly visible and comfortable appearance of colors and appearance of objects, as if the object is viewed outdoors can be implemented. For example, between the drive point A and the drive point E, the correlated color temperature of the packaged LED can be variable in a 3160 K to 5328 K range, and $D_{uvSSL}$ can also be variable in the −0.01365 to −0.01629 range. Further, the average saturation difference of the fifteen types of Munsell colors can also be variable in a 3.79 to 3.40 range. Thus in the area where a preferable appearance of colors can be implemented, optimum illumination conditions can be easily selected from the variable range in accordance with the age, gender or the like of the user of the light-emitting device, or in accordance with the space, purpose or the like of the illumination.

In this case, the following drive control is also possible.

First, when at least one of the index $A_{cg}$, correlated color temperature $T_{SSL}$ (K), and distance $D_{uvSSL}$ from the blackbody radiation locus, is changed, the luminous flux and/or radiant flux emitted from the light-emitting device in the main radiant direction can be unchangeable. If this control is performed, a difference of appearance of colors, caused by a change of the shape of the spectral power distribution, can be easily checked without depending on the luminance of the illumination object, which is preferable.

Second, when the index $A_{cg}$ is decreased in an appropriate range, the luminous flux and/or radiant flux of the light-emitting device can be decreased, so as to decrease the luminance of the illumination object.

Third, when $D_{uvSSL}$ is decreased in an appropriate range as well, the luminous flux and/or radiant flux of the light-emitting device can be decreased, so as to decrease the luminance of the illumination object. In the second and third cases, brightness is normally increased, hence energy consumption can be suppressed by decreasing luminance, which is preferable.

Fourth, when the correlated color temperature is increased, the luminous flux and/or radiant flux of the light-emitting device can be increased, so as to increase the luminance of the illumination object. Under a general illumination environment, a relatively low luminance environment is often felt to be comfortable when the color temperature is in a low range, and a relatively high luminance environment is often felt to be comfortable when the color temperature is in a high range. This psychological effect is known as the Kruithof Effect, and performing control integrating this effect is also possible, and when the correlated color temperature is increased, it is preferable to increase the luminance of the illumination object by increasing the luminous flux and/or radiant flux of the light-emitting device.

Example 7

A light-emitting device, which is a 60 cm×120 cm illumination system embedded in a ceiling and includes sixteen LED light bulbs (light emitting units), is prepared as shown in FIG. 57. Here each portion shaded by solid lines is a light emitting area 1, where the same LED bulb is mounted to form an equivalent light emitting area. Each portion shaded by the dotted lines in FIG. 57 is a light emitting area 2, where the same LED bulb is mounted to form an equivalent light emitting area. The LED light bulbs mounted in the plurality of light emitting areas 1 are connected in parallel, and connected to one independent power supply. On the other hand, the LED light bulbs mounted in the plurality of light emitting areas 2 are connected in parallel and connected to another independent power supply. The light emitting areas 1 and the light emitting areas 2 can be driven independently. The LED light bulb constituting the light emitting area 1 includes a blue semiconductor light-emitting element, a green phosphor and a red phosphor, and the LED light bulb constituting the light emitting area 2 includes a blue semiconductor light-emitting element, a green phosphor and a red phosphor which are adjusted differently.

Figure 89:
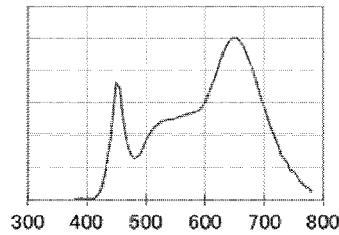
FIG. 89 is a diagram showing a spectral power distribution when the radiant flux ratio of the light emitting area 1 and the light emitting area 2 is 5:0 in Example 7, and a CIELAB color space on which are respectively plotted a* values and b* values of the 15 Munsell renotation color samples when respectively assuming a case (solid line) where an object is illuminated by the spectral power distribution and a case (dotted line) where an object is illuminated by calculational reference light corresponding to the spectral power distribution (drive point A)
Figure 89:
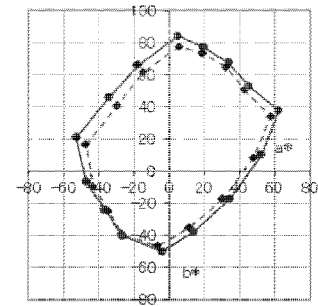
Figure 90:
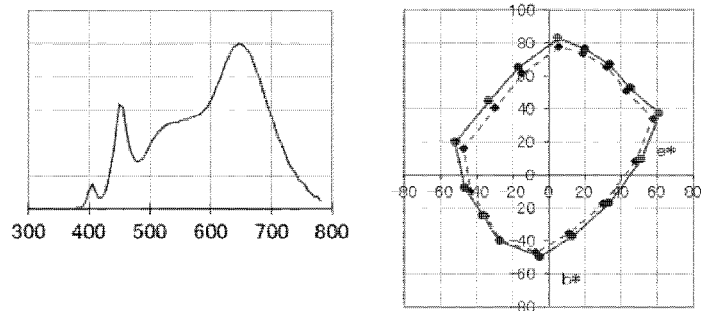
FIG. 90 is a diagram showing a spectral power distribution when the radiant flux ratio of the light emitting area 1 and the light emitting area 2 is 4:1 in Example 7, and a CIELAB color space on which are respectively plotted a* values and b* values of the 15 Munsell renotation color samples when respectively assuming a case (solid line) where an object is illuminated by the spectral power distribution and a case (dotted line) where an object is illuminated by calculational reference light corresponding to the spectral power distribution (drive point B)
Figure 91:
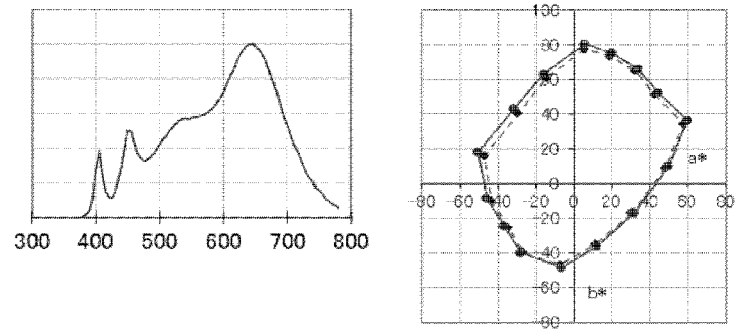
FIG. 91 is a diagram showing a spectral power distribution when the radiant flux ratio of the light emitting area 1 and the light emitting area 2 is 2.5:2.5 in Example 7, and a CIELAB color space on which are respectively plotted a* values and b* values of the 15 Munsell renotation color samples when respectively assuming a case (solid line) where an object is illuminated by the spectral power distribution and a case (dotted line) where an object is illuminated by calculational reference light corresponding to the spectral power distribution (drive point C)
Figure 92:
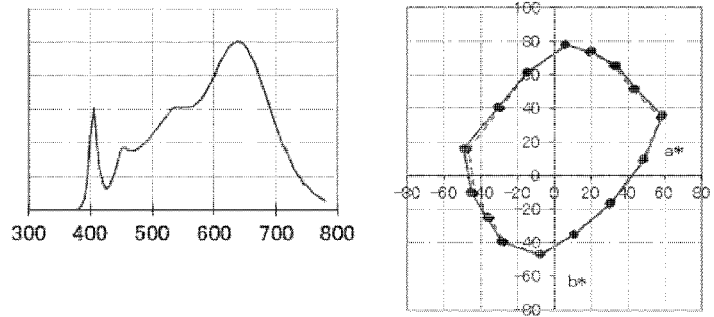
FIG. 92 is a diagram showing a spectral power distribution when the radiant flux ratio of the light emitting area 1 and the light emitting area 2 is 1:4 in Example 7, and a CIELAB color space on which are respectively plotted a* values and b* values of the 15 Munsell renotation color samples when respectively assuming a case (solid line) where an object is illuminated by the spectral power distribution and a case (dotted line) where an object is illuminated by calculational reference light corresponding to the spectral power distribution (drive point D)
Figure 93:
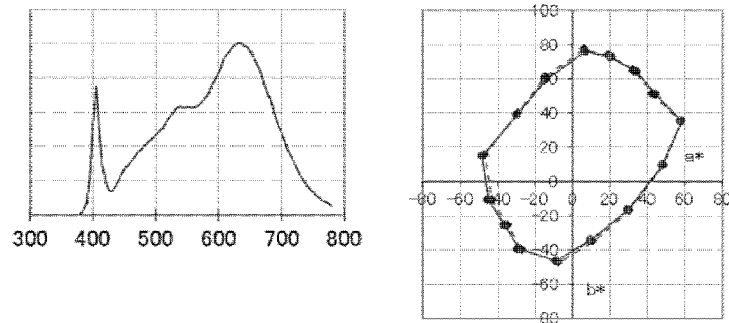
FIG. 93 is a diagram showing a spectral power distribution when the radiant flux ratio of the light emitting area 1 and the light emitting area 2 is 0:5 in Example 7, and a CIELAB color space on which are respectively plotted a* values and b* values of the 15 Munsell renotation color samples when respectively assuming a case (solid line) where an object is illuminated by the spectral power distribution and a case (dotted line) where an object is illuminated by calculational reference light corresponding to the spectral power distribution (drive point E)

If the radiant fluxes of the LED light bulbs constituting the light emitting area 1 and the light emitting area 2 are appropriately adjusted using dimming controllers connected to the independent power supplies respectively, five types of spectral power distributions shown in FIG. 89 to FIG. 93 irradiated onto the central axis of the illumination system, for example, are implemented. FIG. 89 is a case when only the LED light bulbs constituting the light emitting areas 1 are driven and the radiant flux ratio of the light emitting area 1 and the light emitting area 2 is set to 5:0, and FIG. 93 is a case when only the LED light bulbs constituting the light emitting areas 2 are driven and the radiant flux ratio of the light emitting area 1 and the light emitting area 2 is set to 0:5. FIG. 90 is a case when the radiant flux ratio of the LED light bulbs constituting the light emitting area 1 and the LED light emitting area 2 is set to 4:1. FIG. 91 is a case when the radiant flux ratio is set to 2.5:2.5, and FIG. 92 is a case when the radiant flux ratio is set to 1:4. By changing the driving conditions of the LED light bulbs constituting each light emitting area, the radiant flux irradiated onto the central axis of the illumination system can be changed.

Figure 94:
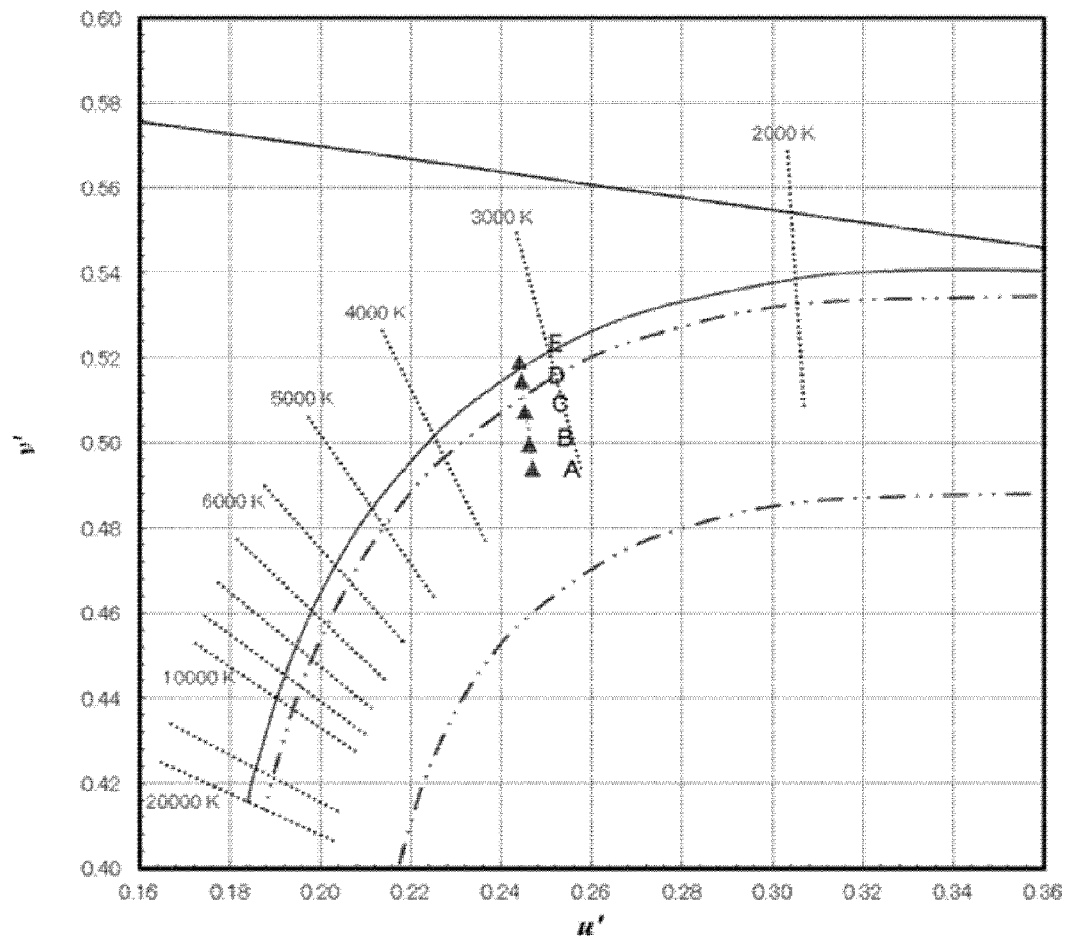
FIG. 94 is the CIE 1976 u'v' chromaticity diagram on which the chromaticity of the drive points A to E in Example 7 are indicated. The two-dot chain line in FIG. 94 is a range of $D_{uv}$ that satisfies Condition 1 of the first embodiment of the first to fourth inventions of the present invention.

The CIELAB plot in each drawing indicates the a* values and the b* values which are plotted respectively: when 15 Munsell renotation color samples #01 to #15 are mathematically assumed as the illumination objects and these illumination objects are illuminated using this illumination system; and when these illumination objects are illuminated by a reference light derived from the correlated color temperature of the light-emitting device of this illumination system. Here the drive point names A to E are assigned to the radiant flux of the illumination system (light-emitting device) in descending order of contribution of the radiant flux of the LED light bulb constituting the light emitting area 1. FIG. 94 shows the chromaticity points at each of the drive points A to E on the CIE 1976 u'v' chromaticity diagram. Table 15 shows the photometric characteristics and colormetric characteristics that are expected at each drive point.

TABLE 15

| | | | | | | | | $\sum_{n=1}^{15} \Delta C_n$ | | | | | Luminous efficacy of | |
|---|---|---|---|---|---|---|---|---|---|---|---|---|---|---|
| Example 7 | (*1) | (*2) | $T_{SSL}$ (K) | $D_{uvSSL}$ | $|\Delta h_n|$ maximum value | $|\Delta h_n|$ minimum value | | $\overline{15}$ | $\Delta C_{max}$ | $\Delta C_{min}$ | $|\Delta C_{max} - \Delta C_{min}|$ | $A_{cg}$ | radiation (lm/W) | Ra |
| Drive Point A | (*3) | 5:0 | 3,327 | −0.01546 | 3.67 | 0.03 | | 4.06 | 7.15 | 0.79 | 6.36 | −78.32 | 218 | 86 |
| Drive Point B | | 4:1 | 3,290 | −0.01174 | 2.58 | 0.11 | | 3.29 | 5.74 | 0.77 | 4.97 | −44.62 | 224 | 89 |
| Drive Point C | | 2.5:2.5 | 3,243 | −0.00660 | 1.48 | 0.14 | | 2.09 | 3.93 | 0.72 | 3.21 | −32.27 | 232 | 92 |
| Drive Point D | | 1:4 | 3,205 | −0.00190 | 0.82 | 0.10 | | 0.84 | 2.27 | −0.02 | 2.29 | 1.84 | 240 | 95 |

TABLE 15-continued

Example 7

| Example 7 | (*1) | (*2) | $T_{SSL}$ (K) | $D_{uvSSL}$ | $|\Delta h_n|$ maximum value | $|\Delta h_n|$ minimum value | $\dfrac{\sum_{n=1}^{15} \Delta C_n}{15}$ | $\Delta C_{max}$ | $\Delta C_{min}$ | $|\Delta C_{max} - \Delta C_{min}|$ | $A_{cg}$ | Luminous efficacy of radiation (lm/W) | Ra |
|---|---|---|---|---|---|---|---|---|---|---|---|---|---|
| Drive Point E | | 0:5 | 3,184 | 0.00100 | 1.34 | 0.06 | −0.05 | 1.65 | −1.41 | 3.05 | 22.44 | 245 | 96 |

(*1) Light-emitting elements constituting each light emitting area
(*2) Radiant flux ratio of spectral power distribution $\phi_{SSL}1$ of light emitting area 1 and spectral power distribution $\phi_{SSL}2$ of light emitting area 2 ($\phi_{SSL}1:\phi_{SSL}2$)
(*3) Light emitting area 1: blue semiconductor light-emitting element, green phosphor and red phosphor; Light emitting area 2: purple semiconductor light-emitting element, blue phosphor, green phosphor and red phosphor The spectral power distributions in FIG. 89 to FIG. 93, the CIELAB plots in FIG. 89 to FIG. 93, the CIE 1976 u'v' chromaticity diagram in FIG. 94 and Table 15 clarify the following.

At the drive point D and the drive point E, both $D_{uvSSL}$ and $A_{cg}$ are not in an appropriate range of the first embodiment of the first to fourth inventions of the present invention, but at the drive point A, the drive point B, the drive point C, and areas between and near these drive points, a natural, vivid, highly visible and comfortable appearance of colors and appearance of objects, as if the objects are seen outdoors, can be implemented. For example, between the drive point A and the drive point C, the correlated color temperature as the illumination system can be variable in a 3327 K to 3243 K range, and $D_{uvSSL}$ can also be variable in a −0.01546 to −0.00660 range, while implementing the above mentioned appearance of colors. Further, the average saturation difference of the 15 Munsell renotation color samples can also be variable in a 4.06 to 2.09 range. Thus in the area where a preferable appearance of colors can be implemented, optimum illumination conditions can easily be selected from the variable range in accordance with the age, gender or the like of the user of the light-emitting device, or in accordance with the space, purpose or the like of the illumination.

In this case, the following drive control is also possible.

First, when at least one of the index $A_{cg}$, correlated color temperature $T_{SSL}$ (K), and distance $D_{uvSSL}$ from the blackbody radiation locus, is changed, the luminous flux and/or radiant flux emitted from the light-emitting device in the main radiant direction can be unchangeable. If this control is performed, a difference of appearance of colors, caused by a change of the shape of the spectral power distribution, can be easily checked without depending on the luminance of the illumination object, which is preferable.

Second, when the index $A_{cg}$ is decreased in an appropriate range, the luminous flux and/or radiant flux of the light-emitting device can be decreased, so as to decrease the luminance of the illumination object.

Third, when $D_{uvSSL}$ is decreased in an appropriate range as well, the luminous flux and/or radiant flux of the light-emitting device can be decreased, so as to decrease the luminance of the illumination object. In the second and third cases, brightness is normally increased, hence energy consumption can be suppressed by decreasing luminance, which is preferable.

Fourth, when the correlated color temperature is increased, the luminous flux and/or radiant flux of the light-emitting device can be increased, so as to increase the luminance of the illumination object. Under a general illumination environment, a relatively low luminance environment is often felt to be comfortable when the color temperature is in a low range, and a relatively high luminance environment is often felt to be comfortable when the color temperature is in a high range. This psychological effect is known as the Kruithof Effect, and performing control integrating this effect is also possible, and when the correlated color temperature is increased, it is preferable to increase the luminance of the illumination object by increasing the luminous flux and/or radiant flux of the light-emitting device.

Example 8

A ceramic package, in which a 7 mm diameter light emitting unit is divided into six sub-light emitting units, is prepared. Here a blue semiconductor light emitting unit, a green phosphor and a red phosphor are mounted and encapsulated in a light emitting area 1-1 and a light emitting area 1-2, so as to be equivalent light emitting areas. The semiconductor light-emitting elements of the light emitting area 1-1 and the light emitting area 1-2 are connected in series and connected to one independent power supply. On the other hand, a blue semiconductor light-emitting element, a green phosphor and a red phosphor, which are adjusted differently, are mounted in a light emitting area 2-1 and a light emitting area 2-2, so as to be equivalent light emitting areas. The semiconductor light-emitting elements in the light emitting area 2-1 and the light emitting area 2-2 are connected in series and connected to another independent power supply. Further, a blue semiconductor light-emitting element, a green phosphor and a red phosphor, which are adjusted differently from the light emitting area 1 and the light emitting area 2, are mounted and encapsulated in the light emitting area 3-1 and the light emitting area 3-2, so as to be equivalent light emitting areas. The semiconductor light-emitting elements of the light emitting area 3-1 and the light emitting area 3-2 are connected in series and connected to another independent power supply. Current can be injected into the light emitting area 1, the light emitting area 2 and the light emitting area 3 independently from each other.

Figure 95:
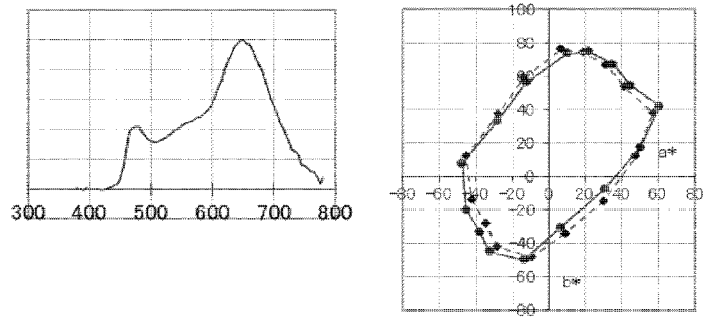
FIG. 95 is a diagram showing a spectral power distribution when the radiant flux ratio of the light emitting area 1, the light emitting area 2 and the light emitting area 3 is 3:0:0 in Example 8, and a CIELAB color space on which are respectively plotted a* values and b* values of the 15 Munsell renotation color samples when respectively assuming a case (solid line) where an object is illuminated by the spectral power distribution and a case (dotted line) where an object is illuminated by calculational reference light corresponding to the spectral power distribution (drive point A)
Figure 96:
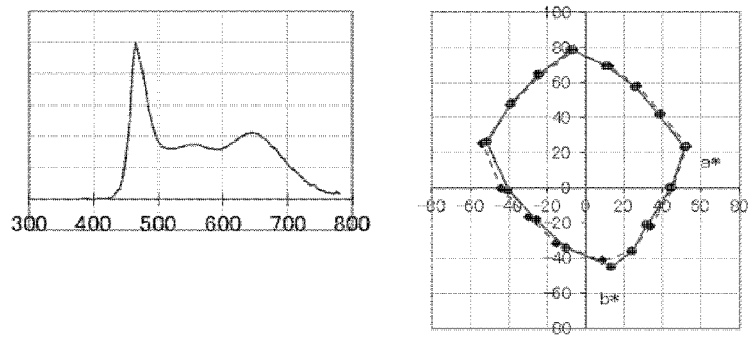
FIG. 96 is a diagram showing a spectral power distribution when the radiant flux ratio of the light emitting area 1, the light emitting area 2 and the light emitting area 3 is 0:3:0 in Example 8, and a CIELAB color space on which are respectively plotted a* values and b* values of the 15 Munsell renotation color samples when respectively assuming a case (solid line) where an object is illuminated by the spectral power distribution and a case (dotted line) where an object is illuminated by calculational reference light corresponding to the spectral power distribution (drive point B)
Figure 97:
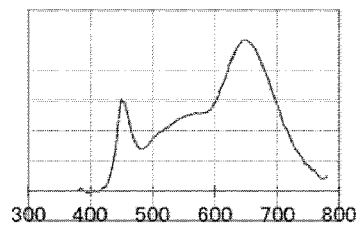
FIG. 97 is a diagram showing a spectral power distribution when the radiant flux ratio of the light emitting area 1, the light emitting area 2 and the light emitting area 3 is 0:0:3 in Example 8, and a CIELAB color space on which are respectively plotted a* values and b* values of the 15 Munsell renotation color samples when respectively assuming a case (solid line) where an object is illuminated by the spectral power distribution and a case (dotted line) where an object is illuminated by calculational reference light corresponding to the spectral power distribution (drive point C)
Figure 97:
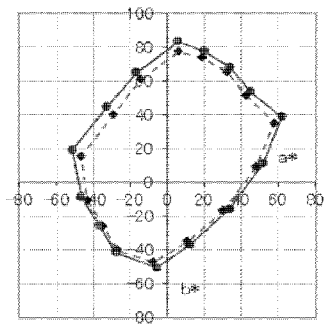
Figure 98:
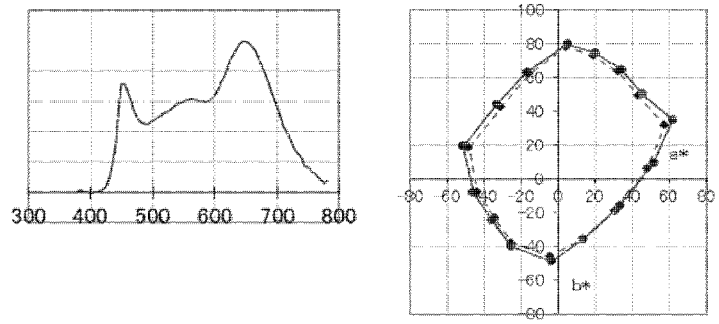
FIG. 98 is a diagram showing a spectral power distribution when the radiant flux ratio of the light emitting area 1, the light emitting area 2 and the light emitting area 3 is 1:1:1 in Example 8, and a CIELAB color space on which are respectively plotted a* values and b* values of the 15 Munsell renotation color samples when respectively assuming a case (solid line) where an object is illuminated by the spectral power distribution and a case (dotted line) where an object is illuminated by calculational reference light corresponding to the spectral power distribution (drive point D)
Figure 99:
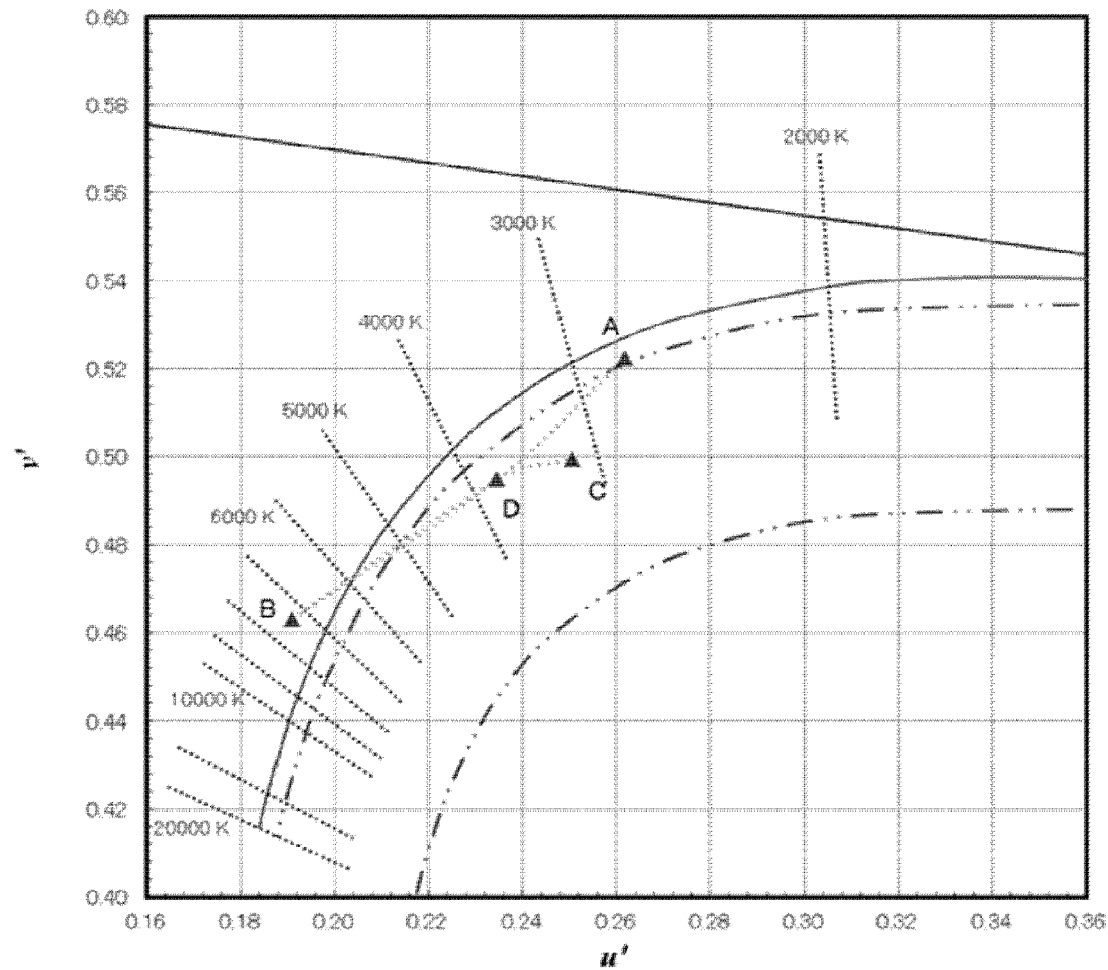
FIG. 99 is the CIE 1976 u'v' chromaticity diagram on which the chromaticity of the drive points A to E in Example 8 are indicated. The two-dot chain line in FIG. 99 is a range of $D_{uv}$ that satisfies Condition 1 of the first embodiment of the first to fourth inventions of the present invention.
Figure 100:
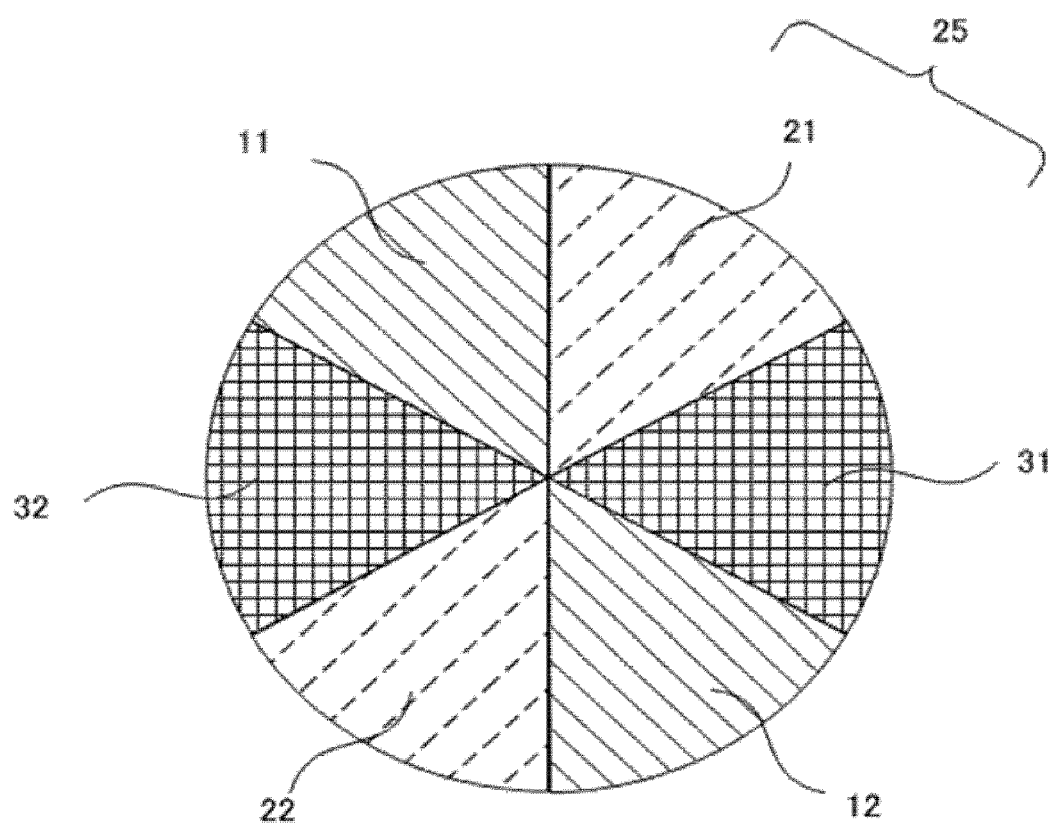
FIG. 100 is a diagram showing the deposition of the light emitting areas of the packaged LED used for Example 8.

Next, if the current value of current injected into each light emitting area of the packaged LED having the light emitting area 1, the light emitting area 2 and the light emitting area 3 is appropriately adjusted, and four types of spectral power distributions shown in FIG. 95 to FIG. 98 irradiated onto the axis of the packaged LED, for example, are implemented. FIG. 95 is a case when current is injected only into the light emitting area 1 (adjusted in the same way as FIG. 77), and the radiant flux ratio of the light emitting area 1, the light emitting area 2 and the light emitting area 3 is set to 3:0:0. FIG. 96 is a case when current is injected only into the light emitting area 2 (adjusted in the same way as FIG. 81), and the radiant flux ratio of the light emitting area 1, the light emitting area 2 and the light emitting area 3 is set to 0:3:0. FIG. 97 is a case when current is injected only into the light emitting area 3 (adjusted in the same way as FIG. 83), and the radiant flux ratio of the light emitting area 1, the light emitting are 2 and the light emitting area 3 is set to 0:0:3. And FIG. 98 is a case when current is injected into all of the light emitting area 1, the light emitting area 2 and the light emitting area 3, and the radiant flux ratio thereof is set to 1:1:1. By changing the current to be injected into each area of the packaged LED 25 shown in FIG. 100, the radiant flux irradiated from the packaged LED main body onto the axis can be changed. The CIELAB plot in each drawing indicates the a* values and the b* values which are plotted respectively: when 15 Munsell renotation color samples #01 to #15 are mathematically assumed as the illumination objects and these illumination objects are illuminated by the packaged LED; and when these illumination objects are illuminated by a reference light derived from the correlated color temperature of the packaged LED. Here the drive point names A to D are assigned to the radiant flux of the light-emitting device. FIG. 99 shows the chromaticity points at each of the drive points A to D on the CIE 1976 u'v' chromaticity diagram. Table 16 shows the photometric characteristics and colormetric characteristics that are expected at each drive point.

range in accordance with the age, gender or the like of the user of the light-emitting device, or in accordance with the space, purpose or the like of the illumination.

This example is especially preferable since one light-emitting device includes three types of light emitting areas for which colors are adjusted differently, and the variable ranges can be wider compared with the case when one light-emitting device includes two types of light emitting areas for which colors are adjusted differently.

In this case, the following drive control is also possible.

First, when at least one of the index $A_{cg}$, correlated color temperature $T_{SSL}$ (K), and distance $D_{uvSSL}$ from the black-body radiation locus, is changed, the luminous flux and/or the radiant flux emitted from the light-emitting device in the main radiant direction can be unchangeable. If this control is performed, a difference of appearance of colors, caused by a change of the shape of the spectral power distribution, can be easily checked without depending on the luminance of the illumination object, which is preferable.

Second, when the index $A_{cg}$ is decreased in an appropriate range, the luminous flux and/or radiant flux of the light-emitting device can be decreased, so as to decrease the luminance of the illumination object.

Third, when $D_{uvSSL}$ is decreased in an appropriate range as well, the luminous flux and/or radiant flux of the light-

TABLE 16

Example 8

| Example 8 | (*1) | (*2) | $T_{SSL}$ (K) | $D_{uvSSL}$ | $|\Delta h_n|$ maximum value | $|\Delta h_n|$ minimum value | $\sum_{n=1}^{15} \Delta C_n / 15$ | $\Delta C_{max}$ | $\Delta C_{min}$ | $|\Delta C_{max} - \Delta C_{min}|$ | $A_{cg}$ | Luminous efficacy of radiation (lm/W) | Ra |
|---|---|---|---|---|---|---|---|---|---|---|---|---|---|
| Drive Point A | (*3) | 3:0:0 | 2,734 | −0.00297 | 12.23 | 0.72 | 1.32 | 5.81 | −4.18 | 9.99 | 4.99 | 218 | 85 |
| Drive Point B | | 0:3:0 | 7,321 | 0.00690 | 8.81 | 0.22 | −0.52 | 4.46 | −3.63 | 8.09 | 245.15 | 263 | 93 |
| Drive Point C | | 0:0:3 | 3,160 | −0.01365 | 3.98 | 0.08 | 3.79 | 6.05 | 1.50 | 4.56 | −68.30 | 217 | 87 |
| Drive Point D | | 1:1:1 | 3,749 | −0.00902 | 5.66 | 0.16 | 2.27 | 5.29 | 0.34 | 4.95 | −25.48 | 229 | 89 |

(*1) Light-emitting elements constituting each light emitting area
(*2) Radiant flux ratio of spectral power distribution $\phi_{SSL}1$ of light emitting area 1, and spectral power distribution $\phi_{SSL}2$ of light emitting area 2 and spectral power distribution $\phi_{SSL}3$ of light emitting area 3 ($\phi_{SSL}1:\phi_{SSL}2:\phi_{SSL}3$)
(*3) Light emitting area 1: blue semiconductor light-emitting element, green phosphor and red phosphor; Light emitting area 2: blue semiconductor light-emitting element, green phosphor and red phosphor; Light emitting area 3: blue semiconductor light-emitting element, green phosphor and red phosphor The spectral power distributions in FIG. 95 to FIG. 98, the CIELAB plots in FIG. 95 to FIG. 98, the CIE 1976 u'v' chromaticity diagram in FIG. 99 and Table 16 clarify the following.

At the drive point A and the drive point B, both $D_{uvSSL}$ and $A_{cg}$ are not in an appropriate range of the first embodiment of the first to fourth inventions of the present invention, but in an area near and between the drive point C and the drive point D, a natural, vivid, highly visible and comfortable appearance of colors and appearance of objects, as if the objects are seen outdoors, can be implemented. For example, in an area near and between the drive point C and the drive point D, the correlated color temperature of the packaged LED can be variable in a 3160 K to 3749 K range, and $D_{uvSSL}$ can also be variable in a −0.01365 to −0.00902 range, while implementing the above mentioned appearance of colors. Further, the average saturation difference of the 15 Munsell renotation color samples can also be variable in a 3.79 to 2.27 range. Thus in the area where a preferable appearance of colors can be implemented, optimum illumination conditions can easily be selected from the variable emitting device can be decreased, so as to decrease the luminance of the illumination object. In the second and third cases, brightness is normally increased, hence energy consumption can be suppressed by decreasing luminance, which is preferable.

Fourth, when the correlated color temperature is increased, the luminous flux and/or radiant flux of the light-emitting device can be increased, so as to increase the luminance of the illumination object. Under a general illumination environment, a relatively low luminance environment is often felt to be comfortable when the color temperature is in a low range, and a relatively high luminance environment is often felt to be comfortable when the color temperature is in a high range. This psychological effect is known as the Kruithof Effect, and performing control integrating this effect is also possible, and when the correlated color temperature is increased, it is preferable to increase the luminance of the illumination object by increasing the luminous flux and/or radiant flux of the light-emitting device.

[Examination]

The following invention issues can be derived from the above experiment results.

In other words, the effect of the first embodiment of the first to fourth inventions of the present invention can be implemented if the light emitting area allows $\phi_{SSL}(\lambda)$ to satisfy the following conditions by changing the luminous flux amount and/or radiant flux amount emitted from the light emitting area, where $\phi_{SSL}N(\lambda)$ (N is 1 to M) is a spectral power distribution of a light emitted from each light emitting area in a main radiant direction of the light-emitting device, and $\phi_{SSL}(\lambda)$ is a spectral power distribution of all the lights emitted from the light-emitting device in the radiant direction and satisfies

[Expression 44]

$$\phi_{SSL}(\lambda) = \sum_{N=1}^{M} \phi_{SSL}N(\lambda).$$

The following conditions can be applied in the same manner to the method for designing the light-emitting device according to the first embodiment of the second invention of the present invention, and the method for driving the light-emitting device according to the first embodiment of the third invention of the present invention.

Condition 1:

light emitted from the light-emitting device includes, in the main radiant direction thereof, light whose distance $D_{uvSSL}$ from a black-body radiation locus as defined by ANSI C78.377 satisfies $-0.0350 \leq D_{uvSSL} \leq -0.0040$, Condition 2:

if a spectral power distribution of light emitted from the light-emitting device in the radiant direction is denoted by $\phi_{SSL}(\lambda)$, a spectral power distribution of a reference light that is selected according to $T_{SSL}$ (K) of the light emitted from the light-emitting device in the radiant direction is denoted by $\phi_{ref}(\lambda)$, tristimulus values of the light emitted from the light-emitting device in the radiant direction are denoted by $(X_{SSL}, Y_{SSL}, Z_{SSL})$, and tristimulus values of the reference light that is selected according to $T_{SSL}$ (K) of the light emitted from the light-emitting device in the radiant direction are denoted by $(X_{ref}, Y_{ref}, Z_{ref})$ and if a normalized spectral power distribution $S_{SSL}(\lambda)$ of light emitted from the light-emitting device in the radiant direction, a normalized spectral power distribution $S_{ref}(\lambda)$ of a reference light that is selected according to $T_{SSL}$ (K) of the light emitted from the light-emitting device in the radiant direction, and a difference $\Delta S(\lambda)$ between these normalized spectral power distributions are respectively defined as $S_{SSL}(\lambda)=\phi_{SSL}(\lambda)/Y_{SSL}$, $S_{ref}(\lambda)=\phi_{ref}(\lambda)/Y_{ref}$ and $\Delta S(\lambda)=S_{ref}(\lambda)-S_{SSL}(\lambda)$ and an index $A_{cg}$ represented by the following Formula (1) satisfies $-360 \leq A_{cg} \leq -10$, in the case when a wavelength that produces a longest wavelength local maximum value of $S_{SSL}(\lambda)$ in a wavelength range from 380 nm to 780 nm is denoted by $\lambda_R$ (nm), and a wavelength $\Lambda 4$ that assumes $S_{SSL}(\lambda_R)/2$ exists on a longer wavelength-side of $\lambda_R$, and an index $A_{cg}$ represented by the following Formula (2) satisfies $-360 \leq A_{cg} \leq -10$, in the case when a wavelength that produces a longest wavelength local maximum value of $S_{SSL}(\lambda)$ in a wavelength range from 380 nm to 780 nm is denoted by $\lambda_R$ (nm), and a wavelength $\Lambda 4$ that assumes $S_{SSL}(\lambda_R)/2$ does not exist on a longer wavelength-side of $\lambda_R$,

[Expression 45]

$$A_{cg}=\int_{380}^{495}\Delta S(\lambda)d\lambda+\int_{495}^{590}(-\Delta S(\lambda))d\lambda+\int_{590}^{\Lambda 4}\Delta S(\lambda)d\lambda \quad (1)$$

[Expression 46]

$$A_{cg}=\int_{380}^{495}\Delta S(\lambda)d\lambda+\int_{495}^{590}(-\Delta S(\lambda))d\lambda+\int_{590}^{780}\Delta S(\lambda)d\lambda \quad (2).$$

In the examples, the light-emitting device includes two types or three types of light emitting areas, but a number of types of the light emitting area is not limited to two or three.

If there are two types of light emitting areas, control of the light-emitting device is easy, which is preferable.

If there are three types of light emitting areas, the control area becomes not a line but a plane on the chromaticity coordinates, and the appearance of colors can be adjusted in a wide range, which is preferable.

If there are four types or more of light emitting areas, not only does the control area become a plane on the chromaticity coordinates, as mentioned above, but also the correlated color temperature $D_{uvSSL}$ and the appearance of colors can be independently controlled, which is preferable. Furthermore, the appearance of colors can be adjusted without changing chromaticity, which is preferable.

If there are too many light emitting areas, on the other hand, control in the actual light-emitting device becomes complicated, therefore a number of light emitting areas is preferably ten or less, and even more preferable is eight or less.

In the light-emitting device which includes a plurality of types of light emitting areas according to the first embodiment of the first invention of the present invention, a following method can be used to change the luminous flux amount or radiant flux amount of each type of the light emitting areas. One method is changing the power to supply each light emitting area. For this, a method of changing current is preferable because it is easy to do. Another method is changing the luminous flux amount and/or radiant flux amount emitted from the light emitting areas by allowing an optical ND filter to be disposed in each light emitting area and exchanging the filter physically, or by electrically changing the transmittance of the polarizing filter or the like.

To improve the appearance of colors, it is preferable to satisfy the following Condition 3 and Condition 4.

Condition 3:

if an a* value and a b* value in CIE 1976 L*a*b* color space of 15 Munsell renotation color samples from #01 to #15 listed below when mathematically assuming illumination by the light emitted in the radiant direction are respectively denoted by $a^*_{nSSL}$ and $b^*_{nSSL}$ (where n is a natural number from 1 to 15), and if an a* value and a b* value in CIE 1976 L*a*b* color space of the 15 Munsell renotation color samples when mathematically assuming illumination by a reference light that is selected according to a correlated color temperature $T_{SSL}$ (K) of the light emitted in the radiant direction are respectively denoted by $a^*_{nref}$ and $b^*_{nref}$ (where n is a natural number from 1 to 15), then each saturation difference $\Delta C_n$ satisfies $-3.8 \leq \Delta C_n \leq 18.6$ (where n is a natural number from 1 to 15), and an average $SAT_{av}$ of saturation difference represented by the formula (3) satisfies formula (4) below and $$1.0 \leq SAT_{av} \leq 7.0 \qquad (4)$$

if a maximum saturation difference value is denoted by $\Delta C_{max}$ and a minimum saturation difference value is denoted by $\Delta C_{min}$, then a difference $|\Delta C_{max} - \Delta C_{min}|$ between the maximum saturation difference value and the minimum saturation difference value satisfies $2.8 \leq |\Delta C_{max} - \Delta C_{min}| \leq 19.6$, where $\Delta C_n = \sqrt{(a^*_{nSSL})^2 + (b^*_{nSSL})^2} - \sqrt{(a^*_{nref})^2 + (b^*_{nref})^2}$

| | |
|---|---|
| #01 | 7.5P 4/10 |
| #02 | 10PB 4/10 |
| #03 | 5PB 4/12 |
| #04 | 7.5B 5/10 |
| #05 | 10BG 6/8 |
| #06 | 2.5BG 6/10 |
| #07 | 2.5G 6/12 |
| #08 | 7.5GY 7/10 |
| #09 | 2.5GY 8/10 |
| #10 | 5Y 8.5/12 |
| #11 | 10YR 7/12 |
| #12 | 5YR 7/12 |
| #13 | 10R 6/12 |
| #14 | 5R 4/14 |
| #15 | 7.5RP 4/12 |

Condition 4:

if hue angles in CIE 1976 L*a*b* color space of the 15 Munsell renotation color samples when mathematically assuming illumination by the light emitted in the radiant direction are denoted by $\theta_{nSSL}$ (degrees) (where n is a natural number from 1 to 15), and if hue angles in a CIE 1976 L*a*b* color space of the 15 Munsell renotation color samples when mathematically assuming illumination by a reference light that is selected according to the correlated color temperature $T_{SSL}$ (K) of the light emitted in the radiant direction are denoted by $\theta_{nref}$ (degrees) (where n is a natural number from 1 to 15), then an absolute value of each difference in hue angles $|\Delta h_n|$ satisfies $0 \leq |\Delta h_n| \leq 9.0$ (degree) (where n is a natural number from 1 to 15), where $\Delta h_n = \theta_{nSSL} - \theta_{nref}$.

It is also preferable that all the $\phi_{SSL}N(\lambda)$ (N is 1 to M) of the light-emitting device satisfies Condition 1 and Condition 2 as shown in Example 1 and Example G. In the case of this mode, a natural, vivid, highly visible and comfortable appearance of colors and appearance of objects, as if the objects are seen outdoors, can be implemented regardless the ratio at which the lights emitted from the light emitting areas are supplied. To determine whether $\phi_{SSL}N(\lambda)$ (N is 1 to M) satisfies Conditions 1 and 2, it is assumed that only this $\phi_{SSL}N(\lambda)$ is emitted from the light-emitting device.

On the other hand, light emitted from a single light emitting area alone, as in the case of Example 2 and Example 5, may be incapable of implementing a natural, vivid, highly visible and comfortable appearance of colors and appearance of objects as if the objects are seen outdoors. Even in such a case, a natural, vivid, highly visible and comfortable appearance of colors and appearance of objects as if the objects are seen outdoors may still be implemented if a combination of light emitting areas and ratio of the luminous flux and/or radiant flux of the light emitting areas are adjusted. Needless to say, this type of light-emitting device still is within the scope of the first embodiment of the first to fourth inventions of the present invention.

As shown in Example 2 and Example 5 for example, one characteristic of the first embodiment of the first to fourth inventions of the present invention is that "a natural, vivid, highly visible and comfortable appearance of colors and appearance of objects, as if the objects are seen outdoors, can be implemented", even if "light sources which cannot implement a natural, vivid, highly visible and comfortable appearance of colors and appearance of objects as if the objects are seen outdoors" are combined. Further, as shown in Example 3, Example 4, Example 7 and Example 8, another characteristic is that "a natural, vivid, highly visible and comfortable appearance of colors and appearance of objects as if the objects are seen outdoors" can be implemented, even if "a light source that cannot implement a natural, vivid, highly visible and comfortable appearance of colors and appearance of objects as if the objects are seen outdoors" as a single unit, and "a light source that can implement a natural, vivid, highly visible and comfortable appearance of colors and appearance of objects as if the objects are seen outdoors can be implemented" as a single unit, are combined. Thus, in order to implement a light-emitting device that "can implement a natural, vivid, highly visible and comfortable appearance of colors and appearance of objects as if the objects are seen outdoors", the following can be used as guidelines to create the light-emitting device according to the first embodiment of the first invention of the present invention, in the case of "a combination including a light source that cannot implement a natural, vivid, highly visible and comfortable appearance of colors and appearance of objects as if the objects are seen outdoors", particularly in the case of "a combination of light sources that cannot implement a natural, vivid, highly visible and comfortable appearance of colors and appearance of objects as if the objects are seen outdoors".

(a) Create the light-emitting device by combining light emitting areas of which chromaticity coordinates on various chromaticity diagrams are completely different from each other.

(b) Create the light-emitting device by combining a plurality of light emitting areas of which correlated color temperatures are completely different if the color temperatures can be defined.

(c) Create the light-emitting device by combining a plurality of light emitting areas of which distance $D_{uv}$ from the black-body radiation locus are completely different if this distance can be defined.

These aspects will be described in more detail. Requirements to implement a natural, vivid, highly visible and comfortable appearance of colors and appearance of objects as if the objects are seen outdoors are as described above, and in the light-emitting device, it is necessary that the same parameters on the spectral power distribution of the light satisfy predetermined values. Important of these parameters is the distance $D_{uv}$ from the black-body radiation locus, and a natural, vivid, highly visible and comfortable appearance of colors and appearance of objects, as if the objects are seen outdoors according to the first embodiment of the first to fourth inventions of the present invention, can be implemented by combining light sources that cannot implement a good appearance of colors, and the reason for this will be described using $D_{uv}$ as an example.

FIG. 56 is the CIE 1976 u'v' chromaticity diagram, on which the two-dot chain line indicates a range of $D_{uv}$ that satisfies Condition 1 according to the first embodiment of the first to fourth inventions of the present invention.

The light source at A and the light source at E in FIG. 56, which are light sources outside this range, cannot implement a good appearance of colors alone. However if the light source at A and the light source at E in FIG. 56 are combined and the radiant flux ratio or luminous flux ratio thereof is changed, the combined light source can be moved on the line connecting point A and point E. Then the optimum range of $D_{uv}$ according to the first embodiment of the first to fourth inventions of the present invention draws not a line but an arc, hence point B or point C, when lights from the light sources are combined at a predetermined ratio, can exist in a range where a good appearance of colors can be implemented.

A number of combinations that implement this combination is infinite, and in FIG. 56, the light source A of which correlated color temperature is low (2700 K) and light source E of which correlated color temperature is high (5506 K) are combined. The chromaticity diagram in FIG. 82 is similar to this. It is also possible to combine a light source, of which value of $D_{uv}$ is extremely low and is outside the range of $D_{uv}$ to implement a good appearance of colors, and a light source, of which value of $D_{uv}$ is extremely high and is outside the range of $D_{uv}$ to implement a good appearance of colors.

Therefore in (a), (b) and (c), it is preferable that the range of $D_{uv}$ (−0.0350 or more and −0.004 or less), disclosed in the first embodiment of the first to fourth inventions of the present invention and the range of chromaticity that can be implemented by combining the light emitting areas, overlap at least partially, and it is more preferable that these ranges overlap on a plane of the chromaticity diagram by using three or more light emitting areas.

Concerning Condition (b), the correlated color temperature difference between two light emitting areas, of which correlated color temperatures are most different among the plurality of light emitting areas constituting the light-emitting device, is favorably 2000 K or more, more favorably 2500 K or more, extremely favorably 3000 K or more, dramatically favorably 3500 K or more, and most favorably 4000 K or more. Concerning Condition (c), the absolute value of the $D_{uv}$ difference between two light emitting areas, of which correlated color temperatures are most different among the plurality of light emitting areas constituting the light-emitting device, is favorably 0.005 or more, more favorably 0.010 or more, extremely favorably 0.015 or more, and dramatically favorably 0.020 or more.

In order to implement the light-emitting device that "can implement a natural, vivid, highly visible and comfortable appearance of colors and appearance of objects as if the objects are seen outdoors", the following can also be used as guidelines to create the light-emitting device according to the first embodiment of the first invention of the present invention, in the case of "a combination including a light source that cannot implement a natural, vivid, highly visible and comfortable appearance of colors and appearance of objects as if the objects are seen outdoors", particularly in the case of "a combination of light sources that cannot implement a natural, vivid, highly visible and comfortable appearance of colors and appearance of objects as if the objects are seen outdoors".

(d) Create the light-emitting device by combining a plurality of light emitting areas of which respective $A_{cg}$ is completely different from each other in the appearance of colors.

(e) Create the light-emitting device by combining a plurality of light emitting areas of which each saturation difference $\Delta C_n$ is completely different from each other in the appearance of colors.

(f) Create the light-emitting device by combining a plurality of light emitting areas of which average $SAT_{av}$ of the saturation difference is completely different from each other in the appearance of colors.

In (d), (e) and (f) as well, it is preferable that the respective range disclosed in the first embodiment of the first to fourth inventions of the present invention and the range of each parameter that can be implemented by the combination of the light emitting area overlap at least partially, and it is more preferable that these ranges overlap on a plane of the chromaticity diagram by using three or more light emitting areas.

If four or more light emitting areas are used, all the items of (a) to (f) can be quite easily adjusted to be in the range disclosed by the first embodiment of the first to fourth inventions of the present invention, even if all the light emitting areas are "light sources that cannot implement a natural, vivid, highly visible and comfortable appearance of color and appearance of objects as if the objects are seen outdoors", which is preferable.

In the first embodiment of the first to fourth inventions of the present invention, it is preferable that at least one of the light emitting areas is a light emitting area having wiring that can be electrically driven independently from the other light emitting areas, and it is more preferable that all the light emitting areas have wiring that can be electrically driven independently from the other light emitting areas. It is also preferable to drive the light-emitting device in this way. In this mode, power to be supplied to each light emitting area can be easily controlled, and the appearance of colors suitable to the taste of the user can be implemented.

In the first embodiment of the first to fourth inventions of the present invention, one light emitting area may be driven so as to be electrically subordinate to another light emitting area. For example, when current is injected into two light emitting areas, one light emitting area may be electrically subordinate to the other, such that when current to be injected into one light emitting area is increased, current to be injected into the other light emitting area is decreased. This circuit is easily implemented by a configuration using a variable resistor or the like, for example, and does not require a plurality of power supplies, which is preferable.

In the light-emitting device, it is preferable that at least one selected from the group consisting of: the index $A_{cg}$ given by the Expression (1) or (2), the correlated color temperature $T_{SSL}$(K) and the distance $D_{uvSSL}$ from the black-body radiation locus, can be changed, and it is also preferable that the luminous flux and/or radiant flux emitted from the light-emitting device in the main radiant direction can be independently controlled when at least one selected from the group consisting of: the index $A_{cg}$ given by the Expression (1) or (2), the correlated color temperature $T_{SSL}$(K) and the distance $D_{uvSSL}$ from the black-body radiation locus is changed. It is preferable to drive the light-emitting device in this way. In this mode, parameters to implement appearance of colors are variable, and an appearance of colors suitable to the taste of the user can be easily implemented.

It is preferable that the maximum distance L between two arbitrary points on a virtual outer periphery enveloping the entire light emitting areas closest to each other is 0.4 mm or more and 200 mm or less. In this mode, the color separation of the lights emitted from a plurality of light emitting areas is not visually recognized clearly, and the strange feeling of seeing an image generated by the light-emitting device can be reduced. Further, the spatial additive color mixing in the illumination light functions sufficiently, and when this light is irradiated onto the illumination object, color unevenness in the illuminated area can be reduced, which is preferable.

The maximum distance L between two arbitrary points on a virtual outer periphery enveloping the entire light emitting areas will be described with reference to drawings.

FIG. 50 shows the packaged LED 20 used for Example 2, where the light emitting areas closest to the light emitting area 22 is the light emitting areas 11, 12 and 13. Out of these light emitting areas, the virtual outer periphery 7 enveloping the light emitting area 12 is the largest virtual outer periphery, and the arbitrary two points 71 on this outer periphery is the maximum distance L. In other words, the maximum distance L is the distance 72 between these two points, which is preferably 0.4 mm or more and 200 mm or less.

This is the same for the illumination system 30 used for Example 3 in FIG. 57 and the pair of packaged LEDs 40 used for Example 4 in FIG. 64.

The maximum distance L between two arbitrary points on a virtual outer periphery enveloping the entire light emitting areas closest to each other is favorably 0.4 mm or more, more favorably 2 mm or more, extremely favorably 5 mm or more, and dramatically favorably 10 mm or more. This is because the higher radiant flux (and/or higher luminous flux) can be emitted as the virtual outer periphery enveloping one light emitting area is larger. The maximum distance L between two arbitrary points on the virtual outer periphery enveloping the entire light emitting areas closest to each other is favorably 200 mm or less, more favorably 150 mm or less, extremely favorably 100 mm or less, and dramatically favorably 50 mm or less. This is critical in terms of suppressing the generation of spatial color unevenness in the illuminated area.

In a driving method according to the first embodiment of the third invention of the present invention, when at least one selected from the group consisting of: the index $A_{cg}$, the correlated color temperature $T_{SSL}(K)$ and the distance $D_{uvSSL}$ from the black-body radiation locus, is changed, the luminous flux and/or radiant flux emitted from the light-emitting device in the main radiant direction may be made to be unchangeable. If this control is performed, the difference of appearance of colors caused by the change of the shape of the spectral power distribution can be easily checked without depending on the luminance of the illumination object, which is preferable.

In the method for driving the light-emitting device, it is preferable that when the index $A_{cg}$ given by the Expression (1) or (2) is decreased within an appropriate range, the luminous flux and/or radiant flux emitted from the light-emitting device in the main radiant direction is decreased, or it is preferable that when the correlated color temperature $T_{SSL}(K)$ is increased, the luminous flux and/or radiant flux emitted from the light-emitting device in the main radiant direction is increased, or it is preferable that when the distance $D_{uvSSL}$ from the black-body radiation locus is decreased within an appropriate range, the luminous flux and/or radiant flux emitted from the light-emitting device in the main radiant direction is decreased. This also means that it is preferable that when the index $A_{cg}$ given by the Expression (1) or (2) is increased within an appropriate range, the luminous flux and/or radiant flux emitted from the light-emitting device in the main radiant direction is increased, or it is preferable that when the correlated color temperature $T_{SSL}(K)$ is decreased, the luminous flux and/or radiant flux emitted from the light-emitting device in the main radiant direction is decreased, or it is preferable that when the distance $D_{uvSSL}$ from the black-body radiation locus is increased within an appropriate range, the luminous flux and/or radiant flux emitted from the light-emitting device in the main radiant direction is increased.

When the index $A_{cg}$ given by the Expression (1) or (2) is decreased, a natural, vivid, highly visible and comfortable appearance of colors and appearance of objects as if the objects are seen outdoors can be implemented. According to various visual experiments, if the index $A_{cg}$ is decreased like this, a sense of brightness improves, hence even if the luminous flux and/or radiant flux or luminance to be measured is decreased, a good appearance of colors can still be maintained in the illumination object, and therefore energy consumption of the light-emitting device can be conserved, which is preferable. In the same manner, when the index $A_{cg}$ is increased within an appropriate range, it is preferable to maintain a good appearance of colors in the illumination object by increasing the luminous flux and/or radiant flux or the luminance to be measured.

If it is driven such that the luminous flux and/or radiant flux is increased when the correlated color temperature $T_{SSL}(K)$ is increased, comfortable illumination can be implemented by the Kruithof Effect. When the color temperature is decreased, on the other hand, it may be controlled to decrease the luminous flux and/or radiant flux of the light-emitting device so as to decrease the luminance of the illumination object. These are control techniques applying the Kruithof Effect, and are preferable.

When the distance $D_{uvSSL}$ from the black-body radiation locus is decreased within an appropriate range, a natural, vivid, highly visible and comfortable appearance of colors and appearance of objects as if the objects are seen outdoors can be implemented. According to various visual experiments, if the distance $D_{uvSSL}$ from the black-body radiation locus is decreased within an appropriate range like this, a sense of brightness improves, hence even if the luminous flux and/or radiant flux or luminance to be measured is decreased, a good appearance of colors can still be maintained in the illumination object, and therefore energy consumption of the light-emitting device can be conserved, which is preferable. In the same manner, when the distance $D_{uvSSL}$ from the black-body radiation locus is increased within an appropriate range, it is preferable to maintain a good appearance of colors in the illumination object by increasing the luminous flux and/or radiant flux or the luminance to be measured.

In the first embodiment of the first to fourth inventions of the present invention, it is also possible to perform the opposite of the above mentioned control, and needless to say, that the control method can be appropriately selected depending on the illumination object, the illumination environment, the purpose or the like.

On the other hand, the following invention issues can be derived from the experiment results.

In other words, the effect of the first embodiment of the first to fourth inventions of the present invention can be implemented by using an illumination method comprising:

illuminated objects preparation step of preparing illuminated objects; and an illumination step of illuminating the objects by light emitted from a light-emitting devices which includes M number of light-emitting areas (M is 2 or greater natural number), and has a semiconductor light-emitting element as a light-emitting element in at least one of the light-emitting areas, in the illumination step, when light emitted from the light-emitting devices illuminate the objects, the objects are illuminated so that the light measured at a position of the objects satisfies <1>, <2> and <3> below:

<1> a distance $D_{uvSSL}$ from a black-body radiation locus as defined by ANSI C78.377 of the light measured at the position of the objects satisfies $-0.0350 \leq D_{uvSSL} \leq -0.0040$;

<2> if an a* value and a b* value in CIE 1976 L*a*b* color space of 15 Munsell renotation color samples from #01 to #15 listed below when mathematically assuming illumination by the light measured at the position of the objects are respectively denoted by $a^*_{nSSL}$ and $b^*_{nSSL}$ (where n is a natural number from 1 to 15), and if an a* value and a b* value in CIE 1976 L*a*b* color space of the 15 Munsell renotation color samples when mathematically assuming illumination by a reference light that is selected according to a correlated color temperature $T_{SSL}$ (K) of the light measured at the position of the objects are respectively denoted by $a^*_{nref}$ and $b^*_{nref}$ (where n is a natural number from 1 to 15), then each saturation difference $\Delta C_n$ satisfies $-3.8 \leq \Delta C_n \leq 18.6$ (where n is a natural number from 1 to 15), and an average $SAT_{av}$ of saturation difference represented by the formula (3) satisfies formula (4) below and $1.0 \leq SAT_{av} \leq 7.0$, if a maximum saturation difference value is denoted by $\Delta C_{max}$ and a minimum saturation difference value is denoted by $\Delta C_{min}$, then a difference $\Delta C_{max} - \Delta C_{min}$ between the maximum saturation difference value and the minimum saturation difference value satisfies $2.8 \leq |\Delta C_{max} - \Delta C_{min}| \leq 19.6$, where $\Delta C_n = \sqrt{\{(a^*_{nSSL})^2 + (b^*_{nSSL})^2\}} - \sqrt{\{(a^*_{nref})^2 + (b^*_{nref})^2\}}$ with the 15 Munsell renotation color samples being:

| | |
|---|---|
| #01 | 7.5P 4/10 |
| #02 | 10PB 4/10 |
| #03 | 5PB 4/12 |
| #04 | 7.5B 5/10 |
| #05 | 10BG 6/8 |
| #06 | 2.5BG 6/10 |
| #07 | 2.5G 6/12 |
| #08 | 7.5GY 7/10 |
| #09 | 2.5GY 8/10 |
| #10 | 5Y 8.5/12 |
| #11 | 10YR 7/12 |
| #12 | 5YR 7/12 |
| #13 | 10R 6/12 |
| #14 | 5R 4/14 |
| #15 | 7.5RP 4/12 |

<3> if hue angles in CIE 1976 L*a*b* color space of the 15 Munsell renotation color samples when mathematically assuming illumination by the light measured at the position of the objects are denoted by $\theta_{nSSL}$ (degrees) (where n is a natural number from 1 to 15), and if hue angles in CIE 1976 L*a*b* color space of the 15 Munsell renotation color samples when mathematically assuming illumination by a reference light that is selected according to the correlated color temperature $T_{SSL}$ (K) of the light measured at the position of the objects are denoted by $\theta_{nref}$ (degrees) (where n is a natural number from 1 to 15), then an absolute value of each difference in hue angles $|\Delta h_n|$ satisfies $0 \leq |\Delta h_n| \leq 9.0$ (degree) (where n is a natural number from 1 to 15), here $\Delta h_n = \theta_{nSSL} - \theta_{nref}$.

It is preferable that when $\phi_{SSL}N(\lambda)$ (N is 1 to M) is a spectral power distribution of a light which was emitted from each light-emitting element and reached the position of the object, and $\phi_{SSL}(\lambda)$ is a spectral power distribution of the light measured at the position of the object is given by

[Expression 47]

$$\phi_{SSL}(\lambda) = \sum_{N=1}^{M} \phi_{SSL}N(\lambda).$$

all of $\phi_{SSL}N(\lambda)$ can satisfy the above mentioned <1>, <2> and <3>.

In the illumination method, it is preferable that at least one light emitting area of the M number of light emitting areas is electrically driven independently from the other light emitting areas for performing the illumination, and it is more preferable that all of the light emitting areas of the M number of light emitting areas are electrically driven independently from the other light emitting areas.

In the illumination method, it is preferable that at least one of: the index $SAT_{av}$, the correlated color temperature $T_{SSL}$ (K), and the distance $D_{uvSSL}$ from the black-body radiation locus is changed, or it is preferable that when at least one of the indexes is changed, the luminance in the object is independently controlled, or it is preferable that when at least one of the indexes is changed, the luminance in the object is made to be unchangeable.

Making the luminance unchangeable means that the luminance is not substantially changed, and the change of the luminance is favorably ±20% or less, more favorably ±15% or less, even more favorably ±10% or less, particularly favorably ±5% or less, and most favorably ±3% or less. If this method is used, the difference of appearance of colors caused by the change of the shape of the spectral power distribution can be easily checked without depending on the luminance of the illumination object, and optimum spectral power distribution depending on the illumination environment, the object, the purpose or the like can be easily detected, which is preferable.

In the illumination method, it is preferable that when the index $SAT_{av}$ is increased, the luminance in the object is decreased. If the index is increased, a more vivid appearance can be implemented, and a sense of brightness normally increased in this situation, hence the luminance can be decreased, whereby energy consumption can be conserved. This also means that it is preferable that when the index $SAT_{av}$ is decreased, the luminance in the object is increased.

In the illumination method, it is preferable that when the correlated color temperature $T_{SSL}$(K) is increased, the luminance in the object is increased. If it is driven such that the luminance is increased when the correlated color temperature $T_{SSL}$(K) is increased, a comfortable illumination can be implemented by the Kruithof Effect. When the color temperature is decreased, on the other hand, it may be controlled to decrease the luminance of the illumination object. These are control techniques applying the Kruithof effect, and are preferable.

In the illumination method, it is preferable that when the distance $D_{uvSSL}$ from the black-body radiation locus is decreased, the luminance in the object is decreased. According to various visual experiments, if the distance $D_{uvSSL}$ from the black-body radiation locus is decreased, a sense of brightness improves, hence even if the luminance is decreased, a good appearance of colors can still be maintained in the illumination object, and therefore energy consumption of the light-emitting device can be conserved, which is preferable. In the same manner, when the distance $D_{uvSSL}$ from the black-body radiation locus is increased, it is preferable to maintain a good appearance of colors in the illumination object by increasing the luminance.

In the illumination method, it is preferable that when L is a maximum distance between two arbitrary points on a virtual outer periphery enveloping the entire light emitting areas closest to each other, and H is a distance between the light-emitting device and the illumination object, the distance H is set so as to satisfy 5×L≤H≤500×L.

In this case, the base point of the light-emitting device to measure the distance is the irradiation port.

If this illumination method is used, color separation of lights from the light sources is not visually recognized clearly when the light-emitting device is observed from the position of the illumination object, and spatial color unevenness is hardly generated in the illumination object, which is preferable.

In the maximum distance L between two arbitrary points on a virtual outer periphery enveloping the entire light emitting areas closest to each other, and the distance H between the light-emitting device and the illumination object, H is favorably 5×L or more, more favorably 10×L or more, extremely favorably 15×L or more, and dramatically favorably 20×L or more. Because as H is greater within an appropriate range, that is, as H is more distant from the maximum distance L between two arbitrary points on a virtual outer periphery enveloping different light emitting areas, the colors of the lights emitted from different light emitting areas are more thoroughly mixed spatially, which is preferable. On the other hand, H is favorably 500×L or less, more favorably 250×L or less, extremely favorably 100×L or less, and dramatically favorably 50×L or less. Because if H is more distant than necessary, sufficient luminance cannot be assured for the illumination object, and maintaining the distance of H and L within this range is important to implement a good luminance environment with driving power in an appropriate range.

Second Embodiment of First, Second, Fourth and Fifth Inventions of the Present Invention Example 9

Figure 101:
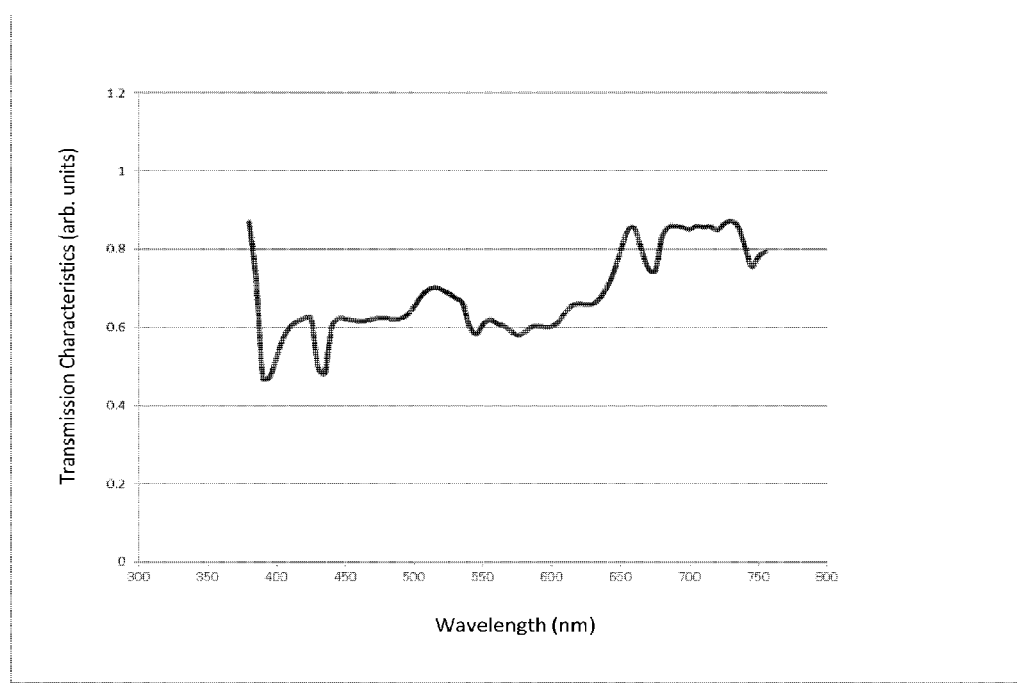
FIG. 101 is a graph showing the transmission characteristic of the control element (filter) used for Example 9.
Figure 102:
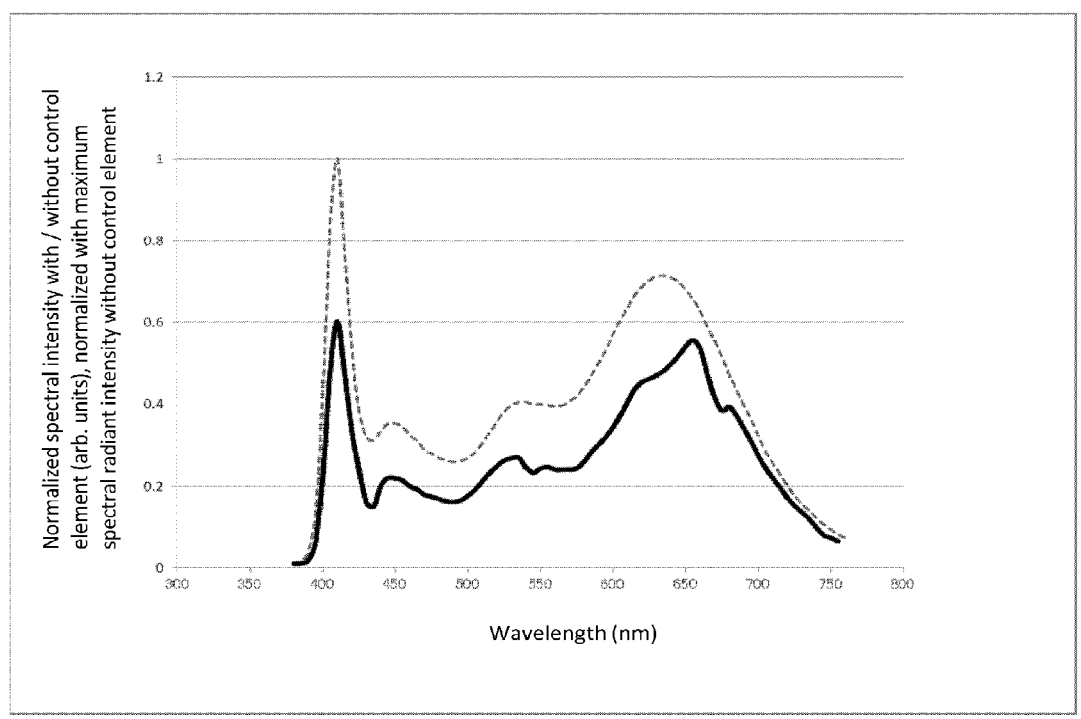
FIG. 102 is a graph showing the spectral power distributions in the Reference Example 1 and Example 9.
Figure 103:
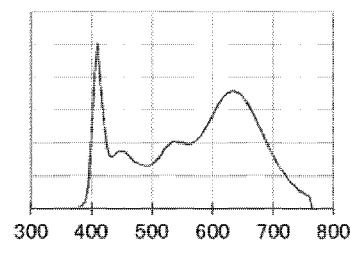
FIG. 103 are graphs showing the spectral power distributions of Reference Example 1 and Example 9, and the CIELAB plots plotting both the a* value and the b* value of the 15 color samples assuming the case of illuminating with these spectral power distributions, and with a calculational reference light (black-body radiator) having a CCT corresponding to these spectral power distributions respectively (the dotted line in the CIELAB plot indicates the result of the reference light, and the solid line indicates the result of the packaged LED)
Figure 103:
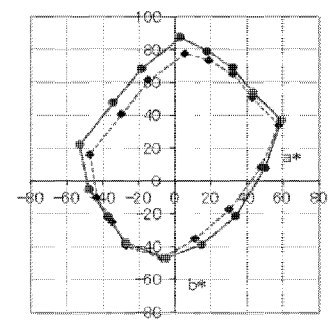
Figure 103:
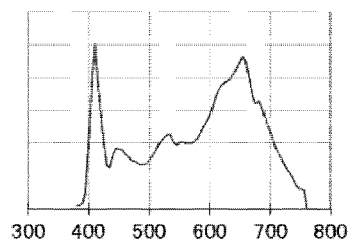
Figure 103:
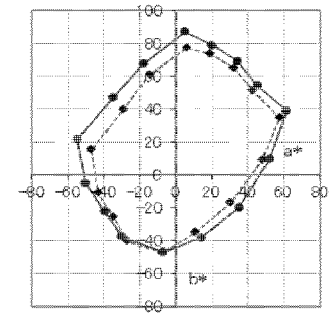

First an optical filter having spectral transmission characteristics shown in FIG. 101 is prepared. Then a packaged LED having a purple LED, an SBCA phosphor, a β-SiAlON phosphor and a CASON phosphor, as a light-emitting element, is prepared, and six of the packaged LEDs are mounted on an LED board, whereby an LED module is fabricated. The dotted line in FIG. 102 indicates the spectral power distribution in this case, normalized by the maximum spectral radiant flux irradiated from the LED module onto the axis. FIG. 103 shows this spectral power distribution, and the CIELAB plot on which the a* values and the b* values are indicated: when the 15 Munsell renotation color samples from #01 to #15 are mathematically assumed as illumination objects and are illuminated by this LED module; and when these illumination objects are illuminated by the reference light derived from the correlated color temperature of the LED module. Further, the photometric characteristics and the colormetric characteristics in this case are shown in Reference Example 1 in Table 17. Here the light emitted from the LED module of the Reference Example 1 onto the axis implements a good appearance of colors, as each value clearly indicates.

Next, an LED lighting fixture of Example 9 is fabricated using the LED module. Here an optical filter having the spectral transmission characteristics shown in FIG. 101 is mounted in the light emitting direction. The solid line in FIG. 102 is a spectral power distribution of the LED lighting fixture of Example 9, normalized by the maximum spectral radiant flux of the light irradiated from the LED module onto the axis. In the spectral power distribution of the LED lighting fixture of Example 9, convex/concave portions are added because of the characteristics of the optical filter. FIG. 103 shows this spectral power distribution, and the CIELAB plot on which the a* values and the b* values are indicated: when 15 Munsell renotation color samples from #01 to #15 are mathematically assumed as illumination objects and are illuminated by the LED lighting fixture of Example 9; and when these objects are illuminated by the reference light derived from the correlated color temperature of the LED lighting fixture. Further, the photometric characteristics and the colormetric characteristics in this case are shown in Example 9 in FIG. 17.

$D_{uv}$ ($\phi_{SSL}$) of the lighting fixture of Example 9 is −0.02063, which is 0.00047 higher than −0.02110 of $D_{uv}$ ($\Phi_{elm}$) of the LED module of Reference Example 1. $A_{cg}$ ($\phi_{SSL}$) of the lighting fixture of Example 9 is −267.09, which is 20.39 lower than −246.70 of $A_{cg}$ ($\Phi_{elm}$) of the LED module of Reference Example 1. $SAT_{av}$ ($\phi_{SSL}$) of the lighting fixture of Example 9 is 5.06, which is 0.92 higher than 4.14 of $SAT_{av}$ ($\Phi_{elm}$) of the LED module of Reference Example 1, and a more clear and better appearance of colors is implemented when observed with a same luminance.

Example 10

Figure 104:
FIG. 104 is a graph showing transmission characteristics of the control element (filter) used for Example 10.
Figure 105:
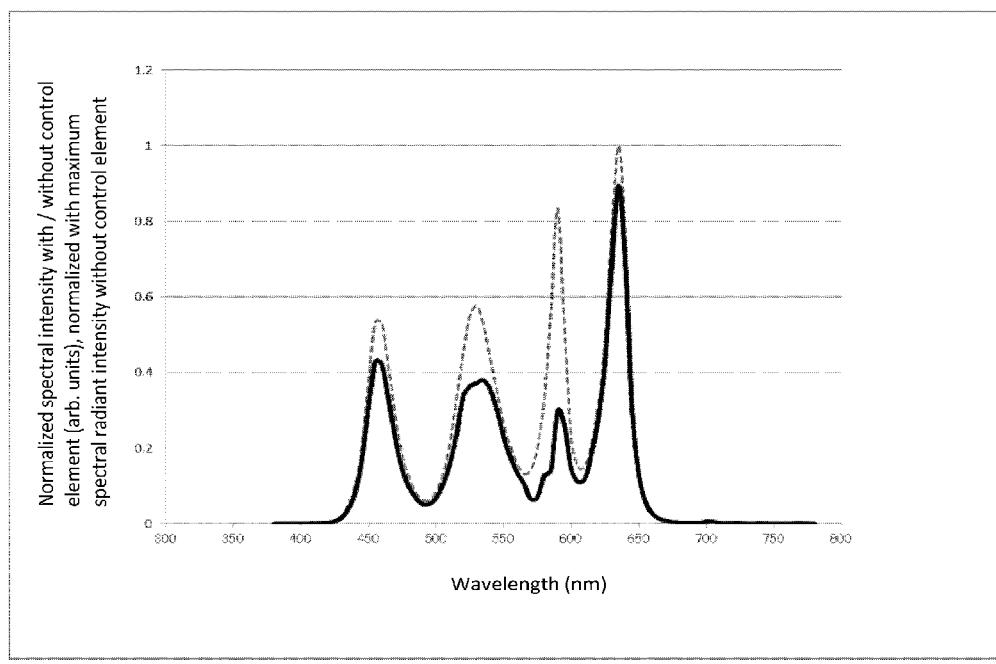
FIG. 105 is a graph showing the spectral power distributions in the Reference Comparative Example 1 and Example 10.
Figure 106:
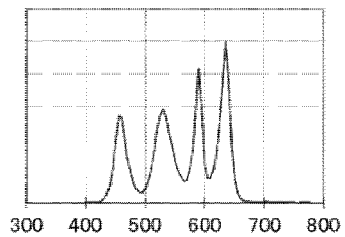
FIG. 106 are graphs showing the spectral power distributions of Reference Comparative Example 1 and Example 10, and the CIELAB plots plotting both the a* value and the b* value of the 15 color samples assuming the case of illuminating with these spectral power distributions, and with a calculational reference light (black-body radiator) having a CCT corresponding to these spectral power distributions respectively (the dotted line in the CIELAB plot indicates the result of the reference light, and the solid line indicates the result of the packaged LED)
Figure 106:
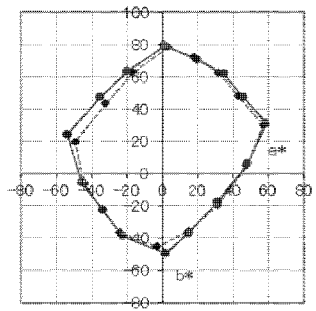
Figure 106:
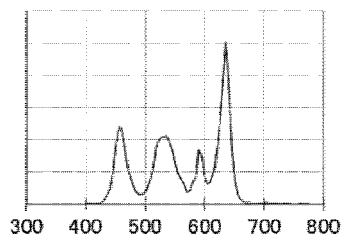
Figure 106:
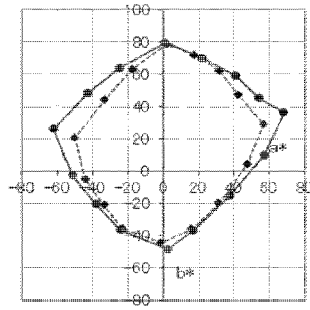

First an optical filter having spectral transmission characteristics shown in FIG. 104 is prepared. Then a semiconductor light-emitting element having four types of central wavelengths is prepared as a light-emitting element, and four of the semiconductor light-emitting elements are mounted on one package, whereby a packaged LED is fabricated. Then twelve of the packaged LEDs are mounted on an LED board, whereby an LED module is fabricated. The dotted line in FIG. 105 indicates the spectral power distribution in this case, normalized by the maximum spectral radiant flux of the light irradiated from this LED module onto the axis. FIG. 106 shows this spectral power distribution, and the CIELAB plot on which the a* values and the b* values are indicated: when the 15 Munsell renotation color samples from #01 to #15 are mathematically assumed as illumination objects and are illuminated by this LED module; and when these illumination objects are illuminated by the reference light derived from the correlated color temperature of the LED module. Further, the photometric characteristics and the colormetric characteristics in this case are shown in the Reference Comparative Example 1 in FIG. 17. Here the light emitted from the light emitted from the LED module according to Reference Comparative Example 1 onto the axis does not implement a good appearance of colors, as each value clearly indicates.

Next, an LED lighting fixture of Example 10 is fabricated using the LED module. Here an optical filter shown in FIG. 104 is mounted in the light emitting direction. The solid line in FIG. 105 is a spectral power distribution of the LED lighting fixture according to Example 10, normalized by the maximum spectral radiant flux of the light irradiated from the LED module onto the axis. In the spectral power distribution of the LED lighting fixture of Example 10, the relative intensity of the radiant flux changes due to the emission of the LED, and concave/convex portions are added because of the characteristics of the optical filter. FIG.

106 shows this spectral power distribution, and the CIELAB plot on which the a* values and the b* values are indicated: when 15 Munsell renotation color samples from #01 to #15 are mathematically assumed as illumination objects and are illuminated by the LED lighting fixture of Example 10; and when these objects are illuminated by the reference light derived from the correlated color temperature of the LED lighting fixture. Further, the photometric characteristics and the colormetric characteristics in this case are shown in Example 10 in Table 17.

$D_{uv}$ ($\phi_{SSL}$) of the lighting fixture of Example 10 is −0.00424, which is 0.00453 lower than 0.00029 of $D_{uv}$ ($\Phi_{elm}$) of the LED module of Reference Comparative Example 1. $A_{cg}$ ($\phi_{SSL}$) of the lighting fixture of Example 10 is −81.41, which is 74.66 lower than −6.75 of $A_{cg}$ ($\Phi_{elm}$) of the LED module of Reference Comparative Example 1. $SAT_{av}$ ($\phi_{SSL}$) of the lighting fixture of Example 10 is 5.28, which is 3.69 higher than 1.59 of $SAT_{av}$ of the LED module of Reference Comparative Example 1.

As a result, even if a lighting fixture uses a semiconductor light-emitting element, a packaged LED and an LED module which cannot implement a good appearance of colors, an LED lighting fixture that can implement a good appearance of colors can be fabricated by the optical characteristics of a control element.

Comparative Example 2

An LED module of Reference Comparative Example 2 and an LED lighting fixture of Comparative Example 2 are fabricated in the same manner as Example 9, except that a packaged LED having a blue LED, a green phosphor and a red phosphor is prepared as the light-emitting element.

Figure 107:
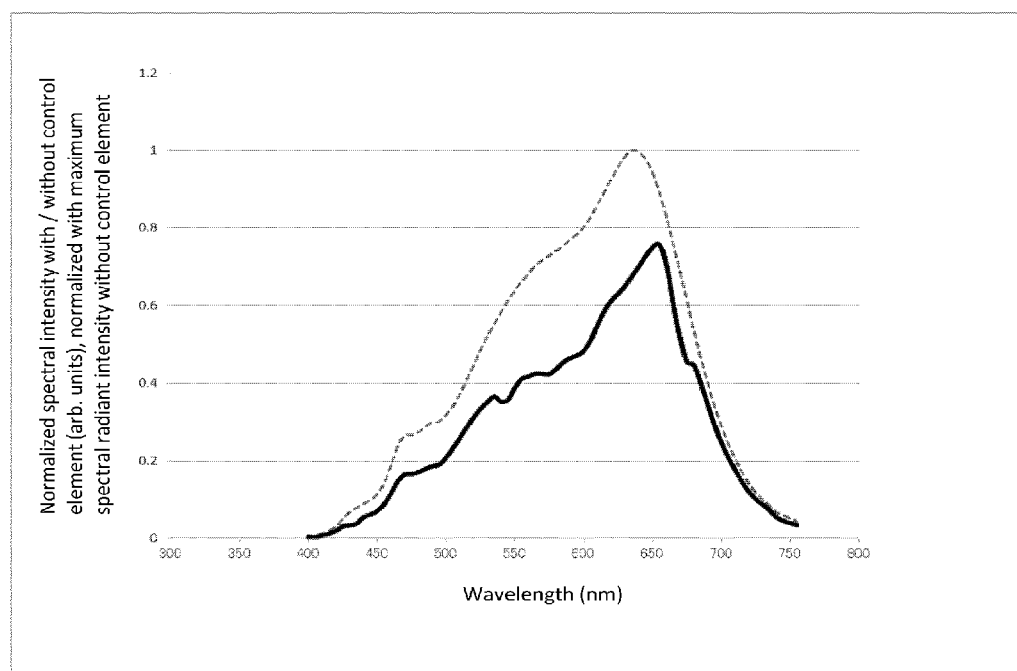
FIG. 107 is a graph showing the spectral power distributions in the Reference Comparative Example 2 and Comparative Example 2.
Figure 108:
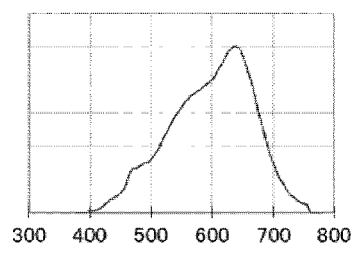
FIG. 108 are graphs showing the spectral power distributions of Reference Comparative Example 2 and Comparative Example 2, and the CIELAB plots plotting both the a* value and the b* value of the 15 color samples assuming the case of illuminating with these spectral power distributions, and with a calculational reference light (black-body radiator) having a CCT corresponding to these spectral power distributions respectively (the dotted line in the CIELAB plot indicates the result of the reference light, and the solid line indicates the result of the packaged LED)
Figure 108:
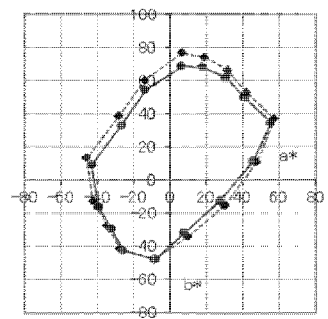
Figure 108:
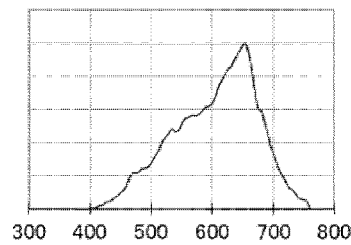
Figure 108:
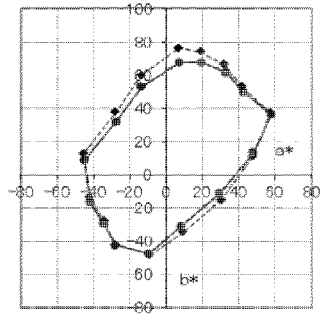

The dotted line in FIG. 107 indicates the spectral power distribution in this case, normalized by the maximum spectral radiant flux of the light irradiated from the LED module onto the axis. FIG. 108 shows this spectral power distribution, and the CIELAB plot on which the a* values and the b* values are indicated: when the 15 Munsell renotation color samples from #01 to #15 are mathematically assumed as illumination objects and are illuminated by this LED module; and when these illumination objects are illuminated by the reference light derived from the correlated color temperature of the LED module. Further, the photometric characteristics and the colormetric characteristics in this case are shown in Reference Comparative Example 2 in Table 17. Here the light emitted from the LED module of Reference Comparative Example 2 onto the axis does not implement a good appearance of colors, as each value clearly indicates.

On the other hand, the characteristics of the LED lighting fixture of Comparative Example 2 fabricated by mounting the optical filter shown in FIG. 98, which is the same as Example 9, are as follows. The solid line in FIG. 107 is a spectral power distribution of the LED lighting fixture of Comparative Example 2, normalized by the maximum spectral radiant flux of the light irradiated from the LED module onto the axis. In the spectral power distribution of the LED lighting fixture of Comparative Example 2, convex/concave portions are added because of the characteristics of the optical filter. FIG. 108 shows this spectral power distribution, and the CIELAB plot on which the a* values and the b* values are indicated: when 15 Munsell renotation color samples from #01 to #15 are mathematically assumed as illumination objects and are illuminated by the LED lighting fixture of Comparative Example 2; and when these objects are illuminated by the reference light derived from the correlated color temperature of the LED lighting fixture. Further, the photometric characteristics and colormetric characteristics in this case are shown in Comparative Example 2 in Table 17.

$D_{uv}$ ($\phi_{SSL}$) of the lighting fixture of Comparative Example 2 is 0.00716, which is 0.00103 lower than 0.00819 of $D_{uv}$ ($\Phi_{elm}$) of the LED module of Reference Comparative Example 2. $A_{cg}$ ($\phi_{SSL}$) of the lighting fixture of Comparative Example 2 is 120.86, which is 35.29 lower than 156.15 of $A_{cg}$ ($\Phi_{elm}$) of the LED module of Reference Comparative Example 2. $SAT_{av}$ ($\phi_{SSL}$) of the lighting fixture of Comparative Example 2 is −2.44, which is 0.89 higher than −3.33 of $SAT_{av}$ ($\Phi_{elm}$) of the LED module of Reference Comparative Example 2.

As a result, even if a control element that can implement a good appearance of colors when combined with a specific light-emitting element, a good appearance of colors may be implemented when this control element is combined with a lighting fixture using a different semiconductor light-emitting element, packaged LED and LED module.

TABLE 17

| | Light-emitting element | Control element | CCT (K) | $D_{uv}$ | $|\Delta h_n|$ maximum value | $|\Delta h_n|$ minimum value | $\frac{\sum_{n=1}^{15} \Delta C_n}{15}$ | $\Delta C_{max}$ | $\Delta C_{min}$ | $|\Delta C_{max} - \Delta C_{min}|$ | $A_{cg}$ | Luminous efficacy of radiation (lm/W) | Ra |
|---|---|---|---|---|---|---|---|---|---|---|---|---|---|
| Reference Example 1 | Purple LED SBCA β-SiAlON CASON | NO | 3,292 | −0.02110 | 7.07059 | 0.58200 | 4.14 | 9.91 | −1.20 | 11.12 | −246.70 | 211 | 88 |
| Example 9 | Purple LED SBCA β-SiAlON CASON | YES | 3,164 | −0.02063 | 8.05371 | 0.01491 | 5.06 | 9.66 | −0.36 | 10.02 | −267.09 | 199 | 82 |
| Reference Comparative Example 1 | Four types of semiconductor light-emitting elements | NO | 4,095 | 0.00029 | 5.68812 | 0.09747 | 1.59 | 6.08 | −1.07 | 7.15 | −6.75 | 334 | 93 |
| Example 10 | Four types of semiconductor light- | YES | 4,421 | −0.00424 | 8.01986 | 0.23345 | 5.28 | 13.58 | −0.77 | 14.35 | −81.41 | 302 | 69 |

TABLE 17-continued

| | Light-emitting element | Control element | CCT (K) | $D_{uv}$ | $|\Delta h_n|$ maximum value | $|\Delta h_n|$ minimum value | $\dfrac{\sum_{n-1}^{15} \Delta C_n}{15}$ | $\Delta C_{max}$ | $\Delta C_{min}$ | $|\Delta C_{max} - \Delta C_{min}|$ | $A_{cg}$ | Luminous efficacy of radiation (lm/W) | Ra |
|---|---|---|---|---|---|---|---|---|---|---|---|---|---|
| Reference Comparative Example 2 | emitting elements Blue LED Green phosphor Red phosphor | NO | 2,880 | 0.00819 | 5.78057 | 0.29252 | −3.33 | −0.07 | −8.02 | 7.95 | 156.15 | 295 | 92 |
| Comparative Example 2 | Blue LED Green phosphor Red phosphor | YES | 2,808 | 0.00716 | 5.75545 | 0.16895 | −2.44 | 1.06 | −8.51 | 9.56 | 120.86 | 272 | 96 |

Example 11

First an optical filter having spectral transmission characteristics shown in FIG. 101 is prepared. Then a packaged LED having a blue LED, a CSO phosphor and a CASN phosphor is prepared as a light-emitting element, and eighteen of the packaged LEDs are mounted on an LED board, whereby an LED module is fabricated.

Figure 109:
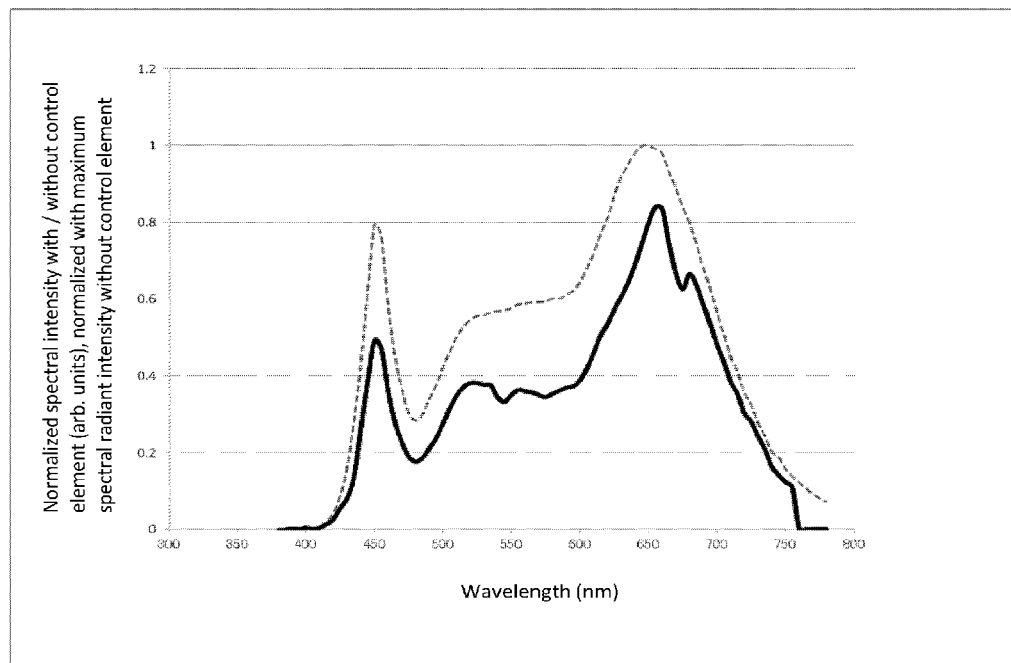
FIG. 109 is a graph showing the spectral power distributions in the Reference Example 2 and Example 11.
Figure 110:
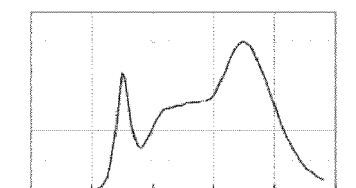
FIG. 110 are graphs showing the spectral power distributions of Reference Example 2 and Example 11, and the CIELAB plots plotting both the a* value and the b* value of the 15 color samples assuming the case of illuminating with these spectral power distributions, and with a calculational reference light (black-body radiator) having a CCT corresponding to these spectral power distributions respectively (the dotted line in the CIELAB plot indicates the result of the reference light, and the solid line indicates the result of the packaged LED)
Figure 110:
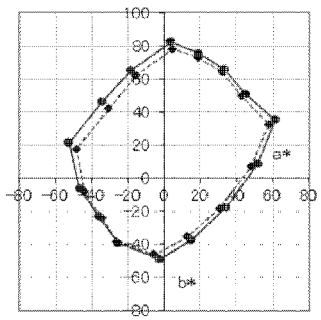
Figure 110:
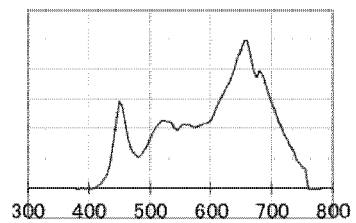
Figure 110:
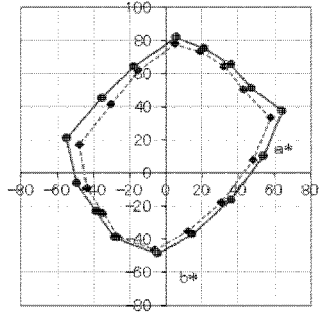

The dotted line in FIG. 109 indicates the spectral power distribution in this case, normalized by the maximum spectral radiant flux irradiated from the LED module onto the axis. FIG. 110 shows this spectral power distribution, and the CIELAB plot on which the a* values and the b* values are indicated: when the Munsell renotation color samples from #01 to #15 are mathematically assumed as illumination objects and are illuminated by this LED module; and when these illumination objects are illuminated by the reference light derived from the correlated color temperature of the LED module. Further, the photometric characteristics and the colormetric characteristics in this case are shown in Reference Example 2 in Table 18. Here the light emitted from the LED module of Reference Example 2 onto the axis implements a good appearance of colors, as each value clearly indicates.

Next, an LED lighting fixture of Example 11 is fabricated using the LED module. Here an optical filter having the spectral transmission characteristics shown in FIG. 101 is mounted in the light emitting direction. The solid line in FIG. 109 is a spectral power distribution of the LED lighting fixture of Example 11, normalized by the maximum spectral radiant flux of the light irradiated from the LED module onto the axis. In the spectral power distribution of the LED lighting fixture of Example 11, convex/concave portions are added because of the characteristics of the optical filter. FIG. 110 shows this spectral power distribution, and the CIELAB plot on which the a* values and the b* values are indicated: when 15 Munsell renotation color samples from #01 to #15 are mathematically assumed as illumination objects and are illuminated by the LED lighting fixture of Example 9; and when these objects are illuminated by the reference light derived from the correlated color temperature of the LED lighting fixture. Further, the photometric characteristics and the colormetric characteristics in this case are shown in Example 11 in Table 18.

$D_{uv}$ ($\phi_{SSL}$) of the lighting fixture of Example 11 is −0.01160, which is 0.00045 higher than −0.01115 of $D_{uv}$ ($\Phi_{elm}$) of the LED module of Reference Example 2. $A_{cg}$ ($\phi_{SSL}$) of the lighting fixture of Example 11 is −120.97, which is 96.67 lower than −24.30 of $A_{cg}$ ($\Phi_{elm}$) of the LED module of Reference Example 2. $SAT_{av}$ ($\phi_{SSL}$) of the lighting fixture of Example 9 is 4.13, which is 1.05 higher than 3.08 of $SAT_{av}$ ($\Phi_{elm}$) of the LED module of Reference Example 1, and a more clear and better appearance of colors is implemented when observed with a same luminance.

TABLE 18

| | Light-emitting element | Control element | CCT (K) | $D_{uv}$ | $|\Delta h_n|$ maximum value | $|\Delta h_n|$ minimum value | $\dfrac{\sum_{n-1}^{15} \Delta C_n}{15}$ | $\Delta C_{max}$ | $\Delta C_{min}$ | $|\Delta C_{max} - \Delta C_{min}|$ | $A_{cg}$ | Luminous efficacy of radiation (lm/W) | Ra |
|---|---|---|---|---|---|---|---|---|---|---|---|---|---|
| Reference Example 2 | Blue LED CSO CASN | NO | 3,606 | −0.01115 | 3.85010 | 0.16256 | 3.08 | 5.64 | 0.52 | 5.12 | −24.30 | 228 | 89 |
| Example 11 | Blue LED CSO CASN | YES | 3,470 | −0.01160 | 5.77707 | 0.07539 | 4.13 | 8.10 | 1.29 | 6.82 | −120.97 | 210 | 82 |
| Reference Comparative Example 3 | Blue LED LuAG CASN | NO | 3,661 | −0.00129 | 5.35826 | 0.03805 | 0.51 | 3.18 | −1.91 | 5.09 | 141.23 | 263 | 96 |
| Example 12 | Blue LED LuAG CASN | YES | 3,762 | −0.00593 | 6.67286 | 0.43365 | 3.45 | 8.67 | 0.46 | 8.20 | −19.95 | 234 | 81 |

Example 12

Figure 111:
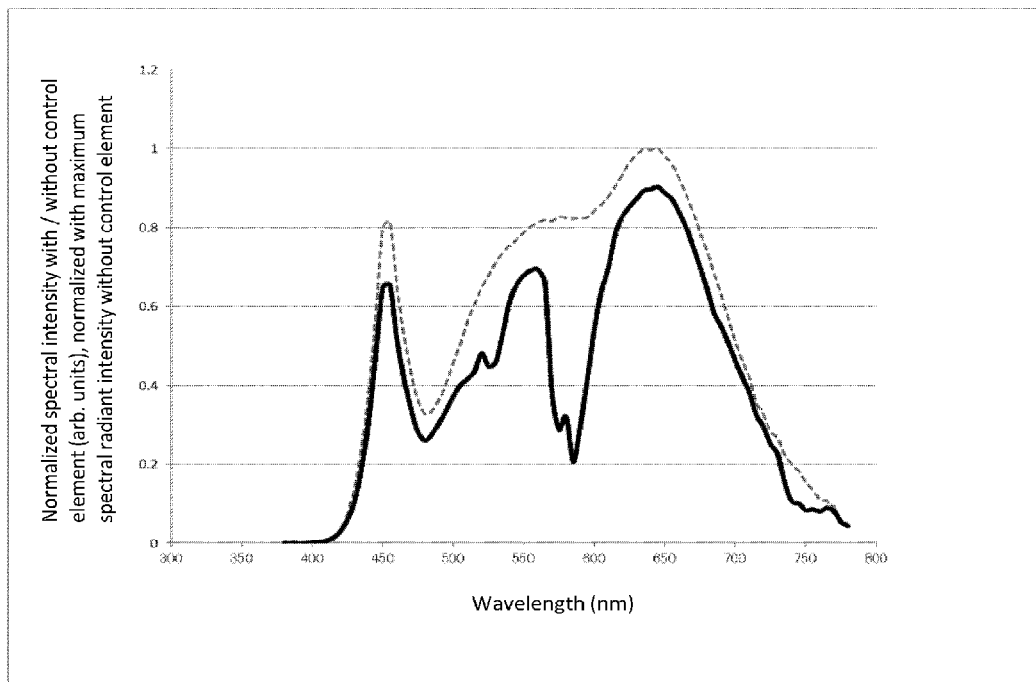
FIG. 111 is a graph showing the spectral power distributions in the Reference Comparative Example 3 and Example 12.
Figure 112:
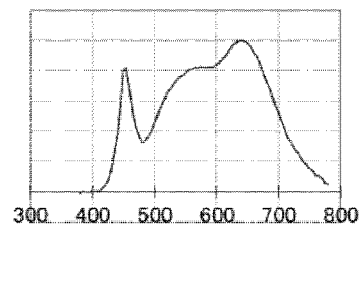
FIG. 112 are graphs showing the spectral power distributions of Reference Comparative Example 3 and Example 12, and the CIELAB plots plotting both the a* value and the b* value of the 15 color samples assuming the case of illuminating with these spectral power distributions, and with a calculational reference light (black-body radiator) having a CCT corresponding to these spectral power distributions respectively (the dotted line in the CIELAB plot indicates the result of the reference light, and the solid line indicates the result of the packaged LED)
Figure 112:
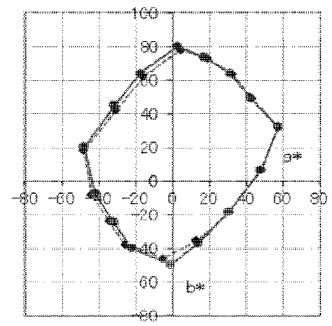
Figure 112:
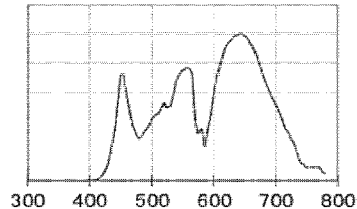
Figure 112:
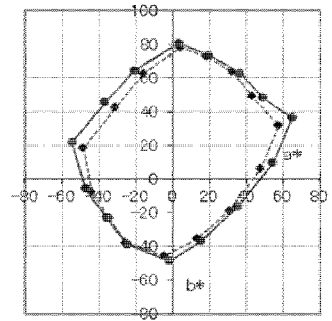

First an optical filter having spectral transmission characteristics shown in FIG. 104 is prepared. Then a packaged LED having a blue LED, an LuAG phosphor and a CASN phosphor is fabricated as a light-emitting element. Then eighteen of the packaged LEDs are mounted on an LED board, whereby an LED module is fabricated. The dotted line in FIG. 111 indicates the spectral power distribution in this case, normalized by the maximum spectral radiant flux irradiated from the LED module onto the axis. FIG. 112 shows this spectral power distribution, and the CIELAB plot on which the a* values and the b* values are indicated: when the 15 Munsell renotation color samples from #01 to #15 are mathematically assumed as illumination objects and are illuminated by this LED module; and when these illumination objects are illuminated by the reference light derived from the correlated color temperature of the LED module. Further, the photometric characteristics and the colormetric characteristics in this case are shown in Reference Comparative Example 3 in Table 18. Here the light emitted from the LED module of Reference Comparative Example 3 onto the axis does not implement a good appearance of colors, as each value clearly indicates.

Next, an LED lighting fixture of Example 12 is fabricated using the LED module. Here an optical filter shown in FIG. 104 is mounted in the light emitting direction. The solid line in FIG. 111 is a spectral power distribution of the LED lighting fixture according to Example 12, normalized by the maximum spectral radiant flux of the light irradiated from the LED module onto the axis. In the spectral power distribution of the LED lighting fixture of Example 12, the relative intensity of the radiant flux changes due to the emission of the LED, and concave/convex portions are added because of the characteristics of the optical filter. FIG. 112 shows this spectral power distribution, and the CIELAB plot on which the a* values and the b* values are indicated: when 15 Munsell renotation color samples from #01 to #15 are mathematically assumed as illumination objects and are illuminated by the LED lighting fixture of Example 10; and when these objects are illuminated by the reference light derived from the correlated color temperature of the LED lighting fixture. Further, the photometric characteristics and the colormetric characteristics in this case are shown in Example 12 in Table 18.

$D_{uv}$ ($\phi_{SSL}$) of the lighting fixture of Example 12 is −0.00593, which is 0.00464 lower than −0.00129 of $D_{uv}$ ($\Phi_{elm}$) of the LED module of Reference Comparative Example 3. $A_{cg}$ ($\phi_{SSL}$) of the lighting fixture of Example 12 is −19.95, which is 161.18 lower than 141.23 of $A_{cg}$ ($\Phi_{elm}$) of the LED module of Reference Comparative Example 3. $SAT_{av}$ ($\phi_{SSL}$) of this lighting fixture is 3.45, which is 2.94 higher than 0.51 of $SAT_{av}$ ($\Phi_{elm}$) of the LED module of Reference Comparative Example 3.

As a result, even if a lighting fixture uses a semiconductor light-emitting element, a packaged LED and an LED module which cannot implement a good appearance of colors, an LED lighting fixture that can implement a good appearance of colors can be fabricated by the optical characteristics of the control element.

(Discussion)

The following invention issues can be derived from the above mentioned experiment results.

As a result of Reference Comparative Example 1 and Example 10, or the result of Reference Comparative Example 3 and Example 12 show, the light-emitting devices of Example 10 and Example 12, which can implement a good appearance of colors, can be implemented respectively by disposing an appropriate control element in the light-emitting device of Reference Comparative Example 1 and Reference Comparative Example 3 (regarded as a light-emitting element in the second embodiment of the first invention of the present invention), which cannot implement a good appearance of colors.

In other words, in a light-emitting device having a light-emitting element, which includes a semiconductor light-emitting element, and a control element, when λ(nm) is a wavelength, $\Phi_{elm}(\lambda)$ is a spectral power distribution of a light which is emitted from the light-emitting element in a main radiant direction, $\phi_{SSL}(\lambda)$ is a spectral power distribution of a light which is emitted from the light-emitting element in the main radiant direction, and $\Phi_{elm}(\lambda)$ does not satisfy at least one of the following Condition 1 and Condition 2, and $\phi_{SSL}(\lambda)$ satisfies both the following Condition 1 and Condition 2, the light-emitting device (light-emitting element) which does not implement a good appearance of colors becomes a light-emitting device which can implement a good appearance of colors by the control element.

Particularly, if a specific control element is disposed in an LED lighting fixture which is already on the market and has not yet implemented a good appearance of colors, this LED lighting device can become a light-emitting device which can implement a good appearance of colors according to this embodiment.

Condition 1 and Condition 2 according to this embodiment are conditions derived from the above mentioned first step to fourth step.

Condition 1:

a light, of which distance $D_{uv}$ from a black-body radiation locus as defined by ANSI C78.377 in a spectral power distribution of the target light satisfies −0.0350≤$D_{uv}$−0.0040, is included;

Condition 2:

if a spectral power distribution of the target light is denoted by $\phi(\lambda)$, a spectral power distribution of a reference light that is selected according to T (K) of the target light is denoted by $\phi_{ref}(\lambda)$, tristimulus values of the target light are denoted by (X, Y, Z), and tristimulus values of the reference light that is selected according to T (K) of the light emitted from the light-emitting device in the radiant direction are denoted by ($X_{ref}$, $Y_{ref}$, $Z_{ref}$), and if a normalized spectral power distribution S (λ) of target light, a normalized spectral power distribution $S_{ref}(\lambda)$ of a reference light, and a difference ΔS (λ) between these normalized spectral power distributions are respectively defined as $S(\lambda) = \phi(\lambda)/Y$ $S_{ref}(\lambda) = \phi_{ref}(\lambda)/Y_{ref}$ $\Delta S(\lambda) = S_{ref}(\lambda) - S(\lambda)$, and when a wavelength that produces a longest wavelength local maximum value of S (λ) in a wavelength range from 380 nm to 780 nm is denoted by $\lambda_R$ (nm), an index $A_{cg}$ represented by the following Formula (1) satisfies −360≤$A_{cg}$≤−10, in the case when the wavelength Λ4 that is S($\lambda_R$)/2 exists in the longer wavelength-side of $\lambda_R$, and an index $A_{cg}$ represented by the following Formula (2) satisfies 360≤$A_{cg}$≤−10, in the case when the wavelength Λ4 that is S($\lambda_R$)/2 does not exist in the longer wavelength-side of $\lambda_R$,

[Expression 48]

$$A_{cg} = \int_{380}^{495} \Delta S(\lambda) d\lambda + \int_{495}^{590} (-\Delta S(\lambda)) d\lambda + \int_{590}^{\Lambda 4} \Delta S(\lambda) d\lambda \quad (1)$$

[Expression 49]

$$A_{cg} = \int_{380}^{495} \Delta S(\lambda) d\lambda + \int_{495}^{590} (-\Delta S(\lambda)) d\lambda + \int_{590}^{780} \Delta S(\lambda) d\lambda \quad (2)$$

It is preferable that $\Phi_{elm}(\lambda)$ does not satisfy at least one of the following Condition 3 and Condition 4, and $\phi_{SSL}(\lambda)$ satisfies both Condition 3 and Condition 4. Condition 3 and Condition 4 are also the conditions derived from the above mentioned first step to fourth step.

Condition 3:

if an a* value and a b* value in CIE 1976 L*a*b* color space of 15 Munsell renotation color samples from #01 to #15 listed below when mathematically assuming illumination by the target light are respectively denoted by $a^*_n$ and $b^*_n$ (where n is a natural number from 1 to 15), and if an a* value and a b* value in CIE 1976 L*a*b* color space of the 15 Munsell renotation color samples when mathematically assuming illumination by a reference light that is selected according to a correlated color temperature T (K) of the light emitted in the radiant direction are respectively denoted by $a^*_{nref}$ and $b^*_{nref}$ (where n is a natural number from 1 to 15), then each saturation difference $\Delta C_n$ satisfies $-3.8 \leq \Delta C_n \leq 18.6$ (where n is a natural number from 1 to 15), and an average $SAT_{av}$ of saturation difference represented by the formula (3) satisfies formula (4) below and $$1.0 \leq SAT_{av} \leq 7.0 \quad (4)$$

if a maximum saturation difference value is denoted by $\Delta C_{max}$ and a minimum saturation difference value is denoted by $\Delta C_{min}$, then a difference $|\Delta C_{max} - \Delta C_{min}|$ between the maximum saturation difference value and the minimum saturation difference value satisfies $2.8 \leq |\Delta C_{max} - \Delta C_{min}| \leq 19.6$, where $\Delta C_n = \sqrt{(a^*_n)^2 + (b^*_n)^2} - \sqrt{(a^*_{nref})^2 + (b^*_{nref})^2}$ with the 15 Munsell renotation color samples being:

| | |
|---|---|
| #01 | 7.5P 4/10 |
| #02 | 10PB 4/10 |
| #03 | 5PB 4/12 |
| #04 | 7.5B 5/10 |
| #05 | 10BG 6/8 |
| #06 | 2.5BG 6/10 |
| #07 | 2.5G 6/12 |
| #08 | 7.5GY 7/10 |
| #09 | 2.5GY 8/10 |
| #10 | 5Y 8.5/12 |
| #11 | 10YR 7/12 |
| #12 | 5YR 7/12 |
| #13 | 10R 6/12 |
| #14 | 5R 4/14 |
| #15 | 7.5RP 4/12 |

Condition 4:

if hue angles in CIE 1976 L*a*b* color space of the 15 Munsell renotation color samples when mathematically assuming illumination by the target light are denoted by $\theta_n$ (degrees) (where n is a natural number from 1 to 15), and if hue angles in a CIE 1976 L*a*b* color space of the 15 Munsell renotation color samples when mathematically assuming illumination by a reference light that is selected according to the correlated color temperature T (K) of the light emitted in the radiant direction are denoted by $\theta_{nref}$ (degrees) (where n is a natural number from 1 to 15), then an absolute value of each difference in hue angles $|\Delta h_n|$ satisfies $0 \leq |\Delta h_n| \leq 9.0$ (degree) (where n is a natural number from 1 to 15), where $\Delta h_n = \theta_n - \theta_{nref}$.

According to the examination of the results of Reference Example 1 and Example 9 and the results of Reference Example 2 and Example 11, the light-emitting devices according to Example 9 and Example 11, which can implement an even better appearance of colors, can be implemented respectively by disposing an appropriate control element in the light-emitting device (regarded as a light-emitting element) according to Reference Example 1 and Reference Example 2, which can implement a good appearance of colors.

In other words, in a light-emitting device having a light-emitting element, which includes a semiconductor light-emitting element, and a control element, if $\lambda$(nm) is a wavelength, $\Phi_{elm}(\lambda)$ is the spectral power distribution of light emitted from this light-emitting element in the main radiant direction, $\phi_{SSL}(\lambda)$ is the spectral power distribution of light emitted from the light-emitting device in the main radiant direction, $\Phi_{elm}(\lambda)$ satisfies both the above mentioned Condition 1 and Condition 2, and $\phi_{SSL}(\lambda)$ satisfies both the above mentioned Condition 1 and Condition 2, the light-emitting device (light-emitting element), which can implemented a good appearance of colors, becomes a light-emitting device which can implement an even better appearance of colors by the control unit.

Particularly, even in a semiconductor light-emitting device in which appearance of colors is excellent when used for an illumination purpose, the appearance of colors can be further adjusted according to the taste of the user.

It is preferable that $\Phi_{elm}(\lambda)$ satisfies both Condition 3 and Condition 4, and $\phi_{SSL}(\lambda)$ satisfies both Condition 3 and Condition 4.

On the other hand, the method for manufacturing the light-emitting device according to the second embodiment of the fifth invention of the present invention can be derived from the above mentioned experiment results.

In other words, this is a method for manufacturing a light-emitting device having: a light-emitting element which includes a semiconductor light-emitting element; and a control element, the manufacturing method comprising: a step of preparing a first light-emitting device having the light-emitting element; and a step of manufacturing a second light-emitting device by disposing the control element so that at least a part of the light emitted from the first light-emitting device in the main radiant direction transmits through, and when $\lambda$(nm) is a wavelength, $\Phi_{elm}(\lambda)$ is a spectral power distribution of a light emitted from the first light-emitting device in the main radiant direction, and $\phi_{SSL}(\lambda)$ is a spectral power distribution of a light emitted from the second light-emitting device in the main radiant direction, $\Phi_{elm}(\lambda)$ does not satisfy at least one of the above mentioned Condition 1 and Condition 2, and $\phi_{SSL}(\lambda)$ satisfies both the above mentioned Condition 1 and Condition 2.

Particularly, manufacturing the light-emitting device that can implement a good appearance of colors according to this embodiment, by executing a step of disposing a specific control element in an LED lighting device which is already on the market and does not implement a good appearance of colors, is within the technical scope of the second embodiment of the first, second, fourth and fifth inventions of the present invention.

The above mentioned manufacturing method is also a method for manufacturing a light-emitting device having: a light-emitting element which includes a semiconductor light-emitting element; and a control element, the manufacturing method comprising: a step of preparing a first light-emitting device having a light-emitting element; and a step of manufacturing a second light-emitting device by disposing the control element so that at least a part of the light emitted from the first light-emitting device in the main radiant direction transmits through, and when λ(nm) is a wavelength, $\Phi_{elm}(\lambda)$ is a spectral power distribution of a light emitted from the first light-emitting device in the main radiant direction, and $\phi_{SSL}(\lambda)$ is a spectral power distribution of a light emitted from the second light-emitting device in the main radiant direction, $\Phi_{elm}(\lambda)$ satisfies both the above mentioned Condition 1 and Condition 2, and $\phi_{SSL}(\lambda)$ satisfies both the above mentioned Condition 1 and Condition 2.

Further, the method for designing the light-emitting device according to the second embodiment of the second invention of the present invention can be derived from the above mentioned experiment results in the same manner.

In other words, this is a method for designing a light-emitting device having: a light-emitting element which includes a semiconductor light-emitting element; and a control element, and when λ(nm) is a wavelength, $\Phi_{elm}(\lambda)$ is a spectral power distribution of a light emitted from the first light-emitting element in the main radiant direction, and $\phi_{SSL}(\lambda)$ is a spectral power distribution of a light emitted from the light-emitting device in the main radiant direction, it is designed that $\Phi_{elm}(\lambda)$ does not satisfy at least one of the above mentioned Condition 1 and Condition 2, and $\phi_{SSL}(\lambda)$ satisfies both the above mentioned Condition 1 and Condition 2.

The above mentioned design method is also a method for designing a light-emitting device: having a light-emitting element which includes a semiconductor light-emitting element; and a control element, and when λ(nm) is a wavelength, $\Phi_{elm}(\lambda)$ is a spectral power distribution of a light emitted from the first light-emitting element in the main radiant direction, and $\phi_{SSL}(\lambda)$ is a spectral power distribution of a light emitted from the light-emitting device in the main radiant direction, it is designed that $\Phi_{elm}(\lambda)$ satisfies both the above mentioned Condition 1 and Condition 2, and $\phi_{SSL}(\lambda)$ also satisfies both the above mentioned Condition 1 and Condition 2.

Further, the illumination method according to the second embodiment of the fourth invention of the present invention can be derived from the above mentioned experiment results in the same manner.

In other words, the illumination method is an illumination method comprising:

illuminated objects preparation step of preparing illuminated objects; and an illumination step of illuminating the objects by light emitted from a light-emitting devices which includes a semiconductor light-emitting element as a light-emitting element and a control element, in the illumination step, when light emitted from the light-emitting element illuminate the objects, the objects are illuminated so that the light measured at a position of the objects does not satisfy at least any one of <1>, <2> and <3> below, and when light emitted from the light-emitting device illuminate the objects, the objects are illuminated so that the light measured at a position of the objects satisfies all <1>, <2> and <3> below:

The following <1>, <2> and <3> are conditions derived from the above mentioned first step to fourth step.

<1> a distance $D_{uvSSL}$ from a black-body radiation locus as defined by ANSI C78.377 of the target light measured at the position of the objects satisfies $-0.0350 \leq D_{uv} \leq -0.0040$;

<2> if an a* value and a b* value in CIE 1976 L*a*b* color space of 15 Munsell renotation color samples from #01 to #15 listed below when mathematically assuming illumination by the target light measured at the position of the objects are respectively denoted by $a^*_n$ and $b^*_n$ (where n is a natural number from 1 to 15), and if an a* value and a b* value in CIE 1976 L*a*b* color space of the 15 Munsell renotation color samples when mathematically assuming illumination by a reference light that is selected according to a correlated color temperature T (K) of the target light measured at the position of the objects are respectively denoted by $a^*_{nref}$ and $b^*_{nref}$ (where n is a natural number from 1 to 15), then each saturation difference $\Delta C_n$ satisfies $-3.8 \leq \Delta C_n \leq 18.6$ (where n is a natural number from 1 to 15), and an average $SAT_{av}$ of saturation difference represented by the formula (3) satisfies formula (4) below and $$1.0 \leq SAT_{av} \leq 7.0 \quad (4)$$

if a maximum saturation difference value is denoted by $\Delta C_{max}$ and a minimum saturation difference value is denoted by $\Delta C_{min}$, then a difference $\Delta C_{max} - \Delta C_{min}$ between the maximum saturation difference value and the minimum saturation difference value satisfies $2.8 \Delta |\Delta C_{max} - \Delta C_{min}| \leq 19.6$, where $\Delta C_n = \sqrt{\{(a^*_n)^2 + (b^*_n)^2\}} - \sqrt{\{(a^*_{nref})^2 + (b^*_{nref})^2\}}$ with the 15 Munsell renotation color samples being:

| | |
|---|---|
| #01 | 7.5P 4/10 |
| #02 | 10PB 4/10 |
| #03 | 5PB 4/12 |
| #04 | 7.5B 5/10 |
| #05 | 10BG 6/8 |
| #06 | 2.5BG 6/10 |
| #07 | 2.5G 6/12 |
| #08 | 7.5GY 7/10 |
| #09 | 2.5GY 8/10 |
| #10 | 5Y 8.5/12 |
| #11 | 10YR 7/12 |
| #12 | 5YR 7/12 |
| #13 | 10R 6/12 |
| #14 | 5R 4/14 |
| #15 | 7.5RP 4/12 |

<3> if hue angles in CIE 1976 L*a*b* color space of the 15 Munsell renotation color samples when mathematically assuming illumination by the target light measured at the position of the objects are denoted by $\theta_n$ (degrees) (where n is a natural number from 1 to 15), and if hue angles in CIE 1976 L*a*b* color space of the 15 Munsell renotation color samples when mathematically assuming illumination by a reference light that is selected according to the correlated color temperature T (K) of the target light measured at the position of the objects are denoted by $\theta_{nref}$ (degrees) (where n is a natural number from 1 to 15), then an absolute value of each difference in hue angles $|\Delta h_n|$ satisfies $0 \leq |\Delta h_n| \leq 9.0$ (degree) (where n is a natural number from 1 to 15), here $\Delta h_n = \theta_n - \theta_{nref}$.

It is preferable that the light emitted from the light emitting apparatus satisfies <4>. <4> is also a condition derived from the above mentioned first step to fourth step.

<4> if a spectral power distribution of the target light measured at the position of the objects is denoted by $\phi(\lambda)$, a spectral power distribution of a reference light that is selected according to T (K) of the target light measured at the position of the objects is denoted by $\phi_{ref}(\lambda)$, tristimulus values of the the target light measured at the position of the objects are denoted by (X, Y, Z), and tristimulus values of the reference light that is selected according to T (K) of the target light measured at the position of the objects are denoted by $(X_{ref}, Y_{ref}, Z_{ref})$, and if a normalized spectral power distribution S (λ) of target light measured at the position of the objects, a normalized spectral power distribution $S_{ref}(\lambda)$ of a reference light that is selected according to T (K) of the target light measured at the position of the objects, and a difference ΔS (λ) between these normalized spectral power distributions are respectively defined as $$S(\lambda)=\phi(\lambda)/Y,$$

$$S_{ref}(\lambda)=\phi_{ref}(\lambda)/Y_{ref}$$

and $$\Delta S(\lambda)=S_{ref}(\lambda)-S(\lambda) \text{ and}$$

when a wavelength that produces a longest wavelength local maximum value of S(λ) in a wavelength range from 380 nm to 780 nm is denoted by $\lambda_R$ (nm), an index $A_{cg}$ represented by the following Formula (1) satisfies $-360 \leq A_{cg} \leq -10$, in the case when the wavelength Λ4 that is $S(\lambda_R)/2$ exists in the longer wavelength-side of $\lambda_R$, and an index $A_{cg}$ represented by the following Formula (2) satisfies $360 \leq A_{cg} \leq -10$, in the case when the wavelength Λ4 that is $S(\lambda_R)/2$ does not exist in the longer wavelength-side of $\lambda_R$,

[Expression 50]

$$A_{cg}=\int_{380}^{495}\Delta S(\lambda)d\lambda+\int_{495}^{590}(-\Delta S(\lambda))d\lambda+\int_{590}^{\Lambda 4}\Delta S(\lambda)d\lambda \quad (1)$$

[Expression 51]

$$A_{cg}=\int_{380}^{495}\Delta S(\lambda)d\lambda+\int_{495}^{590}(-\Delta S(\lambda))d\lambda+\int_{590}^{780}\Delta S(\lambda)d\lambda \quad (2).$$

In addition, the illumination method is an illumination method comprising: illuminated objects preparation step of preparing illuminated objects; and an illumination step of illuminating the objects by light emitted from a light-emitting devices which includes a semiconductor light-emitting element as a light-emitting element and a control element, in the illumination step, when light emitted from the light-emitting element illuminate the objects, the objects are illuminated so that the light measured at a position of the objects satisfies all <1>, <2> and <3> above, and when light emitted from the light-emitting device illuminate the objects, the objects are illuminated so that the light measured at a position of the objects also satisfies all <1>, <2> and <3> above. It is preferable that the light emitted from the light-emitting device satisfies <4> during illumination.

While a favorable embodiment for implementing the light-emitting device and the illumination method that implement a natural, vivid, highly visible and comfortable appearance of colors and appearance of objects as if the objects are seen outdoors according to the first embodiment of the first and fourth inventions of the present invention will be described below, it is to be understood that modes for implementing the light-emitting device and the illumination method according to the first embodiment of the first and fourth inventions of the present invention are not limited to those used in the following description.

While a favorable embodiment for implementing the light-emitting device, the method for manufacturing the light-emitting device, the method for designing the light-emitting device and the illumination method according to the second embodiment of the first, fifth, second and fourth inventions of the present invention will be described below, it is to be understood that modes for implementing the light-emitting device, the method for manufacturing the light-emitting device, the method for designing the light-emitting device and the illumination method according to the second embodiment of the first, fifth, second and fourth inventions of the present invention are not limited to those used in the following description.

In the illumination method according to the first embodiment of the fourth invention of the present invention, no restrictions are placed on configurations, materials, and the like of the light-emitting device as long as a photometric property of test light which is irradiated on an illuminated object and which becomes a color stimulus is in an appropriate range and, at the same time, a difference between color appearances of the 15 color samples when illumination by calculational reference light is assumed and color appearances of the 15 color samples when illumination by an actually measured test light spectral power distribution is assumed is in an appropriate range.

With the light-emitting device according to the first embodiment of the first invention of the present invention, no restrictions are placed on configurations, materials, and the like of the light-emitting device as long as a radiometric property and a photometric property of test light which is irradiated from the light-emitting device in a main radiant direction and which becomes a color stimulus with respect to an illuminated object are in appropriate ranges.

With the light-emitting device, the method for manufacturing the light-emitting device and the method for designing the light-emitting device according to the second embodiment of the first, fifth and second inventions of the present invention, no restrictions are placed on configurations, materials, and the like of the light-emitting device as long as a radiometric property and a photometric property of test light which is irradiated from the light-emitting device in a main radiant direction and which becomes a color stimulus with respect to an illuminated object are in appropriate ranges.

A light-emitting device for implementing the illumination method or the light-emitting device according to the first embodiment of the fourth or the first invention of the present invention such as an illumination light source, alighting fixture including the illumination light source, or a lighting system including the illumination light source or the lighting fixture includes at least one semiconductor light-emitting element that is a light-emitting element. For example, the illumination light source including the semiconductor light-emitting element may be configured such that a plurality of semiconductor light-emitting elements of different types such as blue, green, and red is incorporated in one illumination light source or may be configured such that a blue semiconductor light-emitting element is included in one illumination light source, a green semiconductor light-emitting element is included in another illumination light source, and a red semiconductor light-emitting element is included in yet another illumination light source, whereby the semiconductor light-emitting elements are integrated with a lens, a reflecting mirror, a drive circuit, and the like in a light fixture and provided to a lighting system. Furthermore, in a case where one illumination light source is included in one lighting fixture and an individual semiconductor light-emitting element is incorporated in the illumination light source, even if the illumination method or the light-emitting device according to the first embodiment of the fourth or the first invention of the present invention cannot be implemented as an individual illumination light source or an individual lighting fixture, a lighting system may be configured such that light radiated as the lighting system satisfies desired characteristics at a position of an illuminated object due to additive color mixing with light from a different lighting fixture that exists in the lighting system or the lighting system may be configured such that light in a main radiant direction among light radiated as the lighting system satisfies desired characteristics. In any mode, light as a color stimulus which is ultimately irradiated on an illuminated object or light in a main radiant direction among light emitted from the light-emitting device need only satisfy appropriate conditions according to the first embodiment of the first to fifth inventions of the present invention.

A light-emitting device for implementing the light-emitting device, the method for manufacturing the light-emitting device, the method for designing the light-emitting device or the illumination method according to the second embodiment of the first, fifth, second or fourth invention of the present invention such as an illumination light source, a lighting fixture including the illumination light source, or a lighting system including the illumination light source or the lighting fixture includes at least a light-emitting element and at least a control element. The light-emitting element preferably includes semiconductor light-emitting element. For example, the illumination light source including the semiconductor light-emitting element may be configured such that a plurality of semiconductor light-emitting elements of different types such as blue, green, and red is incorporated in one illumination light source or may be configured such that a blue semiconductor light-emitting element is included in one illumination light source, a green semiconductor light-emitting element is included in another illumination light source, and a red semiconductor light-emitting element is included in yet another illumination light source, whereby the semiconductor light-emitting elements are integrated with a filter, a lens, a reflecting mirror, a drive circuit, and the like in a light fixture and provided to a lighting system. Furthermore, in a case where one illumination light source is included in one lighting fixture and an individual semiconductor light-emitting element is incorporated in the illumination light source, even if the illumination method or the light-emitting device according to the second embodiment of the fourth or the first invention of the present invention cannot be implemented as an individual illumination light source or an individual lighting fixture, a lighting system may be configured such that light radiated as the lighting system satisfies desired characteristics at a position of an illuminated object due to additive color mixing with light from a different lighting fixture that exists in the lighting system or the lighting system may be configured such that light in a main radiant direction among light radiated as the lighting system satisfies desired characteristics. In any mode, light in a main radiant direction among light emitted from the light-emitting device or light as a color stimulus which is ultimately irradiated on an illuminated object need only satisfy appropriate conditions according to the second embodiment of the first, second, fourth and fifth inventions of the present invention.

Hereinafter, characteristics will be described which are favorably attained by the light-emitting device according to the first embodiment of the first to fourth inventions of the present invention that can achieve a color appearance or an object appearance that is as natural, vivid, highly visible, and comfortable as perceived outdoors on the basis of satisfying the appropriate conditions described above.

Moreover, characteristics will be described which are favorably attained by the light-emitting device according to the second embodiment of the first invention of the present invention, a light-emitting device for implementing the method for manufacturing the light-emitting device according to the second embodiment of the fifth invention of the present invention, the method for designing the light-emitting device according to the second embodiment of the second invention of the present invention and the illumination method according to the second embodiment of the fourth invention of the present invention on the basis of satisfying the appropriate conditions described above.

The light-emitting device according to the first embodiment of the first invention of the present invention, a light-emitting device for implementing the light-emitting device according to the second embodiment of the first invention of the present invention, the method for manufacturing the light-emitting device according to the second embodiment of the fifth invention of the present invention, the method for designing the light-emitting device according to the second embodiment of the second invention of the present invention or the illumination method according to the second embodiment of the fourth invention of the present invention favorably includes a light-emitting element (light-emitting material) which has a peak within a short wavelength range from $\Lambda 1$ (380 nm) to $\Lambda 2$ (495 nm), another light-emitting element (light-emitting material) which has a peak within an intermediate wavelength range from $\Lambda 2$ (495 nm) to $\Lambda 3$ (590 nm), and yet another light-emitting element (light-emitting material) which has a peak within a long wavelength range from $\Lambda 3$ (590 nm) to 780 nm. This is because favorable color appearance can be readily achieved if intensity of each of the light-emitting elements can be individually set or controlled.

Therefore, the light-emitting device according to the first embodiment of the first invention of the present invention, the light-emitting device according to the second embodiment of the first invention of the present invention, a light-emitting device for implementing the method for manufacturing the light-emitting device according to the second embodiment of the fifth invention of the present invention, the method for designing the light-emitting device according to the second embodiment of the second invention of the present invention or the illumination method according to the second embodiment of the fourth invention of the present invention favorably includes at least one each of light-emitting elements (light-emitting materials) which have emission peaks in the three respective wavelength ranges described above, more favorably includes one light-emitting element (light-emitting material) in each of two wavelength ranges among the three wavelength ranges and a plurality of light-emitting elements (light-emitting materials) in the one remaining wavelength range, extremely favorably includes one light-emitting element (light-emitting material) in one wavelength range among the three wavelength ranges and a plurality of light-emitting elements (light-emitting materials) in each of the two remaining wavelength ranges, and dramatically favorably includes a plurality of light-emitting elements (light-emitting materials) in all three wavelength ranges. This is because by incorporating light-emitting elements such that two or more peak wavelengths exist in one range, controllability of a spectral power distribution dramatically increases and, mathematically, a color appearance of an illuminated object can be more easily controlled as desired.

Therefore, in an actual light-emitting device that uses a semiconductor light-emitting element as a phosphor excitation light source, favorably, there are two types of phosphors in one light-emitting device and there are peak wavelengths in each of the three wavelength ranges including the wavelength of the semiconductor light-emitting element. In addition, it is even more favorable to have three types of phosphors and have two light-emitting elements incorporated in at least one range among the three wavelength regions including the wavelength of the semiconductor light-emitting element. From this perspective, it is extremely favorable to have four or more types of phosphors and dramatically favorable to have five types of phosphors. In particular, if there are six or more types of phosphors in one light source, spectrum controllability inversely declines due to mutual absorption among the phosphors and therefore becomes unfavorable. Furthermore, from a different perspective of realizing a simple light-emitting device, only one type of phosphor may be used and a light-emitting device may be configured with a total of two types of light-emitting elements including an emission peak of the semiconductor light-emitting element.

This also applies to a case where an actual light-emitting device is configured using only semiconductor light-emitting elements with different peak wavelengths. In other words, from the perspective of realizing a favorable spectral power distribution, the number of different types of semiconductor light-emitting elements in one light source is favorably three or more, more favorably four or more, extremely favorably five or more, and dramatically favorably six or more. Having seven or more different types creates a hassle when mounting on a light source or the like and therefore becomes unfavorable. Furthermore, from a different perspective of realizing a simple light-emitting device, a light-emitting device may be configured with two types of semiconductor light-emitting elements.

Moreover, semiconductor light-emitting elements and phosphors can be mixed and mounted at will. For example, a blue light-emitting element and two types of phosphors (green and red) may be mounted in one light source, or a blue light-emitting element and three types of phosphors (green, red 1, and red 2) may be mounted in one light source. Furthermore, a purple light-emitting element and four types of phosphors (blue, green, red 1, and red 2) may be mounted in one light source. Moreover, one light source may incorporate a portion mounted with a blue light-emitting element and two types of phosphors (green and red) and a portion mounted with a purple light-emitting element and three types of phosphors (blue, green, and red).

From the perspective of controlling intensity of peak portions or intensity of valleys between peaks or, in other words, the perspective of forming an appropriate concave and/or convex shape in a spectral power distribution, light-emitting elements (light-emitting materials) in each of the three wavelength ranges favorably include at least one light-emitting element with a relatively narrow band. Conversely, it is difficult to form an appropriate concave and/or convex shape in a spectral power distribution using only light-emitting elements with widths comparable to widths of the three respective wavelength ranges. Therefore, in the light-emitting device according to the first embodiment of the first invention of the present invention, the light-emitting device according to the second embodiment of the first invention of the present invention, a light-emitting device for implementing the method for manufacturing the light-emitting device according to the second embodiment of the fifth invention of the present invention, the method for designing the light-emitting device according to the second embodiment of the second invention of the present invention or the illumination method according to the second embodiment of the fourth invention of the present invention, it is favorable to include at least one relatively narrow band light-emitting element. However, more favorably, two ranges among the three respective wavelength ranges include a relatively narrow band light-emitting element and, even more favorably, all of the three respective wavelength ranges include a relatively narrow band light-emitting element. In this case, while a relatively narrow band light-emitting element may itself individually constitute a light-emitting element in a given wavelength region, more favorably, a plurality of types of relatively narrow band light-emitting elements exist in the wavelength region and, equally more favorably, a relatively narrow band light-emitting element and a relatively broad band light-emitting element coexist in the wavelength region.

Moreover, a "relatively narrow band" as used herein refers to a full-width at half-maximum of a light-emitting element (light-emitting material) being equal to or less than ⅔ of 115 nm, 95 nm, and 190 nm which are respective range widths of the short wavelength range (380 nm to 495 nm), the intermediate wavelength range (495 nm to 590 nm), and the long wavelength range (590 nm to 780 nm). In addition, among a relatively narrow band light-emitting element, a full-width at half-maximum of the light-emitting element with respect to the respective range widths is favorably ½ or less, more favorably ⅓ or less, extremely favorably ¼ or less, and dramatically favorably ⅕ or less. Furthermore, since a narrow band spectrum that is excessively narrow may result in a case where desired characteristics cannot be realized unless a large number of different types of light-emitting elements are mounted in a light-emitting device, the full-width at half-maximum is favorably 2 nm or more, more favorably 4 nm or more, extremely favorably 6 nm or more, and dramatically favorably 8 nm or more.

From the perspective of realizing a desired spectral power distribution, combining relatively narrow band light-emitting elements (light-emitting materials) is favorable since a concave and/or a convex shape can be more easily formed in the spectral power distribution and the index $A_{cg}$, the luminous efficacy of radiation K (lm/W), and the like whose appropriate ranges have become apparent through the visual experiments can be more easily set to desired values. In addition, it is favorable to treat light as a color stimulus and incorporate a relatively narrow band light-emitting element among the light-emitting elements since a difference between color appearances of the 15 color samples when illumination by the light-emitting device is assumed and color appearances when illumination by calculational reference light is assumed can be more conveniently used to perform saturation control and, in particular, to set $|\Delta h_n|$, $SAT_{av}$, $\Delta C_n$, $|\Delta C_{max} - \Delta C_{min}|$, and the like whose appropriate ranges have become apparent through the visual experiments within appropriate numerical value ranges. Furthermore, it is favorable to use a relatively narrow band phosphor since $D_{uv}$ control can be performed more easily than when using a broad band phosphor.

In the light-emitting device according to the first embodiment of the first invention of the present invention, the following light-emitting materials, phosphor materials, and semiconductor light-emitting elements are favorably incorporated in the light-emitting device as light-emitting elements.

In the light-emitting device, the method for manufacturing the light-emitting device, the method for designing the light-emitting device, and the illumination method according to the second embodiment of the first, fifth, second and fourth inventions of the present invention, a part of the broad band spectral power distribution emitted from the emitting element is absorbed, reflected or collected by the control element, whereby a spectral power distribution of which band is narrower than the light-emitting element can be implemented, which is preferable.

In the light-emitting device, the method for manufacturing the light-emitting device, the method for designing the light-emitting device and the illumination method according to the second embodiment of the first, fifth, second and forth inventions of the present invention, the following light-emitting materials, phosphor materials, and semiconductor light-emitting elements are favorably incorporated in the light-emitting device as light-emitting elements.

First, in the short wavelength range from Λ1 (380 nm) to Λ2 (495 nm) among the three wavelength ranges, light emitted from all light sources can be included, such as thermal emission light from a hot filament or the like, electric discharge emission light from a fluorescent tube, a high-pressure sodium lamp, or the like, stimulated emission light from a laser or the like, spontaneous emission light from a semiconductor light-emitting element, and spontaneous emission light from a phosphor. Among the above, emission of light from a photoexcited phosphor, emission of light from a photoexcited semiconductor light-emitting element, and emission of light from a photoexcited semiconductor laser are favorable due to their small sizes, high energy efficiency, and their ability to emit light in a relatively narrow band.

Specifically, the following is favorable.

Favorable examples of a semiconductor light-emitting element include a purple light-emitting element (with a peak wavelength of around 395 nm to 420 nm), a bluish purple light-emitting element (with a peak wavelength of around 420 nm to 455 nm), or a blue light-emitting element (with a peak wavelength of around 455 nm to 485 nm) in which an In(Al)GaN material formed on a sapphire substrate or a GaN substrate is included in an active layer structure. Furthermore, a blue light-emitting element (with a peak wavelength of around 455 nm to 485 nm) in which a Zn(Cd)(S)Se material formed on a GaAs substrate is included in an active layer structure is also favorable.

Moreover, a spectral power distribution or a peak wavelength of a radiant flux produced by a light-emitting element (light-emitting material) such as a semiconductor light-emitting element or a phosphor normally fluctuates slightly depending on ambient temperature, a heat dissipation environment of the light-emitting device including a package and a fixture, injected current, circuit architecture and, in some cases, deterioration or the like. Therefore, a semiconductor light-emitting element with a peak wavelength of 418 nm under a certain drive condition may exhibit a peak wavelength of, for example, 421 nm when temperature of ambient environment rises.

The same applies to a spectral power distribution or a peak wavelength of a radiant flux produced by light-emitting elements (light-emitting materials) such as the semiconductor light-emitting elements and phosphors described below.

The active layer structure may be any of a multiple quantum well structure in which a quantum well layer and a barrier layer are laminated, a single or a double heterostructure including a relatively thick active layer and a barrier layer (or a clad layer), and a homo junction constituted by a single pn junction.

In particular, when the active layer includes an In(Al)GaN material, a bluish purple light-emitting element and a purple light-emitting element in which In concentration decreases in the active layer structure as compared to a blue light-emitting element are favorable since emission wavelength fluctuation due to segregation by In decreases and a full-width at half-maximum of the emission spectrum becomes narrower. In addition, a bluish purple light-emitting element and a purple light-emitting element are favorable because wavelengths are positioned closer to a relatively outer side (short wavelength-side) of the wavelength range from 380 nm to 495 nm and $D_{uv}$ can be easily controlled. In other words, a semiconductor light-emitting element having an emission peak in the short wavelength range from Λ1 (380 nm) to Λ2 (495 nm) in the first to fifth inventions of the present invention is favorably a blue light-emitting element (with a peak wavelength of around 455 nm to 485 nm), more favorably a bluish purple light-emitting element (with a peak wavelength of around 420 nm to 455 nm) with a shorter wavelength, and extremely favorably a purple light-emitting element (with a peak wavelength of around 395 nm to 420 nm) with a shorter wavelength. Furthermore, it is also favorable to use a plurality of types of these light-emitting elements. Furthermore, it is also favorable to use a plurality of types of these light-emitting elements.

Moreover, a semiconductor laser is also favorably used as the light-emitting element and, for the same reasons as described above, the semiconductor laser is favorably a blue semiconductor laser (with an emission wavelength of around 455 nm to 485 nm), more favorably a bluish purple semiconductor laser (with an emission wavelength of around 420 nm to 455 nm) with a longer wavelength, and extremely favorably a purple semiconductor laser (with an emission wavelength of around 395 nm to 420 nm) with a longer wavelength.

With a short wavelength range semiconductor light-emitting element that is used in the light-emitting device, the method for manufacturing the light-emitting device, the method for designing the light-emitting device or the illumination method according to the second embodiment of the first, fifth, second or fourth invention of the present invention, a full-width at half-maximum of an emission spectrum of the semiconductor light-emitting element is favorably narrow. From this perspective, the full-width at half-maximum of the semiconductor light-emitting element used in the short wavelength range is favorably 45 nm or less, more favorably 40 nm or less, extremely favorably 35 nm or less, and dramatically favorably 30 nm or less. On the other hand, since an excessively narrow band spectrum may result in a case where desired characteristics cannot be realized unless a large number of different types of light-emitting elements are mounted in a light-emitting device, the full-width at half-maximum of the semiconductor light-emitting element used in the short wavelength range is favorably 2 nm or more, more favorably 4 nm or more, extremely favorably 6 nm or more, and dramatically favorably 8 nm or more.

Since the short wavelength range semiconductor light-emitting element that is used in the light-emitting device according to the first embodiment of the first invention of the present invention, and the light-emitting device, the method for manufacturing the light-emitting device, the method for designing the light-emitting device or the illumination method according to the second embodiment of the first, fifth, second or fourth invention of the present invention favorably includes an In(Al)GaN material in an active layer structure, the semiconductor light-emitting element is favorably a light-emitting element formed on a sapphire substrate or a GaN substrate. In particular, the degree of In segregation in the active layer of a light-emitting element formed on a GaN substrate is more favorable than when formed on a sapphire substrate. This is dependent on the degree of lattice matching between the substrate and active layer structure material. Therefore, since the full-width at half-maximum of an In(Al)GaN emission spectrum on a GaN substrate can be set narrower, a dramatic synergistic effect with the first to fifth inventions of the present invention can be expected and is therefore extremely favorable. Furthermore, even among light-emitting elements on a GaN substrate, elements formed on a semi-polar surface or a non-polar surface are particularly favorable. This is because a decrease in a piezoelectric polarization effect in a crystal growth direction causes an increase in spatial overlapping of electrons' and holes' wave function in a quantum well layer and, in principle, an increase in radiation efficiency and a narrower band spectrum can be achieved. Therefore, by using a semiconductor light-emitting element on a semi-polar or non-polar GaN substrate, a dramatic synergistic effect with the first to fifth inventions of the present invention can be expected and is therefore extremely favorable.

In addition, as far as substrate thickness is concerned, the substrate is favorably either thick or completely separated from the semiconductor light-emitting element. In particular, when creating a short wavelength range semiconductor light-emitting element on a GaN substrate, in order to facilitate light extraction from side walls of the GaN substrate, the substrate is favorably thick and is 100 μm or more, more favorably 200 μm or more, extremely favorably 400 μm or more, and dramatically favorably 600 μm or more. On the other hand, for convenience of creating elements, the substrate thickness is favorably 2 mm or less, more favorably 1.8 mm or less, extremely favorably 1.6 mm or less, and dramatically favorably 1.4 mm or less.

Meanwhile, when creating a light-emitting element on a sapphire substrate or the like, the substrate is favorably separated using a method such as laser lift-off. Such a configuration reduces stress acting on the quantum well layer which facilitates widening of bandwidth due to an extreme lattice mismatch with the substrate and, as a result, a narrower band spectrum of the light-emitting element can be achieved. Therefore, with a light-emitting element separated from a sapphire substrate or the like, a dramatic synergistic effect with the first to fifth inventions of the present invention can be expected and is therefore extremely favorable.

With a short wavelength range phosphor material that is used in the light-emitting device according to the first embodiment of the first invention of the present invention, and the light-emitting device, the method for manufacturing the light-emitting device, the method for designing the light-emitting device or the illumination method according to the second embodiment of the first, fifth, second or fourth invention of the present invention, a full-width at half-maximum of the phosphor material is favorably narrow. From this perspective, the full-width at half-maximum of an emission spectrum of the phosphor material used in the short wavelength range when photoexcited at room temperature is favorably 90 nm or less, more favorably 80 nm or less, extremely favorably 70 nm or less, and dramatically favorably 60 nm or less. On the other hand, since an excessively narrow band spectrum may result in a case where desired characteristics cannot be realized unless a large number of different types of light-emitting elements are mounted in a light-emitting device, the full-width at half-maximum of the phosphor material used in the short wavelength range is favorably 2 nm or more, more favorably 4 nm or more, extremely favorably 6 nm or more, and dramatically favorably 8 nm or more.

With a short wavelength range phosphor material, in consideration of exciting the phosphor material and $D_{uv}$ controllability, the phosphor material favorably has a peak wavelength in the following ranges. In a case of light excitation, the peak wavelength favorably ranges from 455 nm to 485 nm and more favorably has a shorter wavelength from 420 nm to 455 nm. On the other hand, in a case of electron beam excitation, the peak wavelength favorably ranges from 455 nm to 485 nm, more favorably has a shorter wavelength from 420 nm to 455 nm, and extremely favorably has a shorter wavelength from 395 nm to 420 nm.

As for specific examples of the short wavelength range phosphor material used in the light-emitting device according to the first embodiment of the first invention of the present invention, and the light-emitting device, the method for manufacturing the light-emitting device, the method for designing the light-emitting device or the illumination method according to the second embodiment of the first, fifth, second or fourth invention of the present invention, while any phosphor material satisfying the full-width at half-maximum described above can be favorably used, one specific example is a blue phosphor which uses $Eu^{2+}$ as an activator and a crystal constituted by alkaline-earth aluminate or alkaline-earth halophosphate as a host. More specifically, examples include a phosphor represented by the following general formula (5), a phosphor represented by the following general formula (5)', $(Sr, Ba)_3MgSi_2O_8:Eu^{2+}$, and $(Ba, Sr, Ca, Mg)Si_2O_2N_2:Eu$.

$$(Ba,Sr,Ca)MgAl_{10}O_{17}:Mn,Eu \qquad (5)$$

(An alkaline-earth aluminate phosphor represented by the general Formula (5) is referred to as a BAM phosphor).

$$Sr_aBa_bEu_x(PO_4)_cX_d \qquad (5)'$$

(In the general formula (5)', X is Cl. In addition, c, d, and x are numbers satisfying $2.7 \leq c \leq 3.3$, $0.9 \leq d \leq 1.1$, and $0.3 \leq x \leq 1.2$. Furthermore, a and b satisfy conditions represented by $a+b=5-x$ and $0 \leq b/(a+b) \leq 0.6$.) (Among alkaline-earth halophosphate phosphors represented by general Formula (5)', those containing Ba are referred to as SBCA phosphors and those not containing Ba are referred to as SCA phosphors).

Favorable examples include a BAM phosphor, a SBCA phosphor, and a SCA phosphor, which are the phosphors described above, as well as a Ba—SION phosphor ($(Ba, Sr, Ca, Mg)Si_2O_2N_2:Eu$) and a $(Sr, Ba)_3MgSi_2O_8:Eu^{2+}$ phosphor.

Next, in the intermediate wavelength range from Λ2 (495 nm) to Λ3 (590 nm) among the three wavelength ranges, light emitted from all light sources can be included, such as thermal emission light from a hot filament or the like, electric discharge emission light from a fluorescent tube, a high-pressure sodium lamp, or the like, stimulated emission light from a laser or the like including second-order harmonic generation (SHG) using a non-linear optical effect or the like, spontaneous emission light from a semiconductor light-emitting element, and spontaneous emission light from a phosphor. Among the above, emission of light from a photoexcited phosphor, emission of light from a photoexcited semiconductor light-emitting element, emission of light from a photoexcited semiconductor laser, and emission of light from a photoexcited SHG laser are favorable due to their small sizes, high energy efficiency, and their ability to emit light in a relatively narrow band.

Specifically, the following is favorable.

Favorable examples of a semiconductor light-emitting element include a greenish blue light-emitting element (with a peak wavelength of around 495 nm to 500 nm), a green light-emitting element (with a peak wavelength of around 500 nm to 530 nm), a yellowish green light-emitting element (with a peak wavelength of around 530 nm to 570 nm), or a yellow light-emitting element (with a peak wavelength of around 570 nm to 580 nm) in which an In(Al)GaN material on a sapphire substrate or a GaN substrate is included in an active layer structure. In addition, a yellowish green light-emitting element (with a peak wavelength of around 530 nm to 570 nm) due to GaP on a GaP substrate or a yellow light-emitting element (with a peak wavelength of around 570 nm to 580 nm) due to GaAsP on a GaP substrate is also favorable. Furthermore, a yellow light-emitting element (with a peak wavelength of around 570 nm to 580 nm) due to AlInGaP on a GaAs substrate is also favorable.

The active layer structure may be any of a multiple quantum well structure in which a quantum well layer and a barrier layer are laminated, a single or a double heterostructure including a relatively thick active layer and a barrier layer (or a clad layer), and a homo junction constituted by a single pn junction.

In particular, when using an In(Al)GaN material, a yellowish green light-emitting element, a green light-emitting element, and a greenish blue light-emitting element in which In concentration decreases in the active layer structure as compared to a yellow light-emitting element are favorable since emission wavelength fluctuation due to segregation by In decreases and a full-width at half-maximum of the emission spectrum becomes narrower. In other words, a semiconductor light-emitting element having an emission peak in the intermediate wavelength range from $\Lambda 2$ (495 nm) to $\Lambda 3$ (590 nm) in the first to fifth inventions of the present invention is favorably a yellow light-emitting element (with a peak wavelength of around 570 nm to 580 nm), more favorably a yellowish green light-emitting element (with a peak wavelength of around 530 nm to 570 nm) with a shorter wavelength, extremely favorably a green light-emitting element (with a peak wavelength of around 500 nm to 530 nm) with a shorter wavelength, and dramatically favorably a greenish blue light-emitting element (with a peak wavelength of around 495 nm to 500 nm).

Furthermore, a semiconductor laser, an SHG laser which converts an emission wavelength of a semiconductor laser using a non-linear optical effect, and the like are also favorably used as a light-emitting element. For the same reasons as described above, an emission wavelength is favorably within a yellow range (with a peak wavelength of around 570 nm to 580 nm), more favorably within a yellowish green range (with a peak wavelength of around 530 nm to 570 nm) with a shorter wavelength, extremely favorably within a green range (with a peak wavelength of around 500 nm to 530 nm) with a shorter wavelength, and dramatically favorably within a greenish blue range (with a peak wavelength of around 495 nm to 500 nm).

With an intermediate wavelength range semiconductor light-emitting element that is used in the light-emitting device according to the first embodiment of the first invention of the present invention, and the light-emitting device, the method for manufacturing the light-emitting device, the method for designing the light-emitting device or the illumination method according to the second embodiment of the first, fifth, second or fourth invention of the present invention, a full-width at half-maximum of an emission spectrum of the semiconductor light-emitting element is favorably narrow. From this perspective, the full-width at half-maximum of the semiconductor light-emitting element used in the intermediate wavelength range is favorably 75 nm or less, more favorably 60 nm or less, extremely favorably 50 nm or less, and dramatically favorably 40 nm or less. On the other hand, since an excessively narrow band spectrum may result in a case where desired characteristics cannot be realized unless a large number of different types of light-emitting elements are mounted in a light-emitting device, the full-width at half-maximum of the semiconductor light-emitting element used in the intermediate wavelength range is favorably 2 nm or more, more favorably 4 nm or more, extremely favorably 6 nm or more, and dramatically favorably 8 nm or more.

When the intermediate wavelength range semiconductor light-emitting element that is used in the light-emitting device according to the first embodiment of the first invention of the present invention, and the light-emitting device, the method for manufacturing the light-emitting device, the method for designing the light-emitting device or the illumination method according to the second embodiment of the first, fifth, second or fourth invention of the present invention includes an In(Al)GaN material in an active layer structure, the semiconductor light-emitting element is favorably a light-emitting element formed on a sapphire substrate or a GaN substrate. In addition, a light-emitting element formed on a GaN substrate is particularly favorable. This is due to the fact that while In must be introduced into the active layer structure in a relatively large amount when creating an InAlGaN element in the intermediate wavelength range, an InAlGaN element formed on a GaN substrate reduces a piezoelectric effect attributable to a difference in lattice constants from the substrate and enables suppression of spatial separation of electrons/holes when injecting a carrier into a quantum well layer as compared to an InAlGaN element formed on a sapphire substrate. As a result, a full-width at half-maximum of the emission wavelength can be narrowed. Therefore, in the first to fifth inventions of the present invention, with an intermediate wavelength range semiconductor light-emitting element on a GaN substrate, a dramatic synergistic effect can be expected and is therefore favorable. Furthermore, even among light-emitting elements on a GaN substrate, elements formed on a semi-polar surface or a non-polar surface is particularly favorable. This is because a decrease in a piezoelectric polarization effect in a crystal growth direction causes an increase in spatial overlapping of electrons' and holes' wave function in a quantum well layer and, in principle, an increase in luminous efficiency and a narrower band spectrum can be achieved. Therefore, by using a semiconductor light-emitting element on a semi-polar or non-polar GaN substrate, a dramatic synergistic effect with the first to fifth inventions of the present invention can be expected and is therefore extremely favorable.

With all semiconductor light-emitting elements, regardless of the type of substrate on which the semiconductor light-emitting element is formed, the substrate is favorably either thick or completely removed.

In particular, when creating an intermediate wavelength range semiconductor light-emitting element on a GaN substrate, in order to facilitate light extraction from side walls of the GaN substrate, the substrate is favorably thick and is 100 μm or more, more favorably 200 μm or more, extremely favorably 400 μm or more, and dramatically favorably 600 μm or more. On the other hand, for convenience of creating elements, the substrate thickness is favorably 2 mm or less, more favorably 1.8 mm or less, extremely favorably 1.6 mm or less, and dramatically favorably 1.4 mm or less.

In addition, the same applies when creating an intermediate wavelength range semiconductor light-emitting element on a GaP substrate and, in order to facilitate light extraction from side walls of the GaP substrate, the substrate is favorably thick and is 100 μm or more, more favorably 200 μm or more, extremely favorably 400 μm or more, and dramatically favorably 600 μm or more. On the other hand, for convenience of creating elements, the substrate thickness is favorably 2 mm or less, more favorably 1.8 mm or less, extremely favorably 1.6 mm or less, and dramatically favorably 1.4 mm or less.

Meanwhile, in a case of an AlInGaP material formed on a GaAs substrate, light in the emission wavelength range is absorbed due to a bandgap of the substrate being smaller than a bandgap of the material constituting the active layer structure. Therefore, as far as substrate thickness is concerned, the substrate is favorably thin or completely separated from the semiconductor light-emitting element.

In addition, when creating a light-emitting element on a sapphire substrate or the like, the substrate is favorably separated using a method such as laser lift-off. Such a configuration reduces stress acting on the quantum well layer which causes widening of bandwidth due to an extreme lattice mismatch with the substrate and, as a result, a narrower band spectrum of the light-emitting element can be achieved. Therefore, with a semiconductor light-emitting element separated from a sapphire substrate or the like, a dramatic synergistic effect with the first to fifth inventions of the present invention can be expected and is therefore extremely favorable.

As the intermediate wavelength range phosphor material used for the light-emitting device according to the first embodiment of the first invention of the present invention, and the light-emitting device, the method for manufacturing the light-emitting device, the method for designing the light-emitting device or the illumination method according to the second embodiment of the first, fifth, second or fourth invention of the present invention, the following case is preferable.

For example, if a light-emitting element that emits a purple light, such as a purple semiconductor light-emitting element, is used in a specific light emitting area, and a blue phosphor is also used in the same light emitting area, it is preferable that the phosphor, which emits light in the intermediate wavelength range, emits light in a narrow band, because the spectral power distributions of the blue phosphor overlaps with the intermediate wavelength range phosphor material. This is because a more appropriate concave portion (portion where the relative spectral intensity is low) can be formed in a range of 465 nm or more and 525 nm or less as the full-width at half-maximum of the intermediate wavelength range phosphor material is narrower, and creating this concave portion appropriately is critical to implement "a natural, vivid, highly visible and comfortable appearance of colors and appearance of objects".

In such a case, in consideration of $D_{uv}$ controllability, a peak wavelength of an intermediate wavelength range phosphor material favorably ranges from 495 nm to 500 nm. A peak wavelength ranging from 500 nm to 530 nm and a peak wavelength ranging from 570 nm to 580 nm are both more favorable to similar degrees, and a peak wavelength ranging from 530 nm to 570 nm is extremely favorable.

If a light-emitting element that emits a purple light, such as a purple semiconductor light-emitting element, is used in a specific light emitting area, and a blue phosphor is also used in the same light emitting area, the full-width at half-maximum of an emission spectrum of the phosphor material used in the intermediate wavelength range when photoexcited at room temperature is favorably 130 nm or less, more favorably 110 nm or less, extremely favorably 90 nm or less, and dramatically favorably 70 nm or less. On the other hand, since an excessively narrow band spectrum may result in a case where desired characteristics cannot be realized unless a large number of different types of light-emitting elements are mounted in a light-emitting device, hence if a light-emitting element that emits purple light is used, the full-width at half-maximum of the phosphor material used in the intermediate wavelength range is favorably 2 nm or more, more favorably 4 nm or more, extremely favorably 6 nm or more, and dramatically favorably 8 nm or more.

On the other hand, if a light-emitting element that emits a blue light, such as a blue semiconductor light-emitting element, is used in a specific light emitting area, for example, it is preferable that phosphor, which emits light in the intermediate wavelength range, emits light in a broad band. The reason for this follows. Generally the full-width at half-maximum of the blue semiconductor light-emitting element is relatively narrow, therefore if the phosphor, which emits light in the intermediate wavelength range, emits light in a narrow band, the concave portion in the spectral power distribution formed in the range of 465 nm or more and 525 nm or less, which is critical to implement "a natural, vivid, highly visible and comfortable appearance of colors and appearance of objects", becomes excessively large (relative spectral intensity becomes too low), which makes it difficult to implement the desired characteristics.

In such a case, in consideration of $D_{uv}$ controllability, a peak wavelength of an intermediate wavelength range phosphor material favorably ranges from 511 nm to 543 nm. A peak wavelength ranging from 514 nm to 540 nm is more favorable, a peak wavelength ranging from 520 nm to 540 nm is extremely favorable, and a peak wavelength ranging from 520 nm to 530 nm is dramatically favorable.

If a light-emitting element that emits a blue light, such as a blue semiconductor light-emitting element, is used in a specific light emitting area, the full-width at half-maximum of an emission spectrum of the phosphor material used in the intermediate wavelength range when photoexcited at room temperature is favorably 90 nm or more, more favorably 96 nm or more, and extremely favorably 97 nm or more. An extremely broad band spectrum may not be able to implement the desired characteristics, because the concave position in the spectral power distribution formed in the range of 465 nm or more and 525 nm or less, which is critical to implement "a natural, vivid, highly visible and comfortable appearance of colors and appearance of objects", becomes too small (relative spectral intensity becomes too high), hence the full-width at half-maximum of the intermediate wavelength range phosphor material is favorably 110 nm or less, more favorably 108 or less, extremely favorably 104 nm or less, and dramatically favorably 103 nm or less.

As for specific examples of the intermediate wavelength range phosphor material used in the light-emitting device according to the first embodiment of the first invention of the present invention, and the light-emitting device, the method for manufacturing the light-emitting device, the method for designing the light-emitting device or the illumination method according to the second embodiment of the first, fifth, second or fourth invention of the present invention, any phosphor material satisfying the full-width at half-maximum described above can be favorably used.

For example, as the phosphor that emits light in the intermediate wavelength range when a light-emitting element that emits a purples light, such as a purple semiconductor light-emitting element, is used in a specific light emitting area, and a blue phosphor is also used in the same light emitting area, a green phosphor that includes $Eu^{2+}$, $Ce^{3+}$ or the like as the activator, can be used. A preferable green phosphor using $Eu^{2+}$ as an activator is a green phosphor which uses a crystal constituted by alkaline-earth silicate, alkaline-earth nitride silicate, or SiAlON as a host. A green phosphor of this type can normally be excited using a semiconductor light-emitting element ranging from ultraviolet to blue.

Specific examples of those using an alkaline-earth silicate crystal as a host include a phosphor represented by the following general formula (6) and a phosphor represented by the following general formula (6)'.

$$Ba_aCa_bSr_cMg_dEu_xSiO_4 \qquad (6)$$

(In the general Formula (6), a, b, c, d, and x satisfy a+b+c+d+x=2, 1.0≤a≤2.0, 0≤b<0.2, 0.2≤c≤1.0, 0≤d<0.2, and 0<x≤0.5.) (Alkaline-earth silicate represented by the general formula (6) is referred to as a BSS phosphor).

$$Ba_{1-x-y}Sr_xEu_yMg_{1-z}Mn_zAl_{10}O_{17} \qquad (6)'$$

(In the general formula (6)', x, y, and z respectively satisfy 0.1≤x≤0.4, 0.25≤y≤0.6, and 0.05≤z≤0.5). (An alkaline-earth aluminate phosphor represented by general formula (6)' is referred to as a G-BAM phosphor).

Specific examples having a SiAlON crystal as a host include a phosphor represented by $Si_{6-z}Al_zO_zN_{8-z}$:Eu (where 0<z<4.2) (this phosphor is referred to as a β-SiAlON phosphor). Preferable green phosphors using $Ce^{3+}$ as an activator include a green phosphor with a garnet-type oxide crystal as a host such as $Ca_3(Sc, Mg)_2Si_3O_{12}$:Ce or a green phosphor with an alkaline-earth scandate crystal as a host such as $CaSc_2O_4$:Ce. Other examples include $SrGa_2S_4$:$Eu^{2+}$.

Still other examples include an oxynitride phosphor represented by $(Ba, Ca, Sr, Mg, Zn, Eu)_3Si_6O_{12}N_2$ (this phosphor is referred to as a BSON phosphor).

Yet other examples include a yttrium aluminum garnet phosphor represented by $(Y_{1-u}Gd_u)_3(Al_{1-v}Ga_v)_5O_{12}$:Ce, Eu (where u and v respectively satisfy 0≤u≤0.3 and 0≤v≤0.5) (this phosphor is referred to as a YAG phosphor) and a lanthanum silicon nitride phosphor represented by $Ca_{1.5x}La_{3-x}Si_6N_{11}$:Ce (where x satisfies 0≤x≤1) (this phosphor is referred to as an LSN phosphor.)

Among the phosphors described above, favorable examples include a BSS phosphor, a β-SiAlON phosphor, a BSON phosphor, a G-BAM phosphor, a YAG phosphor, and a $SrGa_2S_4$:$Eu^{2+}$ phosphor.

On the other hand, as a phosphor that emits light in the intermediate wavelength range when a light-emitting element that emits a blue light, such as a blue semiconductor light-emitting element, is used in a specific light emitting area, a green phosphor, of which host is $Ce^{3+}$ activated aluminate, $Ce^{3+}$ activated yttrium-aluminum oxide, $Eu^{2+}$ activated alkaline earth silicate crystals or $Eu^{2+}$ activated alkaline earth-silicon nitride, can be used. These green phosphors can normally be excited using a semiconductor light-emitting element ranging from ultraviolet to blue.

Specific examples of the $Ce^{3+}$ activated aluminate phosphor include a green phosphor represented by the following general formula (8), $$Y_a(Ce,Tb,Lu)_b(G_a,S_c)_cAl_dO_e \qquad (8)$$

(In the general formula (8), a, b, c, d and e satisfy a+b=3, 0≤b≤0.2, 4.5≤c+d≤5.5, 0.1≤c≤2.6, and 10.8≤e≤13.4.) ($Ce^{3+}$ activated aluminate phosphor represented by the general formula (8) is referred to as a G-YAG phosphor).

In the G-YAG phosphor in particular, the composition range that satisfies the general formula (8) can be suitably selected. In this embodiment, the wavelength and the full-width at half-maximum that implement the maximum emission intensity when light is excited with the phosphor alone are preferably in the following ranges.

0.01≤b≤0.05 and 0.1≤c≤2.6 is preferable,
0.01≤b≤0.05 and 0.3≤c≤2.6 is more preferable, and
0.01≤b≤0.05 and 1.0≤c≤2.6 is extremely preferable;
0.01≤b≤0.03 and 0.1≤c≤2.6 is also preferable,
0.01≤b≤0.03 and 0.3≤c≤2.6 is more preferable, and
0.01≤b≤0.03 and 1.0≤c≤2.6 is extremely preferable.

Specific examples of $Ce^{3+}$ activated yttrium-aluminum oxide phosphor include a green phosphor represented by the following general formula (9).

$$Lu_a(Ce,Tb,Lu)_b(G_a,S_c)_cAl_dO_e \qquad (9)$$

(In the general formula (9), a, b, c, d and e satisfy a+b=3, 0≤b≤0.2, 4.5≤c+d≤5.5, 0≤c≤2.6, and 10.8≤e≤13.4.) (the $Ce^{3+}$ activated yttrium-aluminum oxide phosphor represented by the general formula (9) is called "LuAG phosphor".)

In the LuAG phosphor, in particular, the composition range that satisfies the general formula (9) can be suitably selected. In this embodiment, the wavelength and the full-width at half-maximum that implement the maximum emission intensity when light is excited with the phosphor alone are preferably in the following ranges.

0.00≤b≤0.13 is preferable,
0.02≤b≤0.13 is more preferable, and
0.02≤b≤0.10 is extremely preferable.

Other examples include green phosphors represented by the following general formula (10) and a phosphor represented by the following general formula (11).

$$M^1_aM^2_bM^3_cO_d \qquad (10)$$

(In the general formula (10), $M^1$ indicates a bivalent metallic element, $M^2$ indicates a trivalent metallic element, and $M^3$ indicates a tetravalent metallic element, and a, b, c and d satisfy 2.7≤a≤3.3, 1.8≤b≤2.2, 2.7≤c≤3.3 and 11.0≤d≤13.0.) (the phosphor represented by the general formula (10) is referred to as a CSMS phosphor).

In the above general formula (10), $M^1$ is a bivalent metallic element, and is preferably at least one type selected from the group consisting of Mg, Ca, Zn, Sr, Cd and Ba, further preferably Mg, Ca or Zn, and particularly preferably Ca. In this case, Ca may be a single system or may be a composite system with Mg. $M^1$ may include other bivalent metallic elements.

$M^2$ is a trivalent metallic element, and is preferably at least one type selected from the group consisting of Al, Sc, Ga, Y, In, La, Gd and Lu, further preferably Al, Sc, Y or Lu, and particularly preferably Sc. In this case, Sc may be a single system or may be a composite system with Y or Lu. $M^2$ must include Ce and may include other trivalent metallic elements.

$M^3$ is a tetravalent metallic element, and preferably includes at least Si. An example of a tetravalent metallic element $M^3$, other than Si, is preferably at least one type selected from the group consisting of Ti, Ge, Zr, Sn and Hf, further preferably at least one type selected from the group consisting of Ti, Zr, Sn and Hf, and particularly preferably Sn. Particularly it is preferable that $M^3$ is Si. $M^3$ may include other tetravalent metallic elements.

In the CSMS phosphor in particular, the composition range that satisfies the general formula (10) can be suitably selected. For the wavelength and the full-width at half-maximum that implement the maximum emission intensity when light is excited with the phosphor alone to be in a preferable range in this embodiment, the lower limit of the ratio of Ce included in $M^2$ to the entire $M^2$ is preferably 0.01 or more, and more preferably 0.02 or more. Further, the upper limit of the ratio of Ce included in $M^2$ to the entire $M^2$ is preferably 0.10 or less, and more preferably 0.06 or less. Further, the lower limit of the ratio of Mg included in $M^1$ to the entire $M^1$ is preferably 0.01 or more, and more preferably 0.03 or more. On the other hand, the upper limit is preferably 0.30 or less, and more preferably 0.10 or less.

Furthermore, examples include represented by the following general formula (11).

  (11)

(In the general formula (11), $M^1$ indicates an activator element including at least Ce, $M^2$ is a bivalent metallic element, and $M^3$ is a trivalent metallic element, and a, b, c and d satisfy $0.0001 \leq a \leq 0.2$, $0.8 \leq b \leq 1.2$, $1.6 \leq c \leq 2.4$ and $3.2 \leq d \leq 4.8$.) (A phosphor represented by the general formula (11) is called "CSO phosphor".)

In the above general formula (11), $M^1$ is an activator element contained in a host crystal, and includes at least Ce. $M^1$ can contain at least one type of bivalent to tetravalent element selected from the group consisting of Cr, Mn, Fe, Co, Ni, Cu, Ce, Pr, Nd, Sm, Eu, Tb, Dy, Ho, Er, Tm and Yb.

$M^2$ is a bivalent metallic element, and is preferably at least one type selected from the group consisting of Mg, Ca, Zn, Sr, Cd and Ba, further preferably Mg, Ca or Sr, and is particularly preferably that Ca is 50 mol % or more of the elements of $M^2$.

$M^3$ is a trivalent metallic element, and is preferably at least one type selected from the group consisting of Al, Sc, Ga, Y, In, La, Gd, Yb and Lu, and further preferably Al, Sc, Yb or Lu, more further preferably Sc, or Sc and Al, or Sc and Lu, and is particularly preferably that Sc is 50 mol % or more of the elements of $M^3$.

$M^2$ and $M^3$ are a bivalent metallic element and trivalent metallic element respectively, and a small part of $M^2$ and/or $M^3$ may be a metallic element of which valence is any one of 1, 4 and 5, and a very small amount of anions, such as a halogen element (F, Cl, Br, I), nitrogen, sulfur selenium or the like may be contained in the compound.

In a CSO phosphor in particular, a composition range that satisfies the general formula (11) can be suitably selected. In this embodiment, the wavelength and the full-width at half-maximum that implement the maximum emission intensity when light is excited with phosphor alone are preferably in the following ranges.

$0.005 \leq a \leq 0.200$ is preferable,
$0.005 \leq a \leq 0.012$ is more preferable, and
$0.007 \leq a \leq 0.012$ is extremely preferable.

Furthermore, specific examples of green phosphors using an alkaline-earth silicate crystal as a host and $Eu^{2+}$ as an activator include a phosphor represented by the following general formula (12).

  (12)

(In the general Formula (12), a, b, c, d, and x satisfy $a+b+c+d+x=2$, $1.0 \leq a \leq 2.0$, $0 \leq b < 0.2$, $0.2 \leq c \leq 1.0$, $0 \leq d < 0.2$, and $0 < x \leq 0.5$.) (Alkaline-earth silicate represented by the general formula (12) is referred to as a BSS phosphor).

In the BSS phosphor, a composition range that satisfies the general formula (12) can be suitable selected. In this embodiment, the wavelength and the full-width at half-maximum that implement the maximum emission intensity when light is excited with the phosphor alone are preferably in the following ranges.

$0.20 \leq c \leq 1.00$ and $0.25 < x \leq 0.50$ is more preferable.
$0.20 \leq c \leq 1.00$ and $0.25 < x \leq 0.30$ is extremely preferable;

Furthermore, $0.50 \leq c \leq 1.00$ and $0.00 < x \leq 0.50$ is preferable, $0.50 \leq c \leq 1.00$ and $0.25 < x \leq 0.50$ is more preferable, and $0.50 \leq c \leq 1.00$ and $0.25 < x \leq 0.30$ is extremely preferable.

Furthermore, specific examples of phosphors using an alkaline-earth nitride silicate crystal as a host and $Eu^{2+}$ as an activator include a phosphor represented by the following general formula (13).

$(Ba, Ca, Sr, Mg, Zn, Eu)_3Si_6O_{12}N_2$ (13) (Alkaline-earth nitride silicate represented by the general formula (13) is referred to as a BSON phosphor).

In the BSON phosphor, a composition range that satisfies the general formula (13) can be suitable selected. In this example, the wavelength and the full-width at half-maximum that implement the maximum emission intensity when light is excited with the phosphor alone are preferably in the following ranges.

In the general formula (13), a combination of Ba, Sr and Eu is preferably among the selectable bivalent metallic elements (Ba, Ca, Sr, Mg, Zn, Eu), and the ratio of Sr to Ba is preferably 10 to 30%.

Next, in the long wavelength range from Λ3 (590 nm) to 780 nm among the three wavelength ranges, light emitted from all light sources can be included, such as thermal emission light from a hot filament or the like, electric discharge emission light from a fluorescent tube, a high-pressure sodium lamp, or the like, stimulated emission light from a laser or the like, spontaneous emission light from a semiconductor light-emitting element, and spontaneous emission light from a phosphor. Among the above, emission of light from a photoexcited phosphor, emission of light from a photoexcited semiconductor light-emitting element, and emission of light from a photoexcited semiconductor laser are favorable due to their small sizes, high energy efficiency, and their ability to emit light in a relatively narrow band.

Specifically, the following is favorable.

As the semiconductor light-emitting element, an orange light-emitting element (with a peak wavelength of around 590 nm to 600 nm) or a red light-emitting element (from 600 nm to 780 nm) in which an AlGaAs material formed on a GaAs substrate or an (Al)InGaP material formed on a GaAs substrate is included in an active layer structure is favorable. In addition, a red light-emitting element (from 600 nm to 780 nm) in which an GaAsP material formed on a GaP substrate is included in an active layer structure is favorable.

The active layer structure may be any of a multiple quantum well structure in which a quantum well layer and a barrier layer are laminated, a single or a double heterostructure including a relatively thick active layer and a barrier layer (or a clad layer), and a homo junction constituted by a single pn junction.

In particular, in this wavelength range, a peak wavelength is favorably close to a vicinity of 630 nm in consideration of achieving a balance between $D_{uv}$ controllability and luminous efficacy of radiation. From this perspective, a red light-emitting element is more favorable than an orange light-emitting element. In other words, a semiconductor light-emitting element having an emission peak in the long wavelength range from Λ3 (590 nm) to 780 nm in the first to fifth inventions of the present invention is favorably an orange light-emitting element (with a peak wavelength of around 590 nm to 600 nm), more favorably a red light-emitting element (with a peak wavelength of around 600 nm to 780 nm), and extremely favorably a red light-emitting element with a peak wavelength that is close to around 630 nm. In particular, a red light-emitting element with a peak wavelength ranging from 615 nm to 645 nm is extremely favorable.

In addition, a semiconductor laser is also favorably used as a light-emitting element. For the same reasons as described above, an emission wavelength is favorably within an orange range (with a peak wavelength of around 590 nm to 600 nm), more favorably within a red range (with a peak wavelength of around 600 nm to 780 nm), and extremely favorably within a red range in which a peak wavelength is close to around 630 nm. In particular, a red semiconductor laser with a peak wavelength ranging from 615 nm to 645 nm is extremely favorable.

With a long wavelength range semiconductor light-emitting element that is used in the light-emitting device according to the first embodiment of the first invention of the present invention, and the light-emitting device, the method for manufacturing the light-emitting device, the method for designing the light-emitting device or the illumination method according to the second embodiment of the first, fifth, second or fourth invention of the present invention, a full-width at half-maximum of an emission spectrum of the semiconductor light-emitting element is favorably narrow. From this perspective, the full-width at half-maximum of the semiconductor light-emitting element used in the long wavelength range is favorably 30 nm or less, more favorably 25 nm or less, extremely favorably 20 nm or less, and dramatically favorably 15 nm or less. On the other hand, since an excessively narrow band spectrum may result in a case where desired characteristics cannot be realized unless a large number of different types of light-emitting elements are mounted in a light-emitting device, the full-width at half-maximum of the semiconductor light-emitting element used in the long wavelength range is favorably 2 nm or more, more favorably 4 nm or more, extremely favorably 6 nm or more, and dramatically favorably 8 nm or more.

In the long wavelength range, light in the emission wavelength range is absorbed due to a bandgap of the GaAs substrate being smaller than a bandgap of the material constituting the active layer structure. Therefore, as far as substrate thickness is concerned, the substrate is favorably thin or completely removed.

With a long wavelength range phosphor material that is used in the light-emitting device according to the first embodiment of the first invention of the present invention, and the light-emitting device, the method for manufacturing the light-emitting device, the method for designing the light-emitting device or the illumination method according to the second embodiment of the first, fifth, second or fourth invention of the present invention, a full-width at half-maximum of the phosphor material is favorably narrow. From this perspective, the full-width at half-maximum of an emission spectrum of the phosphor material used in the long wavelength range when photoexcited at room temperature is favorably 130 nm or less, more favorably 110 nm or less, extremely favorably 90 nm or less, and dramatically favorably 70 nm or less. On the other hand, since an excessively narrow band spectrum may result in a case where desired characteristics cannot be realized unless a large number of different types of light-emitting elements are mounted in a light-emitting device, the full-width at half-maximum of the phosphor material used in the long wavelength range is favorably 2 nm or more, more favorably 4 nm or more, extremely favorably 6 nm or more, and dramatically favorably 8 nm or more.

With a long wavelength range phosphor material, when creating a light-emitting device by integrating the phosphor material with other materials, a peak wavelength is extremely favorably close to 630 nm in consideration of achieving a balance between $D_{uv}$ controllability and luminous efficacy of radiation. In other words, a phosphor material having an emission peak in a long wavelength range from $\Lambda 3$ (590 nm) to 780 nm in the first to fifth inventions of the present invention has a peak that is favorably between 590 nm and 600 nm and more favorably around 600 nm to 780 nm, and a peak wavelength is extremely favorably close to 630 nm. In particular, a phosphor material with a peak wavelength ranging from 620 nm to 655 nm is extremely favorable.

As for specific examples of the long wavelength range phosphor material used in the light-emitting device according to the first embodiment of the first invention of the present invention, and the light-emitting device, the method for manufacturing the light-emitting device, the method for designing the light-emitting device or the illumination method according to the second embodiment of the first, fifth, second or fourth invention of the present invention, any phosphor material satisfying the full-width at half-maximum described above can be favorably used. In addition, such specific examples include phosphors using $Eu^{2+}$ as an activator and a crystal constituted by alkaline-earth silicon-nitride, a SiAlON, or alkaline-earth silicate as a host. A red phosphor of this type can normally be excited using a semiconductor light-emitting element ranging from ultraviolet to blue. Specific examples of phosphors using an alkaline-earth silicon-nitride crystal as a host include a phosphor represented by $(Ca, Sr, Ba, Mg)AlSiN_3:Eu$ and/or $(Ca, Sr, Ba)AlSiN_3:Eu$ (this phosphor is referred to as a SCASN phosphor), a phosphor represented by $(CaAlSiN_3)_{1-x}(Si_2N_2O)_x:Eu$ (where x satisfies $0<x<0.5$) (this phosphor is referred to as a CASON phosphor), a phosphor represented by $(Sr, Ca, Ba)_2Al_xSi_{5-x}O_xN_{8-x}:Eu$ (where $0 \leq x \leq 2$), and a phosphor represented by $Eu_y(Sr, Ca, Ba)_{1-y}:Al_{1+x}Si_{4-x}O_xN_{7-x}$ (where $0 \leq x < 4$, $0 \leq y < 0.2$).

Other examples include a $Mn^{4+}$-activated fluoride complex phosphor. A $Mn^{4+}$-activated fluoride complex phosphor is a phosphor which uses $Mn^{4+}$ as an activator and a fluoride complex salt of an alkali metal, amine, or an alkaline-earth metal as a host crystal. Fluoride complex salts which form the host crystal include those whose coordination center is a trivalent metal (B, Al, Ga, In, Y, Sc, or a lanthanoid), a tetravalent metal (Si, Ge, Sn, Ti, Zr, Re, or Hf), and a pentavalent metal (V, P, Nb, or Ta), and the number of fluorine atoms coordinated around the center ranges from 5 to 7.

A favorable $Mn^{4+}$-activated fluoride complex phosphor is $A_{2+x}M_yMn_zF_n$ (where A is Na and/or K; M is Si and Al; and $-1 \leq x \leq 1$ and $0.9 \leq y+z \leq 1.1$ and $0.001 \leq z \leq 0.4$ and $5 \leq n \leq 7$) which uses a hexafluoro complex of an alkali metal as a host crystal. Among the above, particularly favorable are phosphors in which A is one or more types selected from K (potassium) or Na (sodium) and M is Si (silicon) or Ti (titanium), such as $K_2SiF_6:Mn$ (this phosphor is referred to as a KSF phosphor) or $K_2Si_{1-x}Na_xAl_xF_6:Mn$, $K_2TiF_6:Mn$ (this phosphor is referred to as a KSNAF phosphor) that is obtained by replacing a part (favorably, 10 mol % or less) of the components of $K_2SiF_6:Mn$ with Al and Na.

Other examples include a phosphor represented by the following general formula (7) and a phosphor represented by the following general formula (7)'.

$$(La_{1-x-y}Eu_xLn_y)_2O_2S \qquad (7)$$

(In the general formula (7), x and y denote numbers respectively satisfying $0.02 \leq x \leq 0.50$ and $0 \leq y \leq 0.50$, and Ln denotes at least one trivalent rare-earth element among Y, Gd, Lu, Sc, Sm, and Er). (A lanthanum oxysulfide phosphor represented by the general formula (7) is referred to as an LOS phosphor).

$(k-x)MgO.xAF_2.GeO_2:yMn^{4+}$ (7)'

(In the general formula (7)', k, x, and y denote numbers respectively satisfying 2.8≤k≤5, 0.1≤x≤0.7, and 0.005≤y≤0.015, and A is any of calcium (Ca), strontium (Sr), barium (Ba), zinc (Zn), and a mixture consisted of these elements). (A germanate phosphor represented by the general formula (7) is referred to as an MGOF phosphor).

Among the phosphors described above, favorable examples include a LOS phosphor, an MGOF phosphor, a KSF phosphor, a KSNAF phosphor, a SCASN phosphor, a CASON phosphor, a (Sr, Ca, Ba)$_2$Si$_5$N$_8$:Eu phosphor and a (Sr, Ca, Ba)AlSi$_4$N$_7$ phosphor.

In the light-emitting device according to the first embodiment of the first invention of the present invention, and the light-emitting device, the method for manufacturing the light-emitting device, the method for designing the light-emitting device or the illumination method according to the second embodiment of the first, fifth, second or fourth invention of the present invention, no particular restrictions are applied to materials for appropriately controlling a spectral power distribution of the light-emitting device. However, it is extremely favorable to realize a light-emitting device such as those described below.

For example, if a light-emitting element that emits a purple light, such as a purple semiconductor light-emitting element, is used in a specific light emitting area, and a blue phosphor is also used in the same light emitting area, the light-emitting device includes the phosphor which emits light in the intermediate wavelength range in the following cases.

It is favorable to use a purple LED (with a peak wavelength of around 395 nm to 420 nm) as a short wavelength range light-emitting element, and further incorporate at least one or more phosphors selected from a group of relatively narrow band phosphors consisting of SBCA, SCA, and BAM in a light source as a light-emitting element in the short wavelength range, incorporate at least one or more phosphors selected from a group of relatively narrow band phosphors consisting of β-SiAlON, BSS, BSON, and G-BAM in the light source as a light-emitting element in the intermediate wavelength range, and incorporate at least one or more phosphors selected from the group consisting of CASON, SCASN, LOS, KSF, and KSNAF in the light source as a light-emitting element in the long wavelength range.

A further description is given below.

It is extremely favorable to use a purple LED (with a peak wavelength of around 395 nm to 420 nm) as a first light-emitting element in the short wavelength range, further incorporate SBCA that is a relatively narrow band phosphor in a light source as a second light-emitting element in the short wavelength range, use β-SiAlON that is a relatively narrow band phosphor as a first light-emitting element in the intermediate wavelength range, and use CASON as a first light-emitting element in the long wavelength range.

In addition, it is extremely favorable to use a purple LED (with a peak wavelength of around 395 nm to 420 nm) as a first light-emitting element in the short wavelength range, further incorporate SCA that is a relatively narrow band phosphor in a light source as a second light-emitting element in the short wavelength range, include β-SiAlON that is a relatively narrow band phosphor as a first light-emitting element in the intermediate wavelength range, and use CASON as a first light-emitting element in the long wavelength range.

Furthermore, it is extremely favorable to use a purple LED (with a peak wavelength of around 395 nm to 420 nm) as a first light-emitting element in the short wavelength range, further incorporate BAM that is a relatively narrow band phosphor in a light source as a second light-emitting element in the short wavelength range, use BSS that is a relatively narrow band phosphor as a first light-emitting element in the intermediate wavelength range, and use CASON as a first light-emitting element in the long wavelength range.

Meanwhile, it is favorable to use a bluish purple LED (with a peak wavelength of around 420 nm to 455 nm) and/or a blue LED (with a peak wavelength of around 455 nm to 485 nm) as a short wavelength range light-emitting element, incorporate at least one or more phosphors selected from a group of relatively narrow band phosphors consisting of β-SiAlON, BSS, BSON, and G-BAM in a light source as a light-emitting element in the intermediate wavelength range, and incorporate at least one or more phosphors selected from the group consisting of CASON, SCASN, LOS, KSF, and KSNAF in the light source as a light-emitting element in the long wavelength range.

A further description is given below.

It is extremely favorable to use a bluish purple LED (with a peak wavelength of around 420 nm to 455 nm) and/or a blue LED (with a peak wavelength of around 455 nm to 485 nm) as a light-emitting element in the short wavelength range, further use BSON that is a relatively narrow band phosphor as a first light-emitting element in the intermediate wavelength range, and use SCASN as a first light-emitting element in the long wavelength range.

It is extremely favorable to use a bluish purple LED (with a peak wavelength of around 420 nm to 455 nm) and/or a blue LED (with a peak wavelength of around 455 nm to 485 nm) as a light-emitting element in the short wavelength range, further use β-SiAlON that is a relatively narrow band phosphor as a first light-emitting element in the intermediate wavelength range, and use CASON as a first light-emitting element in the long wavelength range.

It is extremely favorable to use a bluish purple LED (with a peak wavelength of around 420 nm to 455 nm) and/or a blue LED (with a peak wavelength of around 455 nm to 485 nm) as a light-emitting element in the short wavelength range, further use β-SiAlON that is a relatively narrow band phosphor as a first light-emitting element in the intermediate wavelength range, use CASON as a first light-emitting element in the long wavelength range, and use KSF or KSNAF as a second light-emitting element in the long wavelength range.

It is extremely favorable to use a bluish purple LED (with a peak wavelength of around 420 nm to 455 nm) and/or a blue LED (with a peak wavelength of around 455 nm to 485 nm) as a light-emitting element in the short wavelength range, further use β-SiAlON that is a relatively narrow band phosphor as a first light-emitting element in the intermediate wavelength range, and use SCASN as a first light-emitting element in the long wavelength range.

It is extremely favorable to use a bluish purple LED (with a peak wavelength of around 420 nm to 455 nm) and/or a blue LED (with a peak wavelength of around 455 nm to 485 nm) as a light-emitting element in the short wavelength range, further use β-SiAlON that is a relatively narrow band phosphor as a first light-emitting element in the intermediate wavelength range, use SCASN as a first light-emitting element in the long wavelength range, and use KSF or KSNAF as a second light-emitting element in the long wavelength range.

With the combinations of light-emitting elements described above, peak wavelength positions, full-widths at half-maximum, and the like of the respective light-emitting elements are extremely advantageous in realizing a color appearance or an object appearance perceived as favorable by the subjects in the visual experiments.

If a light-emitting element that emits a blue light, such as a blue semiconductor light-emitting element, is used in a specific light emitting area, the following combinations of the light-emitting elements are preferable.

It is preferable that a blue light-emitting element is included in the specific light emitting area, at least one green phosphor selected from $Ca_3(Sc, Mg)_2Si_3O_{12}$:Ce (CSMS phosphor), $CaSc_2O_4$:Ce (CSO phosphor), and $Lu_3Al_5O_{12}$:Ce (LuAG phosphor), $Y_3(Al, Ga)_5O_{12}$:Ce (G-YAG phosphor) is included as the phosphor in the intermediate wavelength range, and at least one red phosphor selected from (Sr, Ca) $AlSiN_3$:Eu (SCASN phosphor), $CaAlSi(ON)_3$:Eu (CASON phosphor) and $CaAlSiN_3$:Eu (CASN phosphor) is also included, and it is preferable that the light-emitting device includes this light emitting area.

In the light-emitting device according to the first embodiment of the first invention of the present invention, and the light-emitting device, the method for manufacturing the light-emitting device, the method for designing the light-emitting device or the illumination method according to the second embodiment of the first, fifth, second or fourth invention of the present invention, it is favorable to use the light-emitting elements (light-emitting materials) heretofore described because the index $A_{cg}$, the luminous efficacy of radiation K (lm/W), $D_{uv}$, and the like can be more readily set to desired values. Using the light-emitting elements described above is also favorable because $|\Delta h_n|$, $SAT_{av}$, $\Delta C_n$, and $|\Delta C_{max}-\Delta C_{min}|$ which are related, when light is treated as a color stimulus, to a difference between color appearances of the 15 color samples when illumination by the light-emitting device is assumed and color appearances when illumination by calculational reference light is assumed can also be more readily set to desired values.

Various means are conceivable for lowering $D_{uv}$ from zero to set $D_{uv}$ to an appropriate negative value. For example, when a light-emitting device having one light-emitting element in each of the three wavelength ranges is assumed, an emission position of the light-emitting element in the short wavelength range can be moved toward a shorter wavelength side, an emission position of the light-emitting element in the long wavelength range can be moved toward a longer wavelength side, an emission position of the light-emitting element in the intermediate wavelength range can be displaced from 555 nm. Furthermore, a relative emission intensity of the light-emitting element in the short wavelength range can be increased, a relative emission intensity of the light-emitting element in the long wavelength range can be increased, a relative emission intensity of the light-emitting element in the intermediate wavelength range can be decreased, or the like. In doing so, in order to vary $D_{uv}$ without varying the CCT, the emission position of the light-emitting element in the short wavelength range may be moved toward a shorter wavelength side and, at the same time, the emission position of the light-emitting element in the long wavelength range may be moved toward a longer wavelength side, or the like. Moreover, operations opposite to those described above may be performed to vary $D_{uv}$ toward a positive side.

In addition, when a light-emitting device respectively having two light-emitting elements in each of the three wavelength ranges is assumed, $D_{uv}$ can be lowered by, for example, increasing a relative intensity of a light-emitting element on a relatively shorter wavelength side among the two light-emitting elements in the short wavelength range, increasing a relative intensity of a light-emitting element on a relatively longer wavelength side among the two light-emitting elements in the long wavelength range, or the like. In doing so, in order to vary $D_{uv}$ without varying the CCT, the relative intensity of the light-emitting element on a relatively shorter wavelength side among the two light-emitting elements in the short wavelength range is increased and, at the same time, the relative intensity of the light-emitting element on a relatively longer wavelength side among the two light-emitting elements in the long wavelength range is increased. Moreover, operations opposite to those described above may be performed to vary $D_{uv}$ toward a positive side.

Meanwhile, as means for varying $|\Delta h_n|$, $SAT_{av}$, $\Delta C_n$, and $|\Delta C_{max}-\Delta C_{min}|$ which are related to a difference between color appearances of the 15 color samples when illumination by the light-emitting device is assumed and color appearances when illumination by calculational reference light is assumed and, in particular, as means for increasing $\Delta C_n$, operations such as described below can be performed after adjusting an entire spectral power distribution so that $D_{uv}$ assumes a desired value. Operations which may be performed include replacing each light-emitting element with a material having a narrow full-width at half-maximum, forming a spectrum shape in which light-emitting elements are appropriately separated from each other, installing a filter that absorbs a desired wavelength in an illumination light source, a lighting fixture, or the like in order to form a concave and/or a convex shape in a spectrum of each light-emitting element, and additionally mounting a light-emitting element which performs emission at a narrower band in a light-emitting element.

As described above, the first to fifth inventions of the present invention reveals a primary illumination method or a primary light-emitting device for producing, with respect to a wide variety of illuminated objects with various hues, a color appearance or an object appearance which is as natural, vivid, highly visible, and comfortable as though perceived in a high-illuminance environment such as outdoors where illuminance exceeds 10000 lx, within an illuminance range of approximately 150 lx to approximately 5000 lx for which visual experiments have been carried out. In particular, the first to fifth inventions of the present invention provides respective hues with natural vividness and, at the same time, enables white objects to be perceived more whiter as compared to experimental reference light.

Means according to the embodiment of the first to fifth inventions of the present invention for producing a color appearance or an object appearance which is as natural, vivid, highly visible, and comfortable as perceived in a high-illuminance environment involve providing a light-emitting device setting $D_{uv}$ of light at a position of an illuminated object to within an appropriate range and, at the same time, setting indices related to a difference between color appearances of the 15 color samples when illumination by the light is assumed and color appearances when illumination by calculational reference light is assumed such as $|\Delta h_n|$, $SAT_{av}$, $\Delta C_n$, and $|\Delta C_{max}-\Delta C_{min}|$ to within appropriate ranges.

a light-emitting device used in the illumination method according to the fourth invention of the present invention can be configured in anyway as long as the device is capable of providing such illumination. For example, the device may be any of an individual illumination light source, an illuminating module in which at least one or more of the light sources is mounted on a heatsink or the like, and a lighting fixture in which a lens, a light-reflecting mechanism, a driving electric circuit, and the like are added to the light source or the module. Furthermore, the device may be a lighting system which is a collection of individual light sources, individual modules, individual fixtures, and the like and which at least has a mechanism for supporting such components.

In addition, the light-emitting device according to the first embodiment of the first invention of the present invention is a light-emitting device in which means for producing a color appearance or an object appearance which is as natural, vivid, highly visible, and comfortable as perceived in a high-illuminance environment involve setting $D_{uv}$ as obtained from a spectral power distribution of light emitted in a main radiant direction to within an appropriate range and, at the same time, setting the index $A_{cg}$ to within an appropriate range. For example, the device may be any of an individual illumination light source, an illuminating module in which at least one or more of the light sources is mounted on a heatsink or the like, and a lighting fixture in which a lens, a light-reflecting mechanism, a driving electric circuit, and the like are added to the light source or the module. Furthermore, the device may be a lighting system which is a collection of individual light sources, individual modules, individual fixtures, and the like and which at least has a mechanism for supporting such components.

In the second embodiment of the first, second, fourth and fifth inventions of the present invention, the control element is a passive element that itself has no amplifying function, and is not especially limited if the intensity modulation for each wavelength can be performed in an appropriate range on light that is emitted from a light-emitting element or a light-emitting device having relatively low level processing, in the main radiant direction, and can constitute a light-emitting device having high level processing. In the second embodiment of the first, second, fourth and fifth inventions of the present invention, this function may be expressed as an action of the control element on a light-emitting element. Examples of the control element according to the second embodiment of the first, second, fourth and fifth inventions of the present invention are passive devices, such as a reflection mirror, an optical filter and various types of optical lenses. The control element according to the second embodiment of the first, second, fourth and fifth inventions of the present invention may be an absorption material that is dispersed in the sealing material of the packaged LED, so as to perform intensity modulation for each wavelength in an appropriate range. However, a light-emitting element and a reflection mirror, an optical filter, an absorption material or the like that can perform intensity modulation, of which wavelength dependency is low, on the light emitted from a light-emitting device having relatively low level processing, are not included in the control element.

In the second embodiment of the first, second, fourth and fifth inventions of the present invention, the control element is for converting the spectral power distribution of the light emitted from the light-emitting element in the primary radiation direction into a spectral power distribution of the light that satisfies both Condition 1 and Condition 2 described above. Therefore the characteristics of the control element according to the second embodiment of the first, second, fourth and fifth inventions of the present invention depend on the spectral power distribution of the light emitted from the light-emitting element in the main radiant direction.

However, in some cases, certain characteristics of the light-emitting element are preferable to make a good appearance of colors of the light emitted from the light-emitting device to an even better appearance of colors.

In the second embodiment of the first, second, fourth and fifth inventions of the present invention, it is preferable that when $D_{uv}(\Phi_{elm})$ denotes $D_{uv}$ derived from the spectral power distribution of the light emitted from the light-emitting element in the main radiant direction, and $D_{uv}(\phi_{SSL})$ denotes $D_{uv}$ derived from the spectral power distribution of the light emitted from the light-emitting device in the main radiant direction, the control element satisfies $D_{uv}(\phi_{SSL}) < D_{uv}(\Phi_{elm})$.

The above mentioned Condition 1 specifies that $-0.0350 \leq D_{uv} \leq -0.0040$ is satisfied. $D_{uv}$ in this range is a very small value compared with a common LED illumination which is already on the market. Therefore it is preferable that the control element according to the second embodiment of the first, second, fourth and fifth inventions of the present invention has a characteristic to decrease $D_{uv}$ of the spectral power distribution. However even if the control element according to the second embodiment of the first, second, fourth and fifth inventions of the present invention increase $D_{uv}$, this is acceptable for certain if the light-emitting device satisfies Condition 1. For example, in the case of a light-emitting element with which appearance of colors becomes too strong (glaring), a good appearance of colors may be implemented by disposing a control element that increases $D_{uv}$.

There are various means of decreasing $D_{uv}$, from zero to an appropriate negative value as described above, but these means can also be used to select a suitable control element according to the second embodiment of the first, second, fourth and fifth inventions of the present invention. For example, a control element, that increases the relative emission intensity of the light-emitting element in a short wavelength region, increases the relative emission intensity of the light-emitting element in a long wavelength region, and decreases the relative emission intensity of the light-emitting element in an intermediate wavelength range, more specifically, a control element of which light transmittance is high in the short wavelength region and the long wavelength region, and of which light transmittance is low in the intermediate wavelength range can be selected. A control element that adds convex/concave portions to the spectral power distribution of the light emitted from the light-emitting element in the primary direction, can also be selected. To change $D_{uv}$ in a positive side, an operation the opposite of the above mentioned operation can be performed.

In the second embodiment of the first, second, fourth and fifth inventions of the present invention, it is preferable that when $A_{cg}(\Phi_{elm})$ denotes $A_{cg}$ derived from the spectral power distribution of the light emitted from the light-emitting element in the main radiant direction, and $A_{cg}(\phi_{SSL})$ denotes $A_{cg}$ derived from the spectral power distribution of the light emitted from the light-emitting device in the main radiant direction, the control element satisfies $A_{cg}(\phi_{SSL}) < A_{cg}(\Phi_{elm})$.

The above Condition 2 specifies that $-360 \leq A_{cg} \leq -10$ is satisfied. $A_{cg}$ in this range is a very small value compared with a common LED illumination which is already on the market. Therefore it is preferable that the control element according to the second embodiment of the first, second, fourth and fifth inventions of the present invention has a characteristic to decrease $A_{cg}$. However even if the control element according to the second embodiment of the first, second, fourth and fifth inventions of the present invention increases $A_{cg}$, it is acceptable for certain if the light-emitting device satisfies Condition 2. For example, in the case of a light-emitting element with which appearance of colors becomes too strong (glaring), a good appearance of colors may be implemented by disposing a control element that increases $A_{cg}$.

In the second embodiment of the first, second, fourth and fifth inventions of the present invention, it is preferable that when $SAT_{av}$ ($\Phi_{elm}$) denotes an average of the saturation difference derived from the spectral power distribution of the light emitted from the light-emitting element in the main radiant direction, and $SAT_{av}$ ($\phi_{SSL}$) denotes an average of the saturation difference derived from the spectral power distribution of the light emitted from the light-emitting device in the primary radiation direction, the control element satisfies $SAT_{av}$ ($\Phi_{elm}$)<$SAT_{av}$ ($\phi_{SSL}$).

If the average $SAT_{av}$ of the saturation difference increases within an appropriate range, appearance of colors becomes better, hence it is preferable that the control element according to the second embodiment of the first, second, fourth and fifth inventions of the present invention has a characteristic to increase $SAT_{av}$ when the illumination by the spectral power distribution is mathematically assumed. However even if the control element according to the second embodiment of the first, second, fourth and fifth inventions of the present invention decreases $SAT_{av}$, a good appearance of colors may be implemented by disposing a control element that decreases $SAT_{av}$ in the case of a light-emitting element with which appearance of colors becomes too strong (glaring).

In the second embodiment of the first, second, fourth and fifth inventions of the present invention, it is preferable that the control element absorbs or reflects light in the range of 380 nm≤λ(nm)≤780 nm.

In the second embodiment of the first, second, fourth and fifth inventions of the present invention, it is preferable that the control element includes a collection and/or diffusion function of light emitted from the light-emitting element, such as the function(s) of a concave lens, a convex lens and a Fresnel lens.

In the second embodiment of the first, second, fourth and fifth inventions of the present invention, it is preferable that the control element, which is often disposed close to the light-emitting element, is heat resistant. A control element that is heat resistant is, for example, a control element made of a heat resistant material, such as glass. In the control element according to the second embodiment of the first, second, fourth and fifth inventions of the present invention, a desired element may be doped and colored to implement desired reflection characteristics and transmission characteristics.

For the above mentioned control element according to the second embodiment of the first, second, fourth and fifth inventions of the present invention, an appropriate filter on the market that satisfies the requirements of the second embodiment of the first, second, fourth and fifth inventions of the present invention may be selected. A filter may be designed and fabricated such that the light emitted from the light-emitting device has a desired spectral power distribution.

For example, to fabricate a filter having a plurality of absorption peaks, a plurality of types of films having a characteristic to absorb a light in a certain wavelength region and films having a characteristic to absorb a light in other wavelength regions may be prepared, and a multilayer filter may be created by layering these films. Dielectric films may be stacked to create a multilayer film, so as to implement desired characteristics.

As described above, the second embodiment of the first, second, fourth and fifth inventions of the present invention discloses a method of implementing a light-emitting device with controlling secondary influence by light irradiation, even for illumination objects for which this secondary influence is of concern, while implementing a natural, vivid, highly visible and comfortable appearance of objects as if the objects are seen, in a high luminance environment exceeding 10000 lx, as outdoors, for various illumination objects having various hues, within a 150 lx to about 5000 lx luminous range. In particular, the second embodiment of the first, second, fourth and fifth inventions of the present invention provides respective hues with natural vividness and, at the same time, enables white objects to be perceived more whiter as compared to experimental reference light.

Especially the second embodiment of the first, second, fourth and fifth inventions of the present invention is an extremely practical technique to provide an illumination device that implements a good appearance of colors by a very simple method of disposing such a control element as a filter and reflection mirror, in an illumination device which is already on the market, and cannot implement a good appearance of colors.

In addition, the light-emitting device according to the second embodiment of the first invention of the present invention is a light-emitting device in which means for producing a color appearance which is as natural, vivid, highly visible, and comfortable as perceived in a high-illuminance environment involve setting $D_{uv}$ as obtained from a spectral power distribution of light emitted in a main radiant direction to within an appropriate range and, at the same time, setting the index $A_{cg}$ to within an appropriate range.

In other words, according to the second embodiment of the first invention of the present invention, intensity modulation is performed on an appropriate wavelength in the light emitted from the light-emitting element using a control element, and the light emitted from the light-emitting device satisfies Conditions 1 and 2, and as long as this requirement is satisfied, the light-emitting device may have any configuration. For example, the device may be any of an individual illumination light source, an illuminating module in which at least one or more of the light sources is mounted on a heatsink or the like, and a lighting fixture in which a lens, a light-reflecting mechanism, a driving electric circuit, and the like are added to the light source or the module. Furthermore, the device may be a lighting system which is a collection of individual light sources, individual modules, individual fixtures, and the like and which at least has a mechanism for supporting such components.

Means according to the illumination method of the second embodiment of the fourth invention of the present invention for producing a color appearance which is as natural, vivid, highly visible, and comfortable as perceived in a high-illuminance environment involve providing a light-emitting device setting $D_{uv}$ of light at a position of an illuminated object to within an appropriate range and, at the same time, setting indices related to a difference between color appearances of the 15 color samples when illumination by the light is assumed and color appearances when illumination by calculational reference light is assumed such as $|\Delta h_n|$, $SAT_{av}$, $\Delta C_n$, and $|\Delta C_{max} - \Delta C_{min}|$ to within appropriate ranges.

In other words, the illumination method according to the second embodiment of the fourth invention of the present invention is an illumination method in which light emitted from a semiconductor light-emitting element is included in the spectral power distribution as a constituent element and, at the same time, the illumination method according to the present invention is an illumination method of illuminating light in which $|\Delta h_n|$, $SAT_{av}$, $\Delta C_n$, $|\Delta C_{max} - \Delta C_{min}|$, $D_{uv}$, and the like are within appropriate ranges to an illuminated object, and a light-emitting device used in the illumination method according to the second embodiment of the fourth invention of the present invention can be configured in any way as long as the device is capable of providing such illumination. For example, the device may be any of an individual illumination light source, an illuminating module in which at least one or more of the light sources is mounted on a heatsink or the like, and a lighting fixture in which a lens, a light-reflecting mechanism, a driving electric circuit, and the like are added to the light source or the module. Furthermore, the device may be a lighting system which is a collection of individual light sources, individual modules, individual fixtures, and the like and which at least has a mechanism for supporting such components.

In the second embodiment of the first, second, fourth and fifth inventions of the present invention, the metrological, photometric and colormetric characteristics of the light-emitting devices of the examples are shown in Table 17 and Table 18, where appearance of colors of the illumination objects was generally very good.

The light-emitting device according to the second embodiment of the first invention of the present invention is an illumination device that can implement a good appearance of colors for an illumination device that cannot implement a good appearance of colors, by using a very simple method of disposing such a control element as a filter and a reflection mirror in this illumination device, and also an illumination device that can implement a good appearance of colors suitable to the taste of the user, for an illumination device which is already capable of implementing a good appearance of colors, by using a very simple method of disposing such a control element as a filter and a reflection mirror in this illumination device.

In order to achieve the objects described above, the present invention includes the following inventions.

[1-1]

A light-emitting device which includes M number of light-emitting areas (M is 2 or greater natural number), and incorporating a semiconductor light-emitting element as a light-emitting element in at least one of the light-emitting areas, wherein when $\phi_{SSL}(\lambda)$ (N is 1 to M) is a spectral power distribution of a light emitted from each light-emitting area in a main radiant direction of the light-emitting device, and $\phi_{SSL}(\lambda)$, which is a spectral power distribution of all the lights emitted from the light-emitting device in the radiant direction, is represented by

[Expression 52]

$$\phi_{SSL}(\lambda) = \sum_{N=1}^{M} \phi_{SSL}N(\lambda),$$

the light-emitting device includes light-emitting areas so that $\phi_{SSL}(\lambda)$ can satisfy the Conditions 1 to 2 by changing a luminous flux amount and/or a radiant flux amount emitted from the light-emitting areas.

Condition 1:

light emitted from the light-emitting device includes, in the main radiant direction thereof, light whose distance $D_{uvSSL}$ from a black-body radiation locus as defined by ANSI C78.377 satisfies $-0.0350 \leq D_{uvSSL} \leq -0.0040$, Condition 2:

if a spectral power distribution of light emitted from the light-emitting device in the radiant direction is denoted by $\phi_{SSL}(\lambda)$, a spectral power distribution of a reference light that is selected according to $T_{SSL}$ (K) of the light emitted from the light-emitting device in the radiant direction is denoted by $\phi_{ref}(\lambda)$, tristimulus values of the light emitted from the light-emitting device in the radiant direction are denoted by $(X_{SSL}, Y_{SSL}, Z_{SSL})$, and tristimulus values of the reference light that is selected according to $T_{SSL}$ (K) of the light emitted from the light-emitting device in the radiant direction are denoted by $(X_{ref}, Y_{ref}, Z_{ref})$ and if a normalized spectral power distribution $S_{SSL}(\lambda)$ of light emitted from the light-emitting device in the radiant direction, a normalized spectral power distribution $S_{ref}(\lambda)$ of a reference light that is selected according to $T_{SSL}$ (K) of the light emitted from the light-emitting device in the radiant direction, and a difference $\Delta S(\lambda)$ between these normalized spectral power distributions are respectively defined as $$S_{SSL}(\lambda) = \phi_{SSL}(\lambda)/Y_{SSL},$$

$$S_{ref}(\lambda) = \phi_{ref}(\lambda)/Y_{ref}$$

and $$\Delta S(\lambda) = S_{ref}(\lambda) - S_{SSL}(\lambda) \text{ and}$$

an index $A_{cg}$ represented by the following Formula (1) satisfies $-360 \leq A_{cg} \leq -10$, in the case when a wavelength that produces a longest wavelength local maximum value of $S_{SSL}(\lambda)$ in a wavelength range from 380 nm to 780 nm is denoted by $\lambda_R$ (nm), and a wavelength $\Lambda 4$ that assumes $S_{SSL}(\lambda_R)/2$ exists on a longer wavelength-side of $\lambda_R$, and an index $A_{cg}$ represented by the following Formula (2) satisfies $-360 \leq A_{cg} \leq -10$, in the case when a wavelength that produces a longest wavelength local maximum value of $S_{SSL}(\lambda)$ in a wavelength range from 380 nm to 780 nm is denoted by $\lambda_R$ (nm), and a wavelength $\Lambda 4$ that assumes $S_{SSL}(\lambda_R)/2$ does not exist on a longer wavelength-side of $\lambda_R$,

[Expression 53]

$$A_{cg} = \int_{380}^{495} \Delta S(\lambda) d\lambda + \int_{495}^{590} (-\Delta S(\lambda)) d\lambda + \int_{590}^{\Lambda 4} \Delta S(\lambda) d\lambda \quad (1)$$

[Expression 54]

$$A_{cg} = \int_{380}^{495} \Delta S(\lambda) d\lambda + \int_{495}^{590} (-\Delta S(\lambda)) d\lambda + \int_{590}^{780} \Delta S(\lambda) d\lambda \quad (2).$$

[1-2]

The light-emitting device according to [1-1], wherein all of $\phi_{SSL}N(\lambda)$ (N is 1 to M) satisfies the Condition 1 and Condition 2.

[1-3]

The light-emitting device according to [1-1] or [1-2], wherein at least one light-emitting area of the M number of light-emitting areas has wiring that allows the light-emitting area to be electrically driven independently from other light-emitting areas.

[1-4]

The light-emitting device according to [1-3], wherein all the M numbers of light-emitting areas each have wiring that allows the light-emitting area to be electrically driven independently from other light-emitting areas.

[1-5]

The light-emitting device according to any one of [1-1] to [1-4], wherein at least one selected from the group consisting of the index $A_{cg}$ represented by the Formula (1) or (2), the correlated color temperature $T_{SSL}$(K) and the distance $D_{uvSSL}$ from the black-body radiation locus can be changed.

[1-6]

The light-emitting device according to [1-5], wherein a luminous flux and/or a radiant flux emitted from the light-emitting device in the main radiant direction can be independently controlled when at least one selected from the group consisting of the index $A_{cg}$ represented by the Formula (1) or (2), the correlated color temperature $T_{SSL}$(K) and the distance $D_{uvSSL}$ from the black-body radiation locus is changed.

[1-7]

The light-emitting device according to any one of [1-1] to [1-6], wherein a maximum distance L between two arbitrary points on a virtual outer periphery enveloping the entire light-emitting areas closest to each other, is 0.4 mm or more and 200 mm or less.

[1-8]

The light-emitting device according to any one of [1-1] to [1-7], including the light-emitting areas that allow $\phi_{SSL}(\lambda)$ to further satisfy the following Conditions 3 to 4 by changing a luminous flux amount and/or a radiant flux amount emitted from the light-emitting areas:

Condition 3:

if an a* value and a b* value in CIE 1976 L*a*b* color space of 15 Munsell renotation color samples from #01 to #15 listed below when mathematically assuming illumination by the light emitted in the radiant direction are respectively denoted by $a^*_{nSSL}$ and $b^*_{nSSL}$ (where n is a natural number from 1 to 15), and if an a* value and a b* value in CIE 1976 L*a*b* color space of the 15 Munsell renotation color samples when mathematically assuming illumination by a reference light that is selected according to a correlated color temperature $T_{SSL}$ (K) of the light emitted in the radiant direction are respectively denoted by $a^*_{nref}$ and $b^*_{nref}$ (where n is a natural number from 1 to 15), then each saturation difference $\Delta C_n$ satisfies $-3.8 \leq \Delta C_n \leq 18.6$ (where n is a natural number from 1 to 15), and an average saturation difference represented by formula (3) below satisfies formula (4) below and

[Expression 55]

$$\frac{\sum_{n=1}^{15} \Delta C_n}{15} \quad (3)$$

[Expression 56]

$$1.0 \leq \frac{\sum_{n=1}^{15} \Delta C_n}{15} \leq 7.0 \quad (4)$$

if a maximum saturation difference value is denoted by $\Delta C_{max}$ and a minimum saturation difference value is denoted by $\Delta C_{min}$, then a difference $|\Delta C_{max} - \Delta C_{min}|$ between the maximum saturation difference value and the minimum saturation difference value satisfies $2.8 \leq |\Delta C_{max} - \Delta C_{min}| \leq 19.6$, where $\Delta C_n = \sqrt{(a^*_{nSSL})^2 + (b^*_{nSSL})^2} - \sqrt{(a^*_{nref})^2 + (b^*_{nref})^2}$ with the 15 Munsell renotation color samples being:

| | |
|---|---|
| #01 | 7.5P 4/10 |
| #02 | 10PB 4/10 |
| #03 | 5PB 4/12 |
| #04 | 7.5B 5/10 |
| #05 | 10BG 6/8 |
| #06 | 2.5BG 6/10 |
| #07 | 2.5G 6/12 |
| #08 | 7.5GY 7/10 |
| #09 | 2.5GY 8/10 |
| #10 | 5Y 8.5/12 |
| #11 | 10YR 7/12 |
| #12 | 5YR 7/12 |
| #13 | 10R 6/12 |
| #14 | 5R 4/14 |
| #15 | 7.5RP 4/12 |

Condition 4:

if hue angles in CIE 1976 L*a*b* color space of the 15 Munsell renotation color samples when mathematically assuming illumination by the light emitted in the radiant direction are denoted by $\theta_{nSSL}$ (degrees) (where n is a natural number from 1 to 15), and if hue angles in a CIE 1976 L*a*b* color space of the 15 Munsell renotation color samples when mathematically assuming illumination by a reference light that is selected according to the correlated color temperature $T_{SSL}$ (K) of the light emitted in the radiant direction are denoted by $\theta_{nref}$ (degrees) (where n is a natural number from 1 to 15), then an absolute value of each difference in hue angles $|\Delta h_n|$ satisfies $0 \leq |\Delta h_n| \leq 9.0$ (degree) (where n is a natural number from 1 to 15), where $\Delta h_n = \theta_{nSSL} - \theta_{nref}$.

[1-9]

The light-emitting device according to any one of [1-1] to [1-8], wherein a luminous efficacy of radiation K (lm/W) in a wavelength range from 380 nm to 780 nm as derived from the spectral power distribution $\phi_{SSL}(\lambda)$ of light emitted from the light-emitting device in the radiant direction satisfies $180(lm/W) \leq K(lm/W) \leq 320(lm/W)$.

[1-10]

The light-emitting device according to any one of [1-1] to [1-9], wherein a correlated color temperature $T_{SSL}$ (K) of light emitted from the light-emitting device in the radiant direction satisfies $2550(K) \leq T_{SSL}(K) \leq 5650(K)$.

[1-11]

A method for designing a light-emitting device which includes M number of light-emitting areas (M is 2 or greater natural number), and incorporating a semiconductor light-emitting element as a light-emitting element in at least one of the light-emitting areas, the method comprising designing the light-emitting areas such that, when $\phi_{SSL}(\lambda)$ (N is 1 to M) is a spectral power distribution of a light emitted from each light-emitting area in a main radiant direction of the light-emitting device, and $\phi_{SSL}(\lambda)$, which is a spectral power distribution of all the lights emitted from the light-emitting device in the radiant direction, is represented by

[Expression 57]

$$\phi_{SSL}(\lambda) = \sum_{N=1}^{M} \phi_{SSL}N(\lambda),$$

$\phi_{SSL}(\lambda)$ satisfies the following Conditions 1 to 2 by changing a luminous flux amount and/or a radiant flux amount emitted from the light-emitting areas:
Condition 1:
light emitted from the light-emitting device includes, in the main radiant direction thereof, light whose distance $D_{uvSSL}$ from a black-body radiation locus as defined by ANSI C78.377 satisfies $-0.0350 \leq D_{uvSSL} \leq -0.0040$,
Condition 2:
if a spectral power distribution of light emitted from the light-emitting device in the radiant direction is denoted by $\phi_{SSL}(\lambda)$, a spectral power distribution of a reference light that is selected according to $T_{SSL}$ (K) of the light emitted from the light-emitting device in the radiant direction is denoted by $\phi_{ref}(\lambda)$, tristimulus values of the light emitted from the light-emitting device in the radiant direction are denoted by $(X_{SSL}, Y_{SSL}, Z_{SSL})$, and tristimulus values of the reference light that is selected according to $T_{SSL}$ (K) of the light emitted from the light-emitting device in the radiant direction are denoted by $(X_{ref}, Y_{ref}, Z_{ref})$ and
if a normalized spectral power distribution $S_{SSL}(\lambda)$ of light emitted from the light-emitting device in the radiant direction, a normalized spectral power distribution $S_{ref}(\lambda)$ of a reference light that is selected according to $T_{SSL}$ (K) of the light emitted from the light-emitting device in the radiant direction, and a difference $\Delta S(\lambda)$ between these normalized spectral power distributions are respectively defined as $$S_{SSL}(\lambda) = \phi_{SSL}(\lambda)/Y_{SSL},$$

$$S_{ref}(\lambda) = \phi_{ref}(\lambda)/Y_{ref}$$

$$\Delta S(\lambda) = S_{ref}(\lambda) - S_{SSL}(\lambda) \text{ and}$$

an index $A_{cg}$ represented by the following Formula (1) satisfies $-360 \leq A_{cg} \leq -10$, in the case when a wavelength that produces a longest wavelength local maximum value of $S_{SSL}(\lambda)$ in a wavelength range from 380 nm to 780 nm is denoted by $\lambda_R$ (nm), and a wavelength $\Lambda 4$ that assumes $S_{SSL}(\lambda_R)/2$ exists on a longer wavelength-side of $\lambda_R$, and
an index $A_{cg}$ represented by the following Formula (2) satisfies $-360 \leq A_{cg} \leq -10$, in the case when a wavelength that produces a longest wavelength local maximum value of $S_{SSL}(\lambda)$ in a wavelength range from 380 nm to 780 nm is denoted by $\lambda_R$ (nm), and a wavelength $\Lambda 4$ that assumes $S_{SSL}(\lambda_R)/2$ does not exist on a longer wavelength-side of $\lambda_R$,

[Expression 58]

$$A_{cg} = \int_{380}^{495} \Delta S(\lambda) d\lambda + \int_{495}^{590} (-\Delta S(\lambda)) d\lambda + \int_{590}^{\Lambda 4} \Delta S(\lambda) d\lambda \quad (1)$$

[Expression 59]

$$A_{cg} = \int_{380}^{495} \Delta S(\lambda) d\lambda + \int_{495}^{590} (-\Delta S(\lambda)) d\lambda + \int_{590}^{780} \Delta S(\lambda) d\lambda \quad (2).$$

[1-12]
The method for designing a light-emitting device according to [1-11], wherein
all of $\phi_{SSL}N(\lambda)$ (N is 1 to M) satisfies the Condition 1 and Condition 2.
[1-13]
The method for designing a light-emitting device according to [1-11] or [1-12], wherein
at least one light-emitting area of the M number of light-emitting areas has wiring that allows the light-emitting area to be electrically driven independently from other light-emitting areas.
[1-14]
The method for designing a light-emitting device according to [1-13], wherein
all the M numbers of light-emitting areas each have wiring that allows the light-emitting area to be electrically driven independently from other light-emitting areas.
[1-15]
The method for designing a light-emitting device according to any one of [1-11] to [1-14], wherein
at least one selected from the group consisting of the index $A_{cg}$ represented by the Formula (1) or (2), the correlated color temperature $T_{SSL}$(K) and the distance $D_{uvSSL}$ from the black-body radiation locus can be changed.
[1-16]
The method for designing a light-emitting device according to [1-15], wherein
a luminous flux and/or a radiant flux emitted from the light-emitting device in the main radiant direction can be independently controlled when at least one selected from the group consisting of the index $A_{cg}$ represented by the Formula (1) or (2), the correlated color temperature $T_{SSL}$(K) and the distance $D_{uvSSL}$ from the black-body radiation locus is changed.
[1-17]
The method for designing a light-emitting device according to any one of [1-11] to [1-16], wherein
a maximum distance L between two arbitrary points on a virtual outer periphery enveloping the entire light-emitting areas closest to each other, is 0.4 mm or more and 200 mm or less.
[1-18]
The method for designing a light-emitting device according to any one of [1-11] to [1-17],
further comprising allowing $\phi_{SSL}(\lambda)$ to further satisfy the following Conditions 3 to 4 by changing a luminous flux amount and/or a radiant flux amount emitted from the light-emitting areas:
Condition 3:
if an a* value and a b* value in CIE 1976 L*a*b* color space of 15 Munsell renotation color samples from #01 to #15 listed below when mathematically assuming illumination by the light emitted in the radiant direction are respectively denoted by $a^*_{nSSL}$ and $b^*_{nSSL}$ (where n is a natural number from 1 to 15), and
if an a* value and a b* value in CIE 1976 L*a*b* color space of the 15 Munsell renotation color samples when mathematically assuming illumination by a reference light that is selected according to a correlated color temperature T (K) of the light emitted in the radiant direction are respectively denoted by $a^*_{nref}$ and $b^*_{nref}$ (where n is a natural number from 1 to 15), then each saturation difference $\Delta C_n$ satisfies
$-3.8 \leq \Delta C_n \leq 18.6$ (where n is a natural number from 1 to 15),
an average saturation difference represented by formula (3) below satisfies formula (4) below and

[Expression 60]

$$\frac{\sum_{n=1}^{15} \Delta C_n}{15} \quad (3)$$

[Expression 61]

$$1.0 \leq \frac{\sum_{n=1}^{15} \Delta C_n}{15} \leq 7.0, \quad (4)$$

if a maximum saturation difference value is denoted by $\Delta C_{max}$ and a minimum saturation difference value is denoted by $\Delta C_{min}$, then a difference $|\Delta C_{max} - \Delta C_{min}|$ between the maximum saturation difference value and the minimum saturation difference value satisfies $$2.8 \leq |\Delta C_{max} - \Delta C_{min}| \leq 19.6,$$

where $\Delta C_n = \sqrt{\{(a^*_{nSSL})^2 + (b^*_{nSSL})^2\}} - \sqrt{\{(a^*_{nref})^2 + (b^*_{nref})^2\}}$
with the 15 Munsell renotation color samples being:

| | |
|---|---|
| #01 | 7.5P 4/10 |
| #02 | 10PB 4/10 |
| #03 | 5PB 4/12 |
| #04 | 7.5B 5/10 |
| #05 | 10BG 6/8 |
| #06 | 2.5BG 6/10 |
| #07 | 2.5G 6/12 |
| #08 | 7.5GY 7/10 |
| #09 | 2.5GY 8/10 |
| #10 | 5Y 8.5/12 |
| #11 | 10YR 7/12 |
| #12 | 5YR 7/12 |
| #13 | 10R 6/12 |
| #14 | 5R 4/14 |
| #15 | 7.5RP 4/12 |

Condition 4:

if hue angles in CIE 1976 L*a*b* color space of the 15 Munsell renotation color samples when mathematically assuming illumination by the light emitted in the radiant direction are denoted by $\theta_{nSSL}$ (degrees) (where n is a natural number from 1 to 15), and if hue angles in a CIE 1976 L*a*b* color space of the 15 Munsell renotation color samples when mathematically assuming illumination by a reference light that is selected according to the correlated color temperature $T_{SSL}$ (K) of the light emitted in the radiant direction are denoted by $\theta_{nref}$ (degrees) (where n is a natural number from 1 to 15), then an absolute value of each difference in hue angles $|\Delta h_n|$ satisfies $0 \leq |\Delta h_n| \leq 9.0$ (degree) (where n is a natural number from 1 to 15), where $\Delta h_n = \theta_{nSSL} - \theta_{nref}$.

[1-19]

The method for designing a light-emitting device according to any one of [1-11] to [1-18], wherein a luminous efficacy of radiation K (lm/W) in a wavelength range from 380 nm to 780 nm as derived from the spectral power distribution $\phi_{SSL}(\lambda)$ of light emitted from the light-emitting device in the radiant direction satisfies $$180(lm/W) \leq K(lm/W) \leq 320(lm/W).$$

[1-20]

The method for designing a light-emitting device according to any one of [1-11] to [1-19], wherein the correlated color temperature $T_{SSL}$ (K) of light emitted from the light-emitting device in the radiant direction satisfies $$2550(K) \leq T_{SSL}(K) \leq 5650(K).$$

[1-21]

A method for driving a light-emitting device which includes M number of light-emitting areas (M is 2 or greater natural number), and has a semiconductor light-emitting element as a light-emitting element in at least one of the light-emitting areas, the method comprising supplying power to each light-emitting area such that, when $\phi_{SSL}(\lambda)$ (N is 1 to M) is a spectral power distribution of a light emitted from each light-emitting area in a main radiant direction of the light-emitting device, and $\phi_{SSL}(\lambda)$ which is a spectral power distribution of all the lights emitted from the light-emitting device in the radiant direction, is represented by

[Expression 62]

$$\phi_{SSL}(\lambda) = \sum_{N=1}^{M} \phi_{SSL}N(\lambda),$$

$\phi_{SSL}(\lambda)$ satisfies the following Conditions 1 to 2:
Condition 1:

light emitted from the light-emitting device includes, in the main radiant direction thereof, light whose distance $D_{uvSSL}$ from a black-body radiation locus as defined by ANSI C78.377 satisfies $-0.0350 \leq D_{uvSSL} \leq -0.0040$,
Condition 2:

if a spectral power distribution of light emitted from the light-emitting device in the radiant direction is denoted by $\phi_{SSL}(\lambda)$, a spectral power distribution of a reference light that is selected according to $T_{SSL}$ (K) of the light emitted from the light-emitting device in the radiant direction is denoted by $\phi_{ref}(\lambda)$, tristimulus values of the light emitted from the light-emitting device in the radiant direction are denoted by $(X_{SSL}, Y_{SSL}, Z_{SSL})$, and tristimulus values of the reference light that is selected according to $T_{SSL}$ (K) of the light emitted from the light-emitting device in the radiant direction are denoted by $(X_{ref}, Y_{ref}, Z_{ref})$, and if a normalized spectral power distribution $S_{SSL}(\lambda)$ of light emitted from the light-emitting device in the radiant direction, a normalized spectral power distribution $S_{ref}(\lambda)$ of a reference light that is selected according to $T_{SSL}$ (K) of the light emitted from the light-emitting device in the radiant direction, and a difference $\Delta S(\lambda)$ between these normalized spectral power distributions are respectively defined as $$S_{SSL}(\lambda) = \phi_{SSL}(\lambda)/Y_{SSL},$$

$$S_{ref}(\lambda) = \phi_{ref}(\lambda)/Y_{ref}$$

$$\Delta S(\lambda) = S_{ref}(\lambda) - S_{SSL}(\lambda) \text{ and}$$

an index $A_{cg}$ represented by the following Formula (1) satisfies $-360 \leq A_{cg} \leq -10$, in the case when a wavelength that produces a longest wavelength local maximum value of $S_{SSL}(\lambda)$ in a wavelength range from 380 nm to 780 nm is denoted by $\lambda_R$ (nm), and a wavelength $\Lambda 4$ that assumes $S_{SSL}(\lambda_R)/2$ exists on a longer wavelength-side of $\lambda_R$,

[Expression 63]

$$A_{cg} = \int_{380}^{495} \Delta S(\lambda) d\lambda + \int_{495}^{590} (-\Delta S(\lambda)) d\lambda + \int_{590}^{\Lambda 4} \Delta S(\lambda) d\lambda \quad (1),$$

and an index $A_{cg}$ represented by the following Formula (2) satisfies $-360 \leq A_{cg} - 10$, in the case when a wavelength that produces a longest wavelength local maximum value of $S_{SSL}(\lambda)$ in a wavelength range from 380 nm to 780 nm is denoted by $\lambda_R$ (nm), and a wavelength $\lambda4$ that assumes $S_{SSL}(\lambda_R)/2$ does not exist on a longer wavelength-side of $\lambda_R$,

[Expression 64]

$$A_{cg} = \int_{380}^{495} \Delta S(\lambda) d\lambda + \int_{495}^{590} (-\Delta S(\lambda)) d\lambda + \int_{590}^{780} \Delta S(\lambda) d\lambda \quad (2).$$

[1-22]

The method for driving a light-emitting device according to [1-21], wherein power is supplied to the light-emitting areas so that all of $\phi_{SSL}N(\lambda)$ (N is 1 to M) satisfies the Condition 1 and Condition 2.

[1-23]

The method for driving a light-emitting device according to [1-21] or [1-22], wherein at least one light-emitting area of the M number of light-emitting areas is electrically driven independently from other light-emitting areas.

[1-24]

The method for driving a light-emitting device according to any one of [1-21] to [1-23], wherein all the M number of light-emitting areas are electrically driven independently from other light-emitting areas.

[1-25]

The method for driving a light-emitting device according to any one of [1-21] to [1-24], wherein at least one selected from the group consisting of the index $A_{cg}$ represented by the Formula (1) or (2), the correlated color temperature $T_{SSL}(K)$ and the distance $D_{uvSSL}$ from the black-body radiation locus is changed.

[1-26]

The method for driving a light-emitting device according to [1-25], wherein a luminous flux and/or a radiant flux emitted from the light-emitting device in the main radiant direction is unchanged when at least one selected from the group consisting of the index $A_{cg}$ represented by the Formula (1) or (2), the correlated color temperature $T_{SSL}(K)$ and the distance $D_{uvSSL}$ from the black-body radiation locus is changed.

[1-27]

The method for driving a light-emitting device according to [1-25], wherein a luminous flux and/or a radiant flux emitted from the light-emitting device in the main radiant direction is decreased when the index $A_{cg}$ represented by the Formula (1) or (2) is decreased.

[1-28]

The method for driving a light-emitting device according to [1-25], wherein a luminous flux and/or a radiant flux emitted from the light-emitting device in the main radiant direction is increased when the correlated color temperature $T_{SSL}(K)$ is increased.

[1-29]

The method for driving a light-emitting device according to [1-25], wherein a luminous flux and/or a radiant flux emitted from the light-emitting device in the main radiant direction is decreased when the distance $D_{uvSSL}$ from the black-body radiation locus is decreased.

[1-30]

The method for driving a light-emitting device according to any one of [1-21] to [1-29], further comprising supplying power such that $\phi_{SSL}(\lambda)$ further satisfies the following Condition 3 and Condition 4:

Condition 3:

if an a* value and a b* value in CIE 1976 L*a*b* color space of 15 Munsell renotation color samples from #01 to #15 listed below when mathematically assuming illumination by the light emitted in the radiant direction are respectively denoted by $a^*_{nSSL}$ and $b^*_{nSSL}$ (where n is a natural number from 1 to 15), and if an a* value and a b* value in CIE 1976 L*a*b* color space of the 15 Munsell renotation color samples when mathematically assuming illumination by a reference light that is selected according to a correlated color temperature $T_{SSL}$ (K) of the light emitted in the radiant direction are respectively denoted by $a^*_{nref}$ and $b^*_{nref}$ (where n is a natural number from 1 to 15), then each saturation difference $\Delta C_n$ satisfies $-3.8 \leq \Delta C_n \leq 18.6$ (where n is a natural number from 1 to 15), an average saturation difference represented by formula (3) below satisfies formula (4) below and

[Expression 65]

$$\frac{\sum_{n=1}^{15} \Delta C_n}{15} \quad (3)$$

[Expression 66]

$$1.0 \leq \frac{\sum_{n=1}^{15} \Delta C_n}{15} \leq 7.0, \quad (4)$$

if a maximum saturation difference value is denoted by $\Delta C_{max}$ and a minimum saturation difference value is denoted by $\Delta C_{min}$, then a difference $|\Delta C_{max} - \Delta C_{min}|$ between the maximum saturation difference value and the minimum saturation difference value satisfies $2.8 \leq |\Delta C_{max} - \Delta C_{min}| \leq 19.6$, where $\Delta C_n = \sqrt{\{(a^*_{nSSL})^2 + (b^*_{nSSL})^2\}} - \sqrt{\{(a^*_{nref})^2 + (b^*_{nref})^2\}}$ with the 15 Munsell renotation color samples being:

| | |
|---|---|
| #01 | 7.5P 4/10 |
| #02 | 10PB 4/10 |
| #03 | 5PB 4/12 |
| #04 | 7.5B 5/10 |
| #05 | 10BG 6/8 |
| #06 | 2.5BG 6/10 |
| #07 | 2.5G 6/12 |
| #08 | 7.5GY 7/10 |
| #09 | 2.5GY 8/10 |
| #10 | 5Y 8.5/12 |
| #11 | 10YR 7/12 |
| #12 | 5YR 7/12 |
| #13 | 10R 6/12 |
| #14 | 5R 4/14 |
| #15 | 7.5RP 4/12 |

Condition 4:

if hue angles in CIE 1976 L*a*b* color space of the 15 Munsell renotation color samples when mathematically assuming illumination by the light emitted in the radiant direction are denoted by $\theta_{nSSL}$ (degrees) (where n is a natural number from 1 to 15), and if hue angles in a CIE 1976 L*a*b* color space of the 15 Munsell renotation color samples when mathematically assuming illumination by a reference light that is selected according to the correlated color temperature $T_{SSL}$ (K) of the light emitted in the radiant direction are denoted by $\theta_{nref}$ (degrees) (where n is a natural number from 1 to 15), then an absolute value of each difference in hue angles $|\Delta h_n|$ satisfies $0 \leq |\Delta h_n| \leq 9.0$ (degree) (where n is a natural number from 1 to 15), where $\Delta h_n = \theta_{nSSL} - \theta_{nref}$.

[1-31]

An illumination method comprising:

illuminated objects preparation step of preparing illuminated objects; and an illumination step of illuminating the objects by light emitted from a light-emitting devices which includes M number of light-emitting areas (M is 2 or greater natural number), and has a semiconductor light-emitting element as a light-emitting element in at least one of the light-emitting areas, in the illumination step, when light emitted from the light-emitting devices illuminate the objects, the objects are illuminated so that the light measured at a position of the objects satisfies <1>, <2> and <3> below:

<1> a distance $D_{uvSSL}$ from a black-body radiation locus as defined by ANSI C78.377 of the light measured at the position of the objects satisfies $-0.0350 \leq D_{uvSSL} \leq -0.0040$;

<2> if an a* value and a b* value in CIE 1976 L*a*b* color space of 15 Munsell renotation color samples from #01 to #15 listed below when mathematically assuming illumination by the light measured at the position of the objects are respectively denoted by $a^*_{nSSL}$ and $b^*_{nSSL}$ (where n is a natural number from 1 to 15), and if an a* value and a b* value in CIE 1976 L*a*b* color space of the 15 Munsell renotation color samples when mathematically assuming illumination by a reference light that is selected according to a correlated color temperature $T_{SSL}$ (K) of the light measured at the position of the objects are respectively denoted by $a^*_{nref}$ and $b^*_{nref}$ (where n is a natural number from 1 to 15), then each saturation difference $\Delta C_n$ satisfies $-3.8 \leq \Delta C_n \leq 18.6$ (where n is a natural number from 1 to 15), and an average saturation difference represented by formula (3) below satisfies formula (4) below and

[Expression 67]

$$\frac{\sum_{n=1}^{15} \Delta C_n}{15} \quad (3)$$

[Expression 68]

$$1.0 \leq \frac{\sum_{n=1}^{15} \Delta C_n}{15} \leq 7.0, \quad (4)$$

if a maximum saturation difference value is denoted by $\Delta C_{max}$ and a minimum saturation difference value is denoted by $\Delta C_{min}$, then a difference $|\Delta C_{max} - \Delta C_{min}|$ between the maximum saturation difference value and the minimum saturation difference value satisfies $2.8 \leq |\Delta C_{max} - \Delta C_{min}| \leq 19.6$, where $\Delta C_n = \sqrt{\{(a^*_{nSSL})^2 + (b^*_{nSSL})^2\}} - \sqrt{\{(a^*_{nref})^2 + (b^*_{nref})^2\}}$ with the 15 Munsell renotation color samples being:

| #01 | 7.5P 4/10 |
|---|---|
| #02 | 10PB 4/10 |
| #03 | 5PB 4/12 |
| #04 | 7.5B 5/10 |
| #05 | 10BG 6/8 |
| #06 | 2.5BG 6/10 |
| #07 | 2.5G 6/12 |
| #08 | 7.5GY 7/10 |
| #09 | 2.5GY 8/10 |
| #10 | 5Y 8.5/12 |
| #11 | 10YR 7/12 |
| #12 | 5YR 7/12 |
| #13 | 10R 6/12 |
| #14 | 5R 4/14 |
| #15 | 7.5RP 4/12 |

<3> if hue angles in CIE 1976 L*a*b* color space of the 15 Munsell renotation color samples when mathematically assuming illumination by the light measured at the position of the objects are denoted by $\theta_{nSSL}$ (degrees) (where n is a natural number from 1 to 15), and if hue angles in CIE 1976 L*a*b* color space of the 15 Munsell renotation color samples when mathematically assuming illumination by a reference light that is selected according to the correlated color temperature $T_{SSL}$ (K) of the light measured at the position of the objects are denoted by $\theta_{nref}$ (degrees) (where n is a natural number from 1 to 15), then an absolute value of each difference in hue angles $|\Delta h_n|$ satisfies $0 \leq |\Delta h_n| \leq 9.0$ (degree) (where n is a natural number from 1 to 15), here $\Delta h_n = \theta_{nSSL} - \theta_{nref}$.

[1-32]

The illumination method according to [1-31], wherein when $\phi_{SSL}N(\lambda)$ (N is 1 to M) is a spectral power distribution of a light which has been emitted from each light-emitting element and has reached the position of the objects, and $\phi_{SSL}(\lambda)$ is a spectral power distribution of the light measured at the position of the objects is represented by

[Expression 69]

$$\phi_{SSL}(\lambda) = \sum_{N=1}^{M} \phi_{SSL}N(\lambda),$$

all the $\phi_{SSL}N(\lambda)$ (N is 1 to M) can satisfy the <1>, <2> and <3>.

[1-33]

The illumination method according to [1-31] or [1-32], wherein at least one light-emitting area of the M number of light-emitting areas is electrically driven independently from other light-emitting areas for performing the illumination.

[1-34]

The illumination method according to [1-33], wherein all the M number of light-emitting areas are electrically driven independently from other light-emitting areas.

[1-35]

The illumination method according to any one of [1-31] to [1-34], wherein
at least one selected from the group consisting of an average saturation difference represented by the formula (3),

[Expression 70]

$$\frac{\sum_{n=1}^{15} \Delta C_n}{15},$$

the correlated color temperature $T_{SSL}(K)$, and the distance $D_{uvSSL}$ from the black-body radiation locus is changed.

[1-36]

The illumination method according to [1-35], wherein
the luminance in the object is independently controlled when at least one selected from the group of an average saturation difference represented by the formula (3),

[Expression 71]

$$\frac{\sum_{n=1}^{15} \Delta C_n}{15},$$

the correlated color temperature $T_{SSL}(K)$, and the distance $D_{uvSSL}$ from the black-body radiation locus is changed.

[1-37]

The illumination method according to [1-36], wherein
the luminance in the object is unchangeable when at least one selected from the group of an average saturation difference represented by the formula (3),

[Expression 72]

$$\frac{\sum_{n=1}^{15} \Delta C_n}{15},$$

the correlated color temperature $T_{SSL}(K)$, and the distance $D_{uvSSL}$ from the black-body radiation locus is changed.

[1-38]

The illumination method according to [1-36], wherein
the luminance in the object is decreased when the average saturation difference represented by the formula (3),

[Expression 73]

$$\frac{\sum_{n=1}^{15} \Delta C_n}{15}$$

is increased.

[1-39]

The illumination method according to [1-36], wherein
the illuminance in the object is increased when the correlated color template $T_{SSL}(K)$ is increased.

[1-40]

The illumination method according to [1-36], wherein
the luminance in the object is decreased when the distance $D_{uvSSL}$ from the black-body radiation locus is decreased.

[1-41]

The illumination method according to any one of [1-31] to [1-40], wherein
if a maximum distance between two arbitrary points on a virtual outer periphery enveloping the entire light-emitting areas closest to each other is denoted by L, and a distance between the light-emitting device and the illumination object is denoted by H,
the distance H is set so as to satisfy $5 \times L \leq H \leq 500 \times L$.

[2-1]

A light-emitting device incorporating a light-emitting element including a semiconductor light-emitting element, and a control element, wherein
if a wavelength is denoted by λ(nm), a spectral power distribution of a light emitted from the light-emitting element in a main radiant direction is denoted by $\Phi_{elm}(\lambda)$, and a spectral power distribution of a light emitted from the light-emitting device in the main radiant direction is denoted by $\phi_{SSL}(\lambda)$ $\Phi_{elm}(\lambda)$ does not satisfy at least one of the following Condition 1 and Condition 2, and $\phi_{SSL}(\lambda)$ satisfies both the following Condition 1 and Condition 2:

a light, of which distance $D_{uv}$ from a black-body radiation locus as defined by ANSI C78.377 in a spectral power distribution of the target light satisfies $-0.0350 \leq D_{uv} -0.0040$, is included;

Condition 2:

if a spectral power distribution of the target light is denoted by $\phi(\lambda)$, a spectral power distribution of a reference light that is selected according to T (K) of the target light is denoted by $\phi_{ref}(\lambda)$, tristimulus values of the target light are denoted by (X, Y, Z), and tri stimulus values of the reference light that is selected according to T (K) of the light emitted from the light-emitting device in the radiant direction are denoted by $(X_{ref}, Y_{ref}, Z_{ref})$ and if a normalized spectral power distribution S (λ) of target light, a normalized spectral power distribution $S_{ref}(\lambda)$ of a reference light, and a difference ΔS (λ) between these normalized spectral power distributions are respectively defined as $S(\lambda) = \phi(\lambda)/Y$ $S_{ref}(\lambda) = \phi_{ref}(\lambda)/Y_{ref}$ $\Delta S(\lambda) = S_{ref}(\lambda) - S(\lambda)$, and when a wavelength that produces a longest wavelength local maximum value of S(λ) in a wavelength range from 380 nm to 780 nm is denoted by $\lambda_R$ (nm), an index $A_{cg}$ represented by the following Formula (1) satisfies $-360 \leq A_{cg} \leq -10$, in the case when the wavelength Λ4 that is $S(\lambda_R)/2$ exists in the longer wavelength-side of $\lambda_R$, and an index $A_{cg}$ represented by the following Formula (2) satisfies $360 \leq A_{cg} \leq -10$, in the case when the wavelength Λ4 that is $S(\lambda_R)/2$ does not exist in the longer wavelength-side of $\lambda_R$,

[Expression 74]

$$A_{cg} = \int_{380}^{495} \Delta S(\lambda) d\lambda + \int_{495}^{590} (-\Delta S(\lambda)) d\lambda + \int_{590}^{\Lambda 4} \Delta S(\lambda) d\lambda \quad (1)$$

[Expression 75]

$$A_{cg} = \int_{380}^{495} \Delta S(\lambda) d\lambda + \int_{495}^{590} (-\Delta S(\lambda)) d\lambda + \int_{590}^{780} \Delta S(\lambda) d\lambda \quad (2)$$

[2-2]

The light-emitting device according to [2-1], wherein $\Phi_{elm}(\lambda)$ does not satisfy at least one of the following Condition 3 and Condition 4, and $\phi_{SSL}(\lambda)$ satisfies both the following Condition 3 and Condition 4:

Condition 3:

if an a* value and a b* value in CIE 1976 L*a*b* color space of 15 Munsell renotation color samples from #01 to #15 listed below when mathematically assuming illumination by the target light are respectively denoted by $a^*_n$ and $b^*_n$ (where n is a natural number from 1 to 15), and if an a* value and a b* value in CIE 1976 L*a*b* color space of the 15 Munsell renotation color samples when mathematically assuming illumination by a reference light that is selected according to a correlated color temperature T (K) of the light emitted in the radiant direction are respectively denoted by $a^*_{nref}$ and $b^*_{nref}$ (where n is a natural number from 1 to 15), then each saturation difference $\Delta C_n$ satisfies $-3.8 \Delta C_n \leq 18.6$ (where n is a natural number from 1 to 15), and an average $SAT_{av}$ of saturation difference represented by formula (3) below satisfies formula (4) below and

[Expression 76]

$$SAT_{av} = \frac{\sum_{n=1}^{15} \Delta C_n}{15} \quad (3)$$

[Expression 77]

$$1.0 \leq \frac{\sum_{n=1}^{15} \Delta C_n}{15} \leq 7.0, \quad (4)$$

if a maximum saturation difference value is denoted by $\Delta C_{max}$ and a minimum saturation difference value is denoted by $\Delta C_{min}$, then a difference $|\Delta C_{max} - \Delta C_{min}|$ between the maximum saturation difference value and the minimum saturation difference value satisfies $2.8 \leq |\Delta C_{max} - \Delta C_{min}| \leq 19.6$, where $\Delta C_n = \sqrt{\{(a^*_n)^2 + (b^*_n)^2\}} - \sqrt{\{(a^*_{nref})^2 + (b^*_{nref})^2\}}$ with the 15 Munsell renotation color samples being:

| | |
|---|---|
| #01 | 7.5P 4/10 |
| #02 | 10PB 4/10 |
| #03 | 5PB 4/12 |
| #04 | 7.5B 5/10 |
| #05 | 10BG 6/8 |
| #06 | 2.5BG 6/10 |
| #07 | 2.5G 6/12 |
| #08 | 7.5GY 7/10 |
| #09 | 2.5GY 8/10 |
| #10 | 5Y 8.5/12 |
| #11 | 10YR 7/12 |
| #12 | 5YR 7/12 |
| #13 | 10R 6/12 |
| #14 | 5R 4/14 |
| #15 | 7.5RP 4/12 |

Condition 4:

if hue angles in CIE 1976 L*a*b* color space of the 15 Munsell renotation color samples when mathematically assuming illumination by the target light are denoted by $\theta_n$ (degrees) (where n is a natural number from 1 to 15), and if hue angles in a CIE 1976 L*a*b* color space of the 15 Munsell renotation color samples when mathematically assuming illumination by a reference light that is selected according to the correlated color temperature T (K) of the light emitted in the radiant direction are denoted by $\theta_{nref}$ (degrees) (where n is a natural number from 1 to 15), then an absolute value of each difference in hue angles $|\Delta h_n|$ satisfies $0 \leq |\Delta h_n| \leq 9.0$ (degree) (where n is a natural number from 1 to 15), where $\Delta h_n = \theta_n - \theta_{nref}$.

[2-3]

A light-emitting device incorporating a light-emitting element including a semiconductor light-emitting element, and a control element, wherein if a wavelength is denoted by $\lambda$(nm), a spectral power distribution of a light emitted from the light-emitting element in a main radiant direction is denoted by $\Phi_{elm}(\lambda)$, and a spectral power distribution of a light emitted from the light-emitting device in the main radiant direction is denoted by $\phi_{SSL}(\lambda)$ $\Phi_{elm}(\lambda)$ satisfies both of the following Condition 1 and Condition 2, and $\phi_{SSL}(\lambda)$ also satisfies both of the following Conditions 1 and 2:

Condition 1:

a light, of which distance $D_{uv}$ from a black-body radiation locus as defined by ANSI C78.377 in a spectral power distribution of the target light satisfies $-0.0350 \leq D_{uv} - 0.0040$, is included;

Condition 2:

if a spectral power distribution of the target light is denoted by $\phi(\lambda)$, a spectral power distribution of a reference light that is selected according to T (K) of the target light is denoted by $\phi_{ref}(\lambda)$, tristimulus values of the target light are denoted by (X, Y, Z), and tristimulus values of the reference light that is selected according to T (K) of the light emitted from the light-emitting device in the radiant direction are denoted by $(X_{ref}, Y_{ref}, Z_{ref})$, and if a normalized spectral power distribution S ($\lambda$) of target light, a normalized spectral power distribution $S_{ref}(\lambda)$ of a reference light, and a difference $\Delta S(\lambda)$ between these normalized spectral power distributions are respectively defined as $S(\lambda) = \phi(\lambda)/Y$ $S_{ref}(\lambda) = \phi_{ref}(\lambda)/Y_{ref}$ $\Delta S(\lambda) = S_{ref}(\lambda) - S(\lambda)$, and when a wavelength that produces a longest wavelength local maximum value of $S(\lambda)$ in a wavelength range from 380 nm to 780 nm is denoted by $\lambda_R$ (nm), an index $A_{cg}$ represented by the following Formula (1) satisfies $-360 \leq A_{cg} \leq -10$, in the case when the wavelength $\Lambda 4$ that is $S(\lambda_R)/2$ exists in the longer wavelength-side of $\lambda_R$, and an index $A_{cg}$ represented by the following Formula (2) satisfies $360 \leq A_{cg} \leq -10$, in the case when the wavelength $\Lambda 4$ that is $S(\lambda_R)/2$ does not exist in the longer wavelength-side of $\lambda_R$,

[Expression 78]

$$A_{cg} = \int_{380}^{495} \Delta S(\lambda) d\lambda + \int_{495}^{590} (-\Delta S(\lambda)) d\lambda + \int_{590}^{\Lambda 4} \Delta S(\lambda) d\lambda \quad (1)$$

[Expression 79]

$$A_{cg} = \int_{380}^{495} \Delta S(\lambda) d\lambda + \int_{495}^{590} (-\Delta S(\lambda)) d\lambda + \int_{590}^{780} \Delta S(\lambda) d\lambda \qquad (2).$$

[2-4]

The light-emitting device according to [2-3], wherein $\Phi_{elm}(\lambda)$ satisfies both of the following Condition 3 and Condition 4, and $\phi_{SSL}(\lambda)$ also satisfies both of the following Condition 3 and Condition 4:

Condition 3:

if an a* value and a b* value in CIE 1976 L*a*b* color space of 15 Munsell renotation color samples from #01 to #15 listed below when mathematically assuming illumination by the target light are respectively denoted by $a^*_n$ and $b^*_n$ (where n is a natural number from 1 to 15), and if an a* value and a b* value in CIE 1976 L*a*b* color space of the 15 Munsell renotation color samples when mathematically assuming illumination by a reference light that is selected according to a correlated color temperature T (K) of the light emitted in the radiant direction are respectively denoted by $a^*_{nref}$ and $b^*_{nref}$ (where n is a natural number from 1 to 15), then each saturation difference $\Delta C_n$ satisfies $-3.8 \leq \Delta C_n \leq 18.6$ (where n is a natural number from 1 to 15), and an average $SAT_{av}$ of saturation difference represented by formula (3) below satisfies formula (4) below and

[Expression 80]

$$SAT_{av} = \frac{\sum_{n=1}^{15} \Delta C_n}{15} \qquad (3)$$

[Expression 81]

$$1.0 \leq \frac{\sum_{n=1}^{15} \Delta C_n}{15} \leq 7.0, \qquad (4)$$

if a maximum saturation difference value is denoted by $\Delta C_{max}$ and a minimum saturation difference value is denoted by $\Delta C_{min}$, then a difference $|\Delta C_{max} - \Delta C_{min}|$ between the maximum saturation difference value and the minimum saturation difference value satisfies $2.8 \leq |\Delta C_{max} - \Delta C_{min}| \leq 19.6$, where $\Delta C_n = \sqrt{(a^*_n)^2 + (b^*_n)^2} - \sqrt{(a^*_{nref})^2 + (b^*_{nref})^2}$ with the 15 Munsell renotation color samples being:

| | |
|---|---|
| #01 | 7.5P 4/10 |
| #02 | 10PB 4/10 |
| #03 | 5PB 4/12 |
| #04 | 7.5B 5/10 |
| #05 | 10BG 6/8 |
| #06 | 2.5BG 6/10 |
| #07 | 2.5G 6/12 |
| #08 | 7.5GY 7/10 |
| #09 | 2.5GY 8/10 |
| #10 | 5Y 8.5/12 |
| #11 | 10YR 7/12 |
| #12 | 5YR 7/12 |
| #13 | 10R 6/12 |
| #14 | 5R 4/14 |
| #15 | 7.5RP 4/12 |

Condition 4:

if hue angles in CIE 1976 L*a*b* color space of the 15 Munsell renotation color samples when mathematically assuming illumination by the target light are denoted by $\theta_n$ (degrees) (where n is a natural number from 1 to 15), and if hue angles in a CIE 1976 L*a*b* color space of the 15 Munsell renotation color samples when mathematically assuming illumination by a reference light that is selected according to the correlated color temperature T (K) of the light emitted in the radiant direction are denoted by $\theta_{nref}$ (degrees) (where n is a natural number from 1 to 15), then an absolute value of each difference in hue angles $|\Delta h_n|$ satisfies $0 \leq |\Delta h_n| \leq 9.0$ (degree) (where n is a natural number from 1 to 15), where $\Delta h_n = \theta_n - \theta_{nref}$.

[2-5]

The light-emitting device according to [2-1] or [2-3], wherein if $D_{uv}$ derived from the spectral power distribution of the light emitted from the light-emitting element in the main radiant direction is denoted by $D_{uv}(\Phi_{elm})$, and $D_{uv}$ derived from the spectral power distribution of the light emitted from the light-emitting device in the main radiant direction is denoted by $D_{uv}(\phi_{SSL})$, $D_{uv}(\phi_{SSL}) < D_{uv}(\Phi_{elm})$ is satisfied.

[2-6]

The light-emitting device according to [2-1] or [2-3], wherein if $A_{cg}$ derived from the spectral power distribution of the light emitted from the light-emitting element in the main radiant direction is denoted by $A_{cg}(\phi_{elm})$, and $A_{cg}$ derived from the spectral power distribution of the light emitted from the light-emitting device in the main radiant direction is denoted by $A_{cg}(\phi_{SSL})$, $A_{cg}(\phi_{SSL}) < A_{cg}(\Phi_{elm})$ is satisfied.

[2-7]

The light-emitting device according to [2-2] or [2-4], wherein if an average of the saturation degree difference derived from the spectral power distribution of the light emitted from the light-emitting element in the main radiant direction is denoted by $SAT_{av}(\Phi_{elm})$, and if an average of the saturation degree difference derived from the spectral power distribution of the light emitted from the light-emitting device in the main radiant direction is denoted by $SAT_{av}(\phi_{SSL})$, $SAT_{av}(\Phi_{elm}) < SAT_{av}(\phi_{SSL})$ is satisfied.

[2-8] The light-emitting device according to any one of [2-1] to [2-7], wherein the control element is an optical filter that absorbs or reflects light in a range of 380 nm $\leq \lambda$(nm) $\leq$ 780 nm.

[2-9] The light-emitting device according to any one of [2-1] to [2-8], wherein the control element has a collection function and/or a diffusion function of the light emitted from the light-emitting element.

[2-10]

The light-emitting device according to [2-9], wherein the collection function and/or the diffusion function of the control element is implemented by at least one of the functions of a concave lens, a convex lens and a Fresnel lens.

[2-11]

The light-emitting device according to any one of [2-1] to [2-10], wherein a luminous efficacy of radiation K (lm/W) in a wavelength range from 380 nm to 780 nm as derived from the spectral power distribution $\phi_{SSL}(\lambda)$ of light emitted from the light-emitting device in the radiant direction satisfies $180(\text{lm/W}) \leq K(\text{lm/W}) \leq 320(\text{lm/W})$.

[2-12]

The light-emitting device according to [2-2] or [2-4], wherein
the absolute value of each difference in hue angles $|\Delta h_n|$ light-emitting device satisfies $0.0003 \leq |\Delta h_n| \leq 8.3$ (degree) (where n is a natural number from 1 to 15).

[2-13]

The light-emitting device according to [2-2] or [2-4], wherein
the average $SAT_{av}$ of the saturation difference of the light-emitting device represented by the Formula (3) satisfies the following Formula (4)'

[Expression 82]

$$1.2 \leq \frac{\sum_{n=1}^{15} \Delta C_n}{15} \leq 6.3. \quad (4)$$

[2-14]

The light-emitting device according to [2-2] or [2-4], wherein
the each saturation difference $\Delta C_n$ of the light-emitting device satisfies $-3.4 \leq \Delta C_n \leq 16.8$ (where n is a natural number from 1 to 15).

[2-15]

The light-emitting device according to [2-2] or [2-4], wherein
the difference $|\Delta C_{max} - \Delta C_{min}|$ between the maximum saturation difference value of the light-emitting device and the minimum saturation difference value thereof, satisfies $3.2 \leq |\Delta C_{max} - \Delta C_{min}| \leq 17.8.$

[2-16]

The light-emitting device according to any one of [2-1] to [2-15], wherein
the light emitted from the light-emitting device in the radiant direction has the distance $D_{uv}$ from the black-body radiation locus that specifies $-0.0250 \leq D_{uv} \leq -0.0100.$

[2-17]

The light-emitting device according to any one of [2-1] to [2-16], wherein
the index $A_{cg}$ of the light-emitting device represented by the Formula (1) or (2) satisfies $-322 \leq A_{cg} \leq -12.$

[2-18]

The light-emitting device according to any one of [2-1] to [2-17], wherein
the luminous efficacy of radiation K (lm/W) in a wavelength range from 380 nm to 780 nm as derived from the spectral power distribution $\phi_{SSL}(\lambda)$ of light emitted from the light-emitting device in the radiant direction satisfies $206(lm/W) \leq K(lm/W) \leq 288(lm/W).$

[2-19]

The light-emitting device according to any one of [2-1] to [2-18], wherein
the correlated color temperature T(K) of the light-emitting device satisfies $2550(K) \leq T(K) \leq 5650(K).$

[2-20]

The light-emitting device according to any one of [2-1] to [2-19], wherein
illuminance at which the light emitted from the light-emitting device in the radiant direction illuminates objects is 150 lx to 5000 lx.

[2-21]

The light-emitting device according to any one of [2-1] to [2-20], wherein
the light-emitting device emits, in the radiant direction, light emitted from one to six light-emitting elements.

[2-22]

The light-emitting device according to any one of [2-1] to [2-21], wherein
a peak wavelength of an emission spectrum of the semiconductor light-emitting element is 380 nm or longer and shorter than 495 nm and the full-width at half-maximum of the emission spectrum of the semiconductor light-emitting element is 2 nm to 45 nm.

[2-23]

The light-emitting device according to [2-22], wherein
the peak wavelength of the emission spectrum of the semiconductor light-emitting element is 395 nm or longer and shorter than 420 nm.

[2-24]

The light-emitting device according to [2-22], wherein
the peak wavelength of the emission spectrum of the semiconductor light-emitting element is 420 nm or longer and shorter than 455 nm.

[2-25]

The light-emitting device according to [2-22], wherein
the peak wavelength of the emission spectrum of the semiconductor light-emitting element is 455 nm or longer and shorter than 485 nm.

[2-26]

The light-emitting device according to any one of [2-1] to [2-21], wherein
the peak wavelength of the emission spectrum of the semiconductor light-emitting element is 495 nm or longer and shorter than 590 nm and the full-width at half-maximum of the emission spectrum of the semiconductor light-emitting element is 2 nm to 75 nm.

[2-27]

The light-emitting device according to any one of [2-1] to [2-21], wherein
the peak wavelength of the emission spectrum of the semiconductor light-emitting element is 590 nm or longer and shorter than 780 nm and the full-width at half-maximum of the emission spectrum of the semiconductor light-emitting element is 2 nm to 30 nm.

[2-28]

The light-emitting device according to any one of [2-1] to [2-21], wherein
the semiconductor light-emitting element is fabricated on any substrate selected from the group consisting of a sapphire substrate, a GaN substrate, a GaAs substrate and a GaP substrate.

[2-29]

The light-emitting device according to any one of [2-1] to [2-21], wherein
the semiconductor light-emitting element is fabricated on a GaN substrate or a GaP substrate and a thickness of the substrate is 100 µm to 2 mm.

[2-30]

The light-emitting device according to any one of [2-1] to [2-22], wherein the semiconductor light-emitting element is fabricated on a sapphire substrate or a GaAs substrate and the semiconductor light-emitting element is removed from the substrate.

[2-31]

The light-emitting device according to any one of [2-1] to [2-25], comprising a phosphor as a light-emitting element.

[2-32]

The light-emitting device according to [2-31], wherein the phosphor includes one to five types of phosphors each having different emission spectra.

[2-33]

The light-emitting device according to [2-31] or [2-32], wherein the phosphor includes a phosphor having an individual emission spectrum, when photoexcited at room temperature, with a peak wavelength of 380 nm or longer and shorter than 495 nm and a full-width at half-maximum of 2 nm to 90 nm.

[2-34]

The light-emitting device according to [2-33], wherein the phosphor includes one or more types of phosphors selected from the group consisting of a phosphor represented by general formula (5) below, a phosphor represented by general formula (5)' below, $(Sr, Ba)_3MgSi_2O_8:Eu^{2+}$, and $(Ba, Sr, Ca, Mg)Si_2O_2N_2:Eu$ $$(Ba,Sr,Ca)MgAl_{10}O_{17}:Mn,Eu \quad (5)$$

$$Sr_aBa_bEu_x(PO_4)_cX_d \quad (5)'$$

(in the general formula (5)', X is Cl, in addition, c, d, and x are numbers satisfying $2.7 \leq c \leq 3.3$, $0.9 \leq d \leq 1.1$, and $0.3 \leq x \leq 1.2$, moreover, a and b satisfy conditions represented by $a+b=5-x$ and $0 \leq b/(a+b) \leq 0.6$).

[2-35]

The light-emitting device according to [2-31] or [2-32], wherein the phosphor includes a phosphor having an individual emission spectrum, when photoexcited at room temperature, with a peak wavelength of 495 nm or longer and shorter than 590 nm and a full-width at half-maximum of 2 to 130 nm.

[2-36]

The light-emitting device according to [2-35], wherein the phosphor includes one or more types of phosphors selected from the group consisting of $Si_{6-z}Al_zO_zN_{8-z}:Eu$ (where $0<z<4.2$), a phosphor represented by general formula (6) below, a phosphor represented by general formula (6)' below, and $SrGaS_4:Eu^{2+}$ $$Ba_aCa_bSr_cMg_dEu_xSiO_4 \quad (6)$$

(in the general formula (6), a, b, c, d, and x satisfy $a+b+c+d+x=2$, $1.0 \leq a \leq 2.0$, $0 \leq b<0.2$, $0.2 \leq c \leq 1.0$, $0 \leq d<0.2$, and $0<x \leq 0.5$).

$$Ba_{1-x-y}Sr_xEu_yMg_{1-z}Mn_zAl_{10}O_{17} \quad (6)'$$

(in the general formula (6)', x, y, and z respectively satisfy $0.1 \leq x \leq 0.4$, $0.25 \leq y \leq 0.6$, and $0.05 \leq z \leq 0.5$).

[2-37]

The light-emitting device according to [2-31] or [2-32], wherein the phosphor includes a phosphor having an individual emission spectrum, when photoexcited at room temperature, with a peak wavelength of 590 nm or longer and shorter than 780 nm and a full-width at half-maximum of 2 nm to 130 nm.

[2-38]

The light-emitting device according to [2-37], wherein the phosphor includes one or more types of phosphors selected from the group consisting of a phosphor represented by general formula (7) below, a phosphor represented by general formula (7)' below, $(Sr, Ca, Ba)_2Al_xSi_{5-x}O_xN_{8-x}:Eu$ (where $0 \leq x \leq 2$), $Eu_y(Sr, Ca, Ba)_{1-y}:Al_{1+x}Si_{4-x}O_xN_{7-x}$ (where $0 \leq x<4$, $0 \leq y<0.2$), $K_2SiF_6:Mn^{4+}$, $A_{2+x}M_yMn_zF_n$ (where A is Na and/or K; M is Si and Al; $-1 \leq x \leq 1$ and $0.9 \leq y+z \leq 1.1$ and $0.001 \leq z \leq 0.4$ and $5 \leq n \leq 7$), $(Ca, Sr, Ba, Mg)AlSiN_3:Eu$ and/or $(Ca, Sr, Ba)AlSiN_3:Eu$, and $(CaAlSiN_3)_{1-x}(Si_2N_2O)_x:Eu$ (where x satisfies $0<x<0.5$)

$$(La_{1-x-y}Eu_xLn_y)_2O_2S \quad (7)$$

(in the general formula (7), x and y denote numbers respectively satisfying $0.02 \leq x \leq 0.50$ and $0 \leq y \leq 0.50$, and Ln denotes at least one trivalent rare-earth element among Y, Gd, Lu, Sc, Sm, and Er)

$$(k-x)MgO.xAF_2.GeO_2:yMn^{4+} \quad (7)'$$

(in the general formula (7)', k, x, and y denote numbers respectively satisfying $2.8 \leq k \leq 5$, $0.1 \leq x \leq 0.7$, and $0.005 \leq y \leq 0.015$, and A is calcium (Ca), strontium (Sr), barium (Ba), zinc (Zn), or a mixture consisting of these elements).

[2-39]

The light-emitting device according to any one of [2-1] to [2-21], further comprising a phosphor as the light-emitting element, wherein a peak wavelength of an emission spectrum of the semiconductor light-emitting element is 395 nm or longer and shorter than 420 nm, and the phosphor includes SBCA, β-SiAlON, and CASON.

[2-40]

The light-emitting device according to any one of [2-1] to [2-21], further comprising a phosphor as the light-emitting element, wherein a peak wavelength of an emission spectrum of the semiconductor light-emitting element is 395 nm or longer and shorter than 420 nm, and the phosphor includes SCA, β-SiAlON, and CASON.

[2-41]

The light-emitting device according to any one of [2-1] to [2-40], which is selected from the group consisting of a packaged LED, an LED module, an LED lighting fixture, and an LED lighting system.

[2-42]

The light-emitting device according to any one of [2-1] to [2-41], which is used as a residential uses' device.

[2-43]

The light-emitting device according to any one of [2-1] to [2-41], which is used as an exhibition illumination device.

[2-44]

The light-emitting device according to any one of [2-1] to [2-41], which is used as a presentation illumination device.

[2-45]

The light-emitting device according to any one of [2-1] to [2-41], which is used as a medical illumination device.

[2-46]

The light-emitting device according to any one of [2-1] to [2-41], which is used as a work illumination device.

[2-47]

The light-emitting device according to any one of [2-1] to [2-41], which is used as an illumination device incorporated in industrial equipments.

[2-48]

The light-emitting device according to any one of [2-1] to [2-41], which is used as an illumination device for interior of transportation.

[2-49]

The light-emitting device according to any one of [2-1] to [2-41], which is used as an illumination device for works of art.

[2-50]

The light-emitting device according to any one of [2-1] to [2-41], which is used as an illumination device for aged persons.

[2-51]

A method for producing a light-emitting device: incorporating a light-emitting element which includes a semiconductor light-emitting element; and a control element, the method comprising:

a step of preparing a first light-emitting device having the light-emitting element; and a step of producing a second light-emitting device by disposing the control element so as to act on at least a part of light emitted from the first light-emitting device in a main radiant direction, wherein if a wavelength is denoted by λ(nm), a spectral power distribution of a light emitted from the first light-emitting device in the main radiant direction is denoted by $\Phi_{elm}(\lambda)$, and a spectral power distribution of a light emitted from the second light-emitting device in the main radiant direction is denoted by $\phi_{SSL}(\lambda)$ $\Phi_{elm}(\lambda)$ does not satisfy at least one of the following Condition 1 and Condition 2, and $\phi_{SSL}(\lambda)$ satisfies both the Condition 1 and Condition 2:

Condition 1:

a light, of which distance $D_{uv}$ from a black-body radiation locus as defined by ANSI C78.377 in a spectral power distribution of the target light satisfies $-0.0350 \leq D_{uv} -0.0040$, is included;

Condition 2:

if a spectral power distribution of the target light is denoted by $\phi(\lambda)$, a spectral power distribution of a reference light that is selected according to T (K) of the target light is denoted by $\phi_{ref}(\lambda)$, tristimulus values of the target light are denoted by (X, Y, Z), and tristimulus values of the reference light that is selected according to T (K) of the light emitted from the light-emitting device in the radiant direction are denoted by $(X_{ref}, Y_{ref}, Z_{ref})$, and if a normalized spectral power distribution S (λ) of target light, a normalized spectral power distribution $S_{ref}(\lambda)$ of a reference light, and a difference ΔS (λ) between these normalized spectral power distributions are respectively defined as $S(\lambda) = \phi(\lambda)/Y$ $S_{ref}(\lambda) = \phi_{ref}(\lambda)/Y_{ref}$ $\Delta S(\lambda) = S_{ref}(\lambda) - S(X)$, and when a wavelength that produces a longest wavelength local maximum value of S(λ) in a wavelength range from 380 nm to 780 nm is denoted by $\lambda_R$ (nm), an index $A_{cg}$ represented by the following Formula (1) satisfies $-360 \leq A_{cg} \leq -10$, in the case when the wavelength Λ4 that is $S(\lambda_R)/2$ exists in the longer wavelength-side of $\lambda_R$, and an index $A_{cg}$ represented by the following Formula (2) satisfies $360 \leq A_{cg} \leq -10$, in the case when the wavelength Λ4 that is $S(\lambda_R)/2$ does not exist in the longer wavelength-side of $\lambda_R$,

[Expression 83]

$$A_{cg} = \int_{380}^{495} \Delta S(\lambda) d\lambda + \int_{495}^{590} (-\Delta S(\lambda)) d\lambda + \int_{590}^{\Lambda 4} \Delta S(\lambda) d\lambda \quad (1)$$

[Expression 84]

$$A_{cg} = \int_{380}^{495} \Delta S(\lambda) d\lambda + \int_{495}^{590} (-\Delta S(\lambda)) d\lambda + \int_{590}^{780} \Delta S(\lambda) d\lambda \quad (2).$$

[2-52]

The method for producing a light-emitting device according to [2-51], wherein $\Phi_{elm}(\lambda)$ does not satisfy at least one of the following Condition 3 and Condition 4, and $\phi_{SSL}(\lambda)$ satisfies both the Condition 3 and Condition 4:

Condition 3:

if an a* value and a b* value in CIE 1976 L*a*b* color space of 15 Munsell renotation color samples from #01 to #15 listed below when mathematically assuming illumination by the target light are respectively denoted by $a^*_n$ and $b^*_n$ (where n is a natural number from 1 to 15), and if an a* value and a b* value in CIE 1976 L*a*b* color space of the 15 Munsell renotation color samples when mathematically assuming illumination by a reference light that is selected according to a correlated color temperature T (K) of the light emitted in the radiant direction are respectively denoted by $a^*_{nref}$ and $b^*_{nref}$ (where n is a natural number from 1 to 15), then each saturation difference $\Delta C_n$ satisfies $-3.8 \leq \Delta C_n \leq 18.6$ (where n is a natural number from 1 to 15), and an average $SAT_{av}$ of saturation difference represented by formula (3) below satisfies formula (4) below and

[Expression 85]

$$SAT_{av} = \frac{\sum_{n=1}^{15} \Delta C_n}{15} \quad (3)$$

[Expression 86]

$$1.0 \leq \frac{\sum_{n=1}^{15} \Delta C_n}{15} \leq 7.0, \quad (4)$$

if a maximum saturation difference value is denoted by $\Delta C_{max}$ and a minimum saturation difference value is denoted by $\Delta C_{min}$, then a difference $|\Delta C_{max} - \Delta C_{min}|$ between the maximum saturation difference value and the minimum saturation difference value satisfies $2.8 \leq |\Delta C_{max} - \Delta C_{min}| < 19.6$, where $\Delta C_n = \sqrt{\{(a^*_n)^2 + (b^*_n)^2\}} - \sqrt{\{(a^*_{nref})^2 + (b^*_{nref})^2\}}$ with the 15 Munsell renotation color samples being:

| | |
|---|---|
| #01 | 7.5P 4/10 |
| #02 | 10PB 4/10 |
| #03 | 5PB 4/12 |
| #04 | 7.5B 5/10 |
| #05 | 10BG 6/8 |
| #06 | 2.5BG 6/10 |
| #07 | 2.5G 6/12 |
| #08 | 7.5GY 7/10 |
| #09 | 2.5GY 8/10 |
| #10 | 5Y 8.5/12 |
| #11 | 10YR 7/12 |
| #12 | 5YR 7/12 |
| #13 | 10R 6/12 |
| #14 | 5R 4/14 |
| #15 | 7.5RP 4/12 |

Condition 4:

if hue angles in CIE 1976 L*a*b* color space of the 15 Munsell renotation color samples when mathematically assuming illumination by the target light are denoted by $\theta_n$ (degrees) (where n is a natural number from 1 to 15), and if hue angles in a CIE 1976 L*a*b* color space of the 15 Munsell renotation color samples when mathematically assuming illumination by a reference light that is selected according to the correlated color temperature T (K) of the light emitted in the radiant direction are denoted by $\theta_{nref}$ (degrees) (where n is a natural number from 1 to 15), then an absolute value of each difference in hue angles $|\Delta h_n|$ satisfies $0 \leq |\Delta h_n| \leq 9.0$ (degree) (where n is a natural number from 1 to 15), where $\Delta h_n = \theta_{nSSL} - \theta_{nref}$.

[2-53]

A method for producing a light-emitting device incorporating: a light-emitting element which includes a semiconductor light-emitting element; and a control element, the method comprising:

a step of preparing a first light-emitting device having the light-emitting element; and a step of producing a second light-emitting device by disposing the control element so as to act on at least a part of light emitted from the first light-emitting device in a main radiant direction, wherein if a wavelength is denoted by $\lambda$ (nm), a spectral power distribution of a light emitted from the first light-emitting device in the main radiant direction is denoted by $\Phi_{elm}(\lambda)$, and a spectral power distribution of a light emitted from the second light-emitting device in the main radiant direction is denoted by $\phi_{SSL}(\lambda)$, $\Phi_{elm}(\lambda)$ satisfies both the following Condition 1 and Condition 2, and $\phi_{SSL}(\lambda)$ also satisfies both the following Condition 1 and Condition 2:

Condition 1:

a light, of which distance $D_{uv}$ from a black-body radiation locus as defined by ANSI C78.377 in a spectral power distribution of the target light satisfies $-0.0350 \leq D_{uv} - 0.0040$, is included;

Condition 2:

if a spectral power distribution of the target light is denoted by $\phi(\lambda)$, a spectral power distribution of a reference light that is selected according to T (K) of the target light is denoted by $\phi_{ref}(\lambda)$, tristimulus values of the target light are denoted by (X, Y, Z), and tristimulus values of the reference light that is selected according to T (K) of the light emitted from the light-emitting device in the radiant direction are denoted by $(X_{ref}, Y_{ref}, Z_{ref})$ and if a normalized spectral power distribution $S(\lambda)$ of target light, a normalized spectral power distribution $S_{ref}(\lambda)$ of a reference light, and a difference $\Delta S(\lambda)$ between these normalized spectral power distributions are respectively defined as $S(\lambda) = \phi(\lambda)/Y$ $S_{ref}(\lambda) = \phi_{ref}(\lambda)/Y_{ref}$ $\Delta S(\lambda) = S_{ref}(\lambda) - S(\lambda)$, and when a wavelength that produces a longest wavelength local maximum value of $S(\lambda)$ in a wavelength range from 380 nm to 780 nm is denoted by $\lambda_R$ (nm), an index $A_{cg}$ represented by the following Formula (1) satisfies $-360 \leq A_{cg} \leq -10$, in the case when the wavelength $\Lambda 4$ that is $S(\lambda_R)/2$ exists in the longer wavelength-side of $\lambda_R$, and an index $A_{cg}$ represented by the following Formula (2) satisfies $360 \leq A_{cg} \leq -10$, in the case when the wavelength $\Lambda 4$ that is $S(\lambda_R)/2$ does not exist in the longer wavelength-side of $\lambda_R$,

[Expression 87]

$$A_{cg} = \int_{380}^{495} \Delta S(\lambda) d\lambda + \int_{495}^{590} (-\Delta S(\lambda)) d\lambda + \int_{590}^{\Lambda 4} \Delta S(\lambda) d\lambda \quad (1)$$

[Expression 88]

$$A_{cg} = \int_{380}^{495} \Delta S(\lambda) d\lambda + \int_{495}^{590} (-\Delta S(\lambda)) d\lambda + \int_{590}^{780} \Delta S(\lambda) d\lambda \quad (2).$$

[2-54]

The method for producing a light-emitting device according to [2-53], wherein $\Phi_{elm}(\lambda)$ satisfies both of the following Condition 3 and Condition 4, and $\phi_{SSL}(\lambda)$ also satisfies both of the following Condition 3 and Condition 4:

Condition 3:

if an a* value and a b* value in CIE 1976 L*a*b* color space of 15 Munsell renotation color samples from #01 to #15 listed below when mathematically assuming illumination by the target light are respectively denoted by $a^*_n$ and $b^*_n$ (where n is a natural number from 1 to 15), and if an a* value and a b* value in CIE 1976 L*a*b* color space of the 15 Munsell renotation color samples when mathematically assuming illumination by a reference light that is selected according to a correlated color temperature T (K) of the light emitted in the radiant direction are respectively denoted by $a^*_{nref}$ and $b^*_{nref}$ (where n is a natural number from 1 to 15), then each saturation difference $\Delta C_n$ satisfies $-3.8 \leq \Delta C_n \leq 18.6$ (where n is a natural number from 1 to 15), and an average $SAT_{av}$ of saturation difference represented by formula (3) below satisfies formula (4) below and

[Expression 89]

$$SAT_{av} = \frac{\sum_{n=1}^{15} \Delta C_n}{15} \quad (3)$$

[Expression 90]

$$1.0 \leq \frac{\sum_{n=1}^{15} \Delta C_n}{15} \leq 7.0, \quad (4)$$

if a maximum saturation difference value is denoted by $\Delta C_{max}$ and a minimum saturation difference value is denoted by $\Delta C_{min}$, then a difference $|\Delta C_{max} - \Delta C_{min}|$ between the maximum saturation difference value and the minimum saturation difference value satisfies $2.8 \leq |\Delta C_{max} - \Delta C_{min}| \leq 19.6$.

where $\Delta C_n = \sqrt{\{(a^*_n)^2 + (b^*_n)^2\}} - \sqrt{\{(a^*_{nref})^2 + (b^*_{nref})^2\}}$ with the 15 Munsell renotation color samples being:

| | |
|---|---|
| #01 | 7.5P 4/10 |
| #02 | 10PB 4/10 |
| #03 | 5PB 4/12 |
| #04 | 7.5B 5/10 |
| #05 | 10BG 6/8 |

-continued

| | |
|---|---|
| #06 | 2.5BG 6/10 |
| #07 | 2.5G 6/12 |
| #08 | 7.5GY 7/10 |
| #09 | 2.5GY 8/10 |
| #10 | 5Y 8.5/12 |
| #11 | 10YR 7/12 |
| #12 | 5YR 7/12 |
| #13 | 10R 6/12 |
| #14 | 5R 4/14 |
| #15 | 7.5RP 4/12 |

Condition 4:

if hue angles in CIE 1976 L*a*b* color space of the 15 Munsell renotation color samples when mathematically assuming illumination by the target light are denoted by $\theta_n$ (degrees) (where n is a natural number from 1 to 15), and if hue angles in a CIE 1976 L*a*b* color space of the 15 Munsell renotation color samples when mathematically assuming illumination by a reference light that is selected according to the correlated color temperature T (K) of the light emitted in the radiant direction are denoted by $\theta_{nref}$ (degrees) (where n is a natural number from 1 to 15), then an absolute value of each difference in hue angles $|\Delta h_n|$ satisfies $0 \leq |\Delta h_n| \leq 9.0$ (degree) (where n is a natural number from 1 to 15), where $\Delta h_n = \theta_n - \theta_{nref}$.

EXPLANATION OF REFERENCE NUMERALS

100 light emitting device
1 light emitting area 1
11 light emitting area 1-1
12 light emitting area 1-2
13 light emitting area 1-3
2 light emitting area 2
21 light emitting area 2-1
22 light emitting area 2-2
23 light emitting area 2-3
3 light emitting area 3
31 light emitting area 3-1
32 light emitting area 3-2
4 light emitting area 4
5 light emitting area 5
6 semiconductor light-emitting element
7 virtual outer periphery
71 two points on virtual outer periphery
72 distance between two points on virtual outer periphery
10 packaged LED
20 packaged LED
25 packaged LED
30 illumination system
301 LED bulb (light emitting area 1)
302 LED bulb (light emitting area 2)
303 ceiling
40 pair of packaged LEDs
400 packaged LED
401 light emitting area 1
402 light emitting area 2
51 housing
52 LED chip
52a blue LED chip
52b green LED chip
52c red LED chip
52d thermal radiation filament
53 package
54 phosphor
55 cut-off filter (control element)
56 Encapsulant layer
510 packaged LED (light-emitting device having low level processing)
511 incandescent bulb (light-emitting device having mid-level processing)
520 LED light bulb with filter (light-emitting device having high level processing)
530 lighting system (light-emitting device having further high level processing)

INDUSTRIAL APPLICABILITY

The light-emitting device such as an illumination light source, a lighting fixture, a lighting system, and the like, the method for designing the light-emitting device, the method for driving the light-emitting device and the illumination method according to the first to fourth inventions of the present invention has an extremely wide field of application and may be used without being limited to particular uses. However, in consideration of the features of The light-emitting device such as an illumination light source, a lighting fixture, a lighting system, and the like, the method for designing the light-emitting device, the method for driving the light-emitting device and the illumination method according to the first to fourth inventions of the present invention, the illumination method or the light-emitting device according to the present invention is favorably applied to the following fields.

For example, when illuminated by the light-emitting device or the illumination method according to the first or the fourth invention of the present invention, white may be perceived as being whiter, more natural, and more comfortable as compared to a conventional a conventional light-emitting device or illumination method even at a similar CCT and a similar illuminance. Furthermore, differences in lightness among achromatic colors such as white, gray, and black become more visible.

As a result, for example, black letters or the like on an ordinary sheet of white paper become more legible. To utilize such features, favorable applications include a reading light, lighting for a writing desk, and work lighting such as office lighting. In addition, while work may conceivably involve performing a visual external examination of fine parts, distinguishing between near colors of cloth or the like, checking color in order to verify freshness of meat, performing a product inspection by comparing with a criteria sample, and the like at a factory or the like, illumination by the illumination method according to the fourth invention of the present invention makes color identification among close hues easier and realizes a work environment that is as comfortable as though in a high-illuminance environment. Even from such a perspective, applications to work lighting are favorable.

Furthermore, since color discrimination ability increases, for example, applications to medical lighting such as a light source for surgical operations and a light source used in a gastroscope or the like are also favorable. While arterial blood is vivid red due to its high oxygen content, venous blood is dark red due to its high carbon dioxide content. Although arterial blood and venous blood are both red, chromas of the colors differ from each other. Therefore, with the illumination method or device according to the fourth or first invention of the present invention which achieves favorable color appearance (chroma), it is expected that arterial blood and venous blood can be readily distinguished from each other. In addition, since it is obvious that favorable color representation in color image information such as an endoscope has a significant effect on diagnosis, it is expected that a normal location and a lesion location can be readily distinguished from each other. Due to similar reasons, the illumination method can be favorably applied to an illumination method used in industrial equipments such as a product image judgment device.

When illuminated by the light-emitting device or the illumination method according to the first or fourth invention of the present invention, a truly natural color appearance as though viewed under several tens of thousands of lx such as outdoor illuminance on a sunny day is achieved for a majority of, and in some cases, all colors such as purple, bluish purple, blue, greenish blue, green, yellowish green, yellow, reddish yellow, red, and reddish purple even when illuminance only ranges from around several thousand lx to several hundred lx. In addition, the skin color of the subjects (Japanese), various foods, clothing, wood colors, and the like which have intermediate chroma also acquire natural color appearances which many of the subjects feel more favorable.

Therefore, by applying the light-emitting device or the illumination method according to the first or fourth invention of the present invention to ordinary lighting for homes and the like, it is conceivable that food may appear fresher and more appetizing, newspapers, magazines, and the like may become more legible, and visibility of differences in level in the house may increase, thereby contributing to improving home safety. Accordingly, the first to fifth inventions of the present invention are favorably applied to home lighting. In addition, the present invention is also favorable as exhibit lighting for clothing, food, vehicles, suitcases, shoes, ornaments, furniture, and the like, and enables lighting which makes such items standout from their surroundings.

The present invention is also favorable as lighting for goods such as cosmetics in which slight differences in color are the decisive factor when purchasing the goods. When used as exhibit lighting for white dresses and the like, since subtle differences in color become more visible such as a difference between bluish white and creamy white among similar whites, a person can select a color that is exactly according to his or her desire. Furthermore, the present invention is also favorable as presentation lighting at a wedding center, a theater, and the like, and enables a pure white dress or the like to be perceived as being pure white and kimonos, makeup, in kabuki or the like to appear vividly. The present invention also favorably highlights skin tones. In addition, by using the present invention as lighting in a hair salon, colors that are no different than those perceived outdoors can be obtained during hair coloring and excessive dyeing or insufficient dyeing can be prevented.

Particularly in the light-emitting device or the illumination method according to the second embodiment of the first or fourth invention of the present invention, a relative spectral intensity of light having relatively high energy wavelength components, such as ultraviolet, near ultraviolet, purple or indigo, from the light-emitting element is reduced using the control element, hence fading, degeneration, corrosion, deterioration or the like of the illumination object, such as clothes and food, can be decreased. Further, in the light-emitting device or the illumination method according to the second embodiment of the first or fourth invention of the present invention, relative spectral intensity of light having wavelength components that could cause thermal irradiation from the light-emitting element, such as near ultraviolet, middle infrared and far infrared, is decreased, hence degeneration, corrosion, deterioration or the like such as food can be decreased.

Furthermore, since white appears more white, achromatic colors can be readily distinguished, and chromatic colors attain their natural vividness, the first to fifth inventions of the present invention are also favorable as a light source in a location where a wide variety of activities are conducted in a given limited space. For example, passengers in an airplane read, work, and eat at their seats. Similar situations take place on a train, a long-distance bus, and the like. The first to fifth inventions of the present invention is favorably applicable as interior lighting in such public transport.

In addition, since white appears more white, achromatic colors can be readily distinguished, and chromatic colors attain their natural vividness, the first to fifth inventions of the present invention enables paintings and the like in an art museum or the like to be illuminated in a natural tone as though viewed outdoors and is therefore also favorable as lighting for works of art.

On the other hand, the first to fifth inventions of the present invention is also favorably applicable as lighting for aged persons. In other words, even in case where small characters are hard to read and difference in steps or the like are hard to see under normal illuminance, by applying the illumination method or the light-emitting device according to the fourth or first invention of the present invention, such problems can be solved since achromatic colors and chromatic colors can be readily distinguished from one another. Therefore, the present invention is also favorably applicable to lighting in public facilities or the like which are used by the general public such as a waiting room in a retirement house or a hospital, a book store, and a library.

Furthermore, the illumination method or the light-emitting device according to the present invention can be favorably used in applications for securing visibility by adapting to an illumination environment in which illuminance is often at a relatively low level due to various circumstances.

For example, the illumination method or the light-emitting device according to the present invention is favorably applied to street lamps, head lights of vehicles, and foot lamps to increase visibility as compared to using conventional light sources.

The present invention has been described in detail with reference to the preferred embodiment thereof, but numerous modifications and variations can be made by those skilled in the art, which are included in the spirit and scope of the present invention described in the Claims.

The invention claimed is:
1. A light-emitting device comprising a light-emitting element and satisfying the following A or B:
   A: the light-emitting device comprises M number of light emitting areas, where M is 2 or greater natural number, and has the light-emitting elements in the light emitting areas, wherein
   when $\phi_{SSL}N(\lambda)$, with N being 1 to M, is a spectral power distribution of a light emitted from each light emitting area in a main radiant direction of the light-emitting device, $\phi_{SSL}(\lambda)$, which is a spectral power distribution of all the lights emitted from the light-emitting device in the radiant direction, is

$$\phi_{SSL}(\lambda) = \sum_{N=1}^{M} \phi_{SSL}N(\lambda),$$

wherein $\phi_{SSL}(\lambda)$ emitted from the light-emitting device satisfies both the following Condition 1 and Condition 2; or B: the light-emitting device comprises the light-emitting element and a control element, wherein if a wavelength is denoted by $\lambda$(nm), a spectral power distribution of a light emitted from the light-emitting element in a main radiant direction is denoted by $\Phi_{elm}(\lambda)$, and a spectral power distribution of a light emitted from the light-emitting device in the main radiant direction is denoted by $\phi_{SSL}(\lambda)$, wherein $\Phi_{elm}(\lambda)$ does not satisfy at least one of the following Conditions 1 and 2:

Condition 1:

light emitted from the light-emitting device includes, in the main radiant direction thereof, light whose distance $D_{uvSSL}$ from a black-body radiation locus as defined by ANSI C78.377 satisfies $-0.0350 \leq D_{uvSSL} \leq -0.0040$, Condition 2:

if a spectral power distribution of light emitted from the light-emitting device in the radiant direction is denoted by $\phi_{SSL}(\lambda)$, a spectral power distribution of a reference light that is selected according to $T_{SSL}$ (K) of the light emitted from the light-emitting device in the radiant direction is denoted by $\phi_{ref}(\lambda)$, tristimulus values of the light emitted from the light-emitting device in the radiant direction are denoted by $(X_{SSL}, Y_{SSL}, Z_{SSL})$, and tristimulus values of the reference light that is selected according to $T_{SSL}$ (K) of the light emitted from the light-emitting device in the radiant direction are denoted by $(X_{ref}, Y_{ref}, Z_{ref})$, and if a normalized spectral power distribution $S_{SSL}(\lambda)$ of light emitted from the light-emitting device in the radiant direction, a normalized spectral power distribution $S_{ref}(\lambda)$ of a reference light that is selected according to $T_{SSL}$ (K) of the light emitted from the light-emitting device in the radiant direction, and a difference $\Delta S(\lambda)$ between these normalized spectral power distributions are respectively defined as $$S_{SSL}(\lambda) = \phi_{SSL}(\lambda)/Y_{SSL},$$

$$S_{ref}(\lambda) = \phi_{ref}(\lambda)/Y_{ref}$$

and $$\Delta S(\lambda) = S_{ref}(\lambda) - S_{SSL}(\lambda) \text{ and}$$

an index $A_{cg}$ represented by the following Formula (1) satisfies $-360 \leq A_{cg} \leq -10$, in the case when a wavelength that produces a longest wavelength local maximum value of $S_{SSL}(\lambda)$ in a wavelength range from 380 nm to 780 nm is denoted by $\lambda_R$ (nm), and a wavelength $\Lambda 4$ that assumes $S_{SSL}(\lambda_R)/2$ exists on a longer wavelength-side of $\lambda_R$, and an index $A_{cg}$ represented by the following Formula (2) satisfies $-360 \leq A_{cg} \leq -10$, in the case when a wavelength that produces a longest wavelength local maximum value of $S_{SSL}(\lambda)$ in a wavelength range from 380 nm to 780 nm is denoted by $\lambda_R$ (nm), and a wavelength $\Lambda 4$ that assumes $S_{SSL}(\lambda_R)/2$ does not exist on a longer wavelength-side of $\lambda_R$, $$A_{cg} = \int_{380}^{495} \Delta S(\lambda) d\lambda + \int_{495}^{590} (-\Delta S(\lambda)) d\lambda + \int_{590}^{\Lambda 4} \Delta S(\lambda) d\lambda \quad (1)$$

$$A_{cg} = \int_{380}^{495} \Delta S(\lambda) d\lambda + \int_{495}^{590} (-\Delta S(\lambda)) d\lambda + \int_{590}^{780} \Delta S(\lambda) d\lambda \quad (2).$$

2. The light-emitting device according to claim 1, satisfying the A.

3. The light-emitting device according to claim 2, wherein a semiconductor light-emitting element is included in at least one of the light emitting areas as the light-emitting element.

4. The light-emitting device according to claim 2, including light emitting areas so that $\phi_{SSL}(\lambda)$ can satisfy the Conditions 1 and 2 by changing a luminous flux amount and/or a radiant flux amount emitted from the light emitting areas.

5. The light-emitting device according to claim 2, wherein all of the $\phi_{SSL}N(\lambda)$, with N being 1 to M, satisfies the Condition 1 and Condition 2.

6. The light-emitting device according to claim 2, wherein at least one light emitting area of the M number of light emitting areas has wiring that allows the light emitting area to be electrically driven independently from other light emitting areas.

7. The light-emitting device according to claim 6, wherein all the M numbers of light emitting areas each have wiring that allows the light emitting area to be electrically driven independently from other light emitting areas.

8. The light-emitting device according to claim 2, wherein at least one selected from the group consisting of the index $A_{cg}$ represented by the Formula (1) or (2), the correlated color temperature $T_{SSL}(K)$ and the distance $D_{uvSSL}$ from the black-body radiation locus can be changed.

9. The light-emitting device according to claim 8, wherein a luminous flux and/or a radiant flux emitted from the light-emitting device in the main radiant direction can be independently controlled when at least one selected from the group consisting of the index $A_{cg}$ represented by the Formula (1) or (2), the correlated color temperature $T_{SSL}(K)$ and the distance $D_{uvSSL}$ from the black-body radiation locus is changed.

10. The light-emitting device according to claim 2, wherein a maximum distance L between two arbitrary points on a virtual outer periphery enveloping the entire light emitting areas closest to each other, is 0.4 mm or more and 200 mm or less.

11. The light-emitting device according to claim 2, comprising the light emitting areas that allow $\phi_{SSL}(\lambda)$ to further satisfy the following Conditions 3 to 4 by changing a luminous flux amount and/or a radiant flux amount emitted from the light emitting areas:

Condition 3:

if an a* value and a b* value in CIE 1976 L*a*b* color space of 15 Munsell renotation color samples from #01 to #15 listed below when mathematically assuming illumination by the light emitted in the radiant direction are respectively denoted by $a^*_{nSSL}$ and $b^*_{nSSL}$, where n is a natural number from 1 to 15, and if an a* value and a b* value in CIE 1976 L*a*b* color space of the 15 Munsell renotation color samples when mathematically assuming illumination by a reference light that is selected according to a correlated color temperature $T_{SSL}$ (K) of the light emitted in the radiant direction are respectively denoted by $a^*_{nref}$ and $b^*_{nref}$, where n is a natural number from 1 to 15, then each saturation difference $\Delta C_n$ satisfies $-3.8 \leq \Delta C_n \leq 18.6$, where n is a natural number from 1 to 15, and an average saturation difference represented by formula (3) below satisfies formula (4) below and $$\frac{\sum_{n=1}^{15} \Delta C_n}{15} \quad (3)$$

$$1.0 \leq \frac{\sum_{n=1}^{15} \Delta C_n}{15} \leq 7.0, \quad (4)$$

if a maximum saturation difference value is denoted by $\Delta C_{max}$ and a minimum saturation difference value is denoted by $\Delta C_{min}$, then a difference $|\Delta C_{max} - \Delta C_{min}|$ between the maximum saturation difference value and the minimum saturation difference value satisfies $$2.8 \leq |\Delta C_{max} - \Delta C_{min}| \leq 19.6,$$

where $\Delta C_n = \sqrt{\{(a^*_{nSSL})^2 + (b^*_{nSSL})^2\}} - \sqrt{\{(a^*_{nref})^2 + (b^*_{nref})^2\}}$ with the 15 Munsell renotation color samples being:

| | |
|---|---|
| #01 | 7.5P 4/10 |
| #02 | 10PB 4/10 |
| #03 | 5PB 4/12 |
| #04 | 7.5B 5/10 |
| #05 | 10BG 6/8 |
| #06 | 2.5BG 6/10 |
| #07 | 2.5G 6/12 |
| #08 | 7.5GY 7/10 |
| #09 | 2.5GY 8/10 |
| #10 | 5Y 8.5/12 |
| #11 | 10YR 7/12 |
| #12 | 5YR 7/12 |
| #13 | 10R 6/12 |
| #14 | 5R 4/14 |
| #15 | 7.5RP 4/12 |

Condition 4:

if hue angles in CIE 1976 L*a*b* color space of the 15 Munsell renotation color samples when mathematically assuming illumination by the light emitted in the radiant direction are denoted by $\theta_{nSSL}$, in degrees, where n is a natural number from 1 to 15, and if hue angles in a CIE 1976 L*a*b* color space of the 15 Munsell renotation color samples when mathematically assuming illumination by a reference light that is selected according to the correlated color temperature $T_{SSL}$ (K) of the light emitted in the radiant direction are denoted by $\theta_{nref}$, in degrees, where n is a natural number from 1 to 15, then an absolute value of each difference in hue angles $|\Delta h_n|$ satisfies $0 \leq |\Delta h_n| \leq 9.0$ degree, where n is a natural number from 1 to 15, where $\Delta h_n = \theta_{nSSL} - \theta_{nref}$.

12. The light-emitting device according to claim 2, wherein a luminous efficacy of radiation K (lm/W) in a wavelength range from 380 nm to 780 nm as derived from the spectral power distribution $\phi_{SSL}(\lambda)$ of light emitted from the light-emitting device in the radiant direction satisfies $180 (\text{lm/W}) \leq K(\text{lm/W}) \leq 320(\text{lm/W})$.

13. The light-emitting device according to claim 2, wherein a correlated color temperature $T_{SSL}$ (K) of light emitted from the light-emitting device in the radiant direction satisfies $2550(K) \leq T_{SSL}(K) \leq 5650(K)$.

14. The light-emitting device according to claim 1, satisfying the B.

15. The light-emitting device according to claim 14, wherein the light-emitting element includes a semiconductor light-emitting element.

16. The light-emitting device according to claim 14, wherein $\Phi_{elm}(\lambda)$ does not satisfy at least one of the following Condition 3 and Condition 4, and $\phi_{SSL}(\lambda)$ satisfies both the following Condition 3 and Condition 4:

Condition 3:

if an a* value and a b* value in CIE 1976 L*a*b* color space of 15 Munsell renotation color samples from #01 to #15 listed below when mathematically assuming illumination by the target light are respectively denoted by $a^*_n$ and $b^*_n$, where n is a natural number from 1 to 15, and if an a* value and a b* value in CIE 1976 L*a*b* color space of the 15 Munsell renotation color samples when mathematically assuming illumination by a reference light that is selected according to a correlated color temperature T (K) of the light emitted in the radiant direction are respectively denoted by $a^*_{nref}$ and $b^*_{nref}$, where n is a natural number from 1 to 15, then each saturation difference $\Delta C_n$ satisfies $-3.8 \leq \Delta C_n \leq 18.6$, where n is a natural number from 1 to 15, and an average $SAT_{av}$ of saturation difference represented by formula (3) below satisfies formula (4) below and $$SAT_{av} = \frac{\sum_{n=1}^{15} \Delta C_n}{15} \quad (3)$$

$$1.0 \leq \frac{\sum_{n=1}^{15} \Delta C_n}{15} \leq 7.0, \quad (4)$$

if a maximum saturation difference value is denoted by $\Delta C_{max}$ and a minimum saturation difference value is denoted by $\Delta C_{min}$ then a difference $|\Delta C_{max} - \Delta C_{min}|$ between the maximum saturation difference value and the minimum saturation difference value satisfies $2.8 \leq |\Delta C_{max} - \Delta C_{min}| \leq 19.6,$ where $\Delta C_n = \sqrt{\{(a^*_n)^2 + (b^*_n)^2\}} - \sqrt{\{(a^*_{nref})^2 + (b^*_{nref})^2\}}$ with the 15 Munsell renotation color samples being:

| | |
|---|---|
| #01 | 7.5P 4/10 |
| #02 | 10PB 4/10 |
| #03 | 5PB 4/12 |
| #04 | 7.5B 5/10 |
| #05 | 10BG 6/8 |
| #06 | 2.5BG 6/10 |
| #07 | 2.5G 6/12 |
| #08 | 7.5GY 7/10 |
| #09 | 2.5GY 8/10 |
| #10 | 5Y 8.5/12 |
| #11 | 10YR 7/12 |
| #12 | 5YR 7/12 |
| #13 | 10R 6/12 |
| #14 | 5R 4/14 |
| #15 | 7.5RP 4/12 |

Condition 4:

if hue angles in CIE 1976 L*a*b* color space of the 15 Munsell renotation color samples when mathematically assuming illumination by the target light are denoted by $\theta_n$, in degrees, where n is a natural number from 1 to 15, and if hue angles in a CIE 1976 L*a*b* color space of the 15 Munsell renotation color samples when mathematically assuming illumination by a reference light that is selected according to the correlated color temperature T (K) of the light emitted in the radiant direction are denoted by $\theta_{nref}$, in degrees, where n is a natural number from 1 to 15, then an absolute value of each difference in hue angles $|\Delta h_n|$ satisfies $0 \leq |\Delta h_n| \leq 9.0$ degree, where n is a natural number from 1 to 15, where $\Delta h_n = \theta_n - \theta_{nref}$.

* * * * *